(12) United States Patent
Brodoceanu et al.

(10) Patent No.: US 11,557,692 B2
(45) Date of Patent: Jan. 17, 2023

(54) SELECTIVELY BONDING LIGHT-EMITTING DEVICES VIA A PULSED LASER

(71) Applicant: Facebook Technologies, LLC, Menlo Park, CA (US)

(72) Inventors: Daniel Brodoceanu, Cork (IE); Oscar Torrents Abad, Cork (IE); Jeb Wu, Redmond, WA (US); Zheng Sung Chio, Cork (IE); Sharon Nanette Farrens, Cork (IE)

(73) Assignee: Meta Platforms Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/748,692

(22) Filed: Jan. 21, 2020

(65) Prior Publication Data

US 2020/0395521 A1 Dec. 17, 2020

Related U.S. Application Data

(60) Provisional application No. 62/869,905, filed on Jul. 2, 2019, provisional application No. 62/869,908, filed
(Continued)

(51) Int. Cl.
*H01L 33/00* (2010.01)
*H01L 33/52* (2010.01)
(Continued)

(52) U.S. Cl.
CPC .......... *H01L 33/0095* (2013.01); *H01L 24/75* (2013.01); *H01L 24/83* (2013.01);
(Continued)

(58) Field of Classification Search
CPC . H01L 2224/75253; H01L 2224/75261; H01L 2224/75702; H01L 2224/812;
(Continued)

(56) References Cited

U.S. PATENT DOCUMENTS

| 978,583 A | 12/1910 | Heller |
| 5,272,309 A | 12/1993 | Goruganthu et al. |

(Continued)

FOREIGN PATENT DOCUMENTS

| EP | 3 425 618 | 1/2019 |
| WO | 2002033750 | 4/2002 |

(Continued)

OTHER PUBLICATIONS

International Search Report and Written Opinion dated Jul. 7, 2020 in International Patent Application No. PCT/US2020/033999. 14 pages.

(Continued)

*Primary Examiner* — David A Zarneke
(74) *Attorney, Agent, or Firm* — Shook, Hardy & Bacon LLP

(57) ABSTRACT

The invention is directed towards enhanced systems and methods for employing a pulsed photon (or EM energy) source, such as but not limited to a laser, to electrically couple, bond, and/or affix the electrical contacts of a semiconductor device to the electrical contacts of another semiconductor devices. Full or partial rows of LEDs are electrically coupled, bonded, and/or affixed to a backplane of a display device. The LEDs may be µLEDs. The pulsed photon source is employed to irradiate the LEDs with scanning photon pulses. The EM radiation is absorbed by either the surfaces, bulk, substrate, the electrical contacts of the LED, and/or electrical contacts of the backplane to generate thermal energy that induces the bonding between the electrical contacts of the LEDs' electrical contacts and backplane's electrical contacts. The temporal and spatial profiles of the photon pulses, as well as a pulsing frequency and a scanning frequency of the photon source, are selected to control for adverse thermal effects.

24 Claims, 32 Drawing Sheets

Related U.S. Application Data on Jul. 2, 2019, provisional application No. 62/861,938, filed on Jun. 14, 2019, provisional application No. 62/861,949, filed on Jun. 14, 2019, provisional application No. 62/860,219, filed on Jun. 11, 2019.

(51) Int. Cl.
*H01L 33/62* (2010.01)
*H01L 25/075* (2006.01)
*H01L 23/00* (2006.01)
*G02B 27/01* (2006.01)

(52) U.S. Cl.
CPC .......... *H01L 25/0753* (2013.01); *H01L 33/52* (2013.01); *H01L 33/62* (2013.01); *G02B 27/0172* (2013.01); *G02B 2027/0178* (2013.01); *H01L 2224/75263* (2013.01); *H01L 2224/75702* (2013.01); *H01L 2224/8312* (2013.01); *H01L 2224/83031* (2013.01); *H01L 2224/83092* (2013.01); *H01L 2224/83099* (2013.01); *H01L 2224/83224* (2013.01); *H01L 2224/83444* (2013.01); *H01L 2224/83859* (2013.01); *H01L 2224/83895* (2013.01); *H01L 2224/83896* (2013.01); *H01L 2924/12041* (2013.01); *H01L 2933/005* (2013.01); *H01L 2933/0033* (2013.01); *H01L 2933/0066* (2013.01)

(58) Field of Classification Search
CPC ... H01L 2224/8122; H01L 2224/81224; H01L 2224/83224
See application file for complete search history.

(56) References Cited

U.S. PATENT DOCUMENTS

| | | |
|---|---|---|
| 5,801,350 A | 9/1998 | Shibuya et al. |
| 6,046,076 A * | 4/2000 | Mitchell ................ H01L 24/75 257/E21.511 |
| 7,056,737 B2 | 6/2006 | Feder et al. |
| 7,056,767 B2 * | 6/2006 | Liang ................... H01L 21/563 257/E21.503 |
| 7,170,185 B1 | 1/2007 | Hogerton et al. |
| 7,253,078 B1 | 8/2007 | Nguyen et al. |
| 7,301,222 B1 | 11/2007 | Patwardhan et al. |
| 8,193,468 B2 * | 6/2012 | Cordingley ............ B23K 26/10 219/121.69 |
| RE44,500 E | 9/2013 | Pendse |
| 8,574,966 B2 | 11/2013 | Bauer et al. |
| 9,202,714 B2 * | 12/2015 | Ma .......................... H01L 24/27 |
| 9,373,070 B2 | 6/2016 | Forster |
| 9,425,179 B2 | 8/2016 | Hwang et al. |
| 9,443,800 B2 * | 9/2016 | Inagaki ............. H01L 23/49838 |
| 9,555,644 B2 | 1/2017 | Rogers et al. |
| 9,613,924 B2 * | 4/2017 | Aliane .................... H01L 24/83 |
| 9,691,733 B1 | 6/2017 | Shen et al. |
| 9,785,083 B2 | 10/2017 | Morishita et al. |
| 9,793,198 B2 * | 10/2017 | Uzoh ...................... H01L 24/11 |
| 9,853,010 B2 | 12/2017 | Choi et al. |
| 10,361,341 B2 * | 7/2019 | Danesh ............ H01L 21/02458 |
| 10,388,631 B1 | 8/2019 | England |
| 10,410,990 B2 * | 9/2019 | Han ....................... B23K 3/087 |
| 10,566,494 B2 * | 2/2020 | Zou ..................... H01L 25/0753 |
| 10,636,761 B2 | 4/2020 | Choi et al. |
| 10,714,464 B2 | 7/2020 | Pokhriyal et al. |
| 10,888,001 B2 * | 1/2021 | Lin ........................ H01L 24/14 |
| 10,998,286 B1 * | 5/2021 | Brodoceanu ............ H01L 24/80 |
| 11,024,608 B2 | 6/2021 | Meitl et al. |
| 11,195,811 B2 | 12/2021 | Summerfelt et al. |
| 2002/0129894 A1 | 9/2002 | Liu et al. |
| 2003/0109080 A1 | 6/2003 | Dias |
| 2003/0224581 A1 * | 12/2003 | Lutz ....................... H01L 25/50 257/E21.705 |
| 2005/0028561 A1 | 2/2005 | Greulich-Hickmann et al. |
| 2005/0277231 A1 | 12/2005 | Hembree et al. |
| 2009/0017566 A1 | 1/2009 | Basin et al. |
| 2009/0045507 A1 | 2/2009 | Pendse et al. |
| 2009/0120916 A1 * | 5/2009 | Bruce .................. B23K 26/064 219/121.66 |
| 2010/0159644 A1 * | 6/2010 | Dunne .................. H01L 23/295 438/118 |
| 2011/0221331 A1 | 9/2011 | Yu et al. |
| 2014/0061921 A1 | 3/2014 | Basavanhally |
| 2014/0076863 A1 | 3/2014 | Moffitt |
| 2016/0192496 A1 | 6/2016 | Wang et al. |
| 2017/0263466 A1 | 9/2017 | Ranish et al. |
| 2017/0288102 A1 | 10/2017 | Farrens et al. |
| 2017/0338542 A1 | 11/2017 | Cok |
| 2017/0365755 A1 | 12/2017 | Chu |
| 2018/0269174 A1 | 9/2018 | Fathi et al. |
| 2019/0043843 A1 * | 2/2019 | Liu ........................ H01L 24/00 |
| 2019/0380210 A1 * | 12/2019 | Lin ........................ H01L 24/17 |
| 2020/0266078 A1 | 8/2020 | Eom et al. |
| 2021/0323228 A1 | 10/2021 | Przybyla et al. |

FOREIGN PATENT DOCUMENTS

| | | |
|---|---|---|
| WO | 2003030248 | 4/2003 |
| WO | 2018227453 | 12/2018 |

OTHER PUBLICATIONS

International Search Report and Written Opinion dated Sep. 3, 2020 in International Application No. PCT/US2020/035869. 13 pages.

International Search Report and Written Opinion dated Sep. 3, 2020 in International Patent Application No. PCT/US2020/037077. 13 pages.

International Search Report and Written Opinion dated Sep. 16, 2020 in International Patent Application No. PCT/US2020/037063. 16 pages.

Meniga, A., Tarle, Z., Ristic, M., Sutalo, J., & Pichler, G. (1997). Pulsed blue laser curing of hybrid composite resins. Biomaterials, 18(20), 1349-1354.

Mohan, K., Shahane, N., Liu, R., Smet, V., & Antoniou, A. (2018). A review of nanoporous metals in interconnects. Jom, 70(10), 2192-2204.

European Search Report for European Patent Application No. 21215270.6, dated Apr. 26, 2022, 8 pages.

* cited by examiner

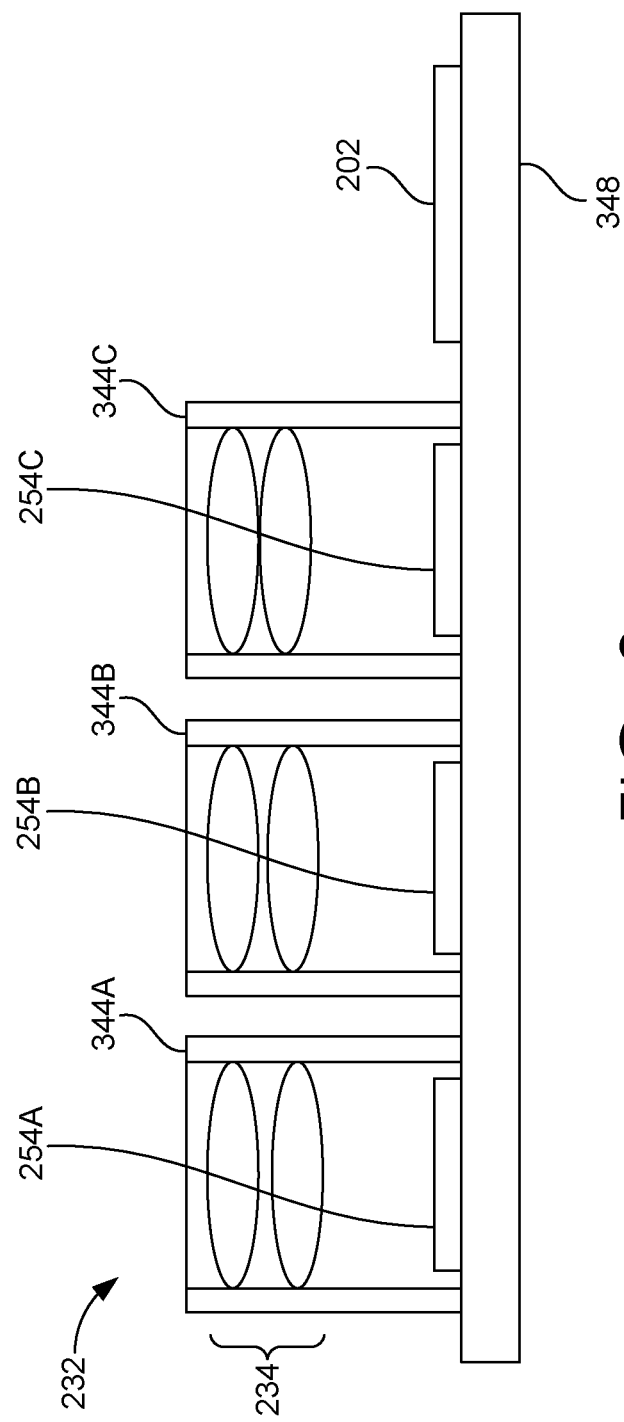

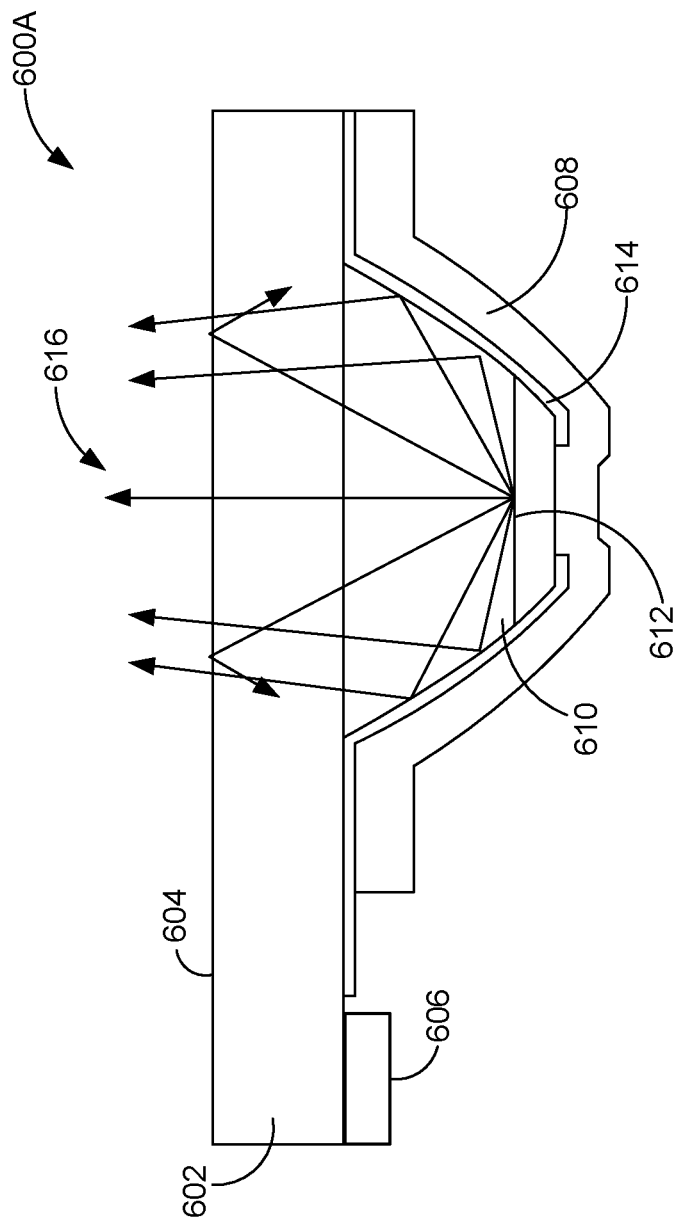

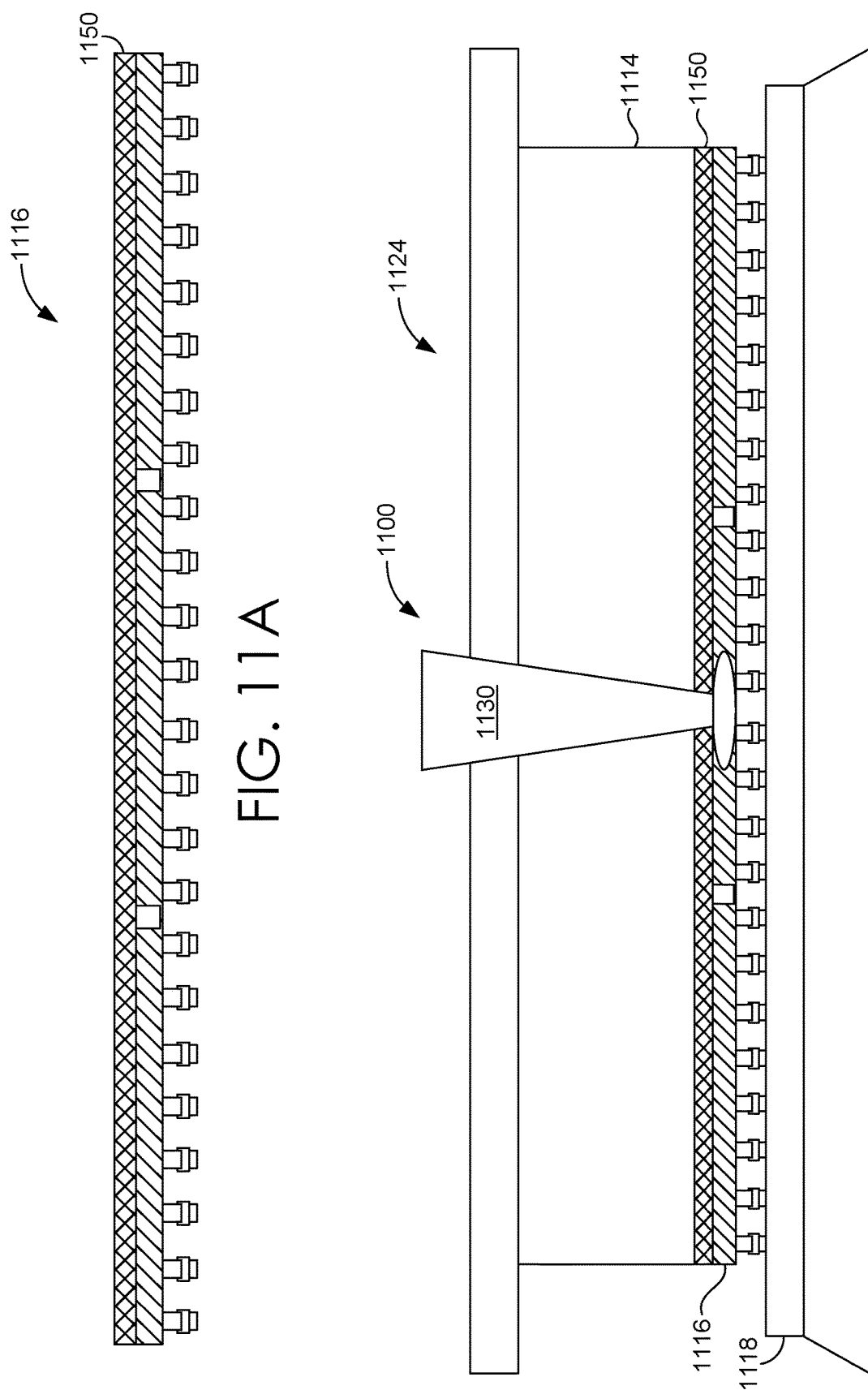

SELECTIVELY BONDING LIGHT-EMITTING DEVICES VIA A PULSED LASER

CROSS-REFERENCE TO RELATED APPLICATIONS

This application claims priority to U.S. Provisional Patent Application 62/860,219 filed on Jun. 11, 2019, and entitled "SELECTIVELY BONDING LIGHT-EMITTING DEVICES VIA A PULSED LASER," the contents of which are incorporated herein in their entirety. This application also claims priority to U.S. Provisional Patent Application 62/861,949 filed on Jun. 14, 2019, and entitled "SELECTIVELY BONDING LIGHT-EMITTING DEVICES VIA A PULSED LASER," the contents of which are incorporated herein in their entirety. This application further claims priority to U.S. Provisional Patent Application 62/861,938 filed on Jun. 14, 2019, and entitled "LED Bonding with Underfill," the contents of which are incorporated herein in their entirety. This application additionally claims priority to U.S. Provisional Patent Application 62/869,905 filed on Jul. 2, 2019, and entitled "DIELECTRIC-DIELECTRIC AND METALLIZATION BONDING VIA PLASMA ACTIVATION AND LASER-INDUCED HEATING," the contents of which are incorporated herein in their entirety. This application also claims priority to U.S. Provisional Patent Application 62/869,908 filed on Jul. 2, 2019, and entitled "BONDING FOR DEFORMABLE ELECTRICAL CONTACTS," the contents of which are incorporated herein in their entirety.

BACKGROUND

The present disclosure relates to the manufacture and assembly of electronic display devices.

Electronic displays are a core component of many computing devices, such as smart phones, tablets, smartwatches, laptops, desktops, televisions (TVs), and head-mounted devices (e.g., virtual reality (VR) devices, augmented reality (AR) devices, and/or mixed-reality (MR) devices). A modern display device may include a two-dimensional (2D) array of millions, or even tens of millions, of pixels. A 2D array of pixels can be arranged in rows and columns of pixels. For example, a 4K TV may include 4096 rows and 2160 columns of pixels (i.e., a 4096×2160 display), for close to nine million pixels.

Each pixel may include one or more light-emitting devices, sub-devices, or components, such as a light-emitting diode (LED). The LED may be an inorganic LED (ILED) or an organic LED (OLED). Each pixel may include multiple LEDs. For example, an RGB pixel may include three separate LEDs: a red (R) LED, a green (G) LED, and a blue (B) LED. Thus, modern displays may include well over ten million individual LEDs. The LEDs may be arranged in rows and columns on one or more backplanes or printed circuit boards (PCBs). When assembling the display, it is typically required to electrically couple, bond, or affix each of the LEDs to the backplane. Conventional methods of bonding millions of LEDs to one or more backplanes may result in adverse thermal effects, which increase the cost and time to assemble the display, as well as decreases the yield in the manufacturing process.

SUMMARY

Embodiments of the present invention relate to selectively bonding light-emitting devices and/or components, such as but not limited to light-emitting diodes (LEDs) and/or micro LEDs (µLEDs) to a target substrate (e.g., a backplane of a display device). The µLEDs may include feature sizes that are less than 100 microns (µm). In at least one embodiment, the feature size may be less than 1 µm (i.e., the feature size may be sub-micron). The feature size of a pixel may refer to the physical size of the pixel and/or the size of the pixel's electrical contacts and/or contact pads. One non-limiting embodiment includes a method for electrically coupling a first semiconductor device (e.g., an LED and/or a µLED) to a target substrate (e.g., a backplane of a display device). The method includes positioning the first semiconductor device proximate to the target substrate and transmitting a photon pulse with a temporal profile and/or spatial profile to irradiate the first semiconductor device. Positioning the first semiconductor device proximate to the target substrate may include spatially aligning an electrical contact of the first semiconductor device with an electrical contact of the target substrate. At least one of a temporal profile and/or a spatial profile of the photon pulse is modulated to control thermal effects associated with thermal energy induced by the transmitted photon pulse. The thermal energy may bond the electrical contact of the first semiconductor device to the electrical contact of the target substrate.

A pick-up head of a pick and place head (PPH) (e.g., a pick-up head) can be employed to pick up the first semiconductor device from a carrier substrate. The pick-up head may position the first semiconductor device proximate to the target substrate. In some embodiments, and upon positioning the first semiconductor device, the PPH may be employed to press downward the first semiconductor device to the target substrate and without significantly affecting the positioning of all the electrical contacts. This applied force may ensure all the electrical contacts are in contact with each other or at least with less than 10 nm gap. In some embodiments, no gap may be achieved. The applied force may depend upon the size of the first device and/or the target substrate, as well as the electrical and material/mechanical properties of the first device/target substrate, such that mechanical damage and/or deformation may be avoided. A photon pulse may be then transmitted through the pick-up head to irradiate the first semiconductor device. The pick-up head may serve as an optical path and enable the photon pulse to pass through it in order to reach the first device. The pick-up head may absorb minimum or none of the energy from the photon pulse. In some embodiments, the pick-up head may not be damaged or lose functionality due to the energy of the pulsed photon An additional photon pulse can be transmitted with an additional temporal profile and/or spatial profile. The additional temporal profile and/or spatial profile may be modulated to control thermal effects associated with additional thermal energy induced by the additional photon pulse. In some embodiments, the additional temporal and/or spatial profiles of the additional photon pulse are similar to the temporal and/or spatial profiles of the photon pulse. In other embodiments, the additional temporal and/or spatial profiles of the additional photon pulse are varied from the temporal and/or spatial profiles of the photon pulse. The additional thermal energy bonds an electrical contact of a second semiconductor device to a second electrical contact of the target substrate. The electrical contact of the first semiconductor device may be linearly positioned with the electrical contact of the second semiconductor device, thereby forming a linear array of semiconductor devices. The photon pulse and the additional photon pulse may be transmitted by scanning a photon pulse source across the linearly positioned first semiconductor device and the second semiconductor device to electrically couple the first semiconductor device and the second semiconductor device to the target substrate. In some embodiments, a plurality of photon sources may be included in a plurality of PPHs. Numerous models of a die bonding machine may have multiple PPHs to increase throughput. Such plurality of PPHs may utilize the same or differing pulse energy and wavelength of photons.

In various embodiments, by modulating the temporal and/or spatial profile of the photon pulse, the thermal energy induced by the photon pulse is spatially localized at the electrical contact of the first semiconductor device and/or the electrical contact of the target substrate, and the thermal energy induced by the photon pulse does not substantially affect either the electrical contact of the second semiconductor device, or the second electrical contact of the target substrate. Likewise, by modulating the additional temporal and/or spatial profile of the additional photon pulse, the thermal energy induced by the additional photon pulse is spatially localized at the electrical contact of the second semiconductor device and/or the second electrical contact of the target substrate, and the thermal energy induced by the additional photon pulse does not substantially affect either the electrical contact of the first semiconductor device, or the electrical contact of the target substrate.

In at least one embodiment, the method includes irradiating the first semiconductor device with a plurality of photon pulses that include the first photon pulse. A temporal period between consecutive photon pulses of the plurality of photon pulses is modulated to control the thermal effects associated with the thermal energy provided by each of the plurality of photon pulses. In some of the embodiments, the temporal profile may be based on a thermal diffusivity and/or a geometry associated with the first semiconductor device. The temporal profile may be modulated to localize the thermal effects at the first semiconductor device.

In addition to forming electrical bonds via photon beams (e.g., continuous photon beams or photon pulses), some embodiments are directed towards annealing the electrical bonds between the first semiconductor device and the target substrate, via one or more additional photon beams. Annealing the electrical bonds, via photon beams, may strengthen the mechanical integrity of the electrical bonds, as well as enhance the electrical performance and/or characteristics (e.g., reduced resistance, enhanced impedance matching, and the like) of the bonds. Similarly as discussed above, and to control for adverse thermal effects, the temporal and/or spatial profile of the annealing photon pulses may be selected and/or modulated as required for the materials, geometries (e.g., feature size and contact pitch), and thermal properties of the first semiconductor device and the target substrate. In some embodiments, the target substrate may be actively cooled, while in other embodiments, the target substrate may be actively heated.

Additional embodiments are directed towards mechanically stabilizing electrical bonds via underfill (UF) material. Note, as used throughout, UF material may include traditional underfill materials, as well as dielectric polymers, such as but not limited to benzocyclobutene (BCB), highly-conductive polymers, and the like. In some embodiments, the UF material may be applied after the formation and/or annealing of the electrical bonds, via capillary flow processes on the uncured (or partially cured) UF material. As used throughout, in additional to uncured UF material, the term "uncured UF material" may be used to refer to partially cured UF material. A (pulsed or continuous) photon beam may be employed to cure the UF material. In other embodiments, the uncured UF material may be applied to at least one of the first semiconductor device or the target substrate prior to positioning the first semiconductor device proximate to the target substrate. That is, the UF material may be disposed intermediate the first semiconductor device and target substrate "sandwich," prior to employing a photon beam to electrically couple the first semiconductor device to the target substrate. One or more curing processes (e.g., thermal, room temperature, pulsed and/or scanned photon beams, and the like) may be employed to cure the sandwiched UF material. In pre-applied UF material embodiments, the uncured UF material may be applied to the first semiconductor device, the target substrate, or a combination thereof, prior to aligning the electrical contacts of the first semiconductor device and the target substrate, to form the first semiconductor device and target substrate "sandwich." Thus, the uncured UF material may be between and/or disposed intermediate the one or more inner surfaces of the "sandwich." The UF material may be similar to UF material employed in "flip-chip"-style semiconductor packaging.

Once cured, the UF material provides many similar benefits to conventionally applied and cured UF material, associated with "flip-chip"-style packed semiconductor devices. For example, the cured UF material may redistribute any thermo-mechanical stress associated with a CTE mismatch between the first semiconductor device and the target substrate. Furthermore, as discussed within, the presence of the UF material, during electrical bonding and/or annealing may provide enhanced mechanical stabilization of the alignment between pairs of uncoupled electrical contacts. The cured UF material may mechanically couple the first semiconductor device to the target substrate, and thus may mechanically stabilize any alignment and/or electrical coupling between the first semiconductor device and the target substrate.

More particularly, and in some embodiments, the uncured UF material may be applied post the electrical bonding and/or annealing of the electrical bonds. The UF material may be applied via capillary action (e.g., capillary flow) and cured via thermal energy induced by one or more (continuous or pulsed) photon beams. The photon beam may be scanned. Furthermore, the spatial and/or temporal profile of the photon beam may be modulated to control for adverse thermal effects. The cured UF material may mechanically stabilize electrical bonds between the electrical contacts of the first semiconductor device and the target substrate.

Still other embodiments are directed towards packaging the mechanically and/or electrically coupled first semiconductor device and the target substrate (e.g., a first semiconductor device and target substrate "integrated device."). For example, the integrated device may be electrically coupled to a circuit board and/or packaging boards with input/output (I/O) pins, via the various embodiments. More particularly, continuous or pulsed photon beams may be employed to electrically couple additional electrical contacts (e.g., I/O pins) of the first semiconductor device and/or the target substrate to another device (e.g., a printed circuit board or packaging material). That is, a circuit board may be populated with semiconductor devices via pulsed photon beams. The temporal and/or spatial profile of the photon pulses may also be selected to further control for thermal effects.

Still other embodiments are directed towards employing multiple photon beams or pulses to form and/or anneal the electrical bonds, as well as cure UF material. For example, one photon pulse may irradiate the first semiconductor device, and another photon pulse may irradiate the target substrate. The photon pulses may be opposed and/or coaxial photon pulses. In some embodiments, the opposed photon beams may be pulsed and/or scanned. The pulsing and/or scanning frequencies of the opposed photon beams may be similar or dissimilar to each other. The pulsing of the two photon beams may be substantially in phase (so that the first semiconductor device and the target substrate are simultaneously irradiated). In some embodiments, the two coaxial beams do not necessarily need to pulse in sync (i.e. same repetition rate/pulse frequency). Depending on the physical properties of the backplane and the chip (e.g. thickness, material type) the optimum localized heating may be achieved at different pulse frequency. In other embodiments, a statically or dynamically determined phase difference may be inserted in the pulsing of the two photon beams. Likewise, the scanning of the two photon beams may be in-phase for some embodiments, while in other embodiments, a phase difference exists in the scanning of the two beams.

As noted above, some embodiments are directed towards pre-applying the UF material. In these embodiments, the UF material may be applied prior to forming the "sandwich" that forms the alignment between the pairs of corresponding electrical contacts of the first semiconductor device and the target substrate. That is, the uncured UF material may be deposited on the first semiconductor device, the target substrate, or a combination thereof. The uncured UF material may be cured via one or more photon beams that are also employed to electrically bond the electrical contacts of the first semiconductor device and the target substrate. In other embodiments, other curing processes may be employed.

In some embodiments, an excess portion of the pre-applied and uncured UF material may be removed via plasma etching. A continuous photon beam or a pulsed photon beam may be employed to form and/or anneal the electrical bonds, as well as cure the UF material. In another embodiment, a two-stage curing process may be employed. The two stages may include a pre-curing stage and a curing stage. In such embodiments, the pre-applied UF material may be pre-cured via a thermal curing process (e.g., with an ultraviolet (UV) or an infrared (IR) photon beam) and/or via a photochemical process (e.g., the UF material may include a photochemical initiator) upon UV irradiation. After pre-curing, the excess portion of the pre-cured UF material may be removed via a laser ablation and/or laser abrasion process. Electrical bonding of the electrical contacts may be formed via continuous or pulsed photon beams. In some embodiments, and in addition to, or as an alternative to pulsed photon beams electrically bonding the contacts, a room (or low) temperature thermocompression bonding process may be employed to electrically bond the electrical contacts after the laser abrasion process. After (or before) the electrical coupling of the first semiconductor device and the target substrate, the pre-cured UF material may be cured via a room temperature (or low temperature) curing process. For example, an anaerobic or moisture curing process may be employed for the second curing stage. In some embodiments, the uncured UF material may be wet UF material. In such embodiments, pre-curing the UF material may not be required. Thus, removing excess wet UF material may not be required. The thickness of the wet UF material may be optimized based on bump height to ensure that the UF material is expanded enough to reach and adhere to the bottom side of the semiconductor device when pulsed photon is applied for localized heating.

In another embodiment, the electrical bonds may be mechanically stabilized without the employment of UF material. An insulating (or dielectric) layer may be formed on surfaces of the first semiconductor device and the target substrate. The insulating layers may be activated via plasma activation. When compressed together, the activated insulating layers may at least partially chemically bond (e.g., covalent bonds, hydrogen bonds, van der Wall bonds, or the like) to form, prior to electrically bonding, at least a somewhat stable mechanical coupling between the first semiconductor device and the target substrate. The chemical bonding of the insulating layers stabilizes the alignment between corresponding electrical contacts of the first semiconductor device and the target substrate. Because of the stabilization of the alignment, adverse thermal effects resulting in a misalignment of the electrical contacts, during electrical bonding, may be mitigated. A continuous or pulsed photon beam may be employed to form the electrical bonds, depending on the thermal properties of the first semiconductor device and/or the target substrate.

In still another embodiment, pre-applied UF material may be employed to stabilize the pre-bonded alignment of the electrical contacts of the first semiconductor device and the target substrate. The electrical contacts of one of the first semiconductor or the target substrate may be formed from deformable electrically conductive material (e.g., nanoporous gold, gold, silver, or the like). The deformable electrical contacts of at least one of the semiconductor device or the target substrate may be formed into a "spikey" or tapered shape. In some embodiments, one of the first semiconductor device or the target substrate has "spikey" deformable contacts, while the other of the first semiconductor device or the target substrate has "flat" contacts. Uncured UF material may be pre-applied to the device (e.g., the first semiconductor device or the target substrate) with the "flat" contacts. The pre-applied and uncured UF material may substantially encapsulate the "flat" electrical contacts. In one non-limiting embodiment, the first semiconductor device has the "spikey" deformable contacts, and uncured UF material is pre-applied to the substantially cover or encapsulate the "flat" electrical contacts of the target substrate. In another embodiment, the target substrate has the "spikey" deformable contacts, and uncured UF material is pre-applied to the substantially cover or encapsulate the "flat" electrical contacts of the first semiconductor device.

A first semiconductor device and target substrate "sandwich" may be formed by aligning the "spikey" electrical contacts of the first semiconductor device with the corresponding "flat" contacts of the target substrate (substantially encapsulated by the pre-applied uncured UF material). The "sandwich" may be compressed via a compressive force. When compressed, the "spikey" contacts act as a wedge to "plow" away (or displace) at least a portion of the uncured UF material encapsulating the corresponding flat electrical contacts. Localized thermal energy (e.g., from continuous or pulsed photon beams) may be applied during the compression. The localized thermal energy deforms and "flattens"-out the "spikey" electrical contacts. As the "spikey" electrical contacts are deformed, additional UF material is displaced. The localized thermal energy bonds the electrical contacts and cures the UF material. Because the "spikey" contacts are "flattened-out" during the compression, bonding, and curing, such embodiments are tolerant to variations in the height and shape of the fabricated electrical contacts.

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

BRIEF DESCRIPTION OF THE DRAWINGS

The present invention is described in detail below with reference to the attached drawing figures, wherein:

FIG. 3 illustrates a cross-sectional view of an embodiment of a light source included in the display device of FIGS. 2A-2C, in accordance with the various embodiments;

FIG. 6A is a cross-sectional diagram illustrating an embodiment of an LED, in accordance with one embodiment;

FIG. 11A is a side-view diagram illustrating a row of LEDs that includes an elastomeric interface layer applied to the top surface of the row of LEDs, in accordance with the various embodiments;

FIG. 11B is a cross-sectional diagram illustrating employment of a re-usable pick-up head to position a row of LEDs on a target substrate;

DETAILED DESCRIPTION

Figure 1A:
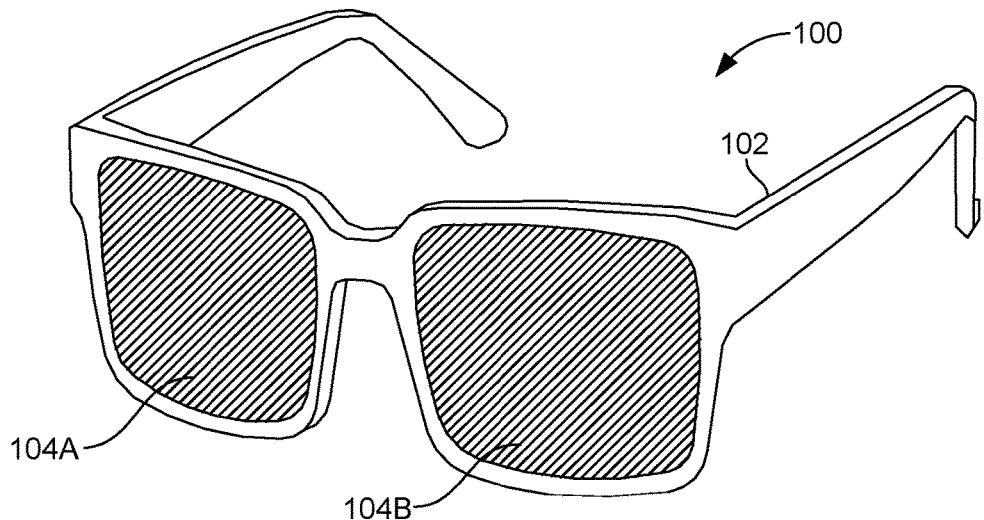
FIG. 1A is a diagram of a head-mounted device according to some embodiments.

Embodiments are directed towards enhanced systems and methods for employing a pulsed photon (or electromagnetic (EM) energy) source, such as but not limited to a laser, to electrically couple, bond, and/or affix the electrical contacts of semiconductor devices (e.g. LEDs) to the electrical contacts of other semiconductor devices (e.g., target substrate). In non-limiting exemplary embodiments, full or partial rows of light-emitting diodes (LEDs) are electrically coupled, bonded, and/or affixed to a backplane of a display device. The LEDs may be micro-LEDs (µLEDs). The pulsed photon source is employed to irradiate the LEDs and/or the backplane with light. The EM radiation of the photon pulses is absorbed by the surfaces, bulk, substrate, electrical contacts of the LED, and/or electrical contacts of the backplane and converted into thermal energy that bonds and/or electrically couples the electrical contacts of the LEDs to the backplane's electrical contacts.

As discussed throughout, conventional employment of continuous wave (CW) lasers to bond semiconductor devices may give rise to adverse thermal effects that limit or degrade the desired electrical coupling between the LEDs and the backplane, or even damage the devices. In contrast to conventional CW laser methods, at least one of a temporal or spatial profile of the photon pulses (or pulsed photon beams) are modulated to control and/or reduce adverse thermal effects associated with the thermal energy induced by the pulsed beam. Modulating the temporal and/or spatial profiles of a pulsed beam enables the temporal and spatial localization of thermal energy induced by the beam's EM interaction with the semiconductor devices and/or the electrical contacts of the devices. Thus, via the enhanced methods and systems discussed herein, any adverse thermal effects of the bonding process are adequately controlled. As used herein, the term "modulating" may be used synonymously with any of the following terms: determining, selecting, choosing, adjusting, controlling, varying, tuning, setting, at least partially optimizing, changing, or the like. For example, modulating a temporal profile may refer to determining, selecting, choosing, adjusting, controlling, setting, at least partially optimizing, tuning, changing, or varying the temporal profile of a photon beam.

As a result of adequately controlling the adverse thermal effects, the couplings between the semiconductor devices function electrically and mechanically as desired and the devices are not damaged. Furthermore, and because the adverse thermal effects are controlled (e.g., reduced) prior to bonding any LEDs included in a row of LEDs, a full (or partial) row of LEDs may be positioned on the backplane. Because a full row of LEDs may be positioned prior to bonding any of the LEDs within the row, the enhanced bonding methods and systems discussed herein are more efficient and precise than conventional laser-bonding methods.

As used herein, the term "temporal profile" of a photon pulse or photon beam refers to the temporal intensity profile of the photon pulse. That is, a temporal profile of a photon pulse indicates a distribution of power transfer per unit area associated with the photon beam, and as a function of time. A temporal profile may be characterized by a temporal pulse width, e.g., 1 nanosecond (ns), 10 ns, 100 ns, or the like. In at least some embodiments, the temporal pulse width may be less than 1 ns. For example, the temporal pulse width in some embodiments may be 1 picosecond (ps), 10 ps, or 100 ps. Note that these temporal pulse widths are non-limiting, and the temporal profile of a photon pulse may be modulated to be virtually any temporal pulse width that is sufficient to adequately control for the adverse thermal effects. The temporal pulse width may referred to as the pulse duration.

Similarly, the term "spatial profile" of a photon pulse (e.g., laser pulse) or photon beam refers to the spatial intensity profile of the photon pulse, in one or more dimensions. That is, a spatial profile of a photon pulse indicates a distribution of power transfer per unit area associated with the photon beam as a function of one or two spatial dimensions. A spatial profile may be characterized by a 1D or 2D spatial pulse width, beam spot size, or the like, e.g., 1 micron (µm), 3 µm, 5 µm, 10 µm, 20 µm, 30 µm, 50 µm, or 100 µm. In some embodiments, the spatial pulse width may be sub-micron (i.e., less than 1 µm). The spatial profile may include a beam spot shape (e.g., circular or linear). The intensity of the photon pulse may be characterized in space and time by a combination of the temporal profile and the spatial profile of the photon pulse.

More particularly, once the (full or partial) row of unbonded LEDs is positioned on the backplane, the pulsed photon beam may be scanned across the row to selectively bond each of the LEDs of the row to the backplane. In some embodiments, to bond the electrical contacts of the LEDs, each LED may be irradiated with multiple consecutive photon pulses via a scanning photon source. The photon pulses may be scanned across the row of LEDs. The spatial profile and the focus (i.e., the center of the spatial profile) of the pulsed beam may be modulated such that the thermal energy induced by a particular pulse is spatially localized at a particular LED of the row of LEDs. That is, a particular photon pulse emitted by the pulsed photon source may selectively target a particular LED of a row of LEDs, such that the thermal energy induced by the particular pulse is at least substantially spatially localized near the selectively targeted LED. Furthermore, the temporal profile of the beam is modulated to control the amount of thermal energy induced by a single pulse. Each LED may be irradiated with a plurality of consecutive of photon pulses to ensure adequate bonding of the electrical contacts. That is, during the scanning, a particular LED or the row of LEDs may be irradiated with multiple photon pulses to generate an electrical coupling between the electrical contacts of the particular LED and the corresponding electrical contacts of the backplane. The temporal gap between consecutive pulses targeting the particular LED may be sufficient to allow for the dissipation of excess thermal energy and control adverse thermal effects.

Scanning a temporally and/or spatially modulated pulsed beam across a row of un-bonded LEDs enables the adequate (temporal and spatial) localization of the thermal energy induced by the beam. When bonding the electrical contacts of a particular LED to the corresponding electrical contacts of the backplane, the pulsed beam may be aligned, via optical components of the enhanced system, with the position of the particular LED within the row of LEDs. One or more pulses may irradiate the particular LED, where the temporal and/or spatial profile of each of the aligned pulses may be modulated. The thermal energy of a single photon pulse may be spatially localized at a single electrical contact of a single LED and the corresponding electrical contact of the backplane. In some embodiments, the thermal energy of a single photon pulse may be spatially localized at a pair of electrical contacts of a LED (and the corresponding electrical contacts of the backplane). In at least one embodiment, the thermal energy of a single photon pulse may be spatially localized at a plurality of electrical contacts of a plurality of LEDs (and the corresponding electrical contacts of the backplane).

Via the modulation of the pulsed beams' profiles, the induced thermal energy is temporally and spatially localized near the particular LED, the particular LEDs' electrical contacts, and/or the corresponding portions of the backplane, e.g., the corresponding electrical contacts of the backplane. The localized thermal energy induces the electrical coupling, bonding, and/or affixing of the particular LED's electrical contacts to the backplane's corresponding electrical contacts. Furthermore, the temporally and/or spatially localized thermal energy, induced when bonding the particular LED, does not adversely affect other (already bonded or not-yet bonded) LEDs within the row, or other portions of the backplane. The pulsed beam may be scanned across the full row of LEDs to bond each of the LEDs within the row.

Although many embodiments are discussed in the context of electrically coupling, bonding, and/or affixing rows of LEDs to a backplane of a display device, other embodiments are not so limited, and the various enhanced pulsed photon source systems and methods may be employed to bond virtually any first semiconductor device to virtually any other second semiconductor device. Furthermore, although many embodiments are discussed in the context of employing a pulsed laser, other embodiments are not so limited, and the various embodiments may employ pulsed photon and/or EM energy sources that are not lasers. For example, the sources of pulsed EM energy need not be coherent sources. Other sources that provide significantly collimated photon pulses of appropriate wavelength and intensity may be employed to provide EM energy that is harnessed to electrically couple, bond, and/or affix a first semiconductor device to a second semiconductor device. Virtually any pulsed EM energy source of sufficient collimation and power may be employed to bond a first semiconductor device to a second semiconductor device. In some embodiments, the pulsed photon source emits photons within a narrow range of frequencies or wavelengths. That is, the pulsed photon source may be a monochromatic, or nearly monochromatic, photon source. In some embodiments, the monochromatic photon source may emit photons of a wavelength between 266 and 1064 nanometers (nm). As one example, the wavelength of the photons emitted by the photon source is 355 nm. As another example, the wavelength of the photons emitted by the photon source is approximately 532 nm. In some embodiments, photon source is a neodymium-doped yttrium aluminum garnet (Nd:YAG) laser. As such, the wavelengths of the emitted photons may include one or more harmonics of a Nd:YAG laser, i.e., 1062 nm, 532 nm, 355 nm, or 266 nm.

In some embodiments, a pulsed photon source is employed to bond rows of separate colors of LEDs to a single backplane. For example, the bonded rows of LEDs may form an array of pixels, in a display device, such as but not limited to 2D array of pixels 1504 of display device 1500 of FIG. 15. In other embodiments, a pulsed photon source is employed to bond rows of separate colors of LEDs to separate backplanes, e.g., one backplane per color. For instance, multiple rows of red (R) LEDs may be bonded (via a pulsed laser) to a first backplane, multiple rows of green (G) LEDs are bonded (via the pulsed lased) to a second backplane, and multiple rows of blue (B) LEDs are bonded (via the pulsed laser) to a third backplane. The three backplanes may be integrated to form rows (and columns) of RGB pixels for a display device. In some embodiments, the rows of LEDs may form emitter arrays, such as but not limited to emitter arrays 254A-254C of FIGS. 2C and 3. The rows of LEDs bonded to a backplane may be employed in a display device of a head-mounted device (HMD), such as but not limited to near-eye display (NED) devices 104A-104B of HMD 100 of FIGS. 1A and 1B. The HMD may be a virtual-reality (VR) HMD, an augmented-reality (AR) HMD, and/or a mixed-reality (MR) HMD.

More particularly, an array of LEDs (e.g., a row or a 2D array of LEDs), or other semiconductor devices, may be transported from a carrier substrate to a target substrate (e.g., a backplane or printed circuit board (PCB) for a display device), via a pick-up head and/or a pick and place head (PPH). The LED array may include at least a portion of a row of LEDs. When placing the array of LEDs on the target substrate, the PPH may align the electrical contacts (or metal interconnects) of the LEDs with the corresponding electrical contacts of the target substrate. In addition to electrical interconnects, as discussed herein, the term "electrical contacts" may include solder bumps, contact pads, or electrical leads. Once positioned and aligned, the pulsed laser may be scanned across the array of LEDs. The EM interaction between the pulses' photons and the electrons of the LED's crystalline lattice (or the conductive material included in the electrical contacts) may convert the EM energy into thermal energy. The thermal energy induces the bonding between the LEDs' electrical contacts and the target substrate's electrical contacts, via melting and/or material diffusion where the bond consists of either same metal type or a metal alloy. At least one of a temporal profile or a spatial profile of the pulses is modulated to control (e.g., reduce) adverse thermal effects of the bonding process. As discussed below, the modulation of the temporal and spatial profiles of the photon pulses enables the control of a thermal heat diffusion length associated with the pulses. The associated heat diffusion length characterizes the spatial localization of the induced thermal energy. In various embodiments, the heat diffusion length depends on both the pulse durations and thermal diffusivity (or conductivity) of the irradiated material. Thus, adequately controlling the pulse duration of the photon source of the pulses spatially localizes the induced thermal energy and controls adverse thermal effects. In various embodiments, at least one of a scanning parameter (i.e., a scanning speed) or a pulsing frequency is also modulated to control the adverse thermal effects.

As used herein, the term "pulsing frequency" may refer to the number of photon pulses per unit of time that are emitted by the pulsed photon source. In some embodiments, the pulsing frequency may be referred to as the "pulse repetition rate." For a non-limiting example, a photon source may emit photon pulses with a temporal profile characterized by a temporal pulse width of 10 ns, at a pulsing frequency of 10 MHz. Thus, in 1 second (s), the pulsed photon source emits $10^7$ photon pulses, each lasting approximately $10^{-8}$ s. The time between the start of consecutive 10 ns photon pulses is approximately $10^{-7}$ s (µs) (or 100 ns). Since a single pulse is 10 ns wide, there is approximately a 90 ns temporal gap between consecutive pulses. Excess thermal energy may be dissipated during this 90 ns "cooling off" period. In other embodiments, the pulsing frequency (or pulsing repetition rate) may be modulated to a value between 1 Hz to 3.5 MHz, based on the degree to which the adverse thermal effects are required to be controlled.

The terms "scanning frequency" or "scan speed" may refer to the number of corresponding electrical contacts (or alternatively the number of LEDs) that are selectively targeted and/or irradiated by the pulsed photon source per unit of time. For a non-limiting example, a pulsed photon source may scan a row of LEDs at a scanning frequency of 1 MHz. That is, $10^6$ LEDs in the row are selectively targeted and irradiated by the pulsed beam per second. If the pulse width of the pulses is 10 ns, and the pulsing frequency is 10 MHz, each LED is selectively targeted and irradiated with 10 consecutive 10 ns pulses. The 10 consecutive 10 ns pulses that selectively target the particular LED may induce a sufficient amount of thermal energy to bond the electrical contacts of the selectively targeted LED to the corresponding electrical contacts of the backplane. Furthermore, the thermal heat diffusion length associated with the 10 ns pulses sufficiently spatially localizes the induced thermal energy to adequately control for adverse thermal effects. For example, the thermal heat diffusion length of the 10 ns pulses may be approximately 6.5 μm, which may be significantly smaller than the feature size of individual LEDs within the row of LEDs. These exemplary values for temporal pulse width, spatial pulse width (e.g., beam spot size), scanning frequency, and pulsing frequency are provided for illustrative purposes. It should be noted that these properties of the photon pulses may take on other values, and the values provided here are in no way limiting values for these properties of the photon pulses.

In the above example, there is approximately 90 ns temporal gap between each pair of consecutive 10 ns pulses. The 90 ns temporal gap (or 90 ns "cooling off" period) may allow excess thermal energy to dissipate, and further reduce any associated adverse thermal effects. Thus, in addition to controlling the heat diffusion length, the modulation of the temporal/spatial profiles, as well as the modulation of the scanning and pulsing frequencies of the pulsed photon source may further control for adverse thermal effects.

Adverse thermal effects may arise from a mismatch between the coefficient of thermal expansion (CTE) associated with the PPH, the LEDs, and/or the CTE associated with the backplane. When exposed to thermal energy, a material expands at a rate (relative to the linear dimensions of the material) associated with the material's CTE. Thus, when exposed to thermal energy, semiconductor devices made from materials with dissimilar CTEs expand at dissimilar, or different, rates. LEDs are often fabricated on gallium arsenide (GaAs), gallium nitride (GaN), or other gallium-based wafers, while backplanes for display devices may include complementary metal-oxide-semiconductor (CMOS) circuitry, and are thus often fabricated on silicon (Si) wafers. The CTE of Si ($\approx 2.6 \cdot 10^{-6 \circ}$ C.$^{-1}$) is significantly dissimilar to the CTE of either GaAs is significantly dissimilar to the CTE of either GaAs ($\approx 5.7 \cdot 10^{-6 \circ}$ C.$^{-1}$) or GaN or GaN . . . ($\approx 5.6 \cdot 10^{-6 \circ}$ C.$^{-1}$).

In contrast to the enhanced embodiments herein, conventional laser bonding methods may employ a CW laser, rather than a pulsed laser. When bonding millions (or even tens of millions) of LEDs to a backplane, a conventional CW laser may induce a significant amount of thermal energy in the LEDs and/or the LEDs'/backplane's interconnects. At least a portion of the thermal energy induced from the conventional CW laser may be transferred from the GaAs/GaN LEDs (or interconnects) to the Si backplane, via the thermal contact or coupling between the LEDs' interconnects and the backplane's interconnects. Thus, via this heat transfer associated with a CW laser and the mismatch in the CTEs of the LEDs and the backplane, the LEDs and the backplane thermally expand at different rates. For interconnects that have not been yet bonded, the dissimilar expansion rates may significantly disturb the alignment between the LEDs' interconnects and the backplane's interconnects. Disturbing the alignment of non-bonded interconnects during the bonding process may result in at least a portion of LEDs not being adequately electrically coupled to the backplane. Furthermore, the heat from the continuous laser may reheat, or even "re-melt," the electrical coupling of already bonded interconnects. Accordingly, conventional bonding methods that employ a CW laser may be accompanied with adverse thermal effects and result in "bad" or even "dead" pixels in the display.

Larger backplane die (or chip) sizes exacerbate these adverse thermal effects associated with CTE mismatches and resulting misalignment of interconnects. The larger the backplane die, the larger the absolute expansion of the backplane die. Thus, the larger the backplane die, the larger the misalignment of the interconnects that is associated with thermal energy induced via a CW laser. Furthermore, smaller LEDs (as compared to the size of the backplane) also exacerbate the adverse thermal effects. Similarly, affixing larger numbers of LEDs to a single backplane die also increase the degree of the adverse thermal effects.

In many embodiments, the LEDs may be μLEDs with feature sizes less than 100 microns (μm). In some embodiments, the feature sizes of a μLED may be just a few of tens of μm. In at least one embodiment, the feature sizes of a μLED are less than 1 micron, i.e., the feature sizes may be sub-micron. The spatial profile of the beam may be modulated to result in a beam spot on the order of a few microns. In some embodiments, the beam spot may be focused to sub-micron size. Thus, the beam spot size of the pulsed laser may be focused to be significantly smaller than a single μLED.

As noted above, a backplane for a modern display device may include thousands of rows of LEDs, each including thousands of individual LEDs. Thus, in various embodiments, millions (or even tens of millions) of LEDs may be affixed to a single backplane. The significant difference in the spatial dimensions of a μLED and a backplane die, which is larger than the integrated area of millions of μLEDs, as well as the large number (and the small pitch) of LEDs placed upon a single backplane die, result in even greater misalignment of the interconnects induced via conventional CW lasers. Additionally, the significant thermal energy induced via a CW laser may give rise to the formation of oxidation on the metal interconnects, which further degrades the performance of the pixels.

As indicated above, and in contrast to the conventional employment of a continuous laser to bond millions of μLEDs to a backplane, the enhanced embodiments herein employ a pulsed laser (or other source of well-collimated photons) to bond μLEDs to the backplane. The temporal and/or the spatial profile of the pulsed laser is modulated to control (e.g., minimize or at least reduce) the adverse thermal effects discussed above. A pulsed laser may deliver less thermal energy than a CW laser, and thus a pulsed laser reduces the adverse thermal effects. Furthermore, during the period between the pulses, at least a portion of the induced thermal energy may be dissipated to the ambient environment, or another heat sink. The temporal and spatial profiles, as well as the laser's wavelength, scanning frequency, and pulsing frequency are modulated to induce a sufficient amount of thermal energy to induce the bonding, while controlling the thermal effects such that the adverse thermal effects are not exacerbated beyond an acceptable level. That is, modulating the shape and pulse width of the laser temporally localizes the thermal energy induced by the laser.

More particularly, one or more rows of μLEDs may be placed upon a backplane (or other target substrate) via the PPH. When placing the μLEDs on the backplane, the PPH may align the electrical contacts, interconnects, contact pads, solder bumps, or leads of the μLEDs with the corresponding electrical contacts, interconnects, contact pads, solder bumps, or leads of the backplane, such that each of the μLEDs' interconnects is in thermal contact with the corresponding interconnect of the backplane. Via one or more mechanical components and/or one or more optical components, one or more pulses from a laser may be steered and/or focused such that the thermal energy induced by the one or more pulses is at least spatially localized to an area proximate a first interconnect of a first μLED of the row of μLEDs. Via the alignment of the interconnects, the first interconnect of the first μLED is in thermal contact with a corresponding second interconnect of the backplane. The one or more pulses of the laser irradiate the first μLED, and at least a portion of the induced thermal energy is absorbed by the first interconnect. Via the absorbed thermal energy and the thermal contact between the first and the second interconnects, the first and second interconnects are temporarily melted and bonded after cooling. In some embodiments, the interconnects are not melted. Rather, a sufficient amount of thermal energy is provided, such that enough atoms are diffused across the interconnects to form an electrical bond. Upon bonding of the aligned interconnects, the first LED is electrically coupled and/or affixed to the backplane. Via the (mechanical and/or optical) steering components, the pulses from the laser are steered and/or focused to be in at least partial alignment with another interconnect of a second LED that is adjacent to the first LED. One or more pulses may irradiate the second LED to electrically couple the interconnect of the second LED to the backplane. Thus, the pulsed laser may be scanned across the row of placed LEDs to electrically couple each LED in the row to the backplane. The PPH (or the pick-up head) may be employed to hold the entire LED chip tightly and firmly to the backplane until all (or at least a significant amount of) the electrical contacts between the LED chip and the backplane are in contact with each other, or at least with less than 10 nm gap. This PPH (and/or the pick-up head) may remain in the same (or similar) condition (holding the LED chip tightly and firmly to the backplane) and position (ensuring electrical contacts between the LED chip and backplane are aligned) throughout the bonding session until the electrical contacts of the last μLED of the entire LED chip are bonded by the pulsed laser. This PPH (pick-up head) may avoid being damaged or loss of its functions due to degradation effect resulted by the energy of the pulsed laser.

As discussed in detail throughout, the temporal and/or spatial profiles of the pulsed laser beam are modulated to control (e.g., minimize or at least reduce) the amount of thermal energy that is transferred to the backplane (and other LEDs). When determining and/or selecting the temporal and/or spatial profiles of the pulses, the thermal diffusivity of the LEDs' and/or backplane's material, as well as the geometry of the LEDs and/or backplane, may be considered. Such factors may be employed to determine the heat diffusion length associated with a pulse of a particular temporal profile and/or a particular spatial profile of a laser of a specific wavelength. The heat diffusion length associated with a pulse characterizes the spatial localization of the thermal energy induced by the pulse. Based on the distance between the LEDs (i.e., the pitch of the LEDs) and the thermal properties of the interconnects that thermally couple the LEDs to the backplane, at least the temporal and/or spatial profiles of the pulses are selected to adequately localize the induced thermal energy. That is, the profiles are modulated, chosen, adjusted, and/or selected to result in a heat diffusion length that is small enough to reduce the diffusion of thermal energy to the backplane (and other LEDs) and control the adverse thermal effects below an acceptable level, while still inducing the bonding of the interconnects. More succinctly, the profiles are modulated to spatially and temporally localize the induced thermal energy to a particular LED (within a row of LEDs) and the regions or portions of the backplane that are being bonded.

In addition to modulating the temporal and/or spatial profiles, the scanning and/or pulsing frequencies of the pulsed laser, as well as the wavelength (or frequency) of the pulsed laser may be modulated, selected, chosen, and/or adjusted to control (e.g., reduce) adverse thermal effects to be at or below an acceptable level, while still inducing the bonding of the interconnects. For instance, the pulsing frequency may be modulated to result in a temporal gap between consecutive pulses such that a significant portion of the induced thermal energy may be dissipated to the ambient environment, or another heat sink, within the "cooling off" period between the consecutive pulses. The number of pulses delivered to a single LED, or interconnect of the LED, may be selected via the scanning frequency to induce enough thermal energy to bond the interconnects, while still controlling, or at least reducing, the adverse thermal effects (i.e. heating the surrounding area) to an acceptable level.

In some embodiments, the wavelength of the laser source is selected to be absorbed either on the surface or within the body of the LED. The absorbed thermal energy is diffused into the thermally coupled metal interconnects. In other embodiments, the wavelength is selected such that the LED is significantly optically transparent to the pulsed laser beam, and the majority of thermal energy is generated via interactions of the photons and interconnects material (e.g. metal or other conductive material) of the LEDs and/or the backplane. It should be noted that the embodiments herein are not restricted to forming bonds between metal interconnects. Rather, the various embodiments may additionally form bonds between objects comprising of materials other than metal. For example, the various embodiments may be employed to form bonds between objects comprising, carbon nanotubes, graphene, or polymers filled with metal or non-metallic nanoparticles (i.e., where the polymer may absorb a specific wavelength that results in metallic or non-metallic bond formation following thermal or chemical decomposition of the polymer). These examples are listed only for exemplary purposes, and this list is not intended to be exhaustive of the materials for which a pulsed photon source may be employed to form bonds. Note that the formed bonds need not be conductive bonds.

To transport a row of LEDs from a carrier substrate and position the row of LEDs on a target substrate (e.g., a backplane), the head of the PPH (i.e., the pick-up head) is brought into contact with the upper surfaces (or an interface layer) of the LEDs positioned in the carrier substrate. The head of the PPH adheres to or couples to the upper surfaces (or an interface layer) of the LEDs. Via this adhesion, the PPH transports the row of LEDs from the carrier substrate and positions the row on the target substrate. In some embodiments, the pick-up head may be a conformable, but non-reusable, pick-up head. For example, the pick-up head may comprise a non-reusable polymer layer, such as but not limited to polydimethylsiloxane (PDMS). In some embodiments, a PDMS pick-up head may be a reusable pick-up head. The polymer layer of the conformable PPH enables adhesion of the pick-up head to the row of LEDs. In other embodiments, the PPH may be a non-conformable, but reusable PPH. For example, the pick-up head may comprise a non-conformable, but reusable, layer of fused silica or borosilicate. In such non-conformable embodiments, prior to transporting from the carrier substrate, an elastomeric interface layer (e-layer) may be formed on the surfaces of the LEDs. The e-layer may include polydimethylsiloxane (PDMS). Rather than the conformable layer of the non-reusable PPH, the e-layer on the LEDs facilitates adhesion of the LEDs to the non-conformable, but reusable PPH embodiments. The carrier substrate may be positioned upon or held by a carrier stage. The target substrate may be positioned upon or held by a target stage. The target stage may be a vacuum chuck. In at least one embodiment, the target stage may be cooled to further control for adverse thermal effects.

In some embodiments, the PPH is optically transparent to the pulsed laser. For example, the pick-up head may be comprised of an optically transparent non-conformable fused-silica layer or an optically transparent conformable polymer layer. After the PPH is employed to position the row of LEDs on the backplane, and the pick-up head is still adhered to or coupled to the LEDs, the laser is transmitted through the PPH to irradiate the LEDs. Accordingly, the pulsed laser may be transmitted through the optically transparent PPH to bond the LEDs to the backplane. That is, the LEDs need not be decoupled from the PPH prior to bonding to the backplane. Accordingly, the pick-up head (while still coupled to the un-bonded LEDs) may be employed to at least partially stabilize the alignment of a row of LEDs during the bonding process. This stabilization, via the optically transparent PPH, further maintains the alignments between the electrical contacts of the LEDs and the backplane.

To summarize at least some of the embodiments, a large group of semiconductor chips (e.g., an entire row of μLEDs) may be bonded to a target substrate (e.g., a backplane of a display device) via a pulsed laser that is scanned, via piezoelectric actuated mirrors, across the group of semiconductor chips. The pulsed laser irradiates the semiconductor chips and induces thermal energy that electrically couples the electrical contacts of the semiconductor chips to the electrical contacts of the target substrate. To irradiate the group of semiconductor chips, the pulsed laser may be transmitted through an optically transparent PPH that is employed to position the semiconductor chips on the target substrate. As discussed throughout, because the adverse thermal effects are controlled, the PPH may position an entire row of LEDs on the backplane at once. The thermal energy may be induced by the pulsed laser being absorbed by the semiconductor chips and/or the electrical contacts of the semiconductor chips. The temporal and/or spatial profiles of the pulsed laser are modulated, selected, chosen, or optimized to control for adverse thermal effects, while simultaneously optimizing (or at least increasing) the quality of the bonds (e.g., the electrical conductivity and mechanical integrity of the coupling) between the corresponding electrical contacts.

For example, the duration of the pulsed laser may be selected within the range of 1 ps-100 ns. The beam spot of the pulsed laser may be focused to be on the order of a few microns, tens or microns, or even hundreds of microns. The beam spot may be shaped to be either circular or linear. If the photon source pulse duration is short enough (e.g. 1 ps-100 ns), the induced thermal energy cannot propagate significantly away from the targeted structure (i.e., the irradiated structure and/or the structures of the semiconductor chip that absorb the pulsed laser). Thus, the thermal energy is localized proximate to the targeted structure of the semiconductor chip. The spatial localization of the thermal energy may be characterized by the thermal heat diffusion length. The heat diffusion length depends on the material of the semiconductor chips, the geometry of the semiconductor chips (e.g., thickness, width, and length), and the temporal profiles of the pulsed laser. By decreasing the laser pulse duration, the heat diffusion length decreases, thus the thermal expansion of the group of semiconductor chips and the target substrate is drastically reduced, as compared to the employment of conventional non-pulsed laser sources (CW lasers). Accordingly, the adverse thermal effects associated with CW lasers (e.g., the misalignment of the electrical contacts of the semiconductor chips and the target substrate) are controlled and the bond quality is increased.

To further control the adverse thermal effects and increase the quality of bonds, the pulsing frequency (or pulsing repetition rate) and/or the scanning frequency (or scan speed) of the pulsed laser may be modulated. In addition, the wavelength (or frequency) and the fluence (or intensity) of the pulsed laser, as well as the temperature of the target carrier (e.g., a vacuum chuck) may be modulated, selected, controlled, or optimized to control the adverse thermal effects. In various embodiments, the fluence of a pulse may be varied and/or modulated within the range of 0-100 mJ/cm$^2$. The target substrate may be cooled to a temperate of 4° C., or lower.

Additionally, the temporal and/or spatial profile of the photon pulses may be varied between consecutive photon pulses of the photon source. For example, when bonding a first electrical contact (or a pair of electrical contacts) of a first LED (of a row of LEDs) to a corresponding first electrical contact (or corresponding pairs of electrical contacts) of a backplane, the first LED may be irradiated by either a single photon pulse, or a plurality of photon pulses, of a first temporal profile and a first spatial profile. Once the first electrical contact (or pairs of electrical contacts) of the first LED are bonded to the corresponding first electrical contact (or corresponding pairs of electrical contacts) of the backplane, the photon source may be scanned to a second LED of the row of LEDs. The second LED may be irradiated by either a single photon pulse, or a plurality of photon pulses, of a second temporal profile and a second spatial profile, to bond the electrical contact(s) of the second LED to the corresponding electrical contact(s) of the backplane. In some embodiments, the first and second temporal profiles may be similar, and/or the first and second spatial profiles may be similar. In other embodiments, the second temporal profile may be varied from the first temporal profile. Likewise, the second spatial profile may be varied from the first spatial profile. As the photon pulses are scanned across a row of LEDs, the temporal and/or spatial profile of the photon pulses may be varied to adequately control the adverse thermal effects, as well as to ensure uniform irradiation of all the LEDs within a chip or row of LEDs. The scanning may be performed in cycles if needed, until the bonds reach a desired quality and/or integrity. During the scanning of a row of LEDs, the temporal and/or spatial profiles may be varied based on the geometry and thermal properties of the LED dies and/or electrical contacts.

The embodiments provide various advantages over conventional methods of employing a CW laser to bonding electrical contacts. For example, by localizing the thermal energy, the heated area of the LED chips/backplane may be reduced to be on the order of the size of the beam spot, which reduces the thermal expansion of the LED chips and the backplane. Furthermore, since the beam spot may be modulated, tuned, or changed (i.e., focused) to be on the order of a few microns, the various embodiments may be deployed to affix μLEDs to a backplane. The reduction in thermal expansion of the devices significantly decreases the likelihood of misalignment of the corresponding electrical contacts during the bonding process. The growth of metal oxides (e.g., tin oxide or copper oxide) on the electrical contacts is also reduced, as compared to conventional methods. The reduction in thermal effects also reduces the likelihood of re-heating or re-melting of already bonded electrical contacts during the scanning of the pulsed laser. That is, the various enhanced embodiments avoid substantially re-heating pairs of electrical contacts that have already been bonded (e.g., situated in close vicinity of the irradiated area). Because the thermal effects are controlled, the LEDs may be affixed to the backplane at a faster rate, decreasing the assembly time for a display device that includes pixels composed of the LEDs. The various embodiments may be employed when the contacts include gold, with or without flux/underfill. In should be noted that the various embodiments are not limited to gold contacts, and that the contacts or interconnects may include other materials, such as but not limited to other conductive metals (e.g., silver). Additionally, since controlling for adverse thermal effects enables an entire row of LEDs to be placed on the backplane, an e-layer may be formed on the row of LEDs. Forming an e-layer on an entire row of LEDs is easier than forming the e-layer on individual LEDs or even individual monolithic LED chips. The ability to place an entire row of LEDs on a backplane at once, also increases the throughput for the assembly of the display device.

In various embodiments, multiple and/or separate photon pulses may be employed to bond, affix, and/or electrically couple the electrical contacts of at least two semiconductor devices. The separate pulses may be from multiple and/or separate photon sources. The separate photon pulses may be comprised of separate wavelengths of photons and/or beam spot sizes. Each separate photon pulse may provide varying numbers of pulses, duty cycles, and/or energy levels to optimize the bonding process. For example, different metallization schemes in different semiconductor devices may call for different wavelengths, beam spots sizes, different number of pulses, duty cycles, energy levels, and the like. Each of the various characteristics of the separate photon pulses (e.g., temporal profile, spatial profile, and the like) may be separately modulated to optimize the bonding of the electrical contacts based on the features, geometries, and/or materials of the semiconductor device and/or of the electrical contacts. The multiple separate pulses and/or separate pulses from separate photon sources may be combined via a beam combiner to form a single beam spot using various focusing optical components, e.g., one or more optical lenses. That is, multiple photon pulses may be combined to irradiate the semiconductor devices to bond the electrical contacts of the semiconductor devices. The spatial and/or temporal profile of each photon pulse may be separately modulated to optimize the bonding process.

In addition to forming electrical bonds via photon beams (e.g., continuous photon beams or photon pulses), some embodiments are directed towards annealing the electrical bonds between a first semiconductor device (a semiconductor device) and a second semiconductor device (e.g., a target substrate), via one or more additional photon beams. Annealing the electrical bonds, via photon beams, may strengthen the mechanical integrity of the electrical bonds, as well as enhance the electrical performance and/or characteristics (e.g., reduced resistance, enhanced impedance matching, and the like) of the bonds. Similarly as discussed above and to control for adverse thermal effects, the temporal and/or spatial profile of the annealing photon pulses may be selected and/or modulated as required for the materials, geometries (e.g., feature size and contact pitch), and thermal properties of the first semiconductor device and the target substrate.

Additional embodiments are directed towards mechanically stabilizing electrical bonds via underfill (UF) material. In some embodiments, the UF material may be applied after the formation and/or annealing of the electrical bonds, via capillary flow processes on the uncured UF material. A (pulsed or continuous) photon beam may be employed to cure the UF material. In other embodiments, the uncured UF material may be applied to at least one of the first semiconductor device or the target substrate prior to positioning the first semiconductor device proximate the target substrate. That is, the UF material may be disposed intermediate the first semiconductor device and target substrate "sandwich," prior to employing a photon beam to electrically couple the first semiconductor device to the target substrate. One or more curing processes (e.g., thermal, room temperature, pulsed and/or scanned photon beams, and the like) may be employed to cure the sandwiched UF material. In pre-applied UF material embodiments, the uncured UF material may be applied to the first semiconductor device, the target substrate, or a combination thereof, prior to aligning the electrical contacts of the first semiconductor device and the target substrate, to form the first semiconductor device and target substrate "sandwich." Thus, the uncured UF material may be between and/or disposed intermediate the one or more inner surfaces of the "sandwich." The UF material may be similar to UF material employed in "flip-chip"-style semiconductor packaging.

Once cured, the UF material provides many similar benefits to conventionally applied and cured UF material, associated with "flip-chip"-style packed semiconductor devices. For example, the cured UF material may redistribute any thermo-mechanical stress associated with a coefficient of thermal expansion (CTE) mismatch between the first semiconductor device and the target substrate. Furthermore, as discussed within, the presence of the UF material, during electrical bonding and/or annealing may provide enhanced mechanical stabilization of the alignment between pairs of uncoupled electrical contacts. The cured UF material may mechanically couple the first semiconductor device to the target substrate, and thus may mechanically stabilize any alignment and/or electrical coupling between the first semiconductor device and the target substrate.

More particularly, and in some embodiments, the uncured UF material may be applied post the electrical bonding and/or annealing of the electrical bonds. The UF material may be applied via capillary action (e.g., capillary flow) and cured via thermal energy induced by one or more (continuous or pulsed) photon beams. The photon beam may be scanned. Furthermore, the spatial and/or temporal profile of the photon beam may be modulated to control for adverse thermal effects. The cured UF material may mechanically stabilize electrical bonds between the electrical contacts of the first semiconductor device and the target substrate.

Still other embodiments are directed towards packaging the mechanically and/or electrically coupled first semiconductor device and the target substrate (e.g., a first semiconductor device and target substrate "integrated device"). For example, the integrated device may be electrically coupled to a circuit board and/or packaging boards with input/output (I/O) pins, via the various embodiments. More particularly, continuous or pulsed photon beams may be employed to electrically couple additional electrical contacts (e.g., I/O pins) of the first semiconductor device and/or the target substrate to another device (e.g., a printed circuit board or packaging material). That is, a circuit board may be populated with semiconductor devices via pulsed photon beams. The temporal and/or spatial profile of the photon pulses may also be selected to further control for thermal effects.

Still other embodiments are directed towards employing multiple photon beams or pulses to form and/or anneal the electrical bonds, as well as cure UF material. For example, one photon pulse may irradiate the first semiconductor device, and another photon pulse may irradiate the target substrate. The photon pulses may be opposed and/or coaxial photon pulses. In some embodiments, the opposed photon beams may be pulsed and/or scanned. The pulsing and/or scanning frequencies of the opposed photon beams may be similar or dissimilar to each other. The pulsing of the two photon beams may be substantially in phase (so that the first semiconductor device and the target substrate are simultaneously irradiated). In other embodiments, a statically or dynamically determined phase difference may be inserted in the pulsing of the two photon beams. Likewise, the scanning of the two photon beams may be in-phase for some embodiments, while in other embodiments, a phase difference exists in the scanning of the two beams.

As noted above, some embodiments are directed towards pre-applying the UF material. In these embodiments, the UF material may be applied prior to forming the "sandwich" that forms the alignment between the pairs of corresponding electrical contacts of the first semiconductor device and the target substrate. That is, the uncured UF material may be deposited on the first semiconductor device, the target substrate, or a combination thereof. The uncured UF material may be cured via one or more photon beams that are also employed to electrically bond the electrical contacts of the first semiconductor device and the target substrate. In other embodiments, other curing processes may be employed.

In some embodiments, an excess portion of the pre-applied and uncured UF material may be removed via plasma etching. A continuous photon beam or a pulsed photon beam may be employed to form and/or anneal the electrical bonds, as well as cure the UF material. In another embodiment, a two-stage curing process may be employed. The two stages may include a pre-curing stage and a curing stage. In such embodiments, the pre-applied UF material may be pre-cured via a thermal curing process (e.g., with an ultraviolet (UV) or an infrared (IR) photon beam). After pre-curing, the excess portion of the pre-cured UF material may be removed via a laser ablation and/or laser abrasion process. Electrical bonding of the electrical contacts may be formed via continuous or pulsed photon beams. In some embodiments, and in addition to, or as an alternative to pulsed photon beams electrically bonding the contacts, a room (or low) temperature thermocompression process may be employed to electrically bond the electrical contacts after the laser abrasion process. After (or before) the electrical coupling of the first semiconductor device and the target substrate, the pre-cured UF material may be cured via a room temperature (or low temperature) curing process. For example, an anaerobic or moisture curing process may be employed for the second curing stage.

In another embodiment, the electrical bonds may be mechanically stabilized without the employment of UF material. An insulating (or dielectric) layer may be formed on surfaces of the first semiconductor device and the target substrate. The insulating layers may be activated via plasma activation. When compressed together, the activated insulating layers may at least partially chemically bond (e.g., covalent bonds) to form, prior to electrically bonding, at least a somewhat stable mechanical coupling between the first semiconductor device and the target substrate. The chemical bonding of the insulating layers stabilizes the alignment between corresponding electrical contacts of the first semiconductor device and the target substrate. Because of the stabilization of the alignment, adverse thermal effects resulting in a misalignment of the electrical contacts, during electrical bonding, may be mitigated. A continuous or pulsed photon beam may be employed to form the electrical bonds, depending on the thermal properties of the first semiconductor device and/or the target substrate.

In still another embodiment, pre-applied UF material may be employed to stabilize the pre-bonded alignment of the electrical contacts of the first semiconductor device and the target substrate. The electrical contacts of one of the first semiconductor or the target substrate may be formed from deformable electrically conductive material (e.g., nanoporous gold, gold, silver, or the like). The deformable electrical contacts of at least one of the semiconductor device or the target substrate may be formed into a "spikey" or tapered shape. In some embodiments, one of the first semiconductor device or the target substrate has "spikey" deformable contacts, while the other of the first semiconductor device or the target substrate has "flat" contacts. Uncured UF material may be pre-applied to the device (e.g., the first semiconductor device or the target substrate) with the "flat" contacts. The pre-applied and uncured UF material may substantially encapsulate the "flat" electrical contacts. In one non-limiting embodiment, the first semiconductor device has the "spikey" deformable contacts, and uncured UF material is pre-applied to substantially cover or encapsulate the "flat" electrical contacts of the target substrate. In another embodiment, the target substrate has the "spikey" deformable contacts, and uncured UF material is pre-applied to substantially cover or encapsulate the "flat" electrical contacts of the first semiconductor device.

A first semiconductor device and target substrate "sandwich" may be formed by aligning the "spikey" electrical contacts of the first semiconductor device with the corresponding "flat" contacts of the substrate device (substantially encapsulated by the pre-applied uncured UF material). The "sandwich" may be compressed via a compressive force. When compressed, the "spikey" contacts act as a wedge to "plow" away (or displace) at least a portion of the uncured UF material encapsulating the corresponding flat electrical contacts. Localized thermal energy (e.g., from continuous or pulsed photon beams) may be applied during the compression. The localized thermal energy deforms and "flattens"-out the "spikey" electrical contacts. As the "spikey" electrical contacts are deformed, additional UF material is displaced. The localized thermal energy bonds the electrical contacts and cures the UF material. Because the "spikey" contacts are "flattened-out" during the compression, bonding, and curing, such embodiments are tolerant to variations in the height and shape of the fabricated electrical contacts.

Exemplary Embodiment of a Head-Mounted Computing Device

The light-emitting components (e.g., micro light-emitting diodes) may be used in a near-eye display (NED) device included in a head-mounted device (HMD). As such, various embodiments, various embodiments of NEDs and HMDs will now be discussed. FIG. 1A is a diagram of a head-mounted device (HMD) 100 according to some embodiments. HMD 100 is one example embodiment of a head-mounted computing device. As such, HMD 100 may include a near-eye display (NED), which may include one or more display devices. The depicted embodiment includes a left display device 104A and a right display device 104B, which may be collectively referred to as the display device 104. The display device 104 may present content to a user. Examples of content presented by display device 104 may include, but are not limited to, one or more images, a series of images (e.g., a video), virtual objects, audio, or some combination thereof. As discussed throughout, display device 104 may include one or more arrays of light-emitting components, such as but not limited to one-dimensional (1D) or two-dimensional (2D) arrays of light-emitting diodes (LEDs). The light-emitting components may be affixed or bonded to a backplane of the display device 104.

In some embodiments, audio content may be presented via an audio device (e.g., speakers and/or headphones) of HMD 100. The audio device may receive audio content or information from the display device 104, a controller or processing unit of the HMD 100 (not shown), or an external device. The display device 104 may generally be configured to operate as an augmented-reality (AR) NED, such that a user can simultaneously view content projected (or otherwise presented) by the display device 104, and their real-world environment through the display device 104. In such embodiments, the display device 104 may augment views of a physical, tangible, and real-world environment with computer-generated (or virtual) elements (e.g., content including images, video, sound, and the like). However, in some embodiments, the display device 104 may be modified to additionally, or in the alternative, operate as a virtual-reality (VR) NED, a mixed-reality (MR) NED, or some combination thereof.

In addition to display device 104, HMD 100 may include a support or frame 102 that secures the display devices 104 in place on the head of a user. In some embodiments, the frame 102 may be a frame of eyewear glasses. HMD 100 may include at least one of a controller or a processing unit (e.g., a central processing unit, microcontroller, or microprocessor), a non-transitory, computer-readable storage device (e.g., volatile or non-volatile memory devices), and a communication transceiver (e.g., a wireless and/or wired network adaptor). As described herein in conjunction with some exemplary embodiments, the display device 104 may include a waveguide and holographic and/or volumetric Bragg gratings. The gratings may be generated by a process of applying one or more dopants or photosensitive media to predetermined portions of the surface of the waveguide, and subsequent exposure to ultraviolet (UV) light or other activating electromagnetic (EM) radiation. The various operations and/or functionalities of HMD 100 may be controlled via executing instructions on a processor device and/or controller device. When the instructions are executed, the processor device and/or controller device may cause the performance of various actions and/or steps. The instructions may be stored on a non-transitory computer-readable storage medium.

Figure 1B:
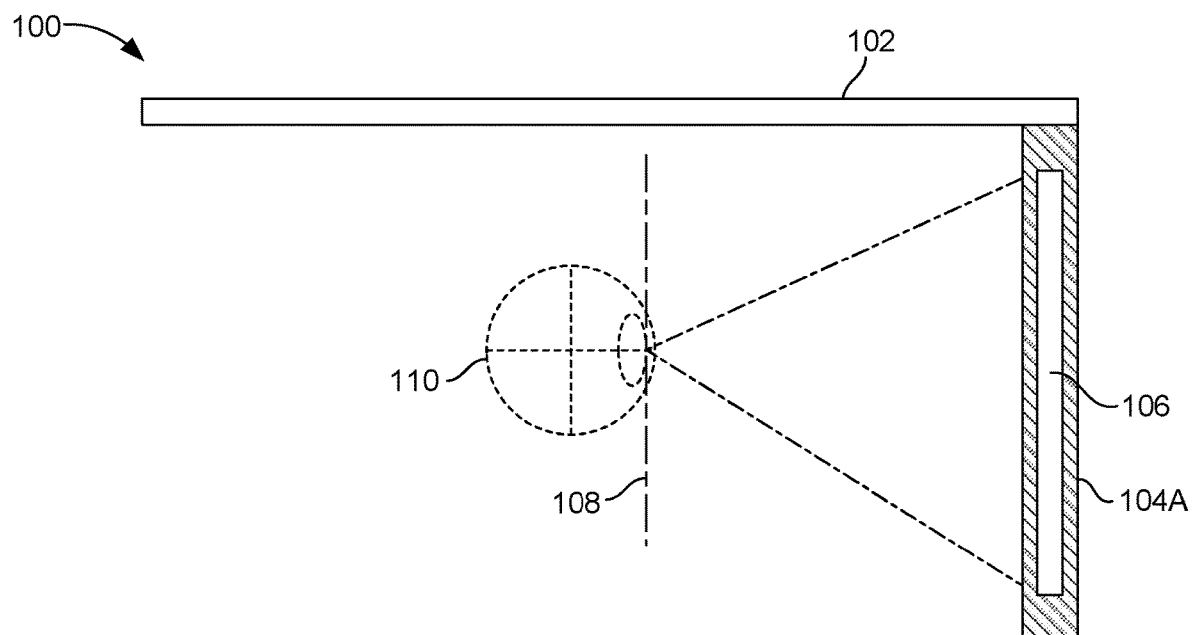
FIG. 1B illustrates a cross-sectional view of a portion of the head-mounted device of FIG. 1A, in accordance with some embodiments.

FIG. 1B illustrates a cross-sectional view of a portion of HMD 100, as shown in FIG. 1A, in accordance with some embodiments. The portion of the HMD 100 shown in FIG. 1B is associated with a single eye 110 of a user. The display device 104A may include at least one waveguide configuration 106. FIG. 1B shows an eye-box 108, which may be a location where the user's eye 110 is positioned when the user wears the HMD 100. When the eye 110 is aligned with the eye-box 108, the user may be visually provided a projected image, via the waveguide configuration 106. Waveguide configuration 106 directs the projected image towards the eye-box 108. The waveguide configuration 106 may receive and direct multiple pupil replications (i.e., replications of an image) towards the eye-box 108. For purposes of illustration, FIG. 1B shows a cross-section associated with a single eye 110 of the user and a single waveguide configuration 106. In some alternative embodiments, another waveguide configuration (which may be separate from the waveguide configuration 106 shown in FIG. 1B) may provide image light to another eye-box located with the other eye of the user, e.g., a waveguide configuration included in each of display devices 104A-104B of FIG. 1A.

The waveguide configuration 106, as illustrated in FIG. 1B, may be configured to direct image light (i.e., light that forms an image) to eye-box 108, which is positioned proximate the eye 110. The waveguide configuration 106 may be composed of one or more optical materials (e.g., plastic, glass, and the like) with one or more refractive indices that effectively minimize weight and widen a field-of-view (FOV) of the display device 104A. In alternative embodiments, the display device 104A may include one or more optical elements between the waveguide configuration 106 and the eye 110. The optical elements may act to manipulate light emitted from the display device 104A (e.g., image light emitted from display device 104A), perform one or more other optical adjustments to the light, or some combination thereof. Non-limiting examples of optical elements include an aperture, a Fresnel lens, a refractive (e.g., convex and/or convex) lens, a reflective surface, a filter, or any other suitable optical elements that manipulates light. Although not shown in FIG. 1B, the waveguide configuration 106 may include a waveguide with one or more sets of Bragg gratings.

In some embodiments, in order to achieve desired optical specifications or criteria, such as but not limited to a desired viewing angle, a maximum aperture size, a desired resolution, a minimum distortion level, a color correction, a back focal distance, and the like, the lenses (and other optical elements) described herein may include various designs. The lens or lenses may include a cylindrical lens, an anomorphic lens, a Fresnel lens, a gradient index lens, and the like. The lens may include a super lens, at least a portion of which having a negative index of refraction. The lens may include multiple lenses having various shapes. In some embodiments, the lens or lenses may include various optical materials. For example, a lens may include glass. In another non-limiting example embodiment, a lens can include a plastic material, such as but not limited to a CR-39 lens material, a urethane-based polymer, or a polycarbonate material.

Figure 2A:
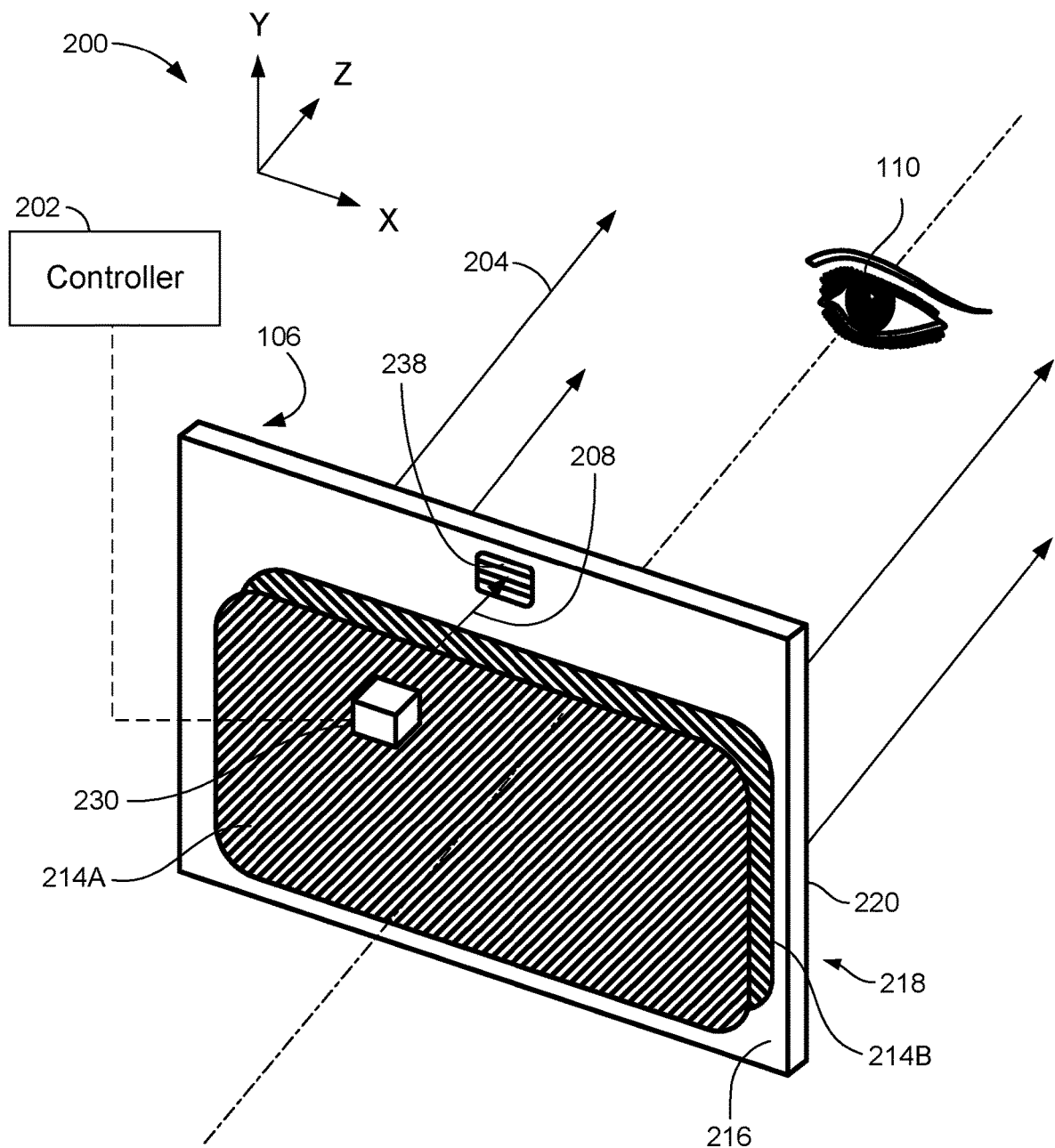
FIG. 2A illustrates an isometric view of an embodiment of a display device that is included in a head-mounted device.

FIG. 2A illustrates an isometric view of an embodiment of a display device 200 that is included in a head-mounted device. The various operations and/or functionalities of display device 200 may be controlled via executing instructions on a processor device and/or controller device. When the instructions are executed, the processor device and/or controller device may cause the performance of various actions and/or steps. The instructions may be stored on a non-transitory computer-readable storage medium.

Display device 200 may be included in HMD 100 of FIGS. 1A-1B. As such, display device 200 may be an embodiment of (or at least be similar to) display devices 104A-104B of FIGS. 1A-1B. In addition to the components discussed in conjunction with FIGS. 1A-1B, display device 200, or other components of HMD 100, may include source assembly 230, waveguide configuration 106, and controller 202. Waveguide configuration 106 may include at least a waveguide 220, a coupling element 236, a first (or top) decoupling element 214A, and a second (or bottom) decoupling element 214B. Waveguide 220 may include a top surface 216 and a bottom surface 218.

As shown in FIG. 2A, the bottom surface 218 of waveguide 220 and the second decoupling element 214B are facing the user's eye 110, while the top surface 216 of waveguide 220 and the first decoupling element 214A are facing towards the user's field-of-view (FOV) of the user's environment. Thus, the bottom surface 218 may be referred to as the user's surface of waveguide 220 and the second decoupling element 214B may be referred to as the user's decoupling element. In contrast, the top surface 216 may be referred to as the environment's surface of waveguide 220 and the first decoupling element 214A may be referred to as the environment's decoupling element. As discussed throughout, second decoupling element 214B outputs post-waveguide image light 204 to the user's eye 110. Thus, second decoupling element 214B may be referred to as the output decoupling element. As discussed in conjunction with FIGS. 2B-2C, source assembly 230 may include a light source and/or an optics system. In at least one embodiment, source assembly 230 may be referred to as a projector device, or simply a projector. Source assembly 230 may be an embodiment of (or at least be similar to) source assembly 230 of FIG. 2C.

Controller 202 may be an example of a central processing device (CPU), graphics processing unit (GPU), microcontroller, microprocessor, or some other logic-executing device, e.g., a field-programmable gate array (FPGA) or an application-specific integrated circuit (ASIC). Similar to FIG. 1B, display device 200 of FIG. 2A is associated with a single eye 110 of a user. As discussed in conjunction with FIG. 1A, another display device included in HMD 100 may provide image light to the user's other eye. In some embodiments, one or more components of HMD 100 may be shared between the separate display devices for each eye. In still other embodiments, the single waveguide configuration 106 or display device 200 may provide post-waveguide image light 204 to both of the user's eyes. Waveguide 220 may be one of one or more waveguides included in waveguide configuration 106.

The source assembly 230 may generate pre-waveguide image light 208 that enters waveguide configuration 106, is transmitted via waveguide 220, and exits waveguide configuration 106, as post-waveguide image light 204. As used herein, prior to entering waveguide configuration 106, via coupling element 238, the image light may be referred to as pre-waveguide image light 208. After the transmitted image light exits waveguide configuration 106, via second decoupling element 214B, the image light may be referred to as post-waveguide image light 204. The pre-waveguide image light 208 may form one or more two-dimensional (2D) monochromatic or multi-chromatic images. The one or more images may be received by waveguide, via coupling element 238. The one or more images may be transmitted through waveguide 220 and outputted towards the user's eye 110, via waveguide 220 second decoupling element 214B. The post-waveguide image light 204 may provide the transmitted one or more 2D images to user's eye 110. In various embodiments, waveguide 220 is an output waveguide, because it outputs image light that is directed towards and received by the user's eye 110.

Figure 2B:
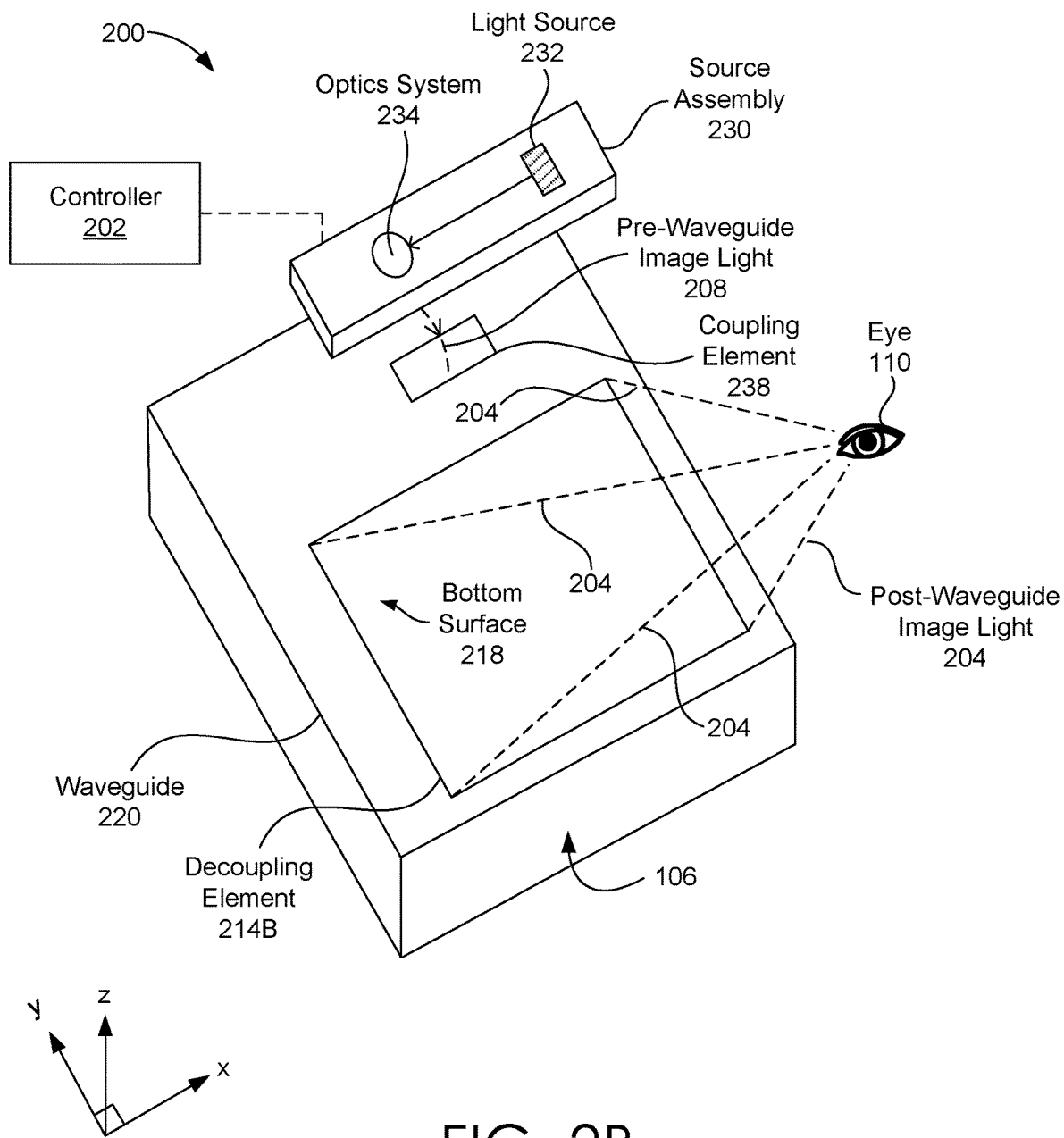
FIG. 2B illustrates a perspective view of another embodiment of a display device that is included in a head-mounted device.
Figure 2C:
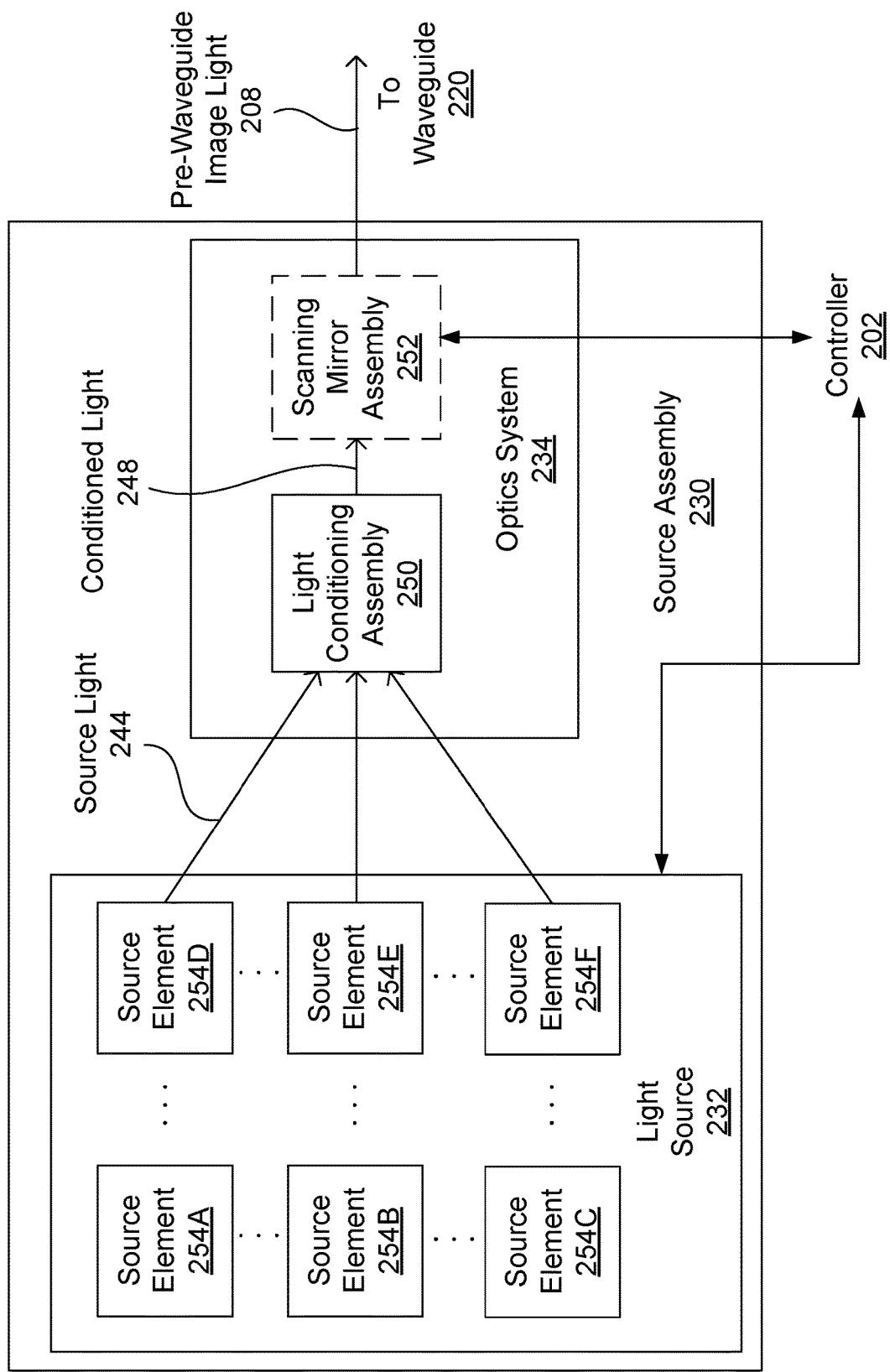
FIG. 2C illustrates a block diagram of the source assembly 230 of FIGS. 2A-2B, in accordance with various embodiment.

Various embodiments of source assembly 230 are described in conjunction with at least FIGS. 2B-2C. As shown in FIGS. 2B-2C, source assembly 230 may include one or more 1D or 2D monochromatic or multi-chromatic light sources and an optics system. Various embodiments of light sources and optics systems are described in conjunction with at least FIGS. 2B-2C, 3, and 4. However, briefly here, light source (e.g., light source 232 of FIG. 2B-2C) may generate the pre-waveguide image light 208. The light source may include arrays (e.g., emitter arrays) of monochromatic or multi-chromatic light-emitting components (e.g., LEDs) which generate image light. The light-emitting components may be bonded to a backplane of source assembly 230. The light source may generate source light and the optics system may condition the source light to project the pre-waveguide image light 208 towards coupling element 238 located on the top surface 216 of the waveguide 220. The projected pre-waveguide image light 208 may include 2D image light that forms one or more 2D images.

In at least some embodiments, an optics system of the source assembly 230 may include a scanning mirror assembly that includes a scanning mirror that scans the generated pre-waveguide image light 208. The scan patterns of the scanning mirror assembly are such that the scanned pre-waveguide image light 208 forms the one or more 2D images. Such non-limiting embodiments may be referred to as scanning embodiments. The pre-waveguide image light 208 may propagate along a dimension or direction towards the coupling element 238, where the pre-waveguide image light 208 is received by and/or coupled to waveguide 220.

The waveguide 220 may be an optical waveguide that outputs 2D images, via 2D post-waveguide image light 204 that is directed to the eye 110 of the user. The waveguide 220 may receive pre-waveguide image light 208, projected via source assembly 230, at coupling element 238. The coupling element 238 may include one or more coupling elements located on the top surface 216 and/or within the body of waveguide 220. Coupling element 238 may guide and/or couple the received pre-waveguide image light 208 to a propagation area of the waveguide 220. Coupling element 238 may include a diffraction grating, a holographic grating, one or more cascaded reflectors, one or more prismatic surface elements, an array of holographic reflectors, a meta-material surface, or some combination thereof. An exemplary, but non-limiting, embodiment of the coupling element 238 may include a grating having a pitch of approximately 300 nm to approximately 600 nm. The coupling element 238 may be understood as extending from the top surface 216 to the bottom surface 218 of the waveguide 220. The coupling element 238 may redirect received pre-waveguide image light 208, according to a first grating vector, into the propagation area of the waveguide 220. Waveguide 220 may be included in and/or formed in the body of waveguide configuration 106. Waveguide 220 may be positioned between the first and second decoupling elements 214A-214B.

The first decoupling element 214A may redirect internally reflected image light from the waveguide 220. The second de-coupling element 214B may decouple the image light from waveguide 220 and direct the image light towards eye 110. In some embodiments, the internally-reflected image light may be totally, or at least near totally, internally reflected. The first decoupling element 214A may be part of, affixed to, or formed in the top surface 216 of the waveguide 220. The second decoupling element 214B may be part of, affixed to, or formed in the bottom surface 218 of the waveguide 220, such that the first decoupling element 214A is opposed to the second decoupling element 214B. A light propagation area may extend between decoupling elements 214A-214B. In some embodiments, there may be an offset between the opposed decoupling elements 214A-214B. The offset may be along the x-axis and/or the y-axis of the 3D Cartesian coordinates illustrated in FIG. 2A. The decoupling elements 214A-214B may include a diffraction grating, a holographic grating, a volumetric Bragg grating, one or more cascaded reflectors, one or more prismatic surface elements, an array of holographic reflectors, or the like. The decoupling elements 214A-214B may form a decoupling area of HMD 100.

In scanning embodiments, display device 200 may be a scanning display device. Various embodiments of scanning display devices are discussed in conjunction with FIGS. 2C and 5A. However, briefly here, source assembly 230 may provide one or more 1D or 2D images via scanning projected light at a scanning rate sufficient to form an apparent image. As such, source assembly 230 may include one or more scanning mirrors. However, in other embodiments, the display device 200 is not a scanning display device, and display device 200 is not required to include a scanning mirror.

Whether a scanning embodiment or a non-scanning embodiment, source assembly 230 may project a 2D image on an image field through waveguide 220, via one or more arrays of light-emitting components (i.e., emitter arrays) included in source assembly 230. In some embodiments, the image emitted by emitter arrays may be conditioned and/or magnified by an optics system and/or light conditioning assembly (e.g., one or more lenses) before the pre-waveguide image light 208 is received by waveguide 220. Such optics systems are discussed in conjunction with at least optics systems 234 of FIGS. 2B-2C.

In various embodiments, an orientation and/or position of post-waveguide image light 204 exiting from waveguide 220 may be controlled by changing an orientation of the pre-waveguide image light 208 entering the coupling element 238. In such embodiments, scanning components included in an optics system of source assembly 230 may re-orient and/or re-position pre-waveguide image light 208 prior to image light entering coupling element 238.

In various embodiments, one or more logic devices (such as controller 202) may control the operations of source assembly 230. As noted above, controller 202 may include any logic device, such as but not limited to a microprocessor, microcontroller, central processing unit (CPU), graphical processing unit (GPU), gate arrays (e.g., an FPGA), an ASIC, or the like. The controller 202 may generate display instructions for the source assembly 230. The display instructions may include instructions to project one or more monochromatic or multi-chromatic images. Display instructions may include an image file (e.g., a bitmap). The display instructions may be received from another processing device included in HMD 100, a memory device of HMD 100, non-transitory computer-readable media, and/or a wireless/wired communication network. As described herein, the display instructions may further include instructions for moving (e.g., scanning) optical components within the source assembly 230, or individual light-emitting arrays included therein, or for moving the waveguide 220 by activating an actuation system. The controller 202 may include a combination of hardware, software, and/or firmware not explicitly shown herein so as not to obscure other aspects of the disclosure. The software and/or firmware may be stored via a storage device or non-transitory computer-readable media of HMD 100 or another computing device.

FIG. 2B illustrates a perspective view of another embodiment of display device 200. The embodiment of display device 200, shown in FIG. 2B, may also be included in a HMD, such as but not limited to HMD 100 of FIGS. 1A-1B. The embodiment of display device 200 shown in FIG. 2B may be an embodiment of (or at least similar to) any of display devices 104A-104B of FIGS. 1A-2A or display device 200 of FIG. 2A. Similarly to the embodiment shown in FIG. 2A, display device 200 includes various components, e.g., the waveguide configuration 106 or part of the waveguide configuration 106, controller 202, and source assembly 230. In alternative embodiments, the display device 200 is included in other HMDs, or in other systems that provide projected image light to a particular location.

Similar to the embodiment shown in FIG. 2A, display device 200 of FIG. 2B includes waveguide configuration 106. Waveguide configuration 106 includes waveguide 220, coupling element 238, and decoupling element 214B. Due to the perspective view of FIG. 2B, the bottom surface 218 of waveguide 220 is shown, but the top surface 216 of waveguide 220 is occluded by waveguide configuration 106. Similarly, the second decoupling element 214B is visible in FIG. 2B, but the first decoupling element 214A is occluded by the waveguide configuration 106. As shown in more detail in FIG. 2C, source assembly 230 may include light source 232 and optics system 234. Optics system 234 may include a light conditioning assembly 250. In various scanning embodiments, display device 200 may be a scanning display device. In such embodiments, optics system 234 may include a scanning mirror assembly.

Figure 5A:
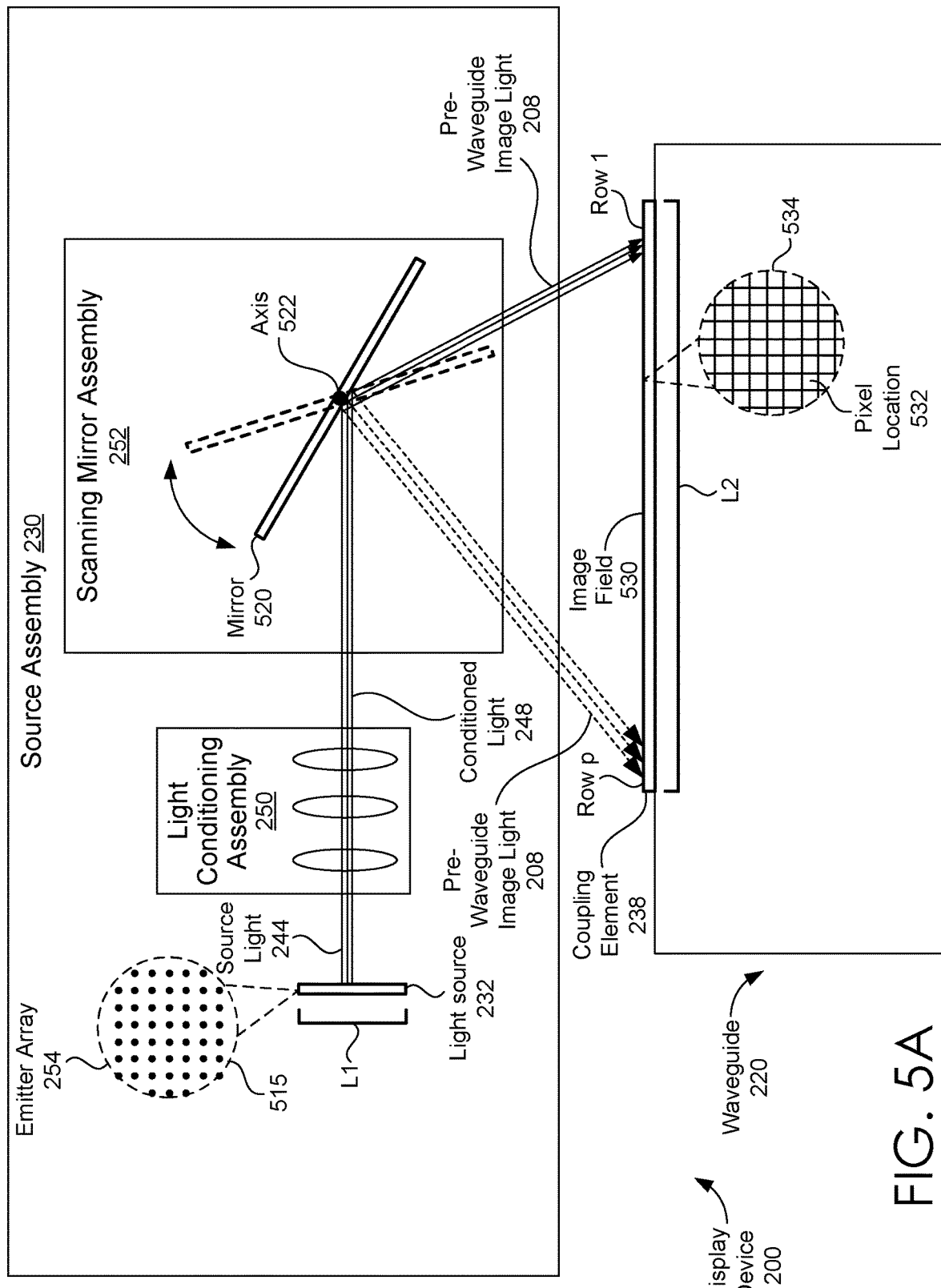
FIG. 5A is a diagram illustrating a scanning operation of a scanning embodiment of display device, in accordance with an embodiment.

Various embodiments of a scanning display device are discussed in conjunction with at least FIG. 2C and FIG. 5A. However, briefly here, display device 200 may provide one or more 1D or 2D images via scanning projected light at a scanning rate sufficient to form an apparent image. As such, display device 200 may include one or more scanning mirrors. For instance, a scanning mirror assembly, which includes a scanning mirror, may be included in an optics system of source assembly 230. However, in other embodiments, the display device 200 is a non-scanning display device, and display device 200 need not include a scanning mirror assembly.

Figure 5B:
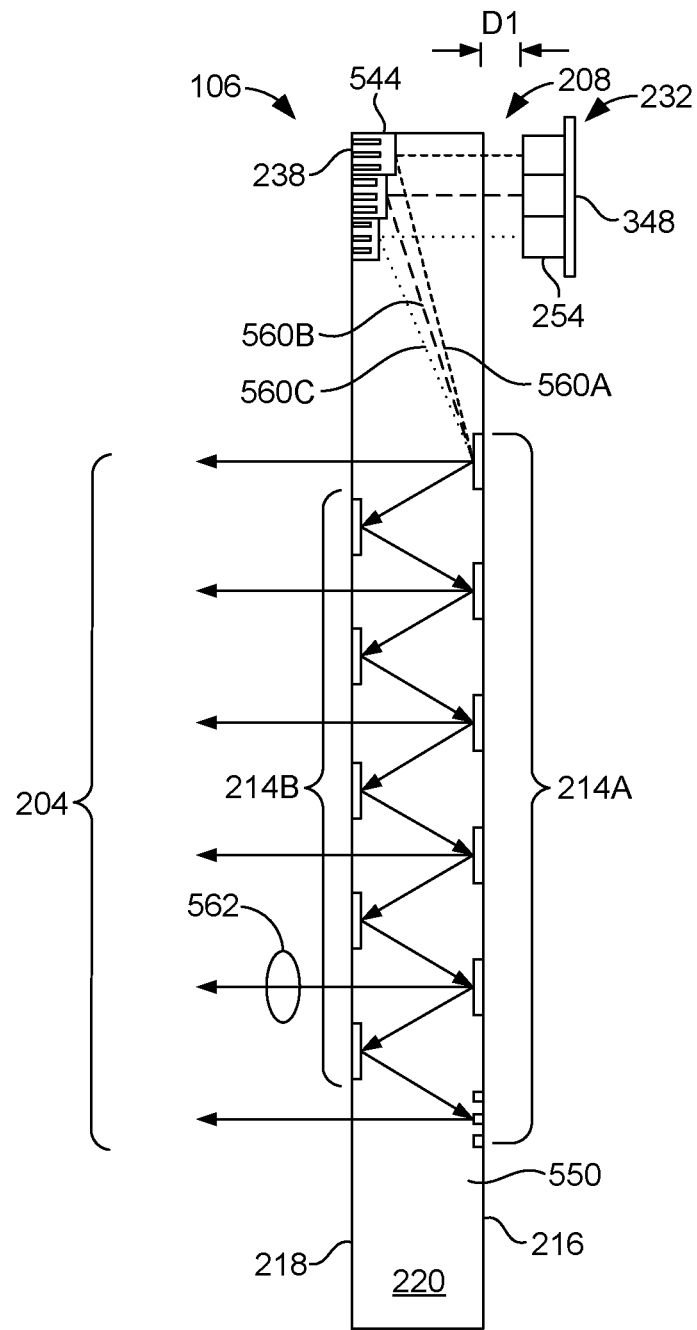
FIG. 5B illustrates a waveguide configuration of a display device that forms images and replications of images, in accordance with various embodiments.

As discussed in conjunction with at least FIG. 2A and FIGS. 5A-5B, the source assembly 230 may project (scanned or non-scanned) image light on an image field through waveguide configuration 106, via one or more 1D and/or 2D arrays of light-emitting components (i.e., emitter arrays) included in light source 232. In scanning embodiments, a scanning mirror may be employed to scan the pre-waveguide image light 208 in such a manner to form scanned images on the image field. In some scanning embodiments, as well as non-scanning embodiments, the image emitted by emitter arrays included in light source 232 may be conditioned and/or magnified by optics system 234 and/or light conditioning assembly (e.g., one or more lenses) before the light is received by coupling element 238 and coupled to waveguide 220 or a screen. Such optics systems are discussed in conjunction with at least optics systems 234 of FIG. 2C.

Similar to FIGS. 1B and 2A, display device 200 may provide images for both eyes or for a single eye 110. For purposes of illustration, FIG. 2B shows the display device 200 associated with a single eye 110. Another display device (not shown), that is separated (or at least partially separated) from the display device 200, may provide image light to another eye of the user. In a partially separated system, one or more components may be shared between display devices for each eye.

The source assembly 230 may be an embodiment of (or at least be similar to) source assembly 230 of FIG. 2C. As such, the source assembly 230 generates pre-waveguide image light 208. The source assembly 230 includes a light source 232 and an optics system 234. The light source 232 is an optical component that generates pre-waveguide image light 208 using a plurality of light emitters arranged in a matrix, i.e., emitter arrays composing light-emitting components (LECs) or light emitters. Each light emitter may emit monochromatic light. The light source 232 generates pre-waveguide image light 208 including, but not restricted to, red (R) image light, blue (B) image light, green (G) image light, infra-red image light, or image light of any other wavelength. While RGB image light, LECs, and pixels are often discussed in this disclosure, embodiments described herein are not limited to using red, blue and green as primary colors. Other colors are also possible to be used as the primary colors of the display device 200. Also, a display device in accordance with an embodiment may use more than three primary colors. Light source 232 may be an embodiment of, or at least be similar to, one of light sources 300 of FIG. 3.

The optics system 234 performs a set of optical processes, including, but not restricted to, focusing, combining, conditioning, and scanning processes on the image light generated by the light source 232. In some embodiments, the optics system 234 includes a light conditioning assembly that conditions pre-waveguide image light 208. In scanning embodiments, optics system 234 may include a scanning mirror assembly, as described below in detail in conjunction with at least FIGS. 2C and 5A. The source assembly 230 generates and outputs pre-waveguide image light 208. Similar to display device of FIG. 2A, the pre-waveguide image light 208 is received by coupling element 238, as is coupled to, as well as transmitted by, the waveguide 220.

The waveguide 220 is an optical waveguide that outputs post-waveguide image light 204 to an eye 110 of a user. The waveguide 220 receives the pre-waveguide image light 208 at one or more coupling elements 238, and guides the received input image light to one or more decoupling elements 214B. The coupling element 238 may be, for example, a diffraction grating, a holographic grating, some other element that couples the pre-waveguide image light 208 into the waveguide 220, or some combination thereof. For example, in embodiments where the coupling element 238 is diffraction grating, the pitch of the diffraction grating is selected such that total (or at least near total) internal reflection occurs, and the pre-waveguide image light 208 propagates internally toward the decoupling element 214B. The pitch of the diffraction grating may be in the range of 300 nm to 600 nm.

The decoupling element 214B decouples and/or outputs the total (or near total) internally reflected image light from the waveguide 220. Thus, waveguide may be an output waveguide. The decoupling element 214B may be, for example, a diffraction grating, a holographic grating, some other element that decouples image light out of the waveguide 220, or some combination thereof. For example, in embodiments where the decoupling element 214B is a diffraction grating, the pitch of the diffraction grating is chosen to cause incident image light to exit the waveguide 220. In scanning embodiments, an orientation and position of the post-waveguide image light 204 exiting from the waveguide 220 may be controlled by changing an orientation and position of the pre-waveguide image light 208 entering the coupling element 238. The pitch of the diffraction grating may be in the range of 300 nm to 600 nm.

The waveguide 220 may be composed of one or more materials that facilitate total (or near total) internal reflection of the pre-waveguide image light 208. For example, the waveguide 220 may be composed of silicon, plastic, glass, or polymers, or some combination thereof. The waveguide 220 has a relatively small form factor. For example, the waveguide 220 may be approximately 50 mm wide along X-dimension, 30 mm long along Y-dimension and 0.5-1 mm thick along Z-dimension.

Similarly to controlling the operations of the embodiments of source assembly 230 of FIG. 2A, controller 202 may control the image rendering operations of the embodiment of source assembly 230 shown in FIG. 2B. The controller 202 determines instructions for the source assembly 230 based at least on the one or more display instructions. Display instructions are instructions to render one or more images. In some embodiments, display instructions may be an image file (e.g., bitmap). In another example, the display instructions may be received from a console of a augmented-reality (AR) system, a virtual-reality (VR) system, and/or a mixed-reality (MR) system, not shown in FIG. 2B. In scanning embodiments, display instructions may include scanning instructions that are used by the source assembly 230 to generate images via scanning pre-waveguide image light 208. For example, the scanning instructions may include a type of a source of image light (e.g., monochromatic, polychromatic), a scanning rate, an orientation of a scanning apparatus, one or more illumination parameters, or some combination thereof. The controller 202 includes a combination of hardware, software, and/or firmware not shown here so as not to obscure other aspects of the disclosure.

FIG. 2C illustrates a schematic block diagram of the source assembly 230 of FIGS. 2A-2B, in accordance with various embodiment. That is, source assembly 230 of FIG. 2C may be an embodiment of (or at least similar to) source assembly 230 of FIG. 2A and/or source assembly 230 of FIG. 2B. As such, source assembly 230 includes a light source 232 and an optics system 234. In some embodiments, source assembly 230 may be a scanning source assembly, while in other embodiments, source assembly 230 is a non-scanning source assembly. The various operations and/or functionalities of source assembly 230 may be controlled via executing instructions on a processor device and/or controller device. When the instructions are executed, the processor device and/or controller device may cause the performance of various actions and/or steps. The instructions may be stored on a non-transitory computer-readable storage medium.

Light source 232 includes a plurality of source elements, shown schematically as source elements 254A-254F. Source elements may include an array of light-emitting components (LECs), i.e., a source element may include and/or be an embodiment of an emitter array. Various embodiments of emitter arrays are discussed in conjunction with FIGS. 3-4. However, briefly here, an emitter array may be a 2D arrays of LECs, such as but not limited to light-emitting diodes (LEDs). As discussed below, the number, arrangement, and configuration of the plurality of source elements may vary based on whether the source assembly is a scanning source assembly, or a non-scanning source assembly.

Optics system 234 includes a light conditioning assembly 250. In scanning embodiments, in addition to light conditioning assembly 250, optics system 234 may include a scanning mirror assembly 252. In non-scanning embodiments of source assembly 230, the optics system 234 need not, but may, include scanning mirror assembly 252. Because the inclusion of scanning mirror assembly 252 is optional, depending upon whether source assembly 230 is a scanning or non-scanning embodiment, scanning mirror assembly 252 is indicated in FIG. 2C via a dashed box.

In non-scanning embodiments, light source 232 may include more source elements (e.g., emitter arrays), than in scanning embodiments. In non-scanning embodiments, there may exist a one-to-one mapping (or correspondence) between individual LECs included in the source elements and pixel regions of a display device, such as but not limited to pixel regions of display device 104 of FIGS. 1A-1B and/or display device 200 of FIGS. 2A-2B. In scanning embodiments, each LEC may be mapped to more than one pixel region of a display device. For example, a scanning mirror included in scanning mirror assembly 252 may be employed to scan light emitted by a single LEC to multiple pixels of the display device. Thus, via the scanning mirror assembly 252, a single LEC may illuminate multiple LECs, and thus less source elements may be required for scanning embodiments. For example, in a scanning embodiment of source assembly 230, light source 232 may include source elements 254A-254C, whereas in a non-scanning embodiment, light source 232 may include source elements 254A-254C, as well as source elements 254D-254F.

Because scanning embodiments may include less source elements, the source elements in a scanning embodiment may be referred to as a "1D" arrangement of source elements or emitter arrays. The source elements in a non-scanning embodiment may be referred to as a "2D" arrangement of source elements or emitter arrays. Note that even though the 1D and 2D nomenclatures are employed, each of the source elements (e.g., source element 254A) may include a 2D array of LECs. That is, in scanning embodiments that include source elements 254A-254C, but do not include source elements 254D-254F, the included source elements are said to be arranged in a 1D array, i.e., a 1D arrangement of 2D emitter arrays. In non-scanning embodiments that include source elements 254A-254F, the included source elements are said to be arranged in a 2D array, i.e., a 2D arrangement of 2D emitter arrays. It should also be noted that the 1D arrangement of source elements 254A-254C and the 2D arrangement of source elements 254A-254F are illustrative only, and the total number of, arrangements of, and configurations of source elements may vary from embodiment to embodiment. The source assembly 230 may generate light in accordance with scanning instructions from the controller 202.

The light source 232 is a source of light that generates image light. In some embodiments, the image light is collimated or at least partially collimated image light. In other embodiments, the image light need not be collimated. The light source 232 emits light in accordance with one or more illumination parameters received from the controller 202. As discussed above, the light source 232 includes one or more source elements 254A-254C, and/or source elements 254A-254F, either configuration which may be collectively referred to as source elements 254. Source elements may be comprised of light-emitting components (LECs), as discussed throughout.

The individual source elements 254 of an emitter array may include one or more compact, efficient and/or powerful sources of lights, e.g., LECs with at least ultra-high brightness, low power consumption, and a low footprint. The source elements 254 may include one or more arrays of light-emitting components (LECs), such as but not limited to light-emitting diodes (LEDs), e.g., μLEDs, organic LEDs (OLEDs), a superluminescent LED (SLED), and organic μLEDs. A μLED may be an LED with features sizes ranging between sub-microns to a hundreds of microns. Various embodiments of μLEDs are discussed in conjunction with FIGS. 6A-6B. In some embodiments, GaN-based inorganic LEDs can be made orders of magnitude brighter than OLEDs with a light emission area of few microns.

In one embodiment, the source elements 254 may be arranged in a concave curved fashion. For example, the source elements 254 may have a radius of curvature ranging from few millimeters to few centimeters depending on the display size and a length of few millimeters. An advantage of a curved array is that it is easier to form a compact lens to have high quality image on curved surface without correcting the field of curvature of the lens. In alternate embodiments, the source elements 254 may be arranged in a flat and/or linear fashion.

The source element 254 emits a source light 244 to the optics system 234. In some embodiments, the source light 244 may emit one or more colors (e.g. red, green, and blue). For example, the source element 254A may emit red source light, the source element 254B may emit blue source light, and the source element 254C may emit green source light. In non-scanning embodiments that additionally include source elements 254D-254F, the source element 254AD may emit red source light, the source element 254E may emit blue source light, and the source element 254F may emit green source light. Additionally, in some embodiments, one or more of the source elements may emit light in the infrared, or light of other non-visible wavelengths.

The optics system 234 may include a light conditioning assembly 250 and a scanning mirror assembly 252. The light conditioning assembly 250 conditions the source light 244 and emits conditioned light 248. In embodiments that include scanning mirror assembly 252, the conditioned light is provided to the scanning mirror assembly 252. In scanning embodiments, light condition assembly 250 may condition source light 244 for incidence on scanning mirror assembly 252. In non-scanning embodiments, light condition assembly 250 may condition source light 244 for being received by a waveguide configuration, such as but not limited to waveguide configuration of FIG. 1B and FIGS. 2A-2B. The light conditioning assembly 250 includes one or more optical components that condition the light from the light source 232. Conditioning light from the light source 232 may include, for example, expanding, collimating, correcting for one or more optical errors (e.g., field curvature, chromatic aberration, etc.), some other adjustment of the light, or some combination thereof. The light conditioning assembly 250 conditions the source light 244 and emits conditioned light 248. In non-scanning embodiments, conditioned light 248 may be outputted as pre-waveguide image light 208. In scanning embodiments, the conditioned light 248 may be received by scanning mirror assembly 252, and scanned and/or further conditioned light may be outputted as pre-waveguide image light 208.

The scanning mirror assembly 252 includes one or more optical elements that redirect image light via one or more reflective portions of the scanning mirror assembly 252. Where the image light is redirected towards is dependent upon specific orientations of the one or more reflective portions. In some embodiments, the scanning mirror assembly 252 includes a single scanning mirror that is configured to scan in at least two dimensions. In other embodiments, the scanning mirror assembly 252 may include a plurality of scanning mirrors that each scan in orthogonal directions to each other. The scanning mirror assembly 252 may raster scan (horizontally, or vertically). In some embodiments, the scanning mirror assembly 252 may perform a controlled vibration along the horizontal and/or vertical directions with a specific frequency of oscillation to scan along two dimensions and generate a two-dimensional projected line image of the media presented to user's eyes. For example, the scanning mirror assembly 252 may undergo an oscillation with peak-to-peak amplitude of few hundreds of nanometers per second along the vertical direction based on the desired frequency of oscillation. The scanning mirror assembly 252 emits a pre-waveguide image light 208 based on the conditioned light 248. The scanning mirror assembly 252 outputs the pre-waveguide image light 208 at a particular orientation (in accordance with the scanning instructions) and towards a waveguide configuration.

In some embodiments, the scanning mirror assembly 252 includes a galvanometer mirror. For example, the galvanometer mirror may represent any electromechanical instrument that indicates that it has sensed an electric current by deflecting a beam of image light with one or more mirrors. The galvanometer mirror may be configured to scan in at least one orthogonal dimension to generate the scanned pre-waveguide image light 208. The pre-waveguide image light 208 from the galvanometer mirror represents a two-dimensional line image of the media presented to user's eyes. As noted above, in non-scanning embodiments, source assembly 230 need not include scanning mirror assembly 252.

The controller 202 controls the light source 232 and/or the scanning mirror assembly 252. The controller 202 takes content for display, and divides the content into discrete sections. The controller 202 instructs the light source 232 to sequentially present the discrete sections. In scanning embodiments, the controller 202 instructs the scanning mirror assembly 252 to scan the presented discrete sections to different areas of a coupling element 238 of the waveguide 220. Accordingly, when scanned light 238 exits the waveguide 220, separate portions of scanned light 238 are presented in different locations of the coupling element 238. While each discrete section is presented at different times, the presentation and scanning of the discrete sections occurs fast enough such that a user's eye integrates the different sections into a single image or series of images. In non-scanning embodiments, the controller 202 instructs the light source 232 to present different areas of the coupling element 238 of the waveguide 220 into different discrete sections.

For example, in scanning embodiments, controller 202 segments the content into scan lines, via scanning instructions. The scan lines are scanned out to different areas of the coupling element 238 of the waveguide 220. When scanned pre-waveguide image light 208 exits the waveguide 220, each of the lines are presented at a different location, as post-waveguide image light 204, which a user's eye integrates into a single 2D image or series of 2D images.

For example, the scanning instructions may cause the source assembly 230 to scan out an image in accordance with a scan pattern (e.g., raster, interlaced, etc.). The scanning instructions control an intensity of light emitted from the light source 232, and the optics system 234 scans out the image by rapidly adjusting orientation of the emitted light. If scanned at a sufficient frequency, a human eye integrates the scanned pattern into a single 2D image. In non-scanning embodiments, the source assembly 230 may similarly generate 2D images without the need for a scan pattern because the light source 232 includes one or more LECs for each pixel of the display device. For example, based on display instructions, controller 202 may operate individual LECs included in source elements 254A-254F to illuminate pixels corresponding the 2D images.

FIG. 3 illustrates a cross-sectional view of an embodiment of light source 232 included in the display device of FIGS. 2A-2C, in accordance with the various embodiments. As shown in FIG. 3, one embodiment of a light source 232 may include a first source element 254A, a second source element 254B, and a third emitter array 254C. As used herein, the terms source element and emitter array may be used interchangeably. Each of the emitter arrays 254A, 254B, and 254C may be disposed in an array housing 344A, 344B, and 344C, respectively. For convenience, the emitter arrays 254A-254C may be referred to collectively as emitter arrays 254, and also individually as emitter array 254. Similarly, the array housings 344A-344C may be referred to collectively as array housings 344, or individually as array housing 344. As discussed in conjunction with at least FIG. 2C, each of the emitter arrays 254 may include a 2D array of light-emitting components (e.g., LEDs). FIG. 3 illustrates a 1D arrangement of emitter arrays for a scanning embodiment. However, as discussed in conjunction with at least FIG. 2C, a 2D arrangement of emitter arrays may be employed for non-scanning embodiments.

Each of the array housings 344 may include an optics system 234, which may include one or more optical components, such as lenses (e.g., glass, plastic, or meta-material lenses), prisms, filters, scanning mirrors, and the like. As discussed in conjunction with FIG. 2C, optics system 234 may include a light conditioning assembly. In scanning embodiments, optics system 234 may additionally include a scanning mirror assembly, such as but not limited to scanning mirror assembly 252 of FIG. 2C. In other embodiments, the optics system 234 is not housed within housings 344. Each of the source elements 254A-254C may include a separate and/or distinct optics system.

As discussed in conjunction with at least FIG. 2C, the optics system 234 may condition and/or alter the direction or control other characteristics of source light 244 emitted by emitter arrays 254. As shown in FIG. 3, the emitter arrays 254 may be secured to a common structure, such as a backplane 348 or printed circuit board (PCB). The backplane 348 may include a logic device, such as but not limited to an ASIC, processor, FPGA, controller 202, or the like. Backplane 348 may include electrical contacts (e.g., leads) that electrically couple individual LECs of the emitter arrays 254 to controller 202. In other embodiments, the controller 202 may be disposed elsewhere on the HMD 100 of FIGS. 1A-1B, secured either directly or indirectly to the frame 102 of FIG. 1A.

Each of the emitter arrays 254 may be a monochromatic emitter array having a 1D or 2D configuration of individual emitters (e.g., LEDs) of a single color. As described herein, a green colored light may be understood as light composed of photons with a range of wavelengths between about 500 nanometers (nm) to about 555 nm. Furthermore, as described herein, red colored light may be understood as light composed of photons with a range of wavelengths between about 622 nm to about 780 nm. Blue colored light may be understood as light composed of photons with a range of wavelengths between about 440 nm to about 492 nm. A monochromatic emitter array 254 may emit light within a narrow wavelength range, rather than a single wavelength, in some embodiments. For example, a monochromatic emitter array 254 may emit colored light (e.g., red, green, or blue photons) within a narrow wavelength range of 5-10 nm in width.

One or more chromatic filters, which may facilitate a simplified projection lens design with reduced achromatic performance requirements, may be employed to further narrow the wavelength range of an emitter array. In some embodiments, the emitter array 254A may include only red light-emitting components, the emitter array 254B may include only green light-emitting components, and the emitter array 254C may include only blue light-emitting components. Under the direction of controller 202, each of the emitter arrays 254A-254C may produce a monochromatic 2D image according to the color produced by its respective emitters. Accordingly, the three monochromatic emitter arrays 254A-254C may simultaneously emit three monochromatic images (e.g., a red image, a green image, and a blue image composed of image light) towards optics system 234.

As discussed elsewhere, the three monochromatic images may be interposed, composited, or otherwise combined to generate a full color image. For example, the controller 202 may receive a full-color image to be displayed to a user and then decompose the full-color image into multiple monochromatic images, such as a red image, a green image, and a blue image. That is, the full-color image may be separated, or otherwise decomposed into three monochromatic images of primary colors. As described herein, the waveguide configuration 106 of FIG. 1B and FIGS. 2A-2B may combine (or recombine) the three monochromatic images to produce a full-color image or a polychromatic (or multi-chromatic) image, via post-waveguide image light 204 and directed toward the eye 110 of FIG. 1B and FIGS. 2A-2B. In yet other examples, one or more emitter arrays 254A-254C may produce light of multiple wavelengths, ranges of wavelengths, or other forms of light other than monochromatic light.

In some embodiments, a calibration and/or alignment system (not shown in FIG. 3) may be employed to align the multiple monochromatic images (e.g., via mechanical movement, or scanning, of one or more of the monochromatic emitter arrays 254A-254C or movement of the one or more of the monochromatic images by one or more pixels as emitted from their associated monochromatic emitters 254A-254C) to produce a desired or intended, properly aligned multi-chromatic image.

Figure 4:
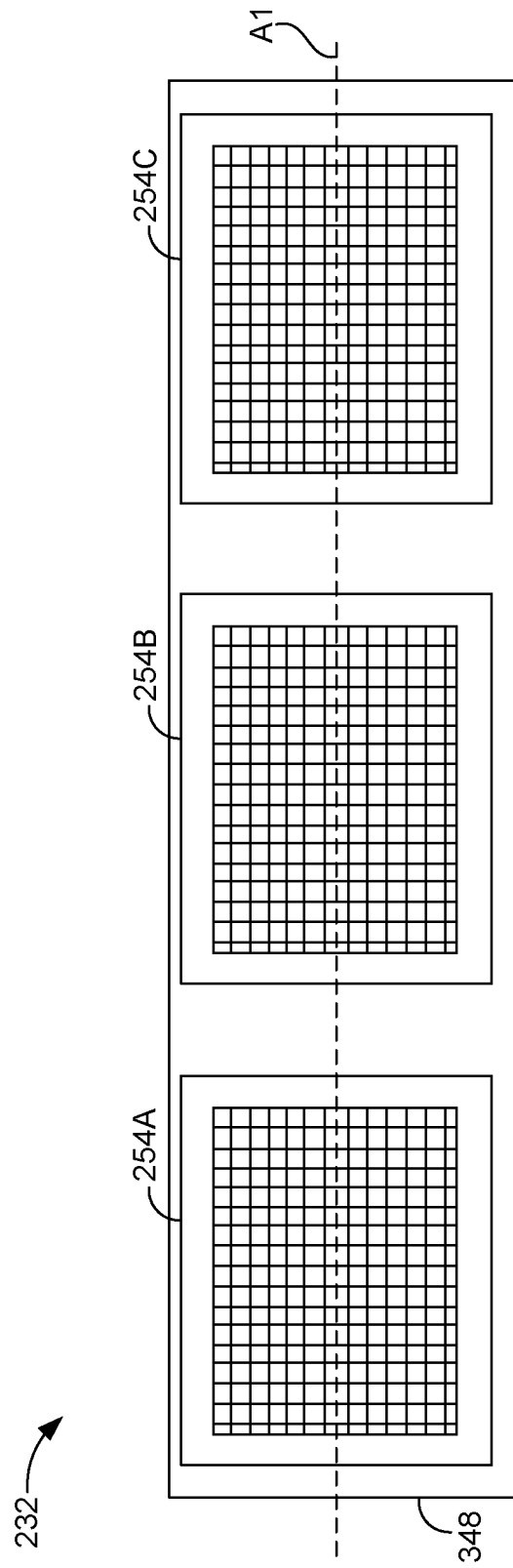
FIG. 4 shows a top view of a light source that includes a 1D configuration of emitter arrays, according to some embodiments.

FIG. 4 shows a top view of light source 232 that includes a 1D configuration of emitter arrays 254A-254C, according to some embodiments. The 1D configuration shown in FIG. 4 is a linear configuration of 2D emitter arrays 254A-254C along the A1 axis. In the embodiment of FIG. 4, the individual emitter arrays 254A-254C have an aspect ratio greater than 1.0 (i.e., emitter arrays 254 are rectangular 2D arrays of LECs). However, in other embodiments, the aspect ratio of the emitter arrays 254A-254C may be equal to 1.0 (i.e., emitter arrays 254 are square 2D arrays of LECs). The particular linear configuration may be arranged according to a longer side of the rectangular arrays 254A-254C. While the emitter arrays 254A-254C may have a 1D configuration of the emitters (e.g., LEDs) in some scanning embodiments, in other non-scanning embodiments, the emitter arrays 254 may be arranged in a (square or rectangular) 2D configuration. In yet other embodiments, the emitter arrays 254A-254C may have other non-linear configurations (e.g., oval, circular, or otherwise round in some fashion) while defining a first dimension (e.g., a width) and a second dimension (e.g. a length) that is orthogonal to the first direction, with one dimension being equal or unequal to each other. The emitters included in emitter arrays 254A-254C may have a 2D emitter array configuration with more than 1000×1000 emitters. In some embodiments, the emitter arrays 254A-254C may be 1D emitter arrays, rather than 2D emitter arrays, as shown in FIG. 4. Various other combinations are also within the scope of the present disclosure. Emitter arrays 254A-254C may be bonded and/or electrically coupled to backplane 348.

Formation of an Image

Figure 5C:
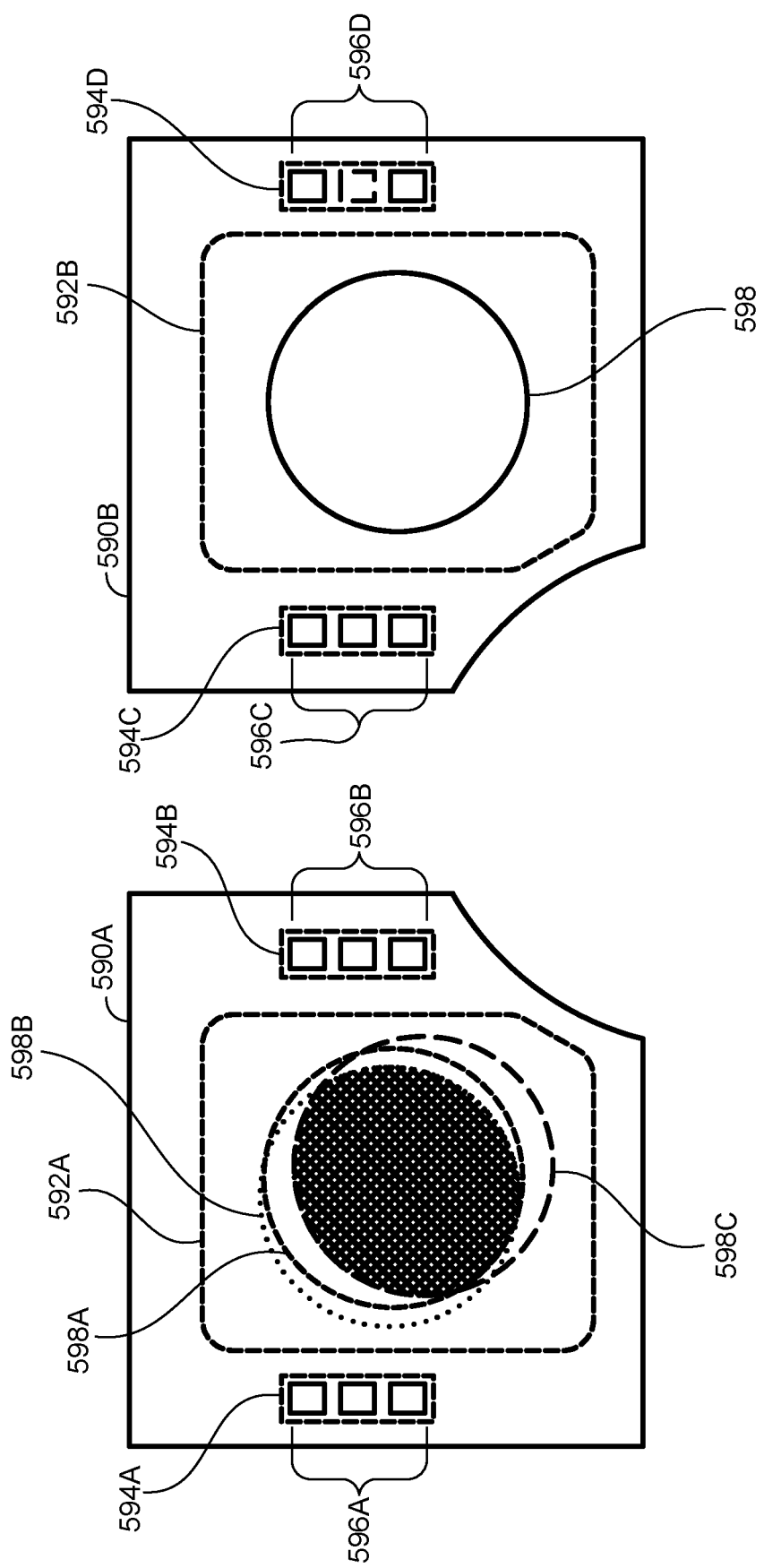
FIG. 5C is a top view of a display device, in accordance with some embodiments.

FIGS. 5A-5C illustrate how images and pupil replications are formed in display device 200 based on different structural arrangement of light emitters, in accordance with different embodiments. An image field 530 of coupling element 238 is an area of coupling element 238 that receives the pre-waveguide image light 208, emitted by the light source 232 and forms an image on the coupling element 238, which is transmitted via waveguide 220. For example, an image field 530 may correspond to a portion of the coupling element 238. Note that decoupling element 214B of FIGS. 2A-2B also includes an image field that outputs the post-waveguide image light 204 to the eye 110 of the user. In some cases, an image field is not an actual physical structure but is an area to which the pre-waveguide or post-waveguide image light is projected and which the image is formed. In one embodiment, the image field is a surface of the coupling element 238 of FIGS. 2A-2B and the image formed on the image field is magnified as light travels through the waveguide 220 of FIGS. 2A-2B. In another embodiment, an image field is formed after light passing through the waveguide, which combines the light of different colors to form the image field. In some embodiments, the image field may be projected directly into the user's eyes.

FIG. 5A is a diagram illustrating a scanning operation of a scanning embodiment of display device 200, in accordance with an embodiment. Display device 200 of FIG. 5A may be a scanning embodiment of display device 104 of FIGS. 1A-1B and/or a scanning embodiment of display device 200 of FIGS. 2A-2B, or a scanning embodiment of any other display device discussed herein. As discussed in conjunction with at least FIGS. 2A-2C, display device 200 may include source assembly 230 and a waveguide configuration that includes waveguide 220 and coupling element 238. Coupling element 238 includes an image field 520, of length L2. The image field 520 may include a 2D array of pixel locations 532, represented by the blocks in inset 534. The 2D array of pixel locations 532 may include p rows, indexed via row 1 through row p. The source assembly 230 includes a light source 232 and a light condition assembly 250. Because display device 200 of FIG. 5A is a scanning display device, the source assembly of FIG. 5A additionally includes a scanning mirror assembly 252, which includes mirror 520, which is a scanning mirror.

As discussed throughout, the light source 232 includes a 1D configuration of emitter arrays (or source elements) 254. That is, light source 232 includes multiple rows and columns of light-emitting components (LECs) that are included in one or more 2D emitter arrays 254. Individual LECs included in emitter array 254 are represented by the dots in inset 515. Thus, in some embodiments, emitter arrays may be comprised of one or more arrays of LECs, such as but not limited to light-emitting diodes (LEDs). Various embodiments of emitter arrays are discussed in conjunction with at least FIGS. 3-4. Various non-limiting embodiments of LEDs are discussed in conjunction with at least FIGS. 6A-6B.

In some embodiments, scanning light source 232 may include a 1D configuration of emitter arrays, wherein a separate emitter array 254 of the 1D configuration is dedicated to each primary color of the 2D images to the presented. In various embodiments, the light source 232 may include more than one emitter array 254 for each primary color. Light source 232 may emit source light 244 as a set of collimated beams of light. For example, FIG. 5A shows multiple beams of source light 244 that are emitted by one or more columns of LECs included in emitter array 254. As discussed in conjunction with at least FIGS. 2A-2C, light conditioning assembly 250 may condition source light 244 and transmit resulting conditioned light 248 to scanning mirror assembly 252.

Conditioned light 248 irradiates scanning mirror 520 of scanning mirror assembly 252. The mirror 520 reflects, scans, and projects pre-waveguide image light 208. The mirror 520 may rotate about an axis 522. The mirror 520 may be a microelectromechanical system (MEMS) mirror or any other suitable mirror. As the mirror 520 rotates about rotational axis 522, the pre-waveguide image light 208 is directed to a different part of the image field 530 of coupling element 238, as illustrated by the reflected part of the pre-waveguide image light 208 in solid lines and the reflected part of the pre-waveguide image light 208 in dash lines.

At a particular orientation of the mirror 520 (i.e., a particular rotational angle), the emitter arrays 254 illuminate a portion of the image field 530 (e.g., a particular subset of multiple pixel locations 532 on the image field 530). In one embodiment, the LECs of emitter arrays 254 are arranged and spaced such that a light beam from each emitter array 254 is projected on a corresponding pixel location 532. In another embodiment, small light emitters such as µLEDs are used for emitter arrays 254 so that light beams from a subset of multiple light emitters are together projected at the same pixel location 532. In other words, a subset of multiple emitter arrays 254 collectively illuminates a single pixel location 532 at a time.

The image field 530 may also be referred to as a scan field because, when the pre-waveguide image light 208 is projected to an area of the image field 530, the area of the image field 530 is being illuminated by the pre-waveguide image light 208. The image field 530 may be spatially defined by a matrix of pixel locations 532 (represented by the blocks in inset 534) in rows and columns. A pixel location here refers to a single pixel. The pixel locations 532 (or simply the pixels) in the image field 530 sometimes may not actually be additional physical structure. Instead, the pixel locations 532 may be spatial regions that divide the image field 530. Also, the sizes and locations of the pixel locations 532 may depend on the projection of the pre-waveguide image light 208 from the source assembly 230. For example, at a given angle of rotation of the mirror 520, light beams emitted from the light source 232 may fall on an area of the image field 530. As such, the sizes and locations of pixel locations 532 of the image field 530 may be defined based on the location of each light beam.

In some embodiments, a pixel location 532 may be subdivided spatially into subpixels (not shown). For example, a pixel location 532 may include a red subpixel, a green subpixel, and a blue subpixel. The red subpixel corresponds to a location at which one or more red light beams are projected, etc. When subpixels are present, the color of a pixel 532 is based on the temporal and/or spatial average of the subpixels.

The number of rows and columns of emitter arrays 254 of the light source 232 may or may not be the same as the number of rows and columns of the pixel locations 532 in the image field 530. In various 1D configurations of emitter arrays 254, the number of emitter arrays 254 in a row is equal to the number of pixel locations 532 in a row of the image field 530 while the number of emitter arrays 254 in a column is two or more, but fewer than the number of pixel locations 532 in a column of the image field 530.

In other 1D configurations of emitter arrays 254, the configuration of emitter arrays 254 of light source 232 has the same number of columns of emitter arrays 254 as the number of columns of pixel locations 532 in the image field 530, but has fewer rows than the image field 530. For example, in one specific embodiment, the light source 232 has approximately 1280 columns of emitter arrays 254, which is the same as the number of columns of pixel locations 532 of the image field 530. The light source 232 may have a first length L1, which is measured from the first row to the last row of emitter arrays 254. The image field 530 has a second length L2, which is measured from row 1 to row p of the scan field 530. In one embodiment, L2 is greater than L1 (e.g., L2 is 50 to 10,000 times greater than L1).

As noted, scanning embodiments of display device 200 include a 1D configuration of emitter arrays 254, where the number of rows of pixel locations 532 is larger than the number of rows of emitter arrays 254. In some embodiments, the display device 200 may employ the mirror 520 to project the light 502 to different rows of pixels at different times. As the scanning mirror 520 rotates and the pre-waveguide image light 208 scans through the image field 530 quickly, a scanned image is formed on the image field 530. In some embodiments, the light source 232 may have a smaller number of columns than the image field 530. The mirror 520 may rotate in two dimensions to fill the image field 530 with light (e.g., a raster-type scanning down rows then moving to new columns in the image field 530).

The display device 200 may operate in predefined display periods. A display period may correspond to a duration of time in which an image is formed. For example, a display period may be associated with the frame rate (e.g., a reciprocal of the frame rate). In the particular scanning embodiment shown in FIG. 5A, scanning mirror 520 mirror rotates as a particular rotational frequency, and the display period is as a scanning period that is dependent upon the rotational frequency of mirror 520. A complete cycle of rotation of the mirror 520 may correspond to the scanning period. A scanning period herein refers to a predetermined cycle time during which the entire image field 530 is completely scanned. The scanning of the image field 530 is controlled by the mirror 520.

The light generation of the display device 200 may be synchronized with the rotation of the mirror 520. For example, in one embodiment, the rotational movement of the mirror 520 from an initial position that projects light to row 1 of the image field 530, to the last position that projects light to row p of the image field 530, and then back to the initial position is equal to a scanning period. The scanning period may also be related to the frame rate of the display device 200. By completing a scanning period, an image (e.g., a frame) is formed on the image field 530 per scanning period. Hence, the frame rate may correspond to the number of scanning periods in a second.

As the mirror 520 rotates, light scans through the image field and images are formed. The actual color value and light intensity (brightness) of a given pixel location 532 may be an average of the color various light beams illuminating the pixel location during the scanning period. After completing a scanning period, the mirror 520 rotates back to the initial position to project light onto the first few rows of the image field 530 again, except that a new set of driving signals may be fed to the emitter arrays 254. The same process may be repeated as the scanning mirror 520 rotates in cycles. As such, additional images are formed in the scanning field 530 in different frames.

FIG. 5B illustrates a waveguide configuration 106 of a display device that forms images and replications of images, in accordance with various embodiments. Replications of images may be referred to as pupil replications. Waveguide configuration 106 may be employed in the scanning embodiments, as well as the non-scanning embodiments discussed herein. Waveguide configuration includes light source 232 and waveguide 220. Light source 232 may be included in a source assembly, such as but not limited to source assembly 230 of FIGS. 2B-2C and FIG. 5A. Thus, in scanning embodiments, light source 232 in a scanning light source, and in non-scanning embodiments, light source 232 is a non-scanning light source. As such, the light source 232 may comprise three separate emitter arrays 254, as described in conjunction with at least FIGS. 3-4. The primary colors of emitter arrays 254 may be red, green, and blue, or another combination of other suitable primary colors. The various operations and/or functionalities of waveguide configuration 106 may be controlled via executing instructions on a processor device and/or controller device. When the instructions are executed, the processor device and/or controller device may cause the performance of various actions and/or steps. The instructions may be stored on a non-transitory computer-readable storage medium.

In non-scanning embodiments, the number of light emitters (e.g., individual LECs) in emitter arrays 254 may be equal to the number of pixel locations within an image field (not shown in FIG. 5B). As such, each LEC included in emitter array 254 of a non-scanning embodiment may be dedicated to generating images at a particular pixel location of the image field. In scanning embodiments, the number of light emitters in emitter arrays 254 may be less than the number of pixel locations within the image field. Thus, in scanning embodiments, each LEC included in emitter array 254 may be dedicated to generating images at multiple pixel locations of the image field. In still other embodiments, scanning and non-scanning configurations may be combined to generate multiple pupil replications.

Thus, the embodiments depicted in FIG. 5B may provide for the projection of many image replications (e.g., pupil replications) or decoupling a single image projection at a single point. Accordingly, additional embodiments of disclosed NEDs may provide for a single decoupling element. Outputting a single image toward the eye-box 108 of FIG. 1B may preserve the intensity of the coupled image light. Some embodiments that provide for decoupling at a single point may further provide for steering of the output image light. Such pupil-steering NEDs may further include systems for eye tracking to monitor a user's gaze. Some embodiments of the waveguide configuration 106 that provide for pupil replication, as described herein, may provide for one-dimensional replication, while other embodiments may provide for two-dimensional replication. For simplicity, FIG. 5B illustrates one-dimensional pupil replication. Two-dimensional pupil replication may include directing light into and outside the plane of FIG. 5B. FIG. 5B is presented in a simplified format. The detected gaze of the user may be used to adjust the position and/or orientation of the emitter arrays 254 individually or the light source 232 as a whole and/or to adjust the position and/or orientation of the waveguide configuration.

The waveguide configuration 106 is disposed in cooperation with a light source 232, which may include one or more monochromatic or polychromatic emitter arrays 254 secured, bonded, and/or electrically coupled to a support structure 348 (e.g., a printed circuit board, a backplane, or another structure). The support structure 348 may be coupled to the frame 102 of FIG. 1A. The waveguide configuration 106 may be separated from the light source 232 by an air gap having a distance D1. The distance D1 may be in a range from approximately 50 μm to approximately 500 μm in some examples. The monochromatic or polychromatic images or images projected from the light source 232 (as pre-waveguide image light 208) may pass through the air gap toward the waveguide configuration 106.

Any of the light source embodiments described herein may be utilized as the light source 232.

The waveguide 220 may be formed from a glass or plastic material. The waveguide 220 may include a coupling area 544 (which includes coupling elements 238) and a decoupling area formed by decoupling elements 214A on a top surface 216 and decoupling elements 214B on a bottom surface 218 in some embodiments. The area within the waveguide 220 in between the decoupling elements 214A and 214B may be considered a propagation area 550, in which light images (formed by pre-waveguide image light 208) received from the light source 232 and coupled into the waveguide 220 by coupling elements 238 included in the coupling area 544 may propagate laterally within the waveguide 220.

The coupling area 544 may include coupling elements 238 configured and dimensioned to couple light of a predetermined wavelength, e.g., red, green, or blue light. When a white light emitter array is included in the light source 232, the portion of the white light that falls in the predetermined wavelength may be coupled by each of the coupling elements 238. In some embodiments, the coupling elements 238 may be gratings, such as Bragg gratings, dimensioned to couple a predetermined wavelength of light. In some examples, the gratings of each coupling element 238 may exhibit a separation distance between gratings associated with the predetermined wavelength of light that the particular coupling element 238 is to couple into the waveguide 220, resulting in different grating separation distances for each coupling element 238. Accordingly, each coupling element 238 may couple a limited portion of the white light from the white light emitter array when included. In other examples, the grating separation distance may be the same for each coupling element 238. In some examples, coupling element 238 may be or include a multiplexed coupler.

As shown in FIG. 5B, pre-waveguide image light 208 may include a red image 560A, a blue image 560B, and a green image 560C. The images 560A-560C may be coupled by the coupling elements 238 of the coupling area 544 into the propagation area 550 and may begin traversing laterally within the waveguide 220. In one embodiment, the red image 560A, the blue image 560B, and the green image 560C, each represented by a different dash line in FIG. 5B, may converge to form an overall image that is represented by a solid line. For simplicity, FIG. 5B may show an image by a single arrow, but each arrow may represent an image field where the image is formed. In another embodiment, red image 560A, the blue image 560B, and the green image 560C, may correspond to different spatial locations.

A portion of the light may be projected out of the waveguide 220 (e.g., post-waveguide light 204) after the light contacts the decoupling element 214A for one-dimensional pupil replication, and after the light contacts both the decoupling element 214A and the decoupling element 214B for two-dimensional pupil replication. In two-dimensional pupil replication embodiments, the light may be projected out of the waveguide 220 at locations where the pattern of the decoupling element 214A intersects the pattern of the decoupling element 214B.

The portion of light that is not projected out of the waveguide 220 by the decoupling element 214A may be internally reflected off the decoupling element 214B. The decoupling element 214B may reflect all (or near-all) incident light back toward the decoupling element 214A, as depicted. Accordingly, the waveguide 220 may combine the red image 560A, the blue image 560B, and the green image 560C into a polychromatic image instance, which may be referred to as a pupil replication 562. The polychromatic pupil replication 562 may be projected toward the eye-box 108 of FIG. 1B and to the eye 110, which may interpret the pupil replication 562 as a full-color image (e.g., an image including colors in addition to red, green, and blue). Pupil replication 562 may include at least a portion of the post-waveguide image light 204. The waveguide 220 may produce tens or hundreds of pupil replications 562 or may produce a single replication 562.

In some embodiments, the waveguide configuration 106 may differ from the configuration illustrated in FIG. 5B. For example, the coupling area 544 may be different. Rather than including gratings as coupling element 238, an alternate embodiment may include a prism that reflects and refracts received image light, directing it toward the decoupling element 214A. Also, while FIG. 5B generally shows the light source 232 having multiple emitter arrays 254 coupled to the same support structure 348, other embodiments may employ a light source 232 with separate monochromatic emitter arrays 254 located at disparate locations about the waveguide configuration (e.g., one or more emitter arrays 254 located near a top surface of the waveguide configuration and one or more emitter arrays 254 located near a bottom surface of the waveguide configuration).

Also, although only three emitter arrays are shown in FIG. 5B (e.g., a scanning 1D configuration of emitter arrays), an embodiment may include more or fewer emitter arrays. For example, in one embodiment, a display device may include two red emitter arrays, two green emitter arrays, and two blue emitter arrays (e.g., a non-scanning 2D configuration of emitter arrays). In one case, the extra set of emitter panels provides redundant light emitters for the same pixel location. In another case, one set of red, green, and blue panels is responsible for generating light corresponding to the most significant bits of a color dataset for a pixel location while another set of panels is responsible for generating light corresponding the least significant bits of the color dataset.

FIG. 5C is a top view of a display system (e.g., an NED), in accordance with an embodiment. The NED may include a pair of waveguide configurations. The included waveguide configuration may be an embodiment of, or at least similar to, at least one of waveguide configuration 106 of FIG. 1B, the waveguide configuration of FIG. 2A, and/or waveguide configuration 106 of FIG. 5B. Each waveguide configuration projects images to an eye of a user. In some embodiments not shown in FIG. 5C, a single waveguide configuration that is sufficiently wide to project images to both eyes may be used.

The waveguide configurations 590A and 590B may each include a decoupling area 592A or 592B. In order to provide images to an eye of the user through the waveguide configuration 590, multiple coupling areas 594 may be provided in a top surface of the waveguide of the waveguide configuration 590. The coupling areas 594A and 594B may include multiple coupling elements to interface with light images provided by an emitter array set 596A and an emitter array set 596B, respectively. Each of the emitter array sets 596 may include a plurality of monochromatic light emitter arrays, as described herein. As shown, the emitter array sets 596 may each include a red emitter array, a green emitter array, and a blue emitter array. As described herein, some emitter array sets may further include a white emitter array or an emitter array emitting some other color or combination of colors.

The right eye waveguide 590A may include one or more coupling areas 594A, 594B, 594C, and 594D (all or a portion of which may be referred to collectively as coupling areas 594) and a corresponding number of emitter array sets 596A, 596B, 596C, and 596D (all or a portion of which may be referred to collectively as the light emitter array sets 596). Accordingly, while the depicted embodiment of the right eye waveguide 590A may include two coupling areas 594 and two emitter array sets 596, other embodiments may include more or fewer. In some embodiments, the individual emitter arrays of an emitter array set may be disposed at different locations around a decoupling area. For example, the emitter array set 596A may include a red emitter array disposed along a left side of the decoupling area 592A, a green emitter array disposed along the top side of the decoupling area 592A, and a blue emitter array disposed along the right side of the decoupling area 592A. Accordingly, emitter arrays of an emitter array set may be disposed all together, in pairs, or individually, relative to a decoupling area.

The left eye waveguide 590B may include the same number and configuration of coupling areas 594 and LED sets 596 as the right eye waveguide 590A, in some embodiments. In other embodiments, the left eye waveguide 590B and the right eye waveguide 590A may include different numbers and configurations (e.g., positions and orientations) of coupling areas 594 and emitter array sets 596. Included in the depiction of the left waveguide 590A and the right waveguide 590B are different possible arrangements of pupil replication areas of the individual emitter arrays included in one emitter array set 596. In one embodiment, the pupil replication areas formed from different color emitter arrays may occupy different areas, as shown in the left waveguide 590A. For example, a red emitter array of the emitter array set 596 may produce pupil replications of a red image within the limited area 598A. A green emitter array may produce pupil replications of a green image within the limited area 598B. A blue emitter array may produce pupil replications of a blue image within the limited area 598C. Because the limited areas 598 may be different from one monochromatic emitter array to another, only the overlapping portions of the limited areas 598 may be able to provide full-color pupil replication, projected toward the eye-box 108. In another embodiment, the pupil replication areas formed from different color emitter arrays may occupy the same space, as represented by a single solid-lined circle 598 in the right waveguide 590B.

In one embodiment, waveguide portions 590A and 590B may be connected by a bridge waveguide (not shown). The bridge waveguide may permit light from the emitter array set 596A to propagate from the waveguide portion 590A into the waveguide portion 590B. Similarly, the bridge waveguide may permit light emitted from the emitter array set 596B to propagate from the waveguide portion 590B into the waveguide portion 590A. In some embodiments, the bridge waveguide portion may not include any decoupling elements, such that all light totally internally reflects within the waveguide portion. In other embodiments, the bridge waveguide portion 590C may include a decoupling area. In some embodiments, the bridge waveguide may be used to obtain light from both waveguide portions 590A and 590B and couple the obtained light to a detection (e.g. a photodetector), such as to detect image misalignment between the waveguide portions 590A and 590B.

Structure of a Light-Emitting Diode (LED)

FIG. 6A is a cross-sectional diagram illustrating an LED 600A, in accordance with one embodiment. LED 600A may be a light-emitting component (LEC) included in any of the emitter arrays discussed herein. As such, LED 600A may be included in a head-mounted device (HMD), such as but not limited to HMD 100 of FIGS. 1A-1B. LED 600A may be an LED die. In various embodiments, LED 600A is a micro-LED (μLED), where the feature sizes are on the order of a few microns (μm) to hundreds of microns. In at least some embodiments, the feature size of LED 600A may be less than a micron (i.e., the feature size may be sub-micron). LED 600A is an example of an LED that may be positioned on and bonded to a surface of a display substrate (e.g., backplane 348 of FIGS. 3-4 or the target substrate 832 shown in FIGS. 8A-8B) to emit visible or invisible light. The target substrate may be a backplane for a display device, such as but not limited to backplane 348 of FIGS. 3-4.

In some embodiments, LED 600A is formed on a substrate layer (not shown in FIG. 6A), or semiconductor wafer, and includes, among other components a semiconductor layer 602, a dielectric layer 614 disposed on the semiconductor layer 602, a p-contact 608 disposed on a first portion of the dielectric layer 614, and an n-contact 606 disposed on a second portion of the semiconductor layer 602. The semiconductor layer 602 may be formed on a substrate layer, such as but not limited to a gallium substrate layer. Thus, semiconductor layer 602 may be a gallium (Ga) semiconductor layer. Note that semiconductor layer 602 may be formed of other semiconductor lattices or materials, such as gallium nitride (GaN), gallium phosphide (GaP), gallium arsenide (GaAS), or any other semiconductor material appropriate for the fabrication of an LED. Note that this discussion of LED 600A is non-limiting, and LED 600A may be formed via other semiconductor lattices other than gallium-based lattices. In some embodiments, the semiconductor layer 602 is formed on the substrate layer as an epitaxial layer.

The p-contact 608 and the n-contact 606 are the electrical contacts coupled to the p-type and n-type regions of LED 600A, respectively. That is, p-contact 608 may be employed to electrically couple the p-type region of LED 600A to other semiconductor devices, such as but not limited to a target substrate. Likewise, n-contact 606 may be employed to electrically couple the n-type region of LED 600A to other semiconductor devices. For example, p-contact 608 and n-contact 606 may be bonded to corresponding electrical contacts of a backplane to bond LED 600A to the backplane. P-contact 608 and n-contact 606 may singly, or collectively, be referred to as electrical contacts, electrical interconnects, electrical leads, or contact pads of LED 600A. In some embodiments, p-contact 608 and n-contact 606 may include metal bumps. In some non-limiting embodiments, p-contact 608 and n-contact 606 may be comprised of a copper-tin (CuSn) alloy.

LED 600A may be less than 100 microns in diameter with a parabolic structure etched onto the LED die during wafer processing to form a quasi-collimated light beam emerging from the light-emitting face 604. In at least one embodiment, LED 600A may be less than 100 microns in diameter. LED 600A may include highlight extraction efficiency and outputs quasi-collimated light because of its shape. As shown in FIG. 6A, semiconductor layer 602 may be shaped into a mesa-structure 610. An active (or light-emitting) layer 612 (or 'active light-emitting area") is included in the mesa-structure 610. The active layer 612 may correspond to the region of the band gap of LED 600A. A voltage difference applied across the p-contact 608 and the n-contact 606 may result in the active layer 612 emitting visible or invisible photons (i.e., light). The mesa 610 has a truncated top, on a side opposed to the light-emitting face 604. The mesa 610 also has a curved or near parabolic shape to form a reflective enclosure for light within LED 600A. The arrows 616 show how light emitted from the active layer 612 is reflected off the walls of the mesa 610 toward the light-emitting face 604 at an angle sufficient for the light to escape the LED 600A (e.g., within the angle of total internal reflection).

The structure of LED 600A results in an increase in the efficiency of light emission when compared to unshaped or conventional LED chips. As such, the LED 600A produces light visible to the human eye with reduced current (e.g., nano-amps of drive current). LED 600A is an example of an LED die, although other types of LED dies may be assembled onto a backplane for a display, as discussed herein.

Figure 6B:
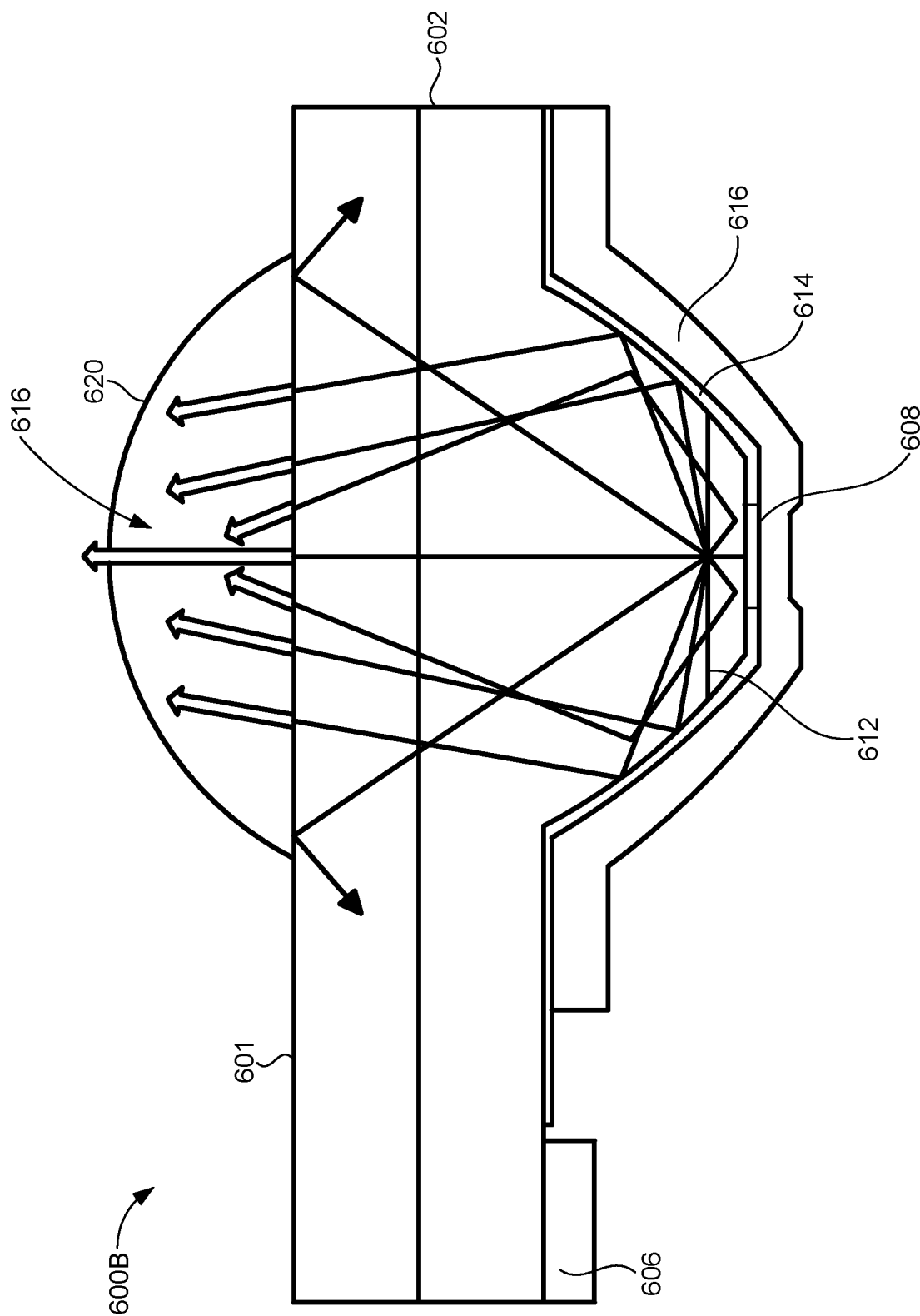
FIG. 6B is a cross-sectional diagram illustrating another embodiment of an LED, in accordance with one embodiment.

FIG. 6B depicts a μLED 600B that is similar in many respects to the μLED 600A of FIG. 6A. The μLED 600B may further include a μlens 620, which may be formed over the parabolic structure. In some embodiments, the μlens 620 may be formed by applying a polymer coating over the μLED 600A, patterning the coating, and reflowing the coating to achieve the desired lens curvature. The μlens 620 may be disposed over an emissive surface to alter a chief ray angle of the μLED 600B. In another embodiment, the μlens 620 may be formed by depositing a μlens material above the μLED 600A (for example, by a spin-on method or a deposition process). For example, a μlens template (not shown) having a curved upper surface can be patterned above the μlens material. In some embodiments, the μlens template may include a photoresist material exposed using a distributing exposing light dose (e.g., for a negative photoresist, more light is exposed at a bottom of the curvature and less light is exposed at a top of the curvature), developed, and baked to form a rounding shape. The μlens 620 can then be formed by selectively etching the μlens material according to the μlens template. In some embodiments, the shape of the μlens 620 may be formed by etching into the substrate. In other embodiments, other types of light-shaping or light-distributing elements, such as an annular lens, Fresnel lens, or photonic crystal structures, may be used instead of μlenses. Note that in FIG. 6B, a metal reflector layer 616 is disposed on the dielectric layer 614 and p-contact 608, although the metal reflector layer 616 may be omitted.

In some embodiments, μLED arrangements other than those specifically discussed above in conjunction with FIGS. 6A and 6B may be employed as a μLED in any of the various embodiments of emitter arrays discussed herein. For example, the μLED may include isolated pillars of epitaxially grown light-emitting material surrounded by a metal reflector. The pixels of an emitter array may also include clusters of small pillars (e.g., nanowires) of epitaxially grown material that may or may not be surrounded by reflecting material or absorbing material to prevent optical crosstalk.

In some examples, the μLED pixels may be individual metal p-contacts on a planar, epitaxially grown LED device, in which the individual pixels may be electrically isolated using passivation means, such as plasma treatment, ion-implantation, or the like. Such devices may be fabricated with light extraction enhancement methods, such as μlenses, diffractive structures, or photonic crystals. Other processes for fabricating the μLEDs of the dimensions noted above other than those specifically disclosed herein may be employed in other embodiments.

Rows of LEDs for an Emitter Array

Figure 7A:
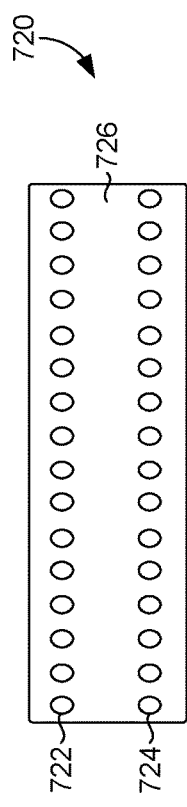
FIG. 7A is a top-view diagram illustrating multiple LED dies integrated into a monolithic LED chip, in accordance with one embodiment.

FIG. 7A is a top-view diagram illustrating multiple LED dies integrated into a monolithic LED chip, in accordance with one embodiment. Monolithic LED chip 720 includes sixteen integrated LED dies, such as but not limited to LED 600A and 600B of FIGS. 6A and 6B. Each of the individual integrated LEDs includes two electrical contacts, corresponding to p-contact 608 and n-contact 606 of LED 600A. Although the electrical contacts are indicated by ovals on the top surface 726 of monolithic LED chip 720, the electrical contacts are located on the bottom surface of monolithic LED chip 720, which is not shown in FIG. 7A. The ovals are shown on the top surface 726 for the reader's clarity. The two contacts of a first LED of monolithic LED chip 720 are labeled 722 and 724. In some embodiments, electrical contact 722 is the p-contact for the first LED and electrical contact 724 is the n-contact for the first LED. In other embodiments, electrical contact 722 is the n-contact for the first LED and electrical contact 724 is the p-contact for the first LED.

Although not indicated in FIG. 7A, the top surface 726 of monolithic LED chip 720 includes sixteen light-emitting surfaces, such as but not limited to light-emitting surface 604 of LED 600A, where each of the sixteen LEDs includes one of the sixteen light-emitting surfaces. Each light-emitting surface is positioned between the n-contact and the p-contact for the corresponding LED. FIG. 7A is intended as an example only, and is non-limiting. Other configurations of monolithic LED chips are possible. For example, FIG. 7C shows monolithic LED chips with eight integrated LED dies. Other numbers of LED dies integrated into a monolithic LED chip and physical layouts of LED dies are possible for monolithic LED chips.

Figure 7B:
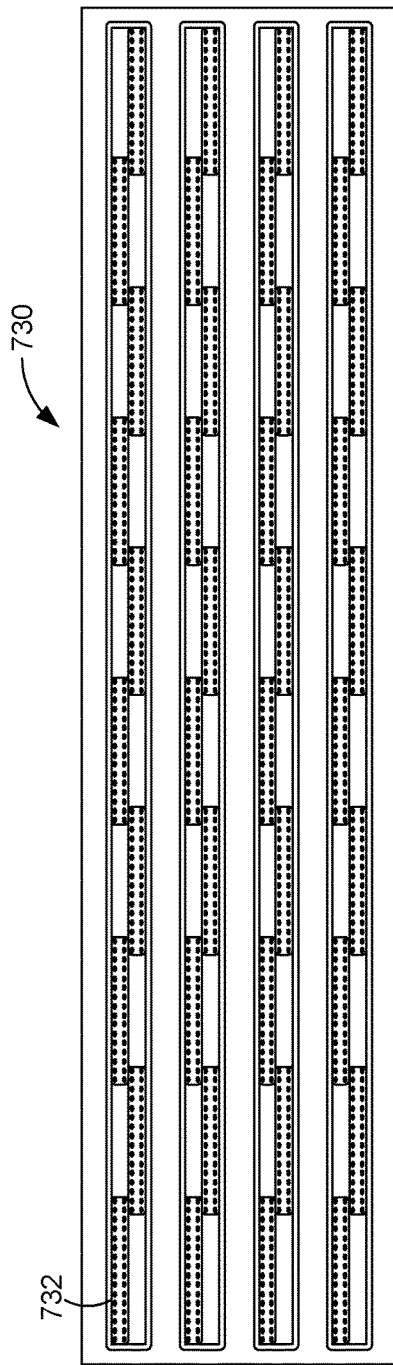
FIG. 7B is a top-view diagram illustrating multiple monolithic LED chips positioned on a carrier substrate, in accordance with one embodiment.
Figure 7C:
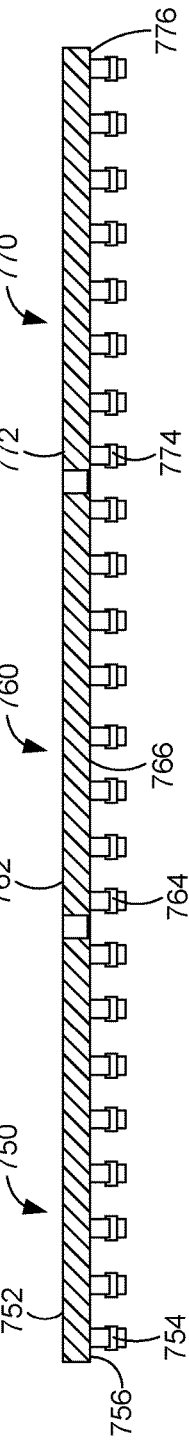
FIG. 7C is a side-view diagram illustrating a row of LEDs that includes three monolithic LED chips, in accordance with one embodiment.

FIG. 7B is a top-view diagram illustrating multiple monolithic LED chips positioned on a carrier substrate, in accordance with one embodiment. As shown in FIG. 7B, carrier substrate 730 is carrying forty monolithic LED chips. In FIG. 7B, one of the forty monolithic LED chips is labeled as monolithic LED chip 732. Each of the monolithic LED chips may be similar to monolithic LED chip 720 of FIG. 7A. As described throughout, a pick and place head (PPH) may transport monolithic LED chips from carrier substrate 730 to a target substrate (not shown in FIG. 7B). Carrier substrate 730 may be a processed LED wafer.

FIG. 7C is a side-view diagram illustrating a row of LEDs that includes three monolithic LED chips. LED row 740 includes three monolithic LED chips: first monolithic LED chip 750, second monolithic LED chip 760, and third monolithic LED chip 770. Each of monolithic LED chips 750/760/770 may be similar to at least one of monolithic LED chip 720 of FIG. 7A or monolithic LED chip 732 of FIG. 7B. In contrast to monolith LED chips 720/732, each of the three monolithic LED chips 750/760/770 includes eight (rather than sixteen) integrated LED dies, such as but not limited to LED 600A of FIG. 6A.

First monolithic LED chip 750 includes a first upper surface 752 and a first lower surface 756. Second monolithic LED chip 760 includes a second upper surface 762 and a second lower surface 766. Third monolithic LED chip 770 includes a third upper surface 772 and a second lower surface 776. Each of the upper surfaces 752/762/772 includes eight light-emitting surfaces of the eight LEDs integrated into the respective monolithic LED chips 750/760/770. Each of the lower surfaces 756/766/776 includes sixteen electrical contacts, two for each of the eight integrated LEDs. Due to the side-view of LED row 740, only one of the two electrical contacts for each LED is visible in FIG. 7C. That is, only the first of two electrical contacts for each LED are shown in FIG. 7C. The corresponding second electrical contacts for each of the LEDs are hidden behind the shown first electrical contacts. First monolithic LED chip 750 includes a first electrical contact 754 for a first LED of first monolithic LED chip 750. Second monolithic LED chip 760 includes a first electrical contact 764 for a first LED of second monolithic LED chip 760. Third monolithic LED chip 770 includes a first electrical contact 774 for a first LED of third monolithic LED chip 770. In some embodiments, electrical contacts 754/764/774 are n-contacts. In other embodiments, electrical contacts 754/764/774 are p-contacts.

In some embodiments, the LEDs integrated in each of monolithic LED chips 750/760/770 all emit the photons (i.e., light) of the same (or nearly the same) frequency (or wavelength). In other embodiments, the LEDs integrated in first monolithic LED chip 750 emit photons of a first frequency, the LEDs integrated in second monolithic LED chip 760 emit photons of a second frequency, and the LEDs integrated in third monolithic LED chip 770 emit photons of a third frequency. For example, first monolithic LED chip 750 may emit red (R) light, second monolithic LED chip 760 may emit green (G) light, and third monolithic LED chip 770 may emit blue (B) light. A RGB pixel, including each of a red-emitting LED, a green-emitting LED, and a blue-emitting LED may be constructed by arranging multiple LED rows together of the various LED colors. In other embodiments, LED row 740 may be integrated into emitter arrays, such as but not limited to emitter arrays 254A-254C of FIGS. 3 and 4. LED row 740 is an exemplary embodiment of a row of LEDs, and other configurations and arrangements of monolithic LED chips may be employed to generate a row of LEDs and/or pixels for a display device, such as but not limited to HMD 100 of FIGS. 1A-1B.

System for Bonding a Row of LEDs to a Target Substrate

Figure 8A:
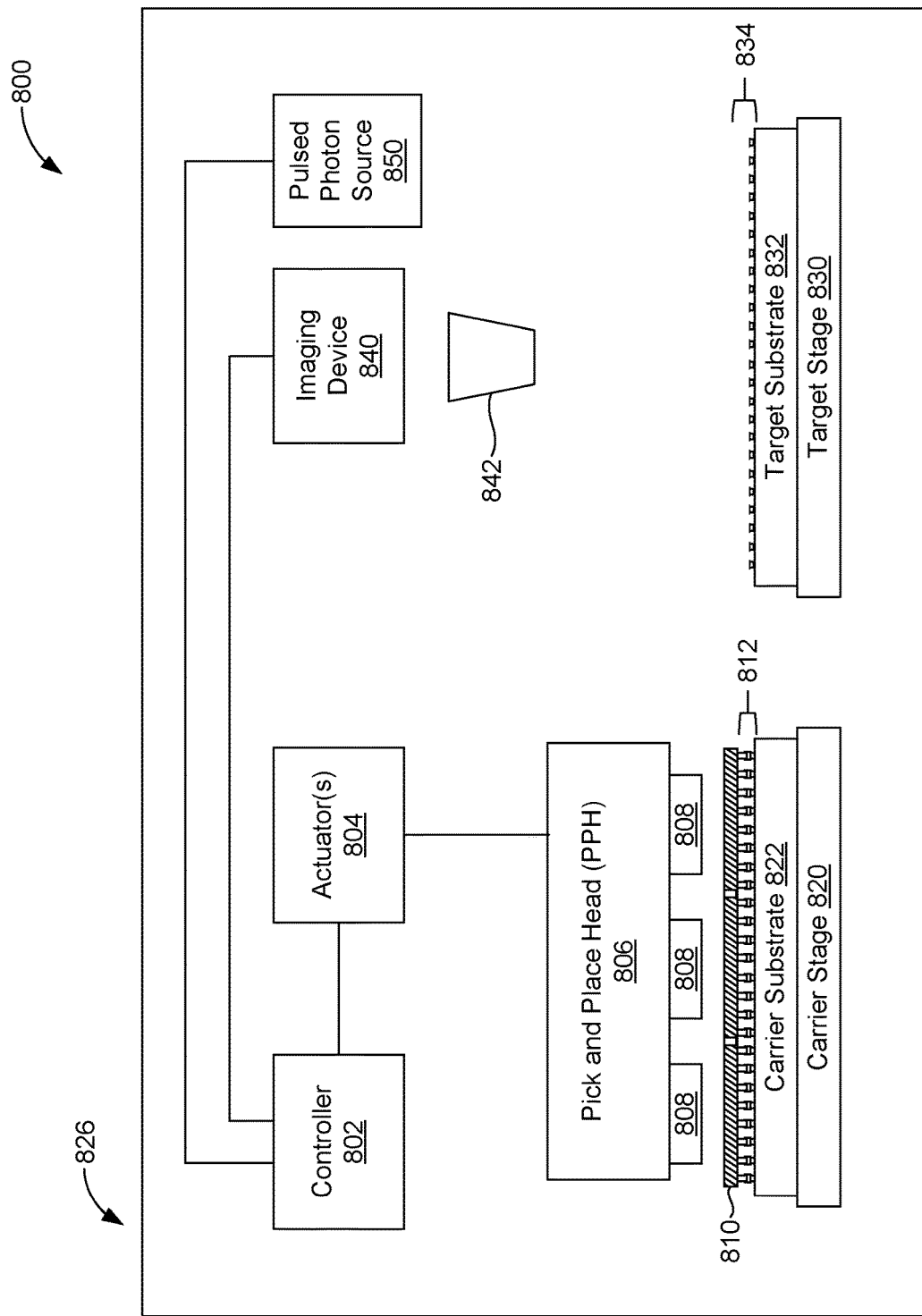
FIGS. 8A-8B include system diagrams of a system for bonding a row of LEDs on a target substrate, via a pulsed photon source, and in accordance with some embodiments.
Figure 8B:
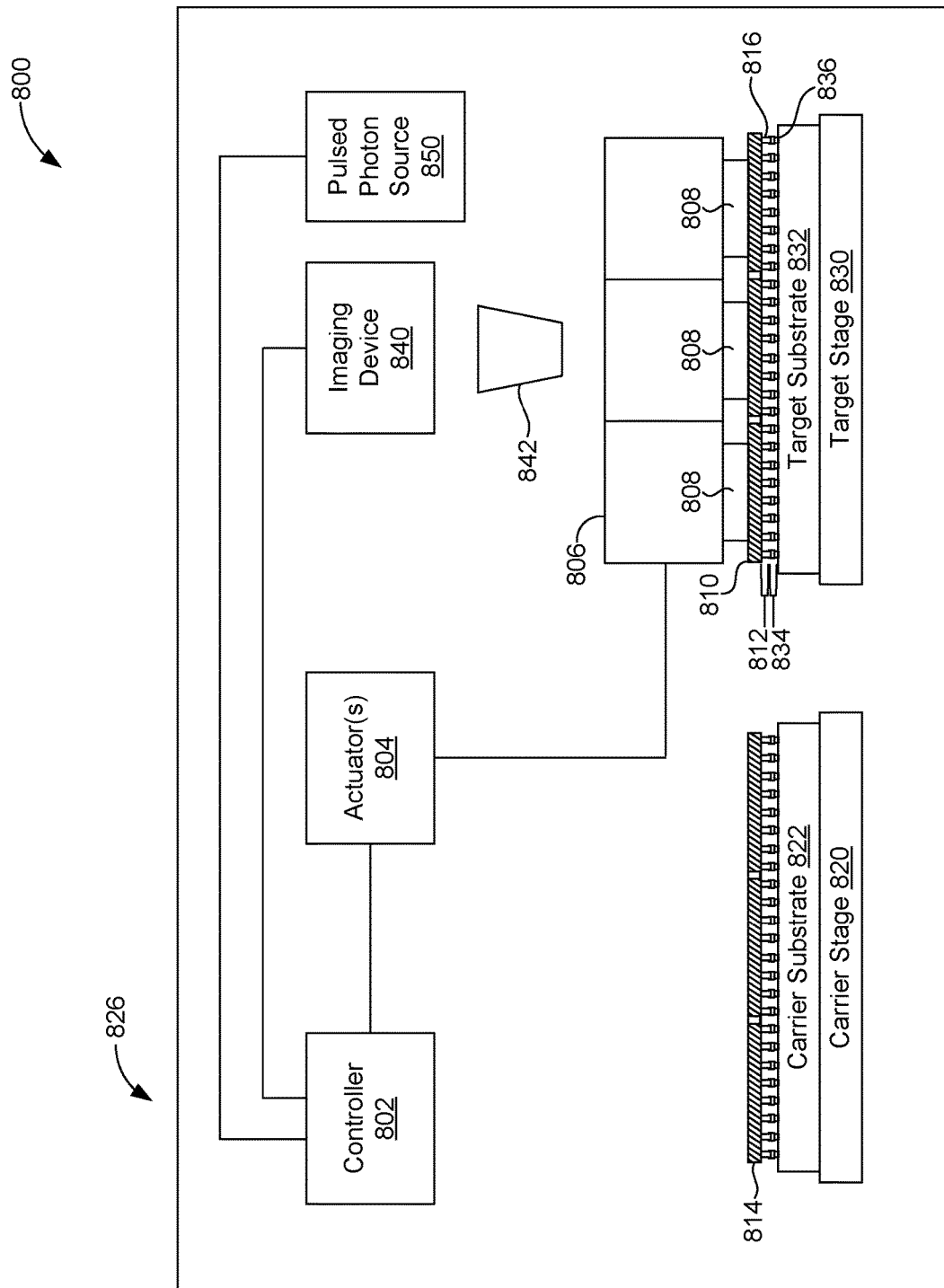

FIGS. 8A-8B include system diagrams of a system 800 for bonding a row of LEDs on a target substrate, via a pulsed photon source, and in accordance with some embodiments. System 800 may employ one or more methods, such as but not limited to method 1400 of FIG. 14, for electrically coupling a semiconductor device to a target substrate. In some non-limiting embodiments, system 800 may be employed to assemble a display device by employing pick and place head (PPH) 806 to position the row of LEDs 810 on target substrate 832 and employing pulse photon source 850 to electrically couple, bond, and/or affix electrical contacts 812 of row of LEDs 810 to electrical contacts 834 of target substrate 832. The temporal and/or spatial profiles of photon pulses emitted by pulsed photon source 850 may be modulated to control for adverse thermal effects associated with bonding the contacts 812 of the row of LEDs 810 to the corresponding electrical contacts 834 of target substrate 832. The row of LEDs 810 may be similar to the row of LEDs 740 of FIG. 7C. Similar to row of LEDs 740, row of LEDs 810 may include three monolithic LED chips, where each of the included monolithic LED chips includes eight integrated LEDs. As discussed throughout, each integrated LED may be a micro LED (µLED). However, other embodiments are not so constrained, and row of LEDS 810 may include fewer or more than three monolithic LED chips. Furthermore, each monolithic LED chip included in row of LEDs 810 may include fewer or more than eight integrated LEDs. In some embodiments, target substrate 832 may be a display substrate. For example, target substrate 832 may be a backplane for a display device, such as but not limited to backplane 348 of FIGS. 3-4. As discussed herein, multiple rows of LEDs may be placed at pixel locations of the backplane to form pixels of the display device, e.g., monochromatic pixels or RGB pixels. Rows of LEDs may form any of the various embodiments of 1D and 2D emitter arrays discussed herein. As discussed throughout, pulsed photon source 850 may be employed to affix, bond, and/or couple the LEDs included in row of LEDs 810 to the target substrate 832.

System 800 may include, among other components or elements, an environment 826 for transporting row of LEDs 810 from carrier substrate 822 to target substrate 832, as well as aligning a plurality of electrical contacts 812 included the row of LEDs 810 with corresponding electrical contacts 834 of the target substrate 832. In the embodiments shown in FIGS. 8A-8B, system 800 includes a PPH 806, a controller 802, an imaging device 840, an actuator(s) 804, a microscope objective 842, and a pulsed photon source 850 located within the environment 826. In some non-limiting embodiments, pulsed photon source 850 is a pulsed laser. System 800 may further include a carrier stage 820 and a target stage 830. Target stage 830 may include a vacuum chuck. To assist in the control of adverse thermal effects, the target stage 830 may be cooled. In some embodiments, the environment 826 is an interior environment of a scanning electron microscope (SEM) chamber, and the imaging device 840 is a scanning electron microscope (SEM). Imaging device 840 may include a camera device that generates images from the detected electrons that are backscattered from the structures being imaged by the SEM.

In some embodiments, PPH 806 includes an array of pick-up heads 808. Each of the pick-up heads 808 may be selectively activated to pick up (or lift) a single monolithic LED chip in place on the carrier substrate 822. In other embodiments, PPH 806 may include a single pick-up head that picks up each of the monolithic LED chips that are included in LED row 810 from carrier substrate 822. As discussed throughout, in some embodiments, PPH 806 may be optically transparent to the frequency (or wavelength) of photons (or electromagnetic waves) emitted by pulsed photon source 850. For example, the pick-up heads 808 may be comprised of an optically transparent, non-conformable, fused-silica (or borosilicate) layer or an optically transparent conformable polymer layer, such as but not limited to polydimethylsiloxane (PDMS).

FIG. 8A depicts system 800 prior to the PPH 806 picking up the row of LEDs 810 from carrier substrate 822. Although system 800 is discussed in the context of assembling rows of LEDs onto the backplane of a display device, the embodiments herein are not so limited. System 800 may be employed to transport virtually any semiconductor device from carrier substrate 822 to target substrate 832, and bonding the electrical contacts of the transported semiconductor device to the electrical contacts 834 of the target substrate 832. For example, the semiconductor devices may include photodiodes, vertical-cavity surface-emitting lasers (VCSELS), or other light-emitting semiconductor components (LECs). A LEC may be any device that emits photons, such as but not limited to a LED, a µLED, photodiodes, VCSELS, and the like. The semiconductor devices need not be light-emitting devices. For example, the semiconductor devices may include transistors, other variants of diodes (e.g., rectifying diodes), resistive elements, capacitors, microelectromechanical (MEMs) devices, and the like. In some embodiments, the semiconductor devices may include logic devices (e.g., processors and/or gate arrays), memory devices (e.g., SRAM, DRAM, and/or EEPROM), or any other integrated circuit (IC) devices. In some embodiments, a lens grating may be bonded if the architecture for a LED is built for backside emission, e.g., the LED chip may be flipped upside down during the assembly steps.

In some embodiments, the pick-up heads 808 may be conformable, but non-reusable, pick-up heads. For example, the pick-up heads 808 may comprise a non-reusable polymer layer, such as but not limited to polydimethylsiloxane (PDMS). The polymer layer of the conformable PPH 806 enables adhesion of the pick-up heads 808 to the row of LEDs 810. In other embodiments, the PPH 806 may be a non-conformable, but reusable PPH 806. For example, the pick-up heads 808 may comprise a non-conformable, but reusable, layer of fused silica. In such non-conformable embodiments, prior to transporting from the carrier substrate 822, an elastomeric interface layer (e-layer) may be formed on the surfaces of the monolithic LED chips. Rather than the conformable layer of the non-reusable PPH 806, the e-layer on the monolithic LED chips facilitates adhesion of the monolithic LED chips to the non-conformable, but reusable PPH embodiments. The e-layer may include PDMS.

The one or more actuator(s) 804 are connected to the PPH 806 and control the movement of the PPH 806. For example, the actuator(s) 804 may facilitate translation and/or rotational movement characterized by multiple degrees of freedom, such as degrees of freedom capable of moving the PPH 806 up and down, left and right, forward and back, and rotation around one or more axes of rotation. The controller 802 may control the movement of the PPH via a connection to the actuator(s) 804. That is, the controller 802 controls the translational and/or rotational movement of the PPH 806 by controlling the movement of the actuator(s) 804. Controller 802 may include one or more logic devices or processors, such as but not limited to a central processing unit (CPU), a microcontroller, a microprocessor, a field programmable gate array (FPGA), an application specific integrated circuit (ASIC), or the like.

The imaging device 840 facilitates a visual arrangement of the pickup, transportation, and positioning of the row of LEDs 810, from the carrier substrate 822 proximate to the target substrate 832. Imaging device 840 also facilitates a visual alignment of the placement of the electrical contacts 812 of the row of LEDs 810 with the corresponding electrical contacts 834 of the target substrate 832. For example, the imaging device 840 may generate images of the PPH 806 and the carrier substrate 822, and provide the images to controller 802. Via various computer vision techniques, human-assisted vision, and/or a combination thereof, the controller 802 aligns the PPH 806 with the carrier substrate 822 (or row of LEDs 810) based on the images, and picks up the row or LEDs 810 by lowering the aligned PPH 806 onto the row of LEDs 810. The adhesive forces between the pick-up heads 808 and the upper surfaces of (or the elastomeric layer placed upon) the row of LEDs 810 enables the pickup of the row of LEDs 810.

In another example, the imaging device 840 generates images of the PPH 806 and the target substrate 832 and/or the electrical contacts 834 of the target substrate 832. These images may be provided to controller 802. Based on the provided images, the controller 802 may translate and/or rotate the PPH 806 to align the PPH 806 (carrying the row of LEDs 810) with the target substrate 832. In some embodiments, the controller 802 may align the electrical contacts 812 of the row of LEDs 810 with the corresponding electrical contacts 834 of the target substrate 832. In various embodiments, the imaging device 840 generates the images by capturing the images through the microscope objective 842, which is an optical component that includes one or more lenses or other optical elements.

The controller 802 aligns the PPH 806 with the target substrate 832 (or electrical contacts 812 with electrical contacts 834) based on the images, and positions the row of LEDs 810 (which are adhered or attached to the pick-up heads 808) on the target substrate 832. In some embodiments, the imaging device 840 is an environmental scanning electron microscope (ESEM). In these embodiments, the environment 826 may be defined by an ESEM chamber. In at least one embodiments, the ESEM chamber may include a high-pressure atmosphere gas, such as but not limited to nitrogen or argon gasses. In various embodiments, other types of imaging devices may be used to facilitate the alignments.

The carrier stage 820 holds the carrier substrate 822. The carrier substrate 822 is mounted with one or more rows of LEDs 810. For example, carrier substrate 822 may be similar to carrier substrate 730 of FIG. 7B. In some embodiments, where the row of LEDs 810 include an elastomeric layer, the row of LEDs 810 is mounted on the carrier substrate 822 with an elastomeric layer facing up to facilitate adhesive pickup of the row of LEDs 810 by the pick-up heads 808 of the PPH 806. In other embodiments, the PPH 806 picks up the row of LEDs 810 by some attractive force other than Van der Waals adhesion, such as but not limited to a suction force, an electromagnetic force, fluidic membranes, and the like. As discussed above, system 800 is not limited to picking and placing rows of LEDs, and may be used with other types of semiconductor devices.

In some embodiments, the carrier stage 820 and/or the target stage 830 may be adjusted to facilitate precision alignment with the PPH 806. For example, the carrier stage 820 and/or the target stage 830 may include at least three degrees of freedom. The degrees of freedom may include left and right, backward and forward, and one or more rotational degrees of freedom. The carrier substrate 822 may be moved with the carrier stage 820, and the target substrate 832 may be moved with the target stage 820. The target stage 830 holds target substrate 832 for the placement and alignment of row of LEDs 810.

FIG. 8B depicts system 800 after the PPH 806 has positioned row of LEDs 810 proximate to target substrate 832 and spatially aligned electrical contacts 812 of the row of LEDs 810 with electrical contacts 834 of target substrate 832. As shown in FIG. 8B, a particular electrical contact 816 of electrical contacts 812 of the row of LEDs is spatially aligned with a corresponding particular electrical contact 836 of electrical contacts 834 of target substrate 832. Although a single carrier substrate 822 is shown in FIGS. 8A-8B, system 800 may include more than one carrier substrate 822. For example, different carrier substrates 822 may carry different colors of rows of LEDs. A carrier substrate 822 may be native substrate on which the monolithic LED chips are fabricated upon (e.g., a semiconductor wafer), or may be an intermediate carrier substrate to the fabrication of the monolithic LED chips.

After the PPH 806 has positioned row of LEDs 810 proximate to the target substrate 832 and spatially aligned electrical contacts 812 of the row of LEDs 810 with electrical contacts 834 of target substrate 832, the controller 806 may scan and pulse the pulse photon source 850 to irradiate the row of LEDs and thermally bond electrical contacts 812 of the row of LEDs 810 to corresponding electrical contact pads 834 of target substrate 832. As noted throughout, the controller 802 may modulate at least the temporal and/or spatial profiles of the pulsed photon beam to control for adverse thermal effects associated with the induced thermal energy. After bonding, particular electrical contact 816 of row of LEDs 810 is electrically coupled to corresponding particular electrical contact 834 of target substrate 832. In various embodiments, the photon pulse (i.e., the pulsed photon beam) is transmitted through the optically transparent pick-up heads 808 to irradiate the monolithic LED chips. Additional pulsed photon source 850 may be used to support parallel bonding of monolithic LED chips and/or multiple rows of LEDs. As noted throughout, at least one of a temporal profile and/or a spatial profile of the photon pulses are modulated to control adverse thermal effects associated with the induced thermal energy of the photon pulses. The manner in which the pulsed photon source 850 is operated to thermally bond the electrical contacts 812 to the electrical contacts 834 of target substrate 832 is described below in further detail in conjunction with FIGS. 9A-14. As shown in FIG. 8B, carrier substrate 822 may include additional rows of LEDs, such as but not limited to row of LEDs 814. The PPH 806 may be employed to position additional rows of LEDs proximate target substrate 832.

Figure 9A:
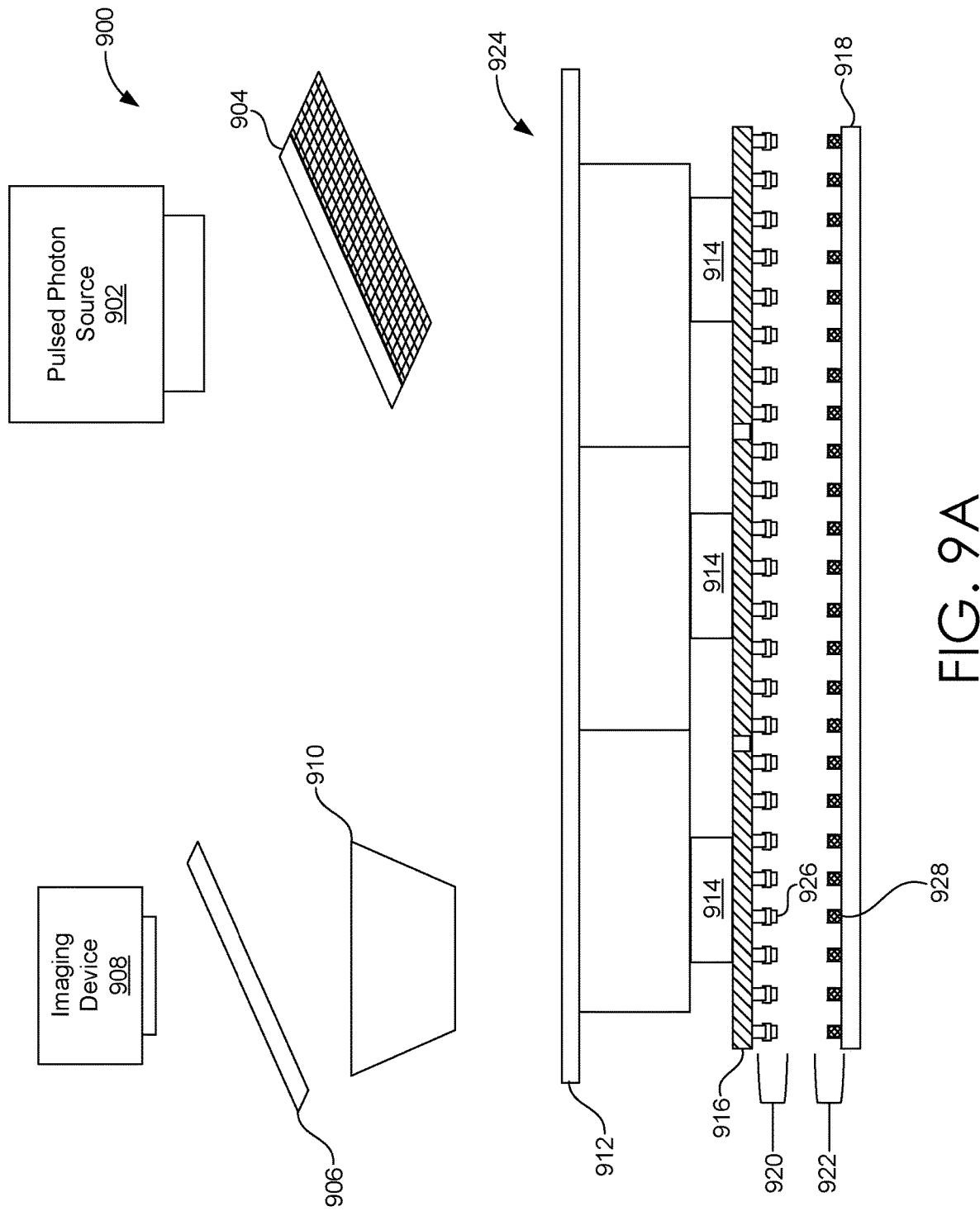
FIGS. 9A-9B include diagrams illustrating another system for selective bonding of rows of LEDs, via a pulsed photon source, to a target substrate, while controlling adverse thermal effects, in accordance with various embodiments.
Figure 9B:
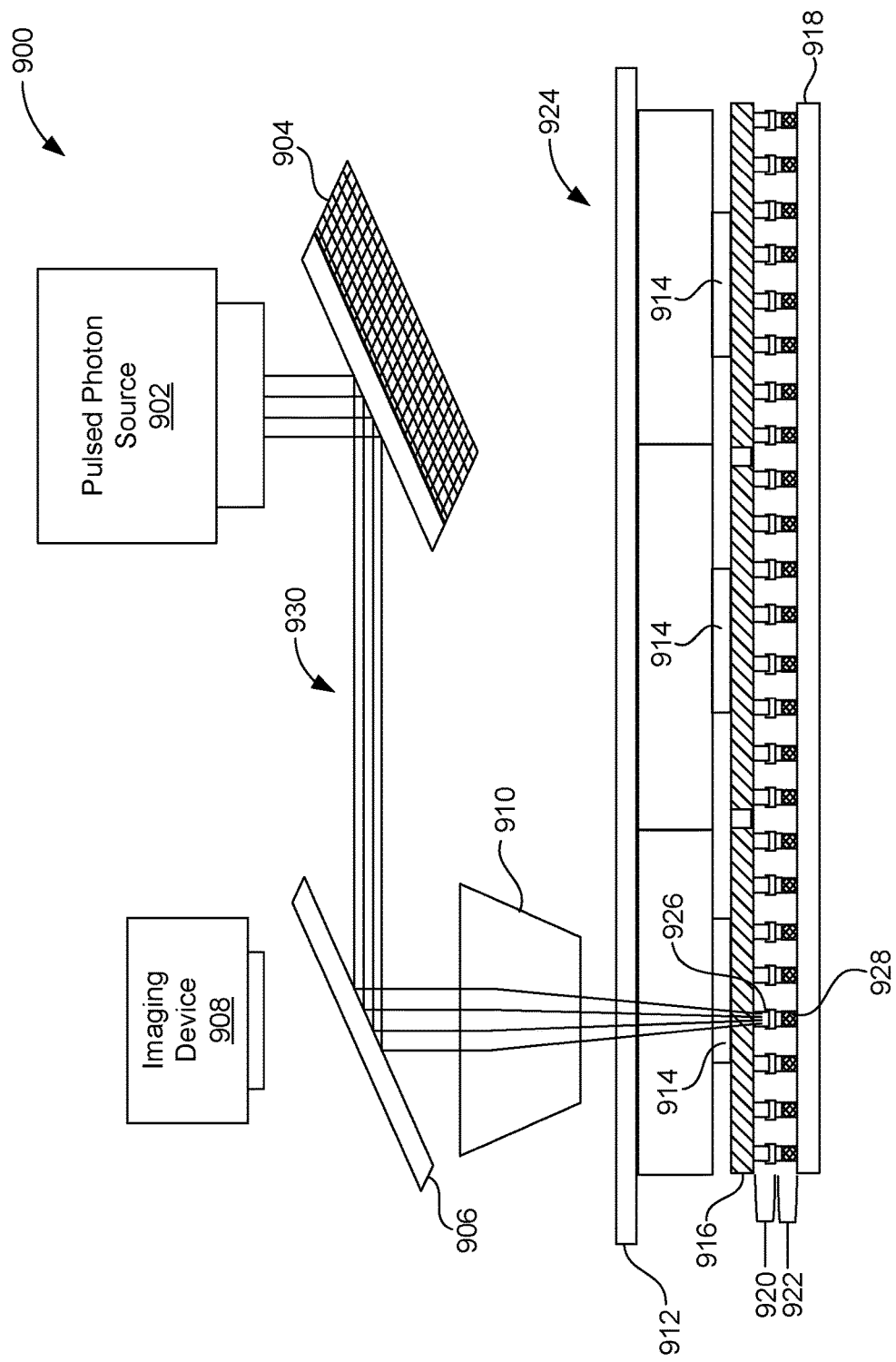

Pulsed Laser-Induced Selective Heating for Bonding a Row of LEDs to a Target Substrate FIGS. 9A-9B are diagrams illustrating a system 900 for selective bonding of rows of LEDs, via a pulsed photon source, to a target substrate, while controlling adverse thermal effects, in accordance with various embodiments. System 900 may employ one or more methods, such as but not limited to method 1400 of FIG. 14, for electrically coupling a semiconductor device to a target substrate. System 900 may be employed to assemble a display device, such as but not limited to display devices 104A-104B of FIGS. 1A-1B and/or display device 1500 of FIG. 15. The system 900 includes a pulsed photon source 902, an actuated mirror 904, a dichroic mirror 906, an imaging device 908, a microscope objective 910, a pick and place head (PPH) 924, a row of LEDs 916, and a target substrate 918. The target substrate 918 may be a backplane for a display device. The PPH 924 includes an actuated glass slide 912 and one or more pick-up heads 914.

FIG. 9A illustrates the PPH 924 transporting the row of LEDs 916 from a carrier substrate (not shown in FIGS. 9A-9B) to the target substrate 918. The row of LEDs 916 includes a plurality of electrical contacts 920. The target substrate 918 includes a plurality of electrical contacts 922 that correspond to the electrical contacts 920 of the row of LEDs 916. Various elements of system 900 may correspond to elements of system 800 shown in FIGS. 8A-8B. For example, the pulsed photon source 902 may correspond to pulsed photon source 850 of FIGS. 8A-8B, imaging device 908 may correspond to imaging device 840, the microscope objective 910 may correspond to the microscope objective 842, PPH 924 may correspond to the PPH 806, pick-up heads 914 may correspond to pick-up heads 808, row of LEDs 916 may correspond to row of LEDs 810, target substrate 918 may correspond to target substrate 832, electrical contacts 920 of row of LEDs 916 may correspond to electrical contacts 812 of row of LEDs 810, and electrical contacts 922 of target substrate 918 may correspond to electrical contacts 934 of target substrate 932.

Referring first to FIG. 9A, system 900 is illustrated after the PPH 924 has picked up and transported the row of LEDs 916 from a carrier substrate (not shown in FIGS. 9A-9B) and before the row of LEDs 916 have been positioned proximate the target substrate 918. For ease of illustration, the PPH 924 shown in FIGS. 9A-9B is depicted as picking up and placing a single row of LEDs 916. However, the PPH 924 may a pick up and place multiple rows of LEDs at once.

The pulsed photon source 902 is a device capable of emitting a pulsed beam of photons, e.g., a pulsed laser beam. The temporal and/or spatial profiles of the pulsed beam are modulated to induce enough thermal energy to bond the electrical contacts 920 of row of LEDs 916 to the electrical contacts 922 of target substrate 918, while controlling for adverse thermal effects associated with the induced thermal energy. Such adverse thermal effects that are controlled for include, but are limited to, the misalignment of electrical contacts 920 of the row of LEDS 916 and the electrical contacts 922 of target substrate 918 resulting from a mismatch between the coefficient of thermal expansion (CTE) of the row of LEDs 916 and the CTE of the target substrate 918. The pulsed photon source 902 may be scanned across the row of LEDs 916. In some embodiments, the pulsed photon source 902 emits a pulsed photon beam at a wavelength that is absorbed by electrical contacts 920 of the row of LEDs 916. For example, in one embodiment, the pulsed photon source 902 emits a pulsed photon beam at a wavelength between 220 nanometers (nm) and 1200 nm. The electrical contacts 920 of the row of LEDs 916 may be formed by a copper-tin (CuSn) alloy. In other embodiments, the contacts may be formed from other metals and/or metal alloys. Such metals and/or metal alloys may have relatively low melting points. Such metals and/or metal alloys may include but are not limited to gold-tin (AuSn), gold-gold (AuAu), gold-silver (AuAg), nanoporous gold, gold-indium (AuIn), a eutectic compound or alloy, gold solder, nanoporous copper, carbon nanotube metals, and the like. Electromagnetic (EM) radiation, having a wavelength within this range, is absorbed by the CuSn electrical contacts 920 (or by the semiconductor layer of the row of LEDs 916), thus causing the CuSn alloy to melt and bond electrical contacts 920 of the row of LEDs 916 to the electrical contacts 922 of the target substrate 918. In other embodiments, the electrical contacts 920 of the row of LEDs 916 are formed of a different material, and the pulsed photon source 902 may emit a pulsed photon beam in a different range of wavelengths that is suitable for melting and bonding the electrical contacts 920 and 922.

The actuated mirror 904 may include an optically reflective mirror that is coupled to one or more actuators, such as but not limited to actuator(s) 804 of FIGS. 8A-8B. The actuators may be operated (via control signals received from controller 802 of FIGS. 8A-8B) to move the actuated mirror 804 in one or more directions. In one embodiment, the actuators facilitate movement of the actuated mirror 904 in at least two translational and/or rotational degrees of freedom. The actuated mirror 904 may be, for example, a piezoelectric actuated mirror that includes a plurality of computer controlled piezoelectric actuators. As described in further detail below with respect to FIG. 9B, the actuated mirror 904 may be operated to deflect a pulsed photon beam through the dichroic mirror 906 and the microscope objective 910 to scan the pulsed photon beam across the row of LEDs 916.

The dichroic mirror 906 reflects photons in a first range of wavelengths, but transmits photons in a second range of wavelengths. More specifically, the dichroic mirror 906 may reflect the pulsed photon beam emitted by the pulsed photon source 902, at a relatively high reflectivity (i.e., with relatively low or negligible absorption), but transmits photons that can be detected by the imaging device 908. In one embodiment, the dichroic mirror 906 reflects photons within the wavelength and/or frequency bandwidth of the pulsed photon source 902 (e.g., within a range of 10 nm bandwidth centered at the wavelength of the pulsed photon source 902), but transmits photons outside of this range. For example, if the pulsed photon source 902 emits photons with a wavelength of 640 nm (i.e., red light), then the dichroic mirror 906 may reflect photons between 630 nm and 650 nm, but transmits visible light outside of this band. This allows the imaging device 908 to capture images of the PPH 924 and the target substrate 918 through the dichroic mirror 906, microscope objective 910, and pick-up heads 914 for alignment purposes, while also allowing photons emitted by the pulsed photon source 902 to be directed through the microscope objective 910 and the PPH 924, to irradiate the row of LEDs 916.

The microscope objective 910 is an optical component that includes one or more lenses and/or other optical elements. The microscope objective 910 may be aligned with the imaging device 908 so that the imaging device 908 may capture images through the microscope objective 910 (and through the dichroic mirror 906, which is positioned between the imaging device 908 and the microscope objective 910). The microscope objective 910 magnifies the images captured by the imaging device 908, which allows imaging device 908 to image the row of LEDs 916 at sufficient resolution for the PPH 924 to perform the positioning and alignment functions described above. In addition, the microscope objective 910 may at least partially modulate the spatial profile of the pulsed photon beam emitted by the pulsed photon source 902. For example, microscope objective 910 may focus the pulsed photon beam to a smaller beam spot size (or de-focus the pulsed photon beam to a larger beam spot size), as described in detail below with respect to FIG. 9B. In one embodiment, the imaging device 908, the dichroic mirror 906, and the microscope objective 910 are integrated into a single imaging system. For example, these three components 906, 908, 910 may be part of a single optical tube.

One or more of the pick-up heads 914 may pick up the row of LEDs 916 from carrier substrate 822 of FIGS. 8A-8B (not shown in FIGS. 9A-9B) and place them onto, or at least proximate, the target substrate 918. In one embodiment, one or more tips of the pick-up heads 914 (i.e., the portion that makes contact with the row of LEDs 916) has the same dimensions (or substantially similar dimensions) as the row of LEDs 916. In this embodiment, the external walls of the pick-up heads 914 may be coated with a reflective metal, which may be employed to modulate the spatial profile of the pulsed photon beam.

The pick-up heads 914 are mechanically coupled to the actuated glass slide 912 of PPH 924. The actuated glass slide 912 is coupled to actuators (e.g., the actuator(s) 804, which are not shown in FIGS. 9A-9B) that are controlled by a controller (e.g., the controller 806 of FIGS. 8A-8B). The actuators move the glass slide 912, which in turn translates and/or rotates the pick-up heads 914. In one embodiment, the actuators can move the glass slide 912 and the pick-up heads 914 in six degrees of freedom (i.e., three translational directions and three rotational directions). For example, the glass slide 912 and the actuators may form a hexapod system that is capable of controlling the position and orientation of the pick-up heads 914 with high accuracy. As described above, the individual LEDs integrated into the row of LEDs 916 are light-emitting semiconductor devices that may include a semiconductor layer (e.g., a gallium semiconductor layer), a light-emitting surface, and electrical contacts 920. For example, an individual LED of row of LEDs 916 may include at least two electrical contacts (i.e., an n-contact and a p-contact). As shown in FIGS. 9A-9B, a particular LED of the row of LEDs 916 includes a particular electrical contact 926, which corresponds to and is aligned particular contact 928 of the target substrate 918. As discussed below, row of LEDs 916 may optionally include an elastomeric interface layer to facilitate attachment to the pick-up heads 914.

As noted above, the target substrate 918 includes a plurality of electrical contacts 922. Each of the electrical contacts 922 of target substrate 918 corresponds to one of the electrical contacts 920 of the row of LEDs. As noted above, electrical contact 928 of electrical contacts 922 corresponds to electrical contact 926 of electrical contacts 920. Photon pulses emitted by the pulsed photon source 902 scan the row of LEDs 916 to bond the corresponding pairs of electrical contacts of electrical contacts 920 and electrical contacts 922. For example, one or more photon pulses emitted by pulsed photon source 902 are employed to electrically couple electrical contact 926 to corresponding electrical contact 928. The electrical contacts 922 of target substrate 918 may be coupled to conductive traces in the target substrate 918 to define control circuits for the LEDs included in row of LEDs 916. In one embodiment, the electrical contacts 922 of target substrate 920 and the conductive traces are formed of copper (Cu). The conductive traces may be formed by other conductive materials, such as but not limited to gold, silver, or the like. Once electrically coupled to the electrical contacts 920 of the row of LEDs 916, the control circuits of target substrate 918 may provide control signals to the individual LEDS, via the electrically coupled electrical contacts 922 of target substrate 918 and electrical contacts 920 of the row of LEDs 916.

When in operation, the controller 802 of FIGS. 8A-8B may receive one or more images of the row of LEDs 916 from the imaging device 908. As discussed above, the images may be captured through the dichroic mirror 906, the microscope objective 910, and the optically transparent PPH 924. The controller 902 and actuators 904 move (e.g., translates and/or rotates) the pick-up heads 914 so that the electrical contacts 920 of the row of LEDs 916 are aligned with the corresponding electrical contacts 922 of the target substrate 918. After the electrical contacts 920, 922 are aligned, the PPH 924 is lowered to position electrical contacts 920 proximate the aligned and corresponding electrical contacts 922. The pulsed photon source 902 is pulsed and scanned to thermally bond corresponding electrical contacts 920 and 922. As noted throughout, the temporal and spatial profiles of the photon pulses are modulated to control adverse thermal effects during the bonding of electrical contacts 920 and 922.

In FIG. 9B, system 900 is illustrated after the pick-up heads 914 have aligned (and positioned proximate) the electrical contacts 920 of the row of LEDs 916 with the corresponding electrical contacts 922 of the target substrate 918. As shown in FIG. 9B, the pulsed photon source 902 emits a photon pulse 930, with modulated temporal and spatial profiles. A controller (e.g., controller 802 of FIGS. 8A-8B) may control the pulsed photon source 902, including at least partially modulating the temporal and spatial profiles of the photon pulse 930. In the embodiment shown in FIGS. 9A-9B, photon pulse 930 emitted by the pulsed photon source 902 is reflected off the actuated mirror 904 and the dichroic mirror 906, and then passes through the microscope objective 910 and the optically transparent PPH 924 to irradiate the row of LEDs 916. In FIG. 9B, the particular electrical contact 926 of the row of LEDs 916 is being bonded to the corresponding particular contact 928 of the target substrate 918. More particularly, the actuated mirror 904 is scanning photon pulse 930 to irradiate the particular LED (through optically transparent PPH 424) that includes particular electrical contact 926. Via photon pulse 930, particular electrical contact 926 is being electrically coupled to corresponding particular electrical contact 928.

As shown in FIG. 9B, the microscope objective 910 focuses (or de-focuses) the photon pulse 930, so the spatial profile of photon pulse 930 converges (or diverges) to a beam spot of a desired dimension or size, after exiting the microscope objective 910. That is, the microscope objective 910 may further modulate the spatial profile of photon pulse 930. In one embodiment, the optical elements in the microscope objective 910 focus (or de-focus) the photon pulse 930 to a beam spot that has approximately the same dimensions as one of the corresponding particular electrical contacts 926, 928, which allows the thermal energy induced by photon pulse 930 to be applied to the single pair of corresponding electrical contacts 926, 928. As noted throughout, the modulation of the spatial and temporal profiles substantially controls any adverse thermal effects associated with the induced thermal energy.

After exiting the microscope objective 910, the photon pulse 920 is transmitted through actuated glass slide 912 and the pick-up heads 914, and irradiates the row of LEDs 916. These components may be formed of materials that do not absorb electromagnetic radiation in the wavelengths emitted by the pulsed photon source 902 (e.g., wavelengths between 355 nm and 1200 nm) and are resistant to temperatures of up to 300° C. In one embodiment, the actuated glass slide 912 is formed of glass and the pick-up head 914 may be formed of optically transparent polydimethylsiloxane (PDMS), fused silica, or borosilicate glass. In still other embodiments, the pick-up head 914 may be formed from other optically transparent materials, such as bot not limited to other types of transparent glasses and/or ceramics. In other embodiments, one or both of these components 912, 914 are formed of a different material that is both transparent or substantially transparent to wavelengths between 380 nm and 1200 nm and resistant to temperatures of up to 300° C.

In the embodiment shown in FIGS. 9A-9B, the photon pulse 930 irradiates the particular LED and/or the particular corresponding electrical contacts 926, 928 via a spatial direction that is substantially perpendicular to the plane of the target substrate 918. In other embodiments, the pulsed photon source 902 is positioned so that the photon pulse 930 irradiates the particular LED and/or the particular corresponding electrical contacts 926, 928 from a different direction. In one embodiment, the direction of the Poynting vector of the photon pulse 930 may be oriented at an angle relative to a direction perpendicular to the plane of the target substrate 918 so that the photon pulse 930 does not pass through one or both of the PPH 924 and/or the row of LEDs 916. In this embodiment, the PPH 924 and/or the row of LEDs 916 may be formed of different materials. In still another embodiment, the pulsed photon source 902 is positioned below the target substrate 918 (i.e., on the side opposite to the pick-up head 914) and the photon pulse 930 passes through the target substrate 918 prior to irradiating the corresponding pair of electrical contacts 926, 928.

In the embodiment shown in FIG. 9B, the photon pulse 930 is transmitted through the row of LEDs 916, without being substantially absorbed by the semiconductor materials of the particular LED, to induce thermal energy proximate the corresponding pair of electrical contacts 926, 928. For instance, the row of LEDs 916 may be formed of semiconductor materials such as but not limited to gallium nitride (GaN) or gallium arsenide (GaAn). Such semiconductor materials may be substantially transparent to electromagnetic radiation of wavelengths greater than the wavelength of the photons emitted by LEDs of the row of LEDs 916 (e.g., greater than 640 nm for a GaAs LED that emits red light, greater than 530 nm for a GaN LED that emits green light, and greater than 460 nm for a GaN LED that emits blue light). These semiconductor materials may absorb wavelengths less than the wavelength of the photons emitted by the LEDs. In this case, the wavelength of the photon pulse 930 is selected and/or modulated to be greater than the wavelength emitted by the LEDs of the row of LEDs 916 and less than 1200 nm so that both the PPH 924 and the row of LEDs 916 are substantially transparent to the photon pulse 930. In embodiments where the row of LEDs 916 or pick-up heads 914 includes an elastomeric layer to facilitate adhesive pick-up, the elastomeric layer is also formed of a material that is transparent or substantially transparent to the photon pulse 930.

In one embodiment, the electrical contacts 920 of the row of LEDs 916 may be formed of a copper-tin alloy (CuSn), while the electrical contacts 922 of the target substrate 918 are formed of copper (Cu). Because electromagnetic radiation between 460 nm and 1200 nm (i.e., the range of wavelengths that is transparent to both the pick-up head 914 and the row of LEDs 916) is absorbed by copper-tin alloy, the photon pulse causes the tin to melt and bond the electrical contacts 920 to the corresponding electrical contacts 922.

In another embodiment, the photon pulse 930 is absorbed by the bulk or substrate of the row of LEDs 916. In this embodiment, the bulk of the row of LEDs 916 converts at least a portion of the photons in photon pulse 930 into thermal energy, via EM interactions. The induced thermal energy is transferred (e.g., by conduction) from the bulk of the row of LEDs 916 to the electrical contacts 920 of the row of LEDs 916 to bond the electrical contacts 920 to the corresponding electrical contacts 922 of the target substrate 918. In this embodiment, the wavelength of the photon pulse 930 is selected so that the bulk of the row of LEDs 916 absorbs at least a significant portion of the photons included in photon pulse 930. As noted above, a semiconductor material, such as gallium nitride (GaN) or gallium arsenide (GaAn), absorbs wavelengths shorter than the wavelength of the photons emitted by the LEDs. Thus, in this embodiment, the wavelength of the photon pulse 922 is selected to be shorter than the wavelength of the photons emitted by the LEDs and longer than 220 nm (so that photon pulse 930 may be transmitted through the pick-up heads 914 without significant absorption or reflection). For example, the LEDs included in row of LEDs 916 may include a layer of gallium nitride (GaN) and emit blue light. The photon pulse 930 may have a wavelength longer than 220 nm and shorter than 360 nm, which results in the photon pulse 930 being significantly absorbed by layer of GaN in the LEDs.

As noted above, in some embodiments the PPH 924 may pick up and place the row of LEDs 916 at once. In other embodiments, each of the monolithic LED chips are picked up and placed individually. The spatial profile of photon pulse 930 may be modulated and/or focused into a beam spot size that has approximately the same spatial dimensions as one of the electrical contacts 920 of row of LEDs 916 or one of electrical contacts 922 of target substrate 918. For example, the spatial profile of photon pulse 930 may be modulated to result in a beam spot on the order of a few μm. In embodiments where the actuated mirror 904 is flat (or substantially flat), the spatial profile of photon pulse 930 may have a substantially circular shape and a diameter of 3-5 μm, or some other diameter. In other embodiments, the actuated mirror 904 has a linearly curved shape, which causes the spatial profile to be linearly shaped. The actuated mirror 904 can then be operated (e.g., via control signals from the controller) to deflect the photon pulse 930 through the microscope objective 910 so that the photon pulse performs a scanning pattern on the plurality of LEDs included in row of LEDs 916 to bond the electrical contacts 920 of each LED to the corresponding electrical contacts 922 of target substrate 918. In one embodiment, the actuated mirror 904 is capable of performing several different scanning patterns in order to improve the bonding quality while controlling the adverse thermal effects caused by the mismatch in CTEs of the row of LEDs 916 and the target substrate 918.

After the electrical contacts 920 of each LED of row of LEDs 916 have been bonded to the corresponding electrical contacts 922 of target substrate 918, the controller raises the PPH 924. Because the bonding process forms a physical connection that fixes the row of LEDs 916 in place, the row of LEDs 916 remain in place on the target substrate 918 when the PPH 924 is raised.

Controlling for Adverse Thermal Effects

Figure 10:
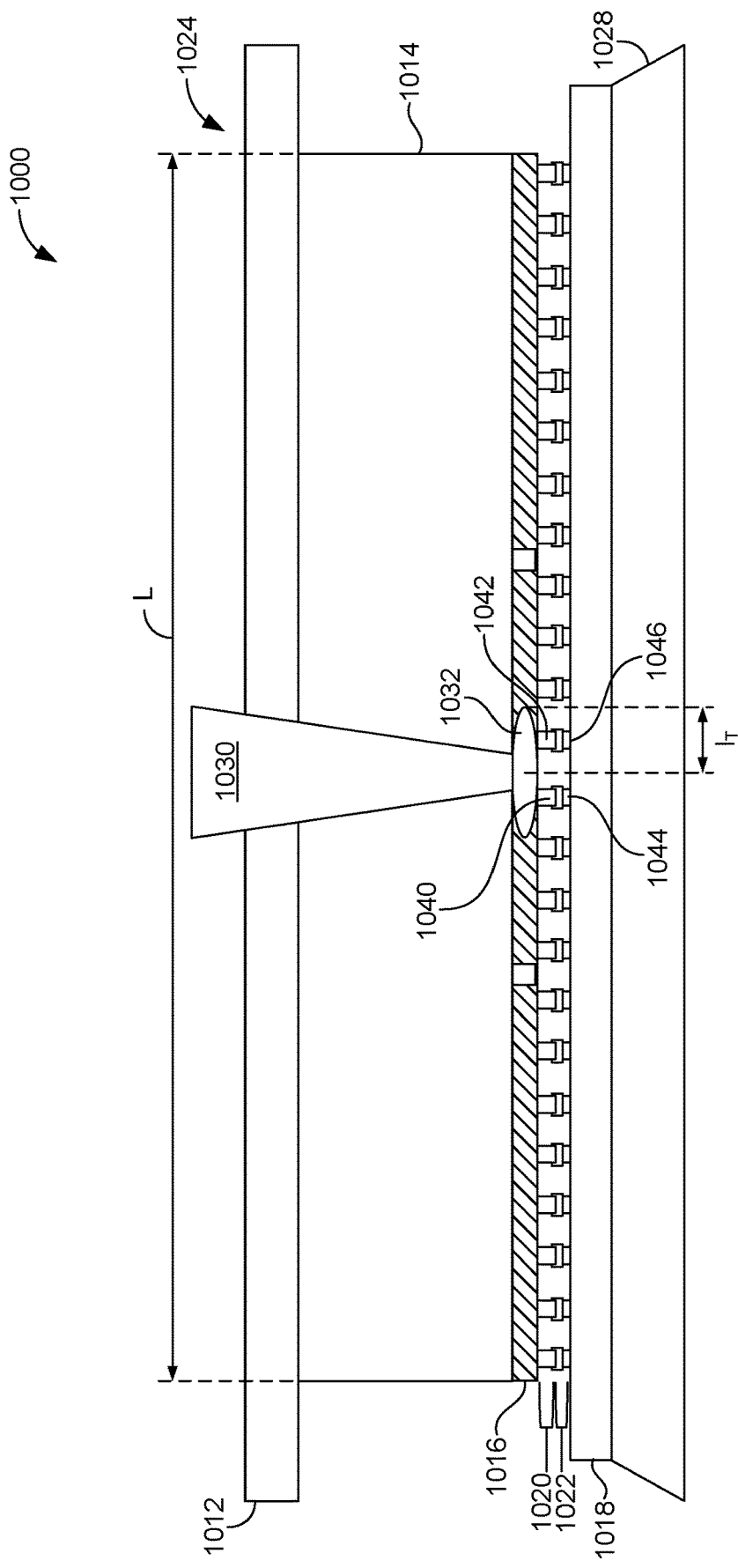
FIG. 10 is a cross-sectional diagram illustrating the localization of laser-induced thermal energy via the modulation of the temporal and spatial profiles of a laser pulse, in accordance with one embodiment.

FIG. 10 is a cross-sectional diagram illustrating the localization of laser-induced thermal energy via the modulation of the temporal and spatial profiles of a laser pulse, in accordance with one embodiment. System 1000 may employ one or more methods, such as but not limited to method 1400 of FIG. 14, for electrically coupling a semiconductor device to a target substrate. System 1000 may be employed to assemble a display device, such as but not limited to display device 104 of FIGS. 1A-1B or display device 1500 of FIG. 15. In FIG. 10, system 1000 is shown bonding the electrical contacts 1020 of row of LEDs 1016 to the electrical contacts 1022 of the backplane 1028, via laser pulse 1030. Although not explicitly shown in FIG. 10, system 1000 may include any of the various components or elements included in system 800 of FIGS. 8A-8B and/or system 900 of FIGS. 9A-9B.

More particularly in FIG. 10, photon pulse 1030 is shown targeting a particular LED of the row of LEDs 1016. The targeted LED includes two electrical contacts 1040 and 1042 of the electrical contacts 1020 of the row of LEDs 1016. Photon pulse 1030 is focused to induce or deposit thermal energy proximate electrical contacts 1040 and 1042 of the targeted LED. In at least one embodiment, electrical contacts 1040 and 1042 may be the n-contact and p-contact, respectively (or vice-versa), of the targeted LED. Electrical contact 1044 of the electrical contacts 1022 of the backplane 1018 corresponds to, and is being bonded to (via the induced thermal energy), electrical contact 1040 of the targeted LED. Similarly, electrical contact 1046 of the electrical contacts 1022 of the backplane 1018 corresponds to, and is being bonded to (via the induced thermal energy), electrical contact 1042 of the targeted LED. In FIG. 10, photon pulse 1030 is selectively targeting the LED to electrically couple electrical contacts 1040, 1042 of the particular LED to the corresponding electrical contacts 1044, 1046 of the backplane 1018. The temporal and spatial profiles of photon pulse 1030 are modulated to temporally and spatially localize the induced thermal energy proximate the targeted LED. By localizing the thermal energy, the adverse thermal effects are controlled, e.g., minimized or at least reduced. For example, as a result of the localization of the thermal energy, any misalignment of the corresponding pairs of electrical contacts of electrical contacts 1020 and electrical contacts 1022, due to the mismatch of the respective CTEs of the row of LEDs 1016 and the backplane 1018, are minimized or at least reduced.

Similar to photon pulse 930 in FIG. 9B, photon pulse 1030 is transmitted through optically transparent PPH 1024 to irradiate the row of LEDs 1016. Similar to PPH 924 of FIGS. 9A-9B, PPH 1024 includes actuated glass slide 1012 and pick-up head 1014. In contrast to PPH 924 of FIGS. 9A-9B and PPH 806 of FIGS. 8A-8B, PPH 1024 includes a single pick-up head 1014, rather than a separate pick-up head for each of the monolithic LED chips included in row of LEDs 1016. In at least one non-limiting embodiment, the spatial dimensions of the surface of the pick-up head 1014 that adheres to the row of LEDs 1016 may be approximately 4000 μm×50 μm. In another non-limiting embodiment, the dimensions are approximately 5000 μm×50 μm. The spatial dimensions of the surface of the pick-up head 1014 may match, or at least be similar to the spatial dimensions of the upper surface of the row of LEDs 1016. At least one of the temporal profile, spatial profile, pulsing frequency, and/or scanning frequency of photon pulse 1030 may be modulated to control for adverse thermal effects, via a controller not shown in FIG. 10.

Row of LEDs 1016 may be similar to any of row of LEDS 740 of FIG. 7C, row of LEDs 816 of FIGS. 8A-8B, or row of LEDs 916 of FIGS. 9A-9B. For instance, row of LEDs 1016 includes three monolithic LED chips, similar to monolithic LED chip 720 of FIG. 7A, wherein each of the monolithic LED chips includes a plurality of integrated LEDs. In contrast to row of LEDs 916 of FIGS. 9A-9B, the electrical contacts for a LED included in row of LEDs 1016 are configured and arranged such that both the electrical contacts for single LED are visible in FIG. 10. In FIG. 10, the n-contacts may not occlude the p-contacts (or vice-versa). Rather, both the n-contact and the p-contact for the targeted LED are visible in FIG. 10, as electrical contacts 1040 and 1042, respectively (or vice-versa).

Backplane 1018 may be a silicon (Si) backplane for a display device. In some embodiments, backplane 1018 may be similar to, and/or included in, backplane 348 of FIGS. 3-4, target substrate 832 of FIGS. 8A-8B and/or target substrate 918 of FIGS. 9A-9B. In at least one embodiment, LED control circuits may be fabricated on backplane 1018. More specifically, complementary metal-oxide-semiconductor (CMOS) structures may be fabricated on backplane 1018 to form the LED control circuits. Once the electrical contacts 1020 are electrically coupled to electrical contacts 1022, the control circuits of the backplane 1018 may operate the LEDs of row of LEDs 1016, such that the LEDs function as pixels for the display device.

In system 1000, backplane 1018 is mounted on a vacuum chuck 1028. Vacuum chuck 1028 may be similar to, and/or included in, target stage 830 of FIGS. 8A-8B. In some embodiments vacuum chuck 1028 may be cooled to further control for adverse thermal effects. In at least one embodiment, vacuum chuck may be cooled to a temperature of approximately 4° C. to further control adverse thermal effects associated with the thermal energy induced via photon pulse 1030. The length of the row of LEDs 1020 is indicated by L. In at least one non-limiting embodiment, L~4 mm. As discussed above, in some embodiments, the electrical contacts 1020 of row of LEDS 1016 may be fabricated from a copper-tin (CuSn) alloy, and the electrical contacts 1022 of the backplane 1018 may be fabricated from a copper (Cu) alloy. In other embodiments, at least one of electrical contacts 1020 and/or 1022 may be a gold (Au) and/or silver (Ag) electrical contact. As noted throughout, the contacts and/or interconnects are not limited to CuSn or Au contacts. The contacts may be comprised of other metallic or non-metallic conductors and/or conductive alloys. The contacts may be with or without flux and/or underfill. In other embodiments, the contacts may include flux and/or underfill. In some embodiments, pick-up head 1014 may be a conformable, but non-reusable pick-up head. Conformable pick-up head 1014 may include a non-reusable polymer layer, such as but not limited to polydimethylsiloxane (PDMS). As noted above, in some embodiments, a PDMS pick-up head may be a reusable pick-up head. That is, a PDMS pick-up head may be re-used, a least for a few pick-up events.

The distribution of thermal energy induced by photon pulse 1030, within the row of LEDs 1016, is indicated by oval 1032. In contrast to photon pulse 830 of FIG. 8B, which is substantially absorbed by electrical contact 826 of the targeted LED and/or the corresponding electrical contact 828 of that target substrate 818, photon pulse 1030 is substantially absorbed within the body (or bulk) of the targeted LED of the row of LEDs 1016. As shown by oval 1032, the thermal energy induced by photon pulse 1030 is substantially spatially localized within the targeted LED and proximate the targeted LED's contacts 1040 and 1042. The localization of the thermal energy is characterized by a heat diffusion length ($l_T$), as shown in FIG. 10. The heat diffusion length (and thus the localization of the thermal energy) is dependent on various properties and/or features of the row of LEDs 1016 and the photon pulse 1030. Any of the various properties and/or features of the row of LEDs 1016 and the photon pulse 1030 may be modulated to control the heat diffusion length. By controlling the heat diffusion length of the thermal energy induced by photon pulse 1030, the induced thermal energy is localized. By adequately localizing the thermal energy, the adverse thermal effects may be reduced.

The heat diffusion length may be dependent upon the thermal diffusivity coefficient (D) of semiconductor material of the row of LEDs 1016, as well as one or more factors that depend upon the geometry (e.g., thickness, length, and width) of the monolithic LED chips. As noted throughout, the LEDs may be fabricated from various semiconductor materials, such as but not limited to GaN and GaAs. In a non-limiting embodiment for GaN LEDs, . . . . In a non-limiting embodiment for GaN LEDs, $D_{GaN} \approx 0.43$ cm$^2$s$^{-1}$. The heat diffusion length may depend upon the spatial and/or temporal profiles of photon pulse 1030. For example, the heat diffusion length may be dependent upon the spatial pulse width (e.g., beam spot size and/or shape) and the temporal pulse width (e.g., pulse duration) of the photon pulse 1030. In various embodiments, the heat diffusion length may be at least approximately modeled to scale as, where, where as, $l_T \approx \xi(D \cdot \tau)^{1/2}$, where D (i.e., the thermal diffusivity coefficient) is dependent upon physical properties of the semiconductor material, τ represents the temporal pulse width, and ξ is a geometric factor that depends on the geometry of the LEDs included in row of LEDs 516. In some embodiments. In some embodiments, the temporal and/or spatial profiles are modulated such that the heat diffusion length is on the order of tens of nanometers. For example, the temporal pulse width may be reduced to sub-picosecond values. Thus, the induced thermal energy is localized to a volume that is much smaller than the structures included in the LEDs. In other embodiments, the heat diffusion length may be controlled to include values. In some embodiments, the temporal and/or spatial profiles are modulated such that the heat diffusion length is on the order of tens of nanometers. For example, the temporal pulse width may be reduced to sub-picosecond values. Thus, the induced thermal energy is localized to a volume that is much smaller than the structures included in the LEDs. In other embodiments, the heat diffusion length may be controlled to include values ξ≈1. In some embodiments, the temporal and/or spatial profiles are modulated such that the heat diffusion length is on the order of tens of nanometers. For example, the temporal pulse width may be reduced to sub-picosecond values. Thus, the induced thermal energy is localized to a volume that is much smaller than the structures included in the LEDs. In other embodiments, the heat diffusion length may be controlled to include values measured in a few, or tens, of microns. For example, laser pulses of a pulse duration of tens of nanoseconds may result in the localization of the thermal energy to a volume on the order of the size of the structures included in the LEDs.

Thus, to control for adverse thermal effects (e.g., misalignment of the corresponding pairs of electrical connections), while also optimizing, or at least increasing, the quality of the resulting electrical couplings, the spatial and/or temporal profiles of the pulsed laser, as well as the pulsing frequency (e.g., the pulsing repetition rate) and scanning frequency (e.g., the scan speed) may be modulated based on one or more of the semiconductor chip geometry (e.g., thickness, length, and width), semiconductor material (e.g., GaN or GaAs), wavelength and bandgap of the laser, material included in the electrical contacts (e.g., Cu, CuSn, or Au), and the temperature of the target substrate 1028. Modulating the spatial profile of the laser pulse may include modulating and/or varying spatial features of the pulse, such as but not limited to the spatial pulse width, beam spot size (e.g., varying the beam spot size from sub-micron values to values ranging in the tens of microns), beam spot shape (e.g., circular or linear), laser fluence (e.g., in the range of 0-100 $mJ/cm^2$), and the like. Modulating the temporal profile of the laser pulse may include modulating and/or varying temporal features of the pulse, such as but not limited to the temporal pulse width, pulse duration, or the like. For example, the temporal pulse width may be varied from sub-picosecond values to values on the order of 100 nanoseconds. The pulsing frequency may be varied from values between 1 Hz to tens or even hundreds of MHz.

In various embodiments, multiple and/or separate photon pulses may be employed to bond, affix, and/or electrically couple the electrical contacts of at least two semiconductor devices. The separate pulses may be from multiple and/or separate photon sources. The separate photon pulses may be comprised of separate wavelengths of photons and/or beam spot sizes. Each separate photon pulse may provide varying numbers of pulses, duty cycles, and/or energy levels to optimize the bonding process. For example, different metallization schemes in different semiconductor devices may call for different wavelengths, beam spots sizes, different number of pulses, duty cycles, energy levels, and the like. Each of the various characteristics of the separate photon pulses (e.g., temporal profile, spatial profile, and the like) may be separately modulated to optimize the bonding of the electrical contacts based on the features, geometries, and/or materials of the semiconductor device and/or of the electrical contacts. The multiple separate pulses and/or separate pulses from separate photon sources may be combined via a beam combiner to form a single beam spot using various focusing optical components, e.g., one or more optical lenses. That is, multiple photon pulses may be combined to irradiate the semiconductor devices to bond the electrical contacts of the semiconductor devices. The spatial and/or temporal profile of each photon pulse may be separately modulated to optimize the bonding process.

FIG. 11A is a side-view diagram illustrating a row of LEDs that includes an elastomeric interface layer (e-layer) applied to the top surface of the row of LEDs, in accordance with the various embodiments. Rows of LEDs 1116 may be similar to row of LEDs 740 of FIG. 7C. In addition to three monolithic LED chips and electrical contacts, row of LEDs 1116 includes an e-layer 1150 applied on the upper surfaces of row of LEDs 1116. The e-layer may include polydimethylsiloxane (PDMS).

FIG. 11B is a cross-sectional diagram illustrating employment of a re-usable pick-up head to position a row of LEDs on a target substrate. System 1100 may employ one or more methods, such as but not limited to method 1400 of FIG. 14, for electrically coupling a semiconductor device to a target substrate. System 1100 may be employed to assemble a display device, such as but not limited to HMD 100 of FIGS. 1A-1B and/or display device 1500 of FIG. 15. System 1100 may be similar to system 1000 of FIG. 10. For example, in FIG. 11, system 1100 is shown bonding the electrical contacts of row of LEDs 1116 to the electrical contacts of the target substrate 1118, via laser pulse 1130. Via the modulation of the temporal and/or spatial profile of laser pulse 1130, the induced thermal energy is adequately localized and any adverse thermal effects are adequately controlled.

As shown in FIGS. 11A-11B, row of LEDs 1116 include e-layer 1150. System 1100 includes PPH 1124. In contrast to the pick-up head 1014 of PPH 1024 of FIG. 10, PPH 1124 includes an optically transparent and re-usable pick-up head 1114. Pick-up head 1114 may be a non-conformable pick-up head. Pick-up head 1114 may be fabricated from optically transparent fused silica. Pick-up head 1114 is adhered to the e-layer 1150 of row of LEDs 1116. For the embodiments shown in FIGS. 11A-11B, because of the significantly larger surface area of the upper surface of row of LEDs 1116, the application of the e-layer is significantly easier than the application of an e-layer to the smaller upper surface of an individual LED die or chip. For example, LEDs need not be discrete or singulated LEDs. Rather, as shown and discussed in conjunction with at least FIG. 7B, the individual LEDs may be integrated into a monolithic LED chip that includes at least a full row of LEDs comprising 10 chips. With such a rectangular monolithic chip structure, the fabrication of an e-layer is significantly easier than fabricating an e-layer on singulated LEDs or a group of discrete LED chips. Furthermore, picking-up, manipulating, and aligning a single monolithic LED chip with a backplane is significantly easier than similar operations on a singulated LEDs.

Because re-usable pick-up head 1114 can pick up and position the entirety of row of LEDs 1116 on the target substrate 1118, via the e-layer 1150, and the e-layer 1150 is relatively easy to apply to the upper surface of row of LEDs 1116, the embodiments shown in FIGS. 11A-11B provide various advantages over conventional methods that pick-up and position individual LED chips. For example, the embodiments of FIGS. 11A-11B are more efficient and enable faster assembly of a display device, as compared to conventional methods of positioning individual LEDs on a target substrate.

Figure 12A:
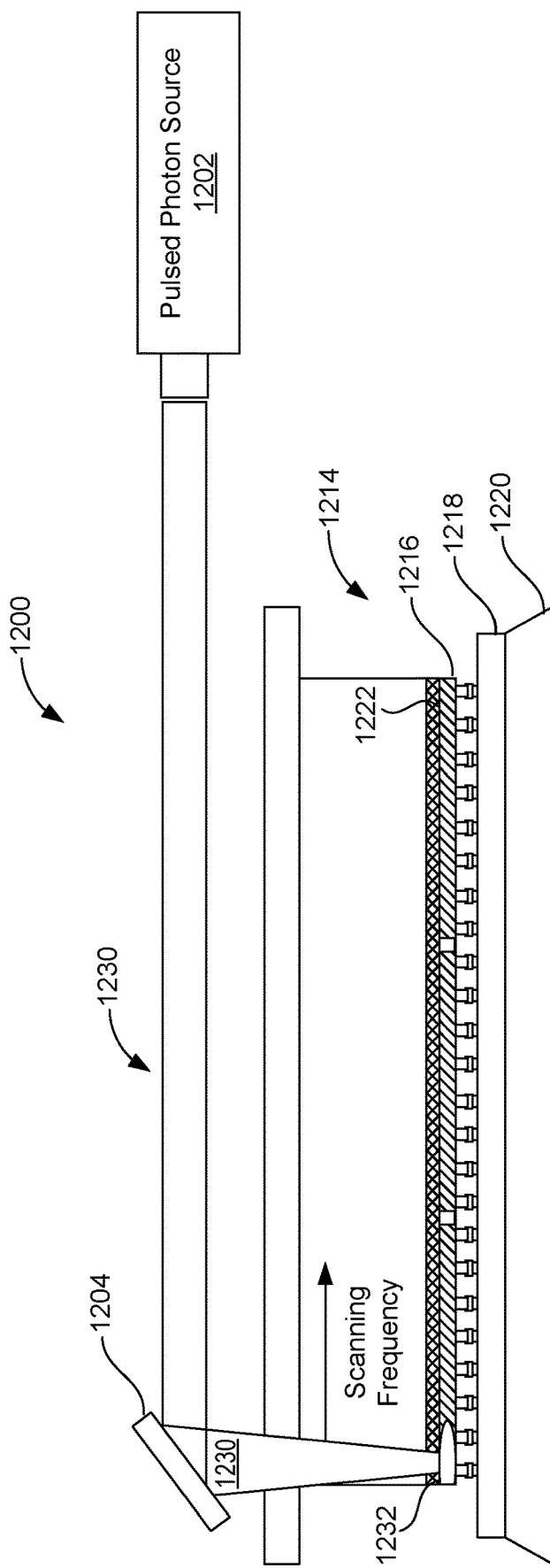
FIG. 12A is a diagram illustrating a system for scanning a pulsed photon source across a row of LEDs for selective bonding of the LEDs to a target substrate, in accordance with various embodiments.

FIG. 12A is a diagram illustrating a system 1200 for scanning a pulsed photon source across a row of LEDs for selective bonding of the LEDs to a target substrate, in accordance with various embodiments. System 1200 may employ one or more methods, such as but not limited to method 1400 of FIG. 14, for electrically coupling a semiconductor device to a target substrate. System 1200 may be employed to assemble a display device, such as but not limited to display device 104 of FIGS. 1A-1B and/or display device 1500 of FIG. 15. System 1200 may be similar to any of systems 800, 900, 1000, or 1100 previously discussed. System 1200 includes a pulsed photon source 1202, an actuated mirror 1204, a PPH 1214, a row of LEDs 1216, a target substrate 1218, and a target carrier 1220. These various components may be similar to the corresponding components discussed in the previous systems. For example, similar to other pulsed photon sources discussed herein, pulsed photon source 1203 may emit photon pulses 1230. Similar to actuated mirror 904 of system 900, actuated mirror 1204 may scan the photon pulses 1230 across the row of LEDs 1216. The spatial and temporal profiles, as well as the pulsing frequency and the scanning frequency of photon pulses 1230 may be modulated to control for adverse thermal effects. The scanning frequency may be modulated via the control of actuated mirror 1204. The scanning frequency (and direction) of the scanning photon pulses is shown by the vector labeled as scanning frequency. For example, the photon pulses 1230 may be scanned from left to right (or any other scanning pattern) across the upper surface of the row of LEDs 1216. Note that in system 1200, the photon pulse 1230 is incident upon, and irradiates, a top surface 1222 of the row of LEDs 1216. Oval 1232 indicates the photon pulse 1230 is substantially absorbed by the row of LEDs 1216 and the thermal effects are localized to a single, or pair, of electrical contacts of a single LED within the row of LEDs 1216.

Figure 12B:
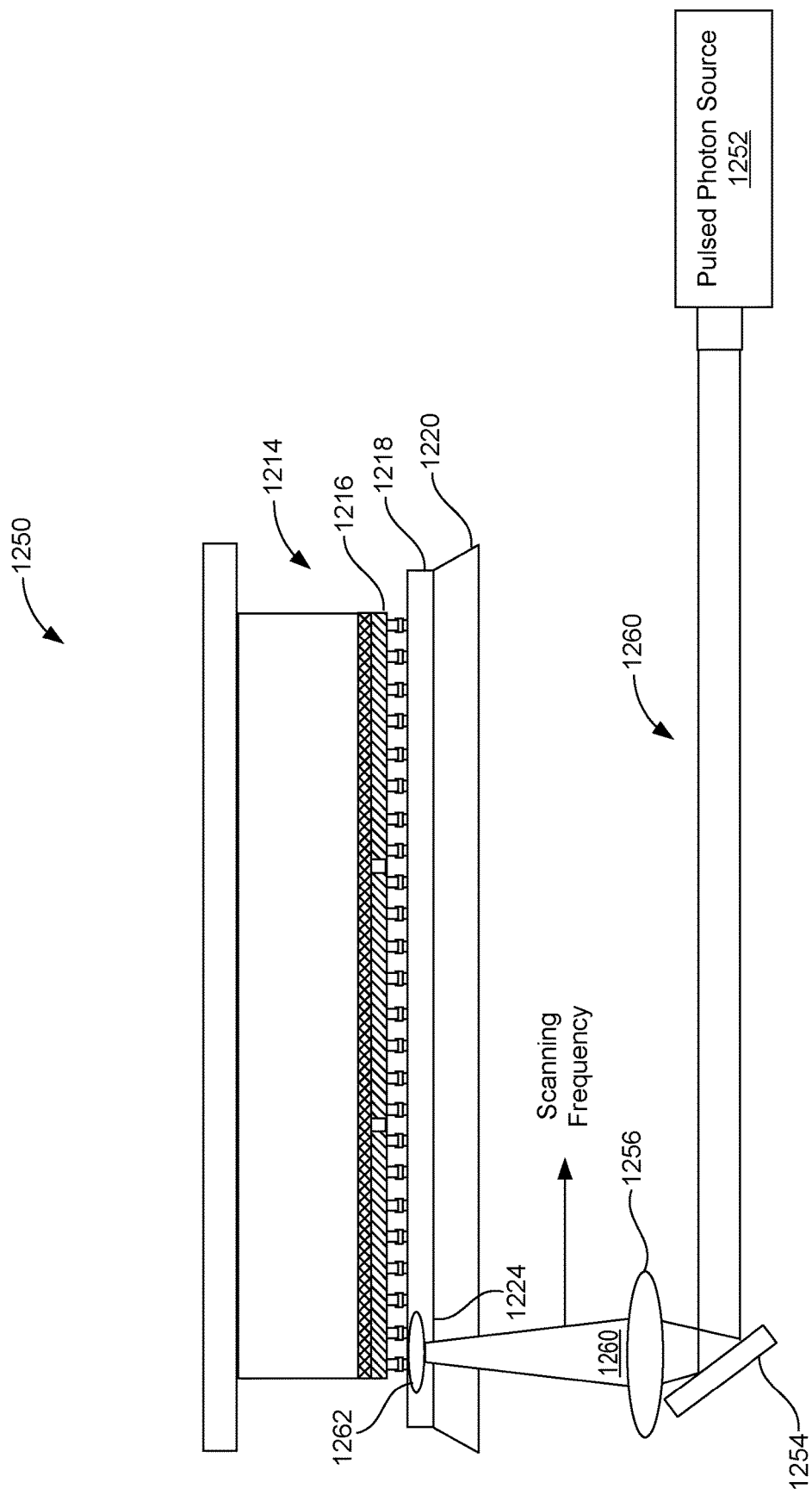
FIG. 12B is a diagram illustrating an alternative system for scanning a pulsed photon source across a row of LEDs for selective bonding of the LEDs to a target substrate, in accordance with various embodiments.

FIG. 12B is a diagram illustrating an alternative system 1250 for scanning a pulsed photon source across a row of LEDs for selective bonding of the LEDs to a target substrate, in accordance with various embodiments. System 1250 may employ one or more methods, such as but not limited to method 1400 of FIG. 14, for electrically coupling a semiconductor device to a target substrate. System 1250 may be employed to assemble a display device, such as but not limited to display device 104 of FIGS. 1A-1B and/or display device 1500 of FIG. 15. System 1250 may be similar to system 1200 of FIG. 12A in that system 1250 includes a pulsed photon source 1252, an actuated mirror 1254, a PPH 1214, a row of LEDs 1216, a target substrate 1218, and a target carrier 1220. In at least some embodiments, the systems discussed herein, including system 1250, may include one or more optical elements to modulate the spatial profile of the photon pulse. For example, system 1250 include lens 1256 to focus or shape the spatial profile of photon pulse 1260.

In contrast to system 1200, the pulsed photon source 1252, actuated mirror 1254, and lens 1256 of system 1250 are configured and arranged such that the photon pulses 1260 are incident upon, and irradiate, a back (or bottom) surface 1224 surface of the target substrate 1218. Thus, in some embodiments, photon pulse 1260 may be transmitted through the target carrier 1220 and at least a portion of the target substrate 1218. In these embodiments, the target carrier 1220 and/or the target substrate 1218 may be at least partially optically transparent to the photon pulse 1260. For example, the target substrate 1220 and/or the target substrate 1218 may be comprised of optically transparent glass. Oval 1262 indicates the photon pulse 1260 is substantially absorbed by the target substrate 1218 and the thermal effects are localized to a single, or pair, of electrical contacts of target substrate 1218. As shown in FIG. 12B, in one embodiment, the target carrier 1220 may be optically transparent and does not absorb photon pulse 1260. The wavelength of the photon pulse 1260 and/or focal length of lens 1256 may be modulated so that a significant portion of energy of the photon pulse 1260 is absorbed within the bulk of the target substrate 1218.

Figure 12C:
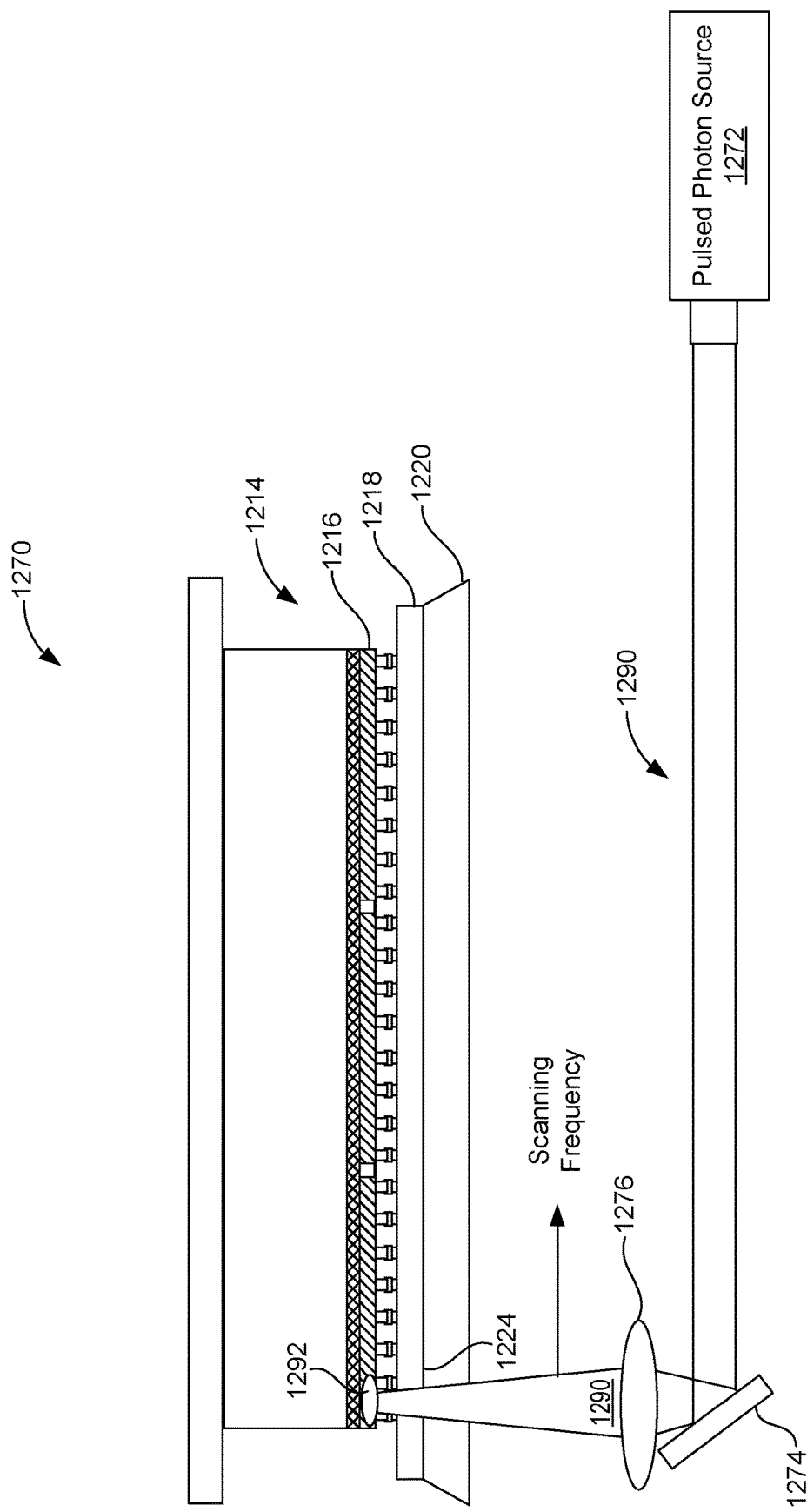
FIG. 12C is a diagram illustrating still another alternative system for scanning a pulsed photon source across a row of LEDs for selective bonding of the LEDs to a target substrate, in accordance with various embodiments.

FIG. 12C is a diagram illustrating still another alternative system 1270 for scanning a pulsed photon source across a row of LEDs for selective bonding of the LEDs to a target substrate, in accordance with various embodiments. System 1270 may employ one or more methods, such as but not limited to method 1400 of FIG. 14, for electrically coupling a semiconductor device to a target substrate. System 1250 may be employed to assemble a display device, such as but not limited to display device 104 of FIGS. 1A-1B and/or display device 1500 of FIG. 15. System 1270 may be similar to system 1250 of FIG. 12B, in that system 1270 includes a pulsed photon source 1272, an actuated mirror 1274, lens 1276, a PPH 1214, a row of LEDs 1216, a target substrate 1218, and a target carrier 1220.

Similar to system 1250 of FIG. 12B, the pulsed photon source 1272, actuated mirror 1274, and lens 1276 of system 1270 are configured and arranged such that the photon pulses 1290 are incident upon, and irradiate, a back (or bottom) surface 1224 surface of the target substrate 1218. In contrast to system 1250, where photon pulse 1260 is absorbed within the target substrate 1218, in FIG. 12C, oval 1292 indicates the photon pulse 1290 is substantially absorbed by the row of LEDs 1216 and the thermal effects are localized to a single, or pair, of electrical contacts of a single LED within the row of LEDs 1216. That is, photon pulse 1290 is transmitted through both the target carrier 1220 and the target substrate 1218 without a significant loss of energy. In this way, the thermal energy induced via photon pulse 1290 is induced and/or localized within a single LED of the row of LEDs 1216. In some embodiments, the thermal energy is induced and/or localized within a pair of LEDs of the row of LEDs. In some embodiments, the thermal energy is localized at an electrical contact, or a pair of electrical contacts, of a single LED of the rows of LEDs 1216. In such embodiments, the target carrier 1220 and the target substrate 1218 are optically transparent to photon pulse 1290. In FIG. 12C, the target carrier 1220 and the target substrate 1218 are optically transparent and do not absorb photon pulse 1260. For example, the target carrier 1220 and the target substrate may be comprised of optically transparent glass. The wavelength of the photon pulse 1290 and/or focal length of lens 1276 may be modulated so that photon pulse 1290, incident upon back surface 1224 of the target substrate 1218, is transmitted through target carrier 1220 and target substrate 1218, without significant energy loss. Rather, a significant portion of energy of the photon pulse 1290 is absorbed within the bulk of a single LED included in the row of LEDs 1216. In such embodiments, the thermal effects may be localized to an electrical contact (or a pair of electrical contacts) of the single LED included in the row of LEDs. In other embodiments, the significant portion of the energy of the photon pulse 1290 is absorbed within the bulk of a two (or more) LEDs included in the row of LEDs 1216.

Figure 13:
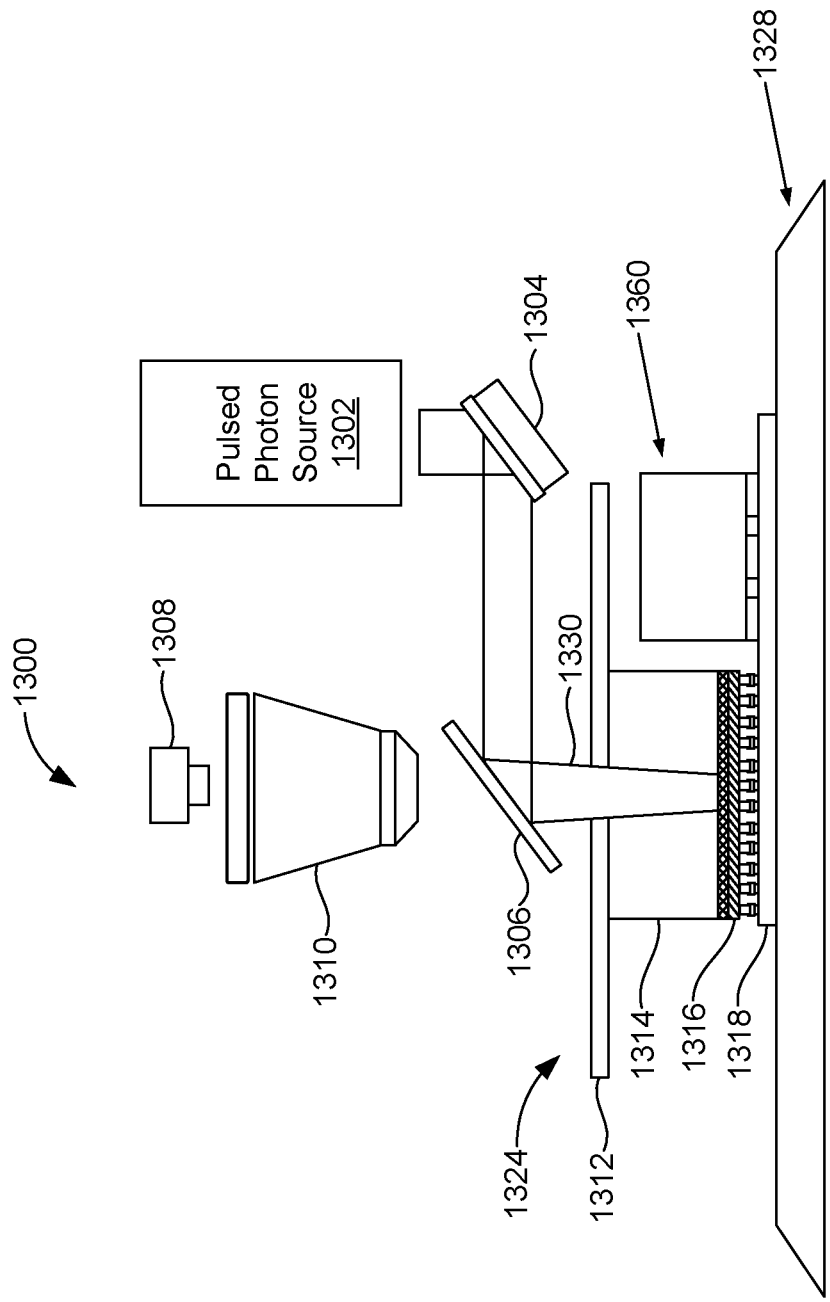
FIG. 13 is a diagram illustrating a system for selective bonding of rows of LEDs, via a pulsed photon source, employing a specialized pick-up head, in accordance with various embodiments.

FIG. 13 is a diagram illustrating a system for selective bonding of rows of LEDs, via a pulsed photon source, employing a specialized pick-up head, in accordance with various embodiments. System 1300 may employ one or more methods, such as but not limited to method 1400 of FIG. 14, for electrically coupling a semiconductor device to a target substrate. System 1300 may be employed to assemble a display device, such as but not limited to display device 1500 of FIG. 15. System 1300 may be similar to any of the previously discussed systems. For example, similar to system 900 of FIGS. 9A-9B, system 1300 includes pulsed photon source 1302, actuated mirror 1304, dichroic mirror 1306, imaging device 1308, microscope objective 1310, row of LEDs 1316, backplane 1318, PPH 1324, and vacuum chuck 1328. Vacuum chuck 1328 may be cooled via a thermoelectric cooling method, such as but not limited to a method that employs the Peltier effect to generate a heat flow away from vacuum chuck 1328. For example, a Peltier cell (not shown in FIG. 13) may be employed to cool vacuum chuck 1328 to a temperature of approximately 4° C.

Backplane 1318 includes an LED driver IC 1360, which was pre-bonded onto the backplane 1318, prior to the backplane 1318 being positioned on the vacuum chuck 1328 within system 1300. The LED driver IC 1360 may drive the control circuit signals included in the backplane 1318 that control the LEDs included in the row of LEDs 1316. The height of the LED driver IC 1360 is larger compared to the height of the row of LEDs 1316.

The PPH 1324 may be similar to PPH 924 of FIGS. 9A-9B, in that PPH 1324 includes an actuated glass slide 1312 and pick-up-head 1314. Note that the thickness of the pick-up head 1314 has been increased to enable the relatively tall LED driver IC 1360 to fit below the actuated glass slide 1312. Being able to accommodate the height of the LED driver IC 1360 within system 1300 allows for in-situ bonding of LED driver circuit 1360 to backplane 1318. Thus, in the various embodiments, the shape of the pick-up head 1314 may be modulated to accommodate varying chip geometries and allowing for in-situ bonding of chips of varying geometries. That is, because the laser pulse 1330 is transmitted through the optically-transparent pick-up head 1314, and the pick-up head 1314 does not substantially absorb the photons in the pulse, the thickness (or height) of the pick-up head 1314 may be varied to accommodate various chip geometries. Such an ability further increases the speed and efficiency for assembling display devices.

Figure 14:
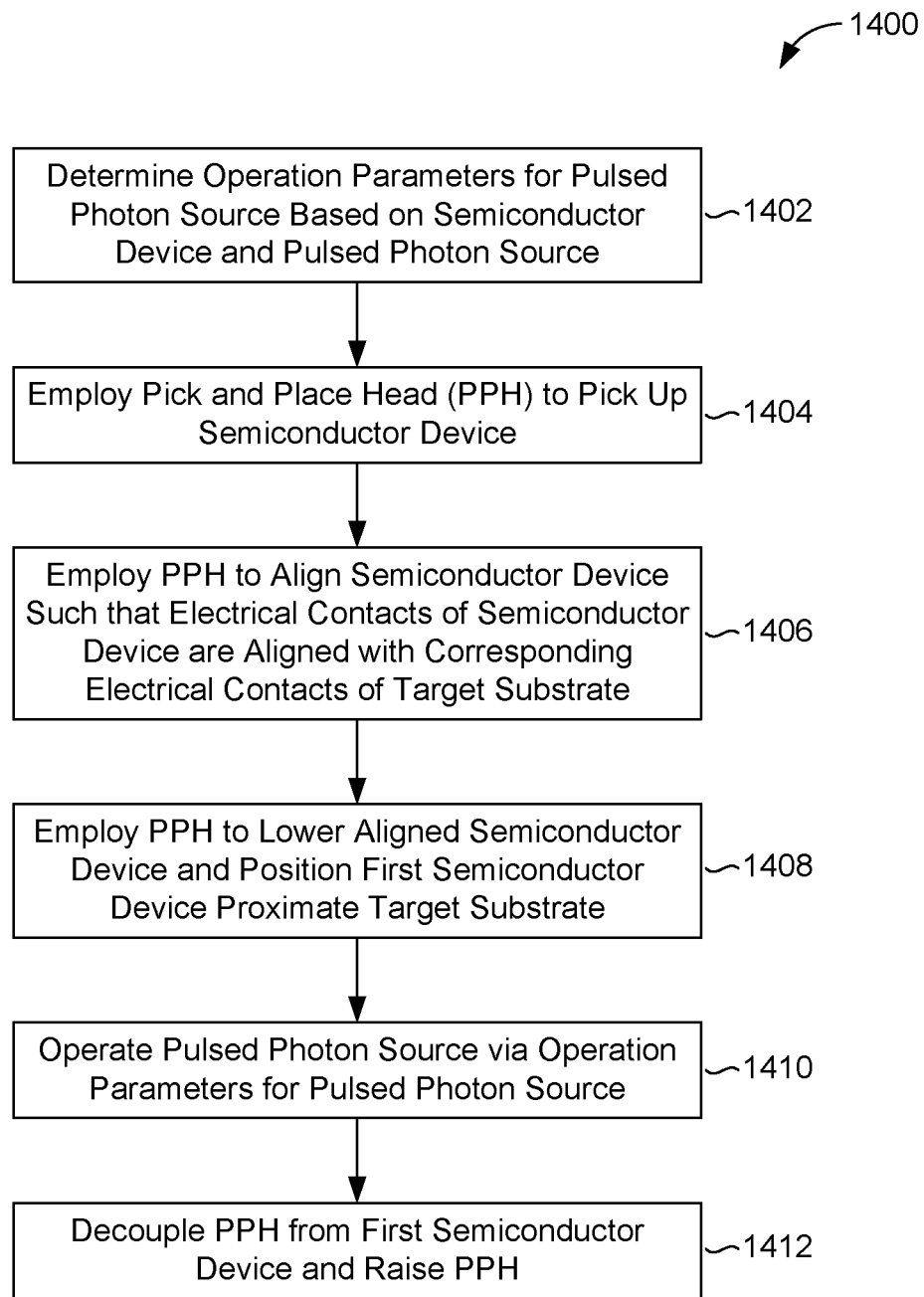
FIG. 14 illustrates one embodiment of an enhanced process flow for selectively bonding semiconductor devices, via a pulsed photon source, and controlling for adverse thermal effects, consistent with the various embodiments.

Generalized Processes for Selectively Bonding Semiconductor Devices Via a Pulsed Laser FIG. 14 illustrates one embodiment of an enhanced process flow for selectively bonding semiconductor devices, via a pulsed photon source, and controlling for adverse thermal effects, consistent with the various embodiments. Process 1400 may be employed to bond, affix, and/or electrically couple the electrical contacts of a semiconductor device to the electrical contacts of a target substrate, while controlling for adverse thermal effects associated with thermal energy induced by a photon pulse emitted by the pulsed photon source. Process 1400 may be employed to assemble a display device, such as but not limited to display device 104 of FIGS. 1A-1B and/or display device 1500 of FIG. 15.

At least portions of process 1400 may be implemented by any of systems 800, 900, 1000, 1100, 1200, or 1300 of FIGS. 8A-13. As such, the semiconductor device may include a row of LEDs, such as but not limited to row of LEDs 816 of FIGS. 8A-8B and/or row of LEDs 916 of FIGS. 9A-9B. In at least one embodiment, the LEDs included in the row of LEDs are similar to LED 600A of FIG. 6A and/or 600B of FIG. 6B. The LEDs may be μLEDs. The semiconductor device may be another type of light-emitting component (LEC). In other embodiments, the semiconductor device need not be a light-emitting device. For example, the semiconductor device may include a transistor, a non light-emitting diode, a resistive element, a capacitor, a microelectromechanical (MEMs) device, and the like. In some embodiments, the semiconductor device may include a logic device (e.g., a processors and/or an array of logic gates), a memory device (e.g., a SRAM, DRAM, and/or EEPROM), or any other integrated circuit (IC) device. The semiconductor device may include a linear or a 2D array of semiconductor devices. The target substrate may be a backplane for a display, such as but not limited to backplane 348 of FIGS. 3-4, backplane 1018 of FIG. 10 and/or backplane 1502 of FIG. 15. In some embodiments, the row of LEDs is a first semiconductor device and the target substrate is a second semiconductor device. The various operations, blocks, actions, and/or steps of process 1400 may be implemented via executing instructions on a processor device and/or controller device. When the instructions are executed, the processor device and/or controller device may cause the performance of the various operations, blocks, actions, and/or steps of process 1400. The instructions may be stored on a non-transitory computer-readable storage medium and/or media.

As used herein, computer-readable storage media and/or medium can be any available media that can be accessed by a computing device and includes both volatile and nonvolatile media, and removable and non-removable media. By way of example, and not limitation, computer-readable media may comprise computer storage media and communication media. Computer storage media includes both volatile and nonvolatile, removable and non-removable media implemented in any method or technology for storage of information such as computer-readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computing device. Non-transitory computer-readable storage media does not comprise signals per se. Communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer-readable media.

Process 1400 begins at block 1402, where operation parameters for the pulsed photon source are determined. The operation parameters may be determined based on the semiconductor device, the target substrate, and/or the pulsed photon source. The determined operation parameters may include values for any operation parameter that may be controlled and/or varied to modulate at least one of the temporal profile or the spatial profile of a photon pulse emitted by the pulsed photon source in order to control for adverse thermal effects.

The determined operation parameters may include the temporal pulse width and/or a spatial pulse width of the photon pulse. For example, the operation parameters may include a pulse duration, a beam spot size, and/or a beam spot shape of the photon pulse. As another example, the operation parameters may also include a pulsing frequency (e.g., pulse repetition rate) and/or a scanning frequency (e.g., a scanning speed) of the photon pulse. As yet another example, the operation parameters may include the fluence of the photon pulse. The operation parameters may be based on semiconductor materials and/or conductive materials (e.g., materials included in the electrical contacts) included in either the semiconductor device and/or the target substrate. For example, the operation parameters may be based on a thermal diffusivity of the semiconductor materials. The operation parameters may also be based on a geometry of the semiconductor device and/or the target device. The operation parameters may be further based on the wavelength of the photons emitted by the pulsed photon source. The operation parameters may be based on a temperature of a target stage that holds the target substrate (e.g., a cooled vacuum chuck).

Determining the operation parameters may include determining the heat diffusion length associated with the photon pulse. The heat diffusion length may be based on a thermal diffusivity of the semiconductor material, the geometry of the semiconductor device, and the spatial and/or temporal profile of the photon pulse. The operation parameters are determined, such that adverse thermal effects resulting from thermal energy induced by the photon pulses irradiating the semiconductor device, are adequately modulated, while resulting in high quality mechanical and electrical couplings of the electrical contacts of the semiconductor device and the target substrate. In some embodiments, the adverse thermal effects are localized at an electrical contact (or a pair of electrical contacts) of the semiconductor device.

At block 1404, a pick and place head (PPH) (or a pick-up head of the PPH) is employed to pick up the semiconductor device. For instance, the semiconductor device may be picked up from a carrier substrate, such as but not limited to carrier substrate 822 of FIGS. 8A-8B. In some embodiments, at block 1404, the PPH (and/or the pick-up head) is employed to transport the semiconductor device from the carrier substrate to be positioned above the target substrate.

At block 1406, the PPH (or the pick-up head) is employed to align the semiconductor device. Aligning the semiconductor device may include aligning the electrical contacts of the semiconductor device with the corresponding electrical contacts of the target substrate. Aligning the semiconductor device may include spatially aligning an electrical contact of the semiconductor device with a corresponding electrical contact of the target substrate. At block 1408, the PPH (or the pick-up head) is employed to lower the aligned semiconductor device. Lowering the semiconductor device may include positioning the first semiconductor device proximate to the target substrate.

Additionally at block 1406, the PPH (and/or the pick-up head) may be employed to hold the first semiconductor device tightly and firmly against the target substrate until all (or at least a significant portion thereof) the electrical contacts between the first semiconductor device and target substrate are in contact with each other, or at least with less than 10 nm gap. This PPH (and/or pick-up head) may stay in the same condition (holding the first semiconductor device tightly and/or firmly) and position (ensure electrical contacts between the first semiconductor device and target substrate are aligned) throughout the bonding session until the last electrical contacts are bonded by the pulsed laser. This PPH (and/or the pick-up head) is considered fully or almost fully "transparent" to the pulsed laser where it will absorb none, or at least negligible, energy from the pulsed laser, which may affect the bonding effect or the pick-up head. The pick up head may avoid damage and/or loss of its functions due to degradation effect resulted from the energy of the pulsed laser.

At block 1410, the pulsed photon source is operated via the determined operation parameters for the pulsed photon source. In some embodiments, a controller may operate the pulsed photon source. The controller may control the temporal and/or spatial profile of the photon pulse based on the determined operation parameters. Operating the pulsed photon source may include transmitting the photon pulse with a temporal profile and/or spatial profile that is modulated based on the operation parameters. As noted throughout, the temporal profile and/or the spatial profile of the transmitted photon pulse is modulated to control adverse thermal effects associated with the thermal energy induced by the photon pulse. The thermal energy bonds the aligned electrical contact of the semiconductor device to the corresponding electrical contact of the target substrate. For example, the thermal energy may catalyze the formation of at least one of chemical bonds, metal bonds, covalent bonds, and/or polymerization bonds (e.g., within underfill materials and polymeric materials). In at least one embodiment, the photon pulse irradiates the semiconductor device. In some embodiments, the photon pulse may be transmitted through the PPH (and the pick-up head), as the PPH (via the pick-up head) is still coupled (or adhered) to the semiconductor device. By transmitting the photon pulse through the PPH, the PPH may stabilize the alignment of the semiconductor device, further controlling adverse thermal effects. Operating the pulsed photon source may include scanning the pulsed photon source across semiconductor device to selectively bond each of the contacts. At block 1412, the PPH is decoupled from the semiconductor device and the PPH may be raised to transport another semiconductor device to the target substrate.

Additional Display Devices

Figure 15:
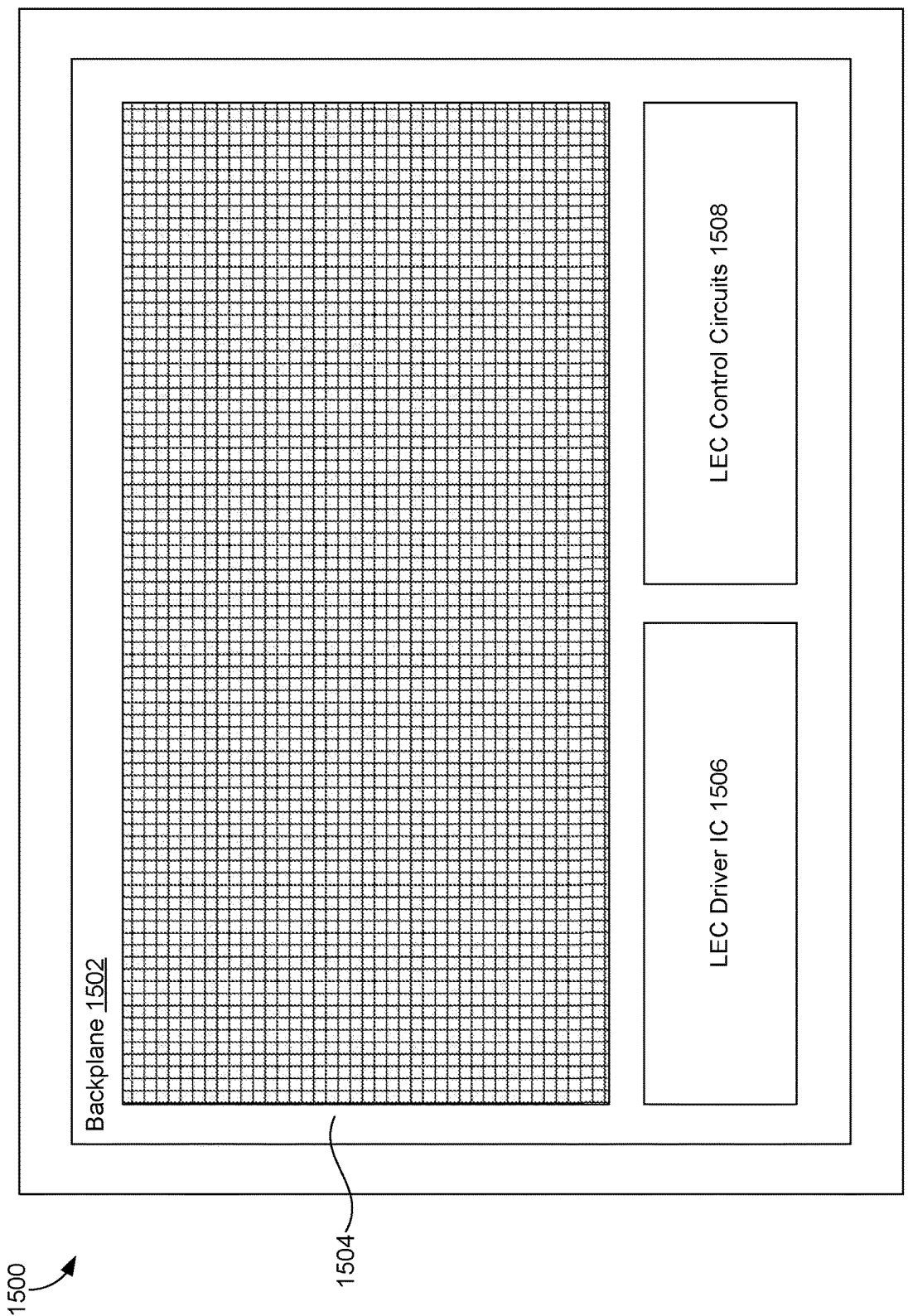
FIG. 15 schematically illustrates a display device that is consistent with the various embodiments.

FIG. 15 schematically illustrates a display device that is consistent with the various embodiments. Display device 1500 includes a display backplane 1502. The backplane 1502 may be a display substrate having a plurality of electrical contacts arranged thereon. A plurality of light-emitting components (LECs) may form a 2D array of pixels 1504. For example, each pixel of the array of pixels 1004 may include three LECs: a red (R) LEC, a green (G) LEC, and a blue (B) LEC. The three LECs may form an RGB pixel. As shown in FIG. 15, the pixels 1504 may be arranged in rows and columns of pixels. The LECs may be arranged in rows to form the rows and columns of pixels 1504. Each LEC may include one or more of electrical contacts. For instance, each LEC may include at least two electrical leads, e.g., an n-contact and a p-contact. The LECs may be LEDs or µLEDs. Thus, display device 1500 may be an LED display of a µLED display. A plurality of electrical couplings affixes the leads of the LECs to corresponding electrical contacts of the backplane 1502. The backplane 1502 may include LEC control circuits 1508 to control the operation of the LECs that comprise pixels 1504. Backplane 1502 may additionally include an LEC driver integrated circuit (IC) 1506. LEC drive IC 1506 may include similar functionality as LED driver IC 1360 of FIG. 13.

Display device 1500 may be at least partially assembled via method 1400 of FIG. 14. In some embodiments, display device 1500 may be included in mobile, non-mobile, and/or wearable computing devices. For example, display device 1500 may be integrated into devices such as but not limited to smart phones, tablets, smartwatches, laptops, desktops, televisions (TVs), and head mounted devices, such as virtual reality (VR) and augmented reality (AR) devices. In various embodiments, display device 1500 may be included in display device 104 of FIGS. 1A-1B. That is, display device 1500 may be a near-eye display (NED) included in a head-mounted computing device, such as but not limited to HMD 100 of FIGS. 1A-1B. As such, backplane 1502 may be similar to backplane 348 of FIGS. 3-4.

Figure 16:
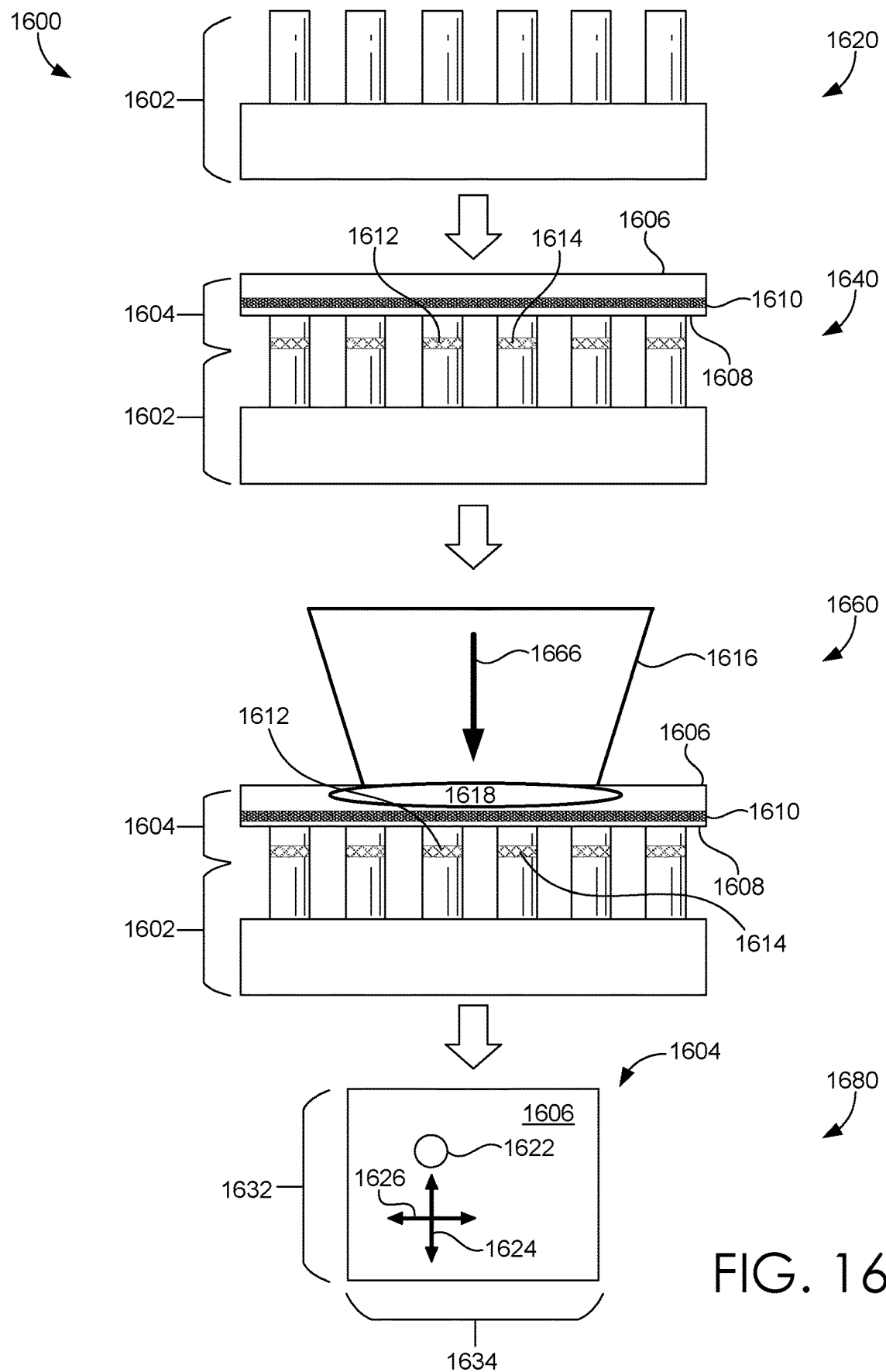
FIG. 16 illustrates an enhanced process flow for selectively annealing electrical bonds that couple semiconductor devices, via a photon source, and controlling for adverse thermal effects, that is consistent with the various embodiments.

Generalized Processes for Selectively Annealing Electrical Bonds that Couple Semiconductor Devices Via a Laser FIG. 16 illustrates one embodiment of an enhanced process flow for selectively annealing electrical bonds that couple semiconductor devices, via a photon source, and controlling for adverse thermal effects, consistent with the various embodiments. Some embodiments of process 1600 are directed towards annealing the electrical bonds between a first semiconductor device (e.g., semiconductor device 1604) and a second semiconductor device (e.g., the target substrate 1602), via one or more additional photon beams. Annealing the electrical bonds, via photon beams, may strengthen the mechanical integrity of the electrical bonds, as well as enhance the electrical performance and/or characteristics (e.g., reduced resistance, enhanced impedance matching, and the like) of the bonds. Similarly as discussed above and to control for adverse thermal effects, the temporal and/or spatial profile of the annealing photon pulses may be selected and/or modulated as required for the materials, geometries (e.g., feature size and contact pitch), and thermal properties of the first semiconductor device and the target substrate.

Process 1600 may be employed to anneal any of electrical bonds formed, generated, and/or created by any of the various embodiments discussed herein. For example, process 1600 may be employed to anneal any of the electrical bonds formed by a pulsed laser as discussed throughout. However, the embodiments are not so limited, and process 1600 may be employed to anneal electrical bonds formed by other methods, such as but not limited to continuous photons sources, conventional soldering, and the like.

Annealing electrical bonds, via process 1600, may enhance the mechanical and/or electrical integrity of an electrical bond, while controlling for any adverse effects associated with providing thermal energy to semiconductor devices, discussed throughout. Enhancing the mechanical integrity of an electrical bond may include mechanically stabilizing and/or mechanical strengthening of the electrical bond between the electrical contacts, where the electrical bond may mechanically couple at least two semiconductor devices. Enhancing the electrical integrity of an electrical bond may include increasing electrical properties of the electrical bond between the electrical contacts. For example, increasing the electrical properties may include increasing electrical conductivity (or reducing electrical resistance) of the bond, providing enhanced impedance matching between the contacts, increasing an expected electrical and/or mechanical lifetime of the bond, and the like. Annealing an electrical bond may include providing thermal energy to the bond, after the bond has been formed, generated, and or created (e.g., via other thermal energy previously provided). The embodiments of process 1600 may control for and/or mitigate thermal effects associated with the thermal energy provided for annealing (e.g., CTE mismatch which may cause misalignment of the contacts).

Step 1620 of process 1600 may include positioning a target semiconductor device (e.g., a backplane and/or target substrate 1602). At step 1640, the process may include positioning another semiconductor device (e.g., semiconductor device 1604) proximate the target substrate 1604. Also, at step 1640, one or more electrical bonds may be formed, created, and/or generated between the electrical contacts of semiconductor device 1604 and target substrate 1602. For example, FIG. 16, shows a plurality of electrical bonds between the contacts, including but not limited to first electrical bond 1612 and second electrical bond 1614. The electrical bonds may be formed via any of the embodiments discussed herein (e.g., with one or more photon pulses to control thermal effects). In some embodiments, semiconductor device 1604 may be any of the semiconductor devices discussed herein, such as but not limited to LED device 810 of FIGS. 8A-8B. As such, semiconductor device 1604 may include an active layer 1610 (e.g., a layer of one or more quantum wells for the LEDs) disposed between a first surface 1606 and a second surface 1608 of semiconductor device 1604. Other embodiments are not so limited, and the target substrate 1602 and/or the semiconductor device 1604 may be virtually any semiconductor device.

At step 1660, localized thermal energy is provided to first electrical bond 1612. The provided thermal energy may anneal electrical bond 1612. The thermal energy may be provided by a photon source. For example, a photon source may transmits photon beam 1616, where the photon beam 1616 is absorbed by at least one of semiconductor device 1604 and/or target substrate 1602. The absorption of photon beam 1616 may induce the localized thermal energy that is provided to anneal first electrical bond 1612. The thermal energy may be localized via focusing photon beam 1616 to one or more of the electrical contacts. That is, the spatial profile of photon beam 1616 may be tailored to localize the thermal energy. The transmitted photon beam 1616 may be a photon beam that is in addition to a photon beam (e.g., a photon pulse) that provided the thermal energy that formed, created, and/or generated first electrical bond 1612. Thus, the thermal energy that anneals first electrical bond 1612 may be in addition to the thermal energy that formed first electrical bond 1612. The photon source may be a laser, thus photon beam 1616 may be a laser beam. In various embodiments, photon beam may be a photon pulse with a temporal and/or spatial profile that is selected to control the thermal effects associated with the induced thermal energy. The temporal and/or spatial profile of the photon pulse 1616 may be selected, controlled, and/or modulated, to control any of various thermal effects that are associated with the thermal energy and/or the annealing of first electrical bond 1612, as discussed in any of the various embodiments.

Figure 19:
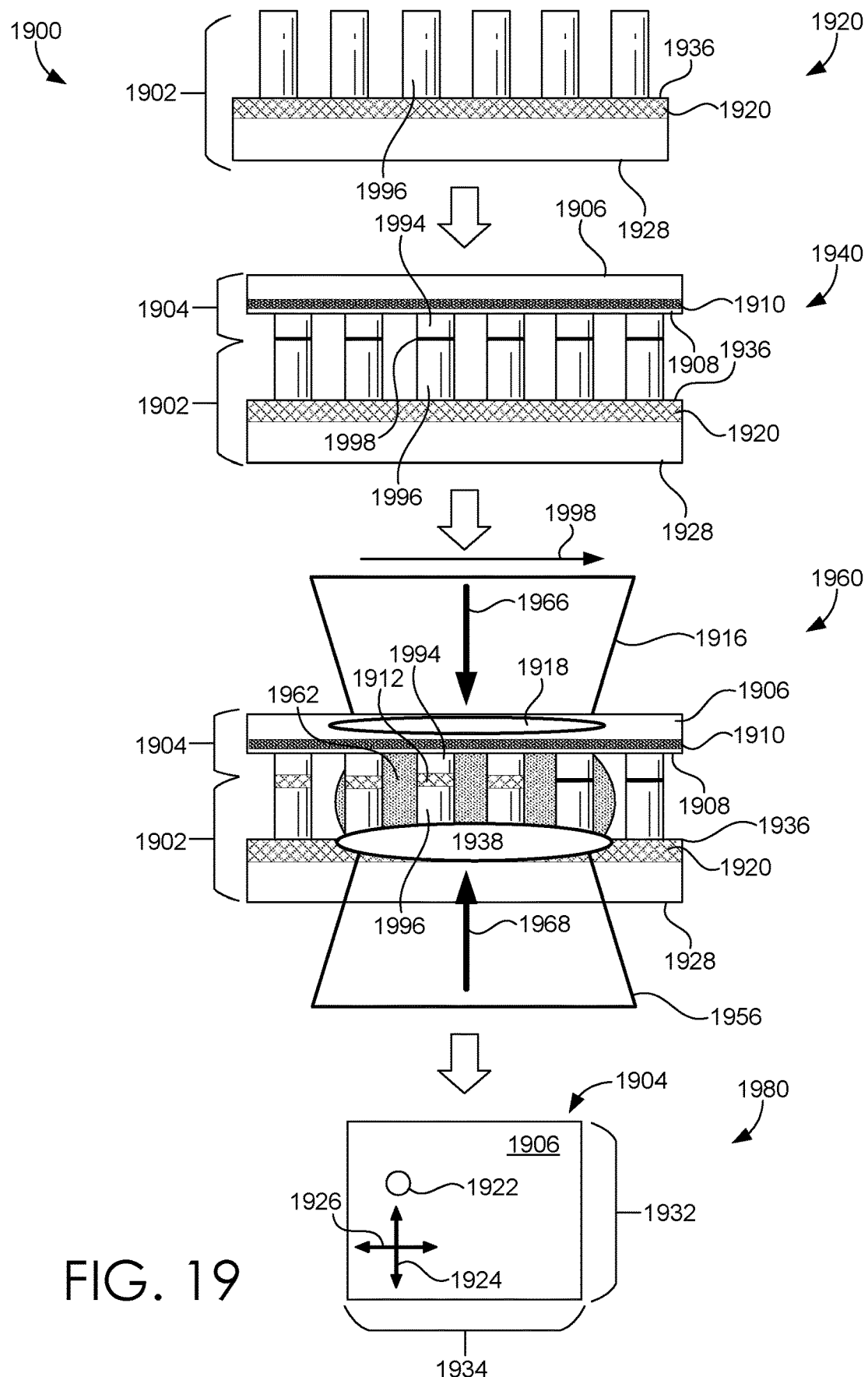
FIG. 19 illustrates one embodiment of an enhanced process flow for selectively bonding semiconductor devices, via multiple photon beams, that is consistent with the various embodiments.

In the embodiments shown in FIG. 16, the photon pulse 1616 irradiates the first surface 1606 of semiconductor device 1604. In other embodiments not shown in FIG. 16, photon pulse 1616 may irradiate target substrate 1602. Poynting vector 1666 illustrates the directional energy flux of photon pulse 1616. In at least one embodiment, two or more photon pulses may be employed to anneal first electrical bond 1612. For example, at least one of the photon pulses may irradiate semiconductor device 1604, while at least one other photon pulse may irradiate target substrate 1602. In various embodiments, the two of more photon pulses may by opposing photon pulses, such as those shown in FIG. 19. As such, a first photon pulse that irradiates semiconductor device 1604 may have a first Poynting vector (e.g., Poynting vector 1666) and a second photon pulse that irradiates target substrate 1602 may have a second Poynting vector (not shown in FIG. 16). The first and second Poynting vectors may be substantially aligned Poynting vectors. In embodiments where the first and second Poynting vectors are opposing Poynting vectors, the Poynting vectors may be substantially aligned Poynting vectors. In some non-limiting embodiments, the first and second Poynting vectors may be substantially opposed and substantially co-axial Poynting vectors, as shown in FIG. 19.

In addition to selecting, modulating, and/or controlling the temporal and/or spatial profile of photon beam 1616, a wavelength of the photons of photon pulse 1616 may be selected such that the at least a substantial amount of the radiation associated with photon pulse 1616 is absorbed in a selected region of the semiconductor device 1604 and/or a selected region of the target substrate 1602. For example, when irradiating the first surface 1606 of semiconductor device 1604, the wavelength may be selected such the laser radiation associated with photon beam 1616 is substantially absorbed by a portion or region of semiconductor device 1604 that is disposed between (or intermediate) the first surface 1606 and the second surface 1608 of semiconductor device 1604. In at least one embodiment, the wavelength is selected such that the laser radiation is substantially absorbed in a region disposed intermediate the irradiation surface (e.g., first surface 1606) and the active layer 1610 of semiconductor device 1604. The spatial profile 1618 shown in step 1660 schematically illustrates a region of the semiconductor device 1604 where the laser radiation of photon beam 1616 is substantially absorbed. Note that the absorption region (e.g., spatial profile 1618), where the laser radiation is substantially absorbed, is disposed intermediate the irradiation surface 1606 and the active layer 1610. Thus, the laser radiation of photon pulse 1616 is not transmitted through the quantum wells (located in active layer 1610) of semiconductor device 1604. Even though the laser radiation is substantially absorbed in region 1618, at least a portion of the induced thermal energy may flow through active layer 1610 and to first electrical bond 1612, via heat diffusion or other heat transfer mechanisms. Note that the thermal energy may not have significant thermal damage effects on the quantum wells within active layer 1610. However, ionization occurring with the quantum wells of active layer 1610 may induce radiation damage (e.g., effecting the bandgap energy and/or the bandgap region), and reduce the performance of semiconductor device 1604. Thus, the wavelength of laser pulse 1616 (or any other laser/photon pulse and/or beam discussed herein) may be selected to avoid, mitigate, or at least decrease an amount of any radiation damage to semiconductor device 1604 associated with the laser radiation, while still annealing first electrical bond 1612.

In some embodiments, when semiconductor device 1604 is comprised of gallium arsenide (GaAs), gallium nitride (GaN), or other gallium-based compounds, so that the ionizing radiation is substantially absorbed in region 1618 (i.e., the bulk material of semiconductor device 1604 is relatively opaque to photon beam 1616), the wavelength of the photons may be within the ultraviolet (UV) range. In at least one embodiment, the wavelength may be less than 360 nm. In other embodiments, the wavelength of the photons may be within the visible region of the electromagnetic (EM) spectrum. In still other embodiments, the wavelength of the photons is within infrared (IR) region of the EM spectrum. For example, the photon source may be a carbon dioxide ($CO_2$) laser, where the wavelength is on the order of 10 microns (e.g., a mid-IR laser).

As discussed throughout, in order to control the thermal effects, the temporal and/or spatial profile of photon pulse 1616 may be selected based on a heat diffusion length, which depends on the bulk material that the laser radiation will be transmitted through, as well as the laser pulse duration (e.g., temporal pulse width) and/or wavelength. As discussed throughout, the heat diffusion length may be at least approximately modeled to scale as, $l_t \approx \tau(D \cdot \tau)^{1/2}$, where D is dependent upon physical properties of the semiconductor material, $\tau$ represents the temporal pulse width, and $\xi$ is a geometric factor that depends on the geometry of the irradiated device (e.g., semiconductor device 1604 or target substrate 1602). In a non-limiting embodiment for GaN LEDs, $D_{GaN} \approx 0.43$ $cm^2 s^{-1}$. In some embodiments, the temporal pulse width may be within the range of 1 microsecond to 10 microseconds. The thermal heat diffusion length for GaN with temporal pulse widths on the order of 10 ns pulses may be approximately 6.5 µm. In other embodiments, the temporal pulse width may be within the range of 10 nanoseconds to 1 microsecond, with a corresponding range of thermal heat diffusion lengths of 6.5 µm to 65 µm. In still other embodiments, the temporal pulse width may be within the range of 1 picosecond to 10 picoseconds, with a corresponding range of thermal heat diffusion lengths of 65 nanometers to 200 nanometers. Note that photon pulse 1616 may be focused to localize the induced thermal energy at selected electrical contacts.

Generalized Processes for Curing Post-Applied Underfill Material Via Lasers

Figure 17:
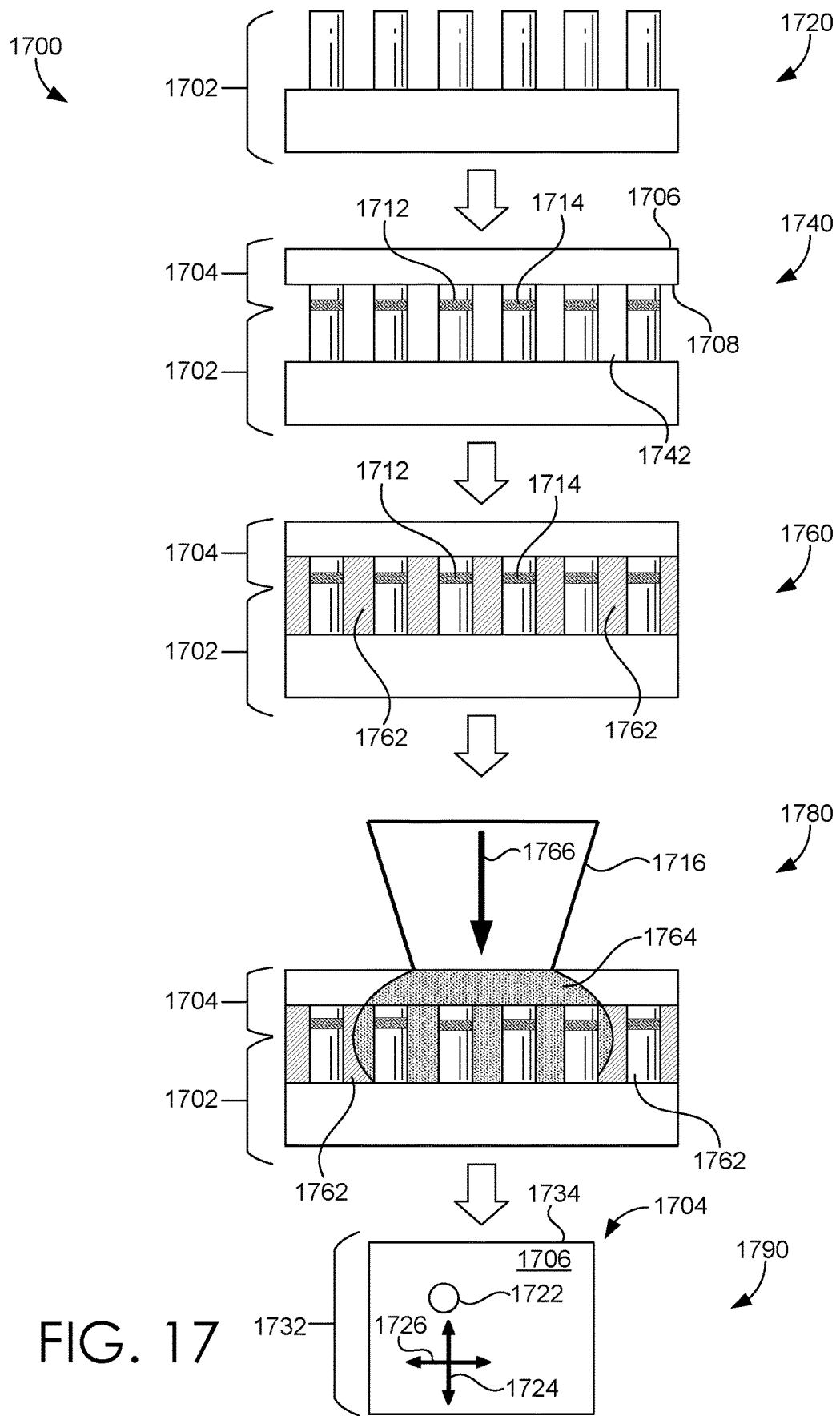
FIG. 17 illustrates an enhanced process flow for curing post-applied underfill (UF) material via photon beams, that is consistent with the various embodiments.

FIG. 17 illustrates one embodiment of an enhanced process flow for curing post-applied curing underfill (UF) material via photon beams. Some embodiments of process 1700 are directed towards mechanically stabilizing electrical bonds between a first semiconductor device (e.g., semiconductor device 1704) and a second semiconductor device (e.g., target substrate 1702), via UF material. In process 1700, the UF material may be applied after the formation and/or annealing of the electrical bonds, via capillary flow process on the uncured UF material. A (pulsed or continuous) photon beam may be employed to cure the UF material. In other embodiments discussed in conjunction with at least FIGS. 20, 21, and 23, the uncured UF material may be applied to at least one of the semiconductor 1704 or the target substrate 1702 prior to positioning the semiconductor device 1704 proximate the target substrate 1702. That is, the UF material may be disposed intermediate the semiconductor device 1704 and target substrate 1702 "sandwich," prior to employing a photon beam to electrically couple the semiconductor device 1704 to the target substrate 1702. One or more curing processes (e.g., thermal, room temperature, pulsed and/or scanned photon beams, and the like) may be employed to cure the sandwiched UF material. In pre-applied UF material embodiments (see FIGS. 20, 21, and 23), the uncured UF material may be applied to the semiconductor device 1704, the target substrate 1702, or a combination thereof, prior to aligning the electrical contacts of the semiconductor device 1704 and the target substrate 1702, to form the semiconductor device and target substrate "sandwich." Thus, the uncured UF material may be between and/or disposed on one or more inner surfaces of the "sandwich." The UF material may be similar to UF material employed in "flip-chip"-style semiconductor packaging.

Once cured, the UF material provides many similar benefits to conventionally applied and cured UF material, associated with "flip-chip"-style packed semiconductor devices. For example, the cured UF material may redistribute any thermo-mechanical stress associated with a CTE mismatch between the semiconductor device 1704 and the target substrate 1702. Furthermore, as discussed within, the presence of the UF material, during electrical bonding and/or annealing may provide enhanced mechanical stabilization of the alignment between pairs of uncoupled electrical contacts. The cured UF material may mechanically couple the semiconductor device 1704 to the target substrate 1702, and thus may mechanically stabilize any alignment and/or electrical coupling between the semiconductor device 1704 and the target substrate 1702.

More particularly, and in some embodiments, the uncured UF material may be applied post the electrical bonding and/or annealing of the electrical bonds. The UF material may be applied via capillary action (e.g., capillary flow) and cured via one or more (continuous or pulsed) photon beams. The photon beam may be scanned. Furthermore, the spatial and/or temporal profile of the photon beam may be modulated to control for adverse thermal effects. The cured UF material may mechanically stabilize electrical bonds between the electrical contacts of the semiconductor device 1704 and the target substrate 1702.

As noted above, process 1700 may be employed to cure UF material to mechanically stabilize one or more electrical bonds, which electronically couple semiconductor devices. More specifically, once applied and cured, the UF material may reduce the thermal effects associated with chip-backplane coefficient of thermal expansion (CTE) mismatch, which are discussed herein. Furthermore, the UF material may reduce the mechanical stress and strains exerted on the electrical bonds (e.g., due to thermal expansion), and redistribute these concentrated forces from the electrical bonds to larger portions of the semiconductor devices. For instance, concentrated pressures (e.g., compressive, sheering, and/or expanding pressures) exerted at the electrical bonds are distributed and reduced. The cured UF material may additionally protect the electrical bonds (and other components of the coupled semiconductor devices) against electromigration, moisture, thermal stress, mechanical shock, vibrational stress, and other elements of a hostile environment. The cured UF material may at least partially encapsulate mechanically sensitive portions (e.g., electrical bonds and/or contacts) of one or more semiconductor devices. The cured UF material may enhance the mechanical integrity of packing materials that encapsulate the one or more semiconductor devices. In at least one embodiment, the UF material provides adhesive (or binding) forces between two or more mechanically (and/or electrically) coupled semiconductor devices. Thus, once cured, the UF material may mechanically couple and/or bond semiconductor devices.

Step 1720 of process 1700 may include positioning a target semiconductor device (e.g., a backplane and/or target substrate 1702). At step 1740, the process includes positioning another semiconductor device (e.g., semiconductor device 1704) proximate the target substrate 1704. Also, at step 1740, one or more electrical bonds may be formed, created, and/or generated between the electrical contacts of semiconductor device 1704 and target substrate 1702. For example, FIG. 17, shows a plurality of electrical bonds between the contacts, including but not limited to first electrical bond 1712 and second electrical bond 1714. The electrical bonds may be formed via any of the embodiments discussed herein (e.g., with one or more photon pulses to control thermal effects). In some embodiments, semiconductor device 1704 may be any of the semiconductor devices discussed herein, such as but not limited to LED device 810 of FIGS. 8A-8B. Similar to semiconductor device 1604 of FIG. 16, semiconductor device 1704 may include an active layer (e.g., a layer of one or more quantum wells for the LEDs) disposed between a first surface 1706 and a second surface 1708 of semiconductor device 1704. Note that such an active layer is not explicitly shown in FIG. 17. Other embodiments are not so limited, and the target semiconductor device and/or the other semiconductor device may be virtually any semiconductor device. In at least one embodiment, the electrical bonds may have been annealed, as discussed in conjunction with the various embodiments of FIG. 16. Note that a volume surrounding the electrical contacts of the target substrate 1702 and the semiconductor device 1704, and disposed intermediate the target substrate 1702 and the semiconductor device 1704, defines a void 1742 that encapsulates the electrical contacts (and the electrical bonds).

At step 1760, uncured UF material 1762 is applied. The hatched volume 1762 indicates the UF material. Note that in applying the UF material 1762, the UF material 1762 may at least partially fill the void 1742. The UF material 1762 may be applied, post-electrical bonding of the target substrate 1702 and the semiconductor device 1704, via capillary action/flow and/or an UF reflow process. In some embodiments, the UF material 1762 is applied prior to annealing the electrical bonds. In other embodiments, the UF material 1762 is applied post the annealing of the electrical bonds.

At step 1760, localized thermal energy is provided to cure the uncured UF material 1762. The hatch pattern 1764 represents the localization of the thermal energy. That is, the thermal energy is localized to the volume represented by the hatched pattern 1764. Thus, the localized thermal energy may be referred to as thermal energy 1764. The localized thermal energy 1764 may be provided by a photon source. For example, a photon source may transmit photon beam 1716, where the photon beam 1716 is absorbed by at least one of semiconductor device 1704 and/or target substrate 1702. The absorption of photon beam 1716 may induce the localized thermal energy 1764 that cures UF material 1762. The transmitted photon beam 1716 may be a photon beam that is in addition to a photon beam (e.g., a photon pulse) that provided the thermal energy that formed, created, and/or generated first electrical bond 1712 and/or may be in addition to the photon beam that annealed first electrical bond 1712, as discussed in conjunction with at least FIG. 16. Thus, the thermal energy 1764 that cures UF material 1764 may be in addition to the thermal energy that formed first electrical bond 1712 and/or in addition to the thermal energy that annealed first electrical bond 1712. The photon source may be a laser, thus photon beam 1716 may be a laser beam. In various embodiments, photon beam may be a photon pulse with a temporal and/or spatial profile that is selected to control the thermal effects associated with the induced thermal energy. The temporal and/or spatial profile of the photon pulse 1716 may be selected, controlled, and/or modulated, to control any of various thermal effects that are associated with the thermal energy and/or the annealing of first electrical bond 1712, as discussed in any of the various embodiments. The temporal and/or spatial profile of the photon pulse 1716 may be selected to localized thermal energy 1764, as shown in FIG. 17.

In the embodiments shown in FIG. 17, the photon pulse 1716 irradiates the first surface 1706 of semiconductor device 1704. In other embodiments not shown in FIG. 17, photon pulse 1716 may irradiate target substrate 1702. In at least one embodiment, two or more photon pulses may be employed to anneal first electrical bond 1712. For example, at least one of the photon pulses may irradiate semiconductor device 1704, while at least one other photon pulse may irradiate target substrate 1702. In various embodiments, the two of more photon pulses may by opposing photon pulses, such as those shown in FIG. 19. Poynting vector 1766 illustrates the directional energy flux of photon pulse 1716.

In addition to selecting, modulating, and/or controlling the temporal and/or spatial profile of photon beam 1716, a wavelength of the photons of photon pulse 1716 may be selected such that the at least a substantial amount of the laser radiation associated with photon pulse 1716 is absorbed in a selected region of the semiconductor device 1704 and/or a selected region of the target substrate 1702. For example, similar to the discussion of photon pulse 1616 of FIG. 16, when irradiating the first surface 1706 of semiconductor device 1704, the wavelength may be selected such the laser radiation associated with photon beam 1716 is substantially absorbed by a portion or region of semiconductor device 1704 that is disposed between (or intermediate) the first surface 1706 and the second surface 1708 of semiconductor device 1704. In at least one embodiment, the wavelength is selected such that the laser radiation is substantially absorbed in a region disposed intermediate the irradiation surface (e.g., first surface 1706) and the active layer of semiconductor device 1704. Even though the laser radiation is substantially absorbed in region excluded from the active layer, and as shown in FIG. 17, at least a portion of the induced thermal energy may flow through active layer and to the uncured UF material 1762, via heat diffusion or other heat transfer mechanisms. Thus, the wavelength of laser pulse 1716 (or any other laser/photon pulse and/or beam discussed herein) may be selected to avoid, mitigate, or at least decrease an amount of any damage to semiconductor device 1704 associated with the laser radiation, while still curing UF material 1762.

In some embodiments, wherein semiconductor device 1704 is comprised of gallium arsenide (GaAs), gallium nitride (GaN), or other gallium-based compounds, so that the laser radiation is substantially absorbed in the bulk material of semiconductor device 1704, the wavelength of the photons may be within the ultraviolet (UV) range. In at least one embodiment, the wavelength may be less than 360 nm. In other embodiments, the wavelength of the photons may be within the visible region of the electromagnetic (EM) spectrum. In still other embodiments, the wavelength of the photons is within infrared (IR) region of the EM spectrum. For example, the photon source may be a carbon dioxide ($CO_2$) laser, where the wavelength is on the order of 10.6 microns (e.g., a mid-IR laser).

As discussed throughout, in order to control the thermal effects, the temporal and/or spatial profile may be selected based on a heat diffusion length, which depends on the bulk material that the laser radiation will be transmitted through, as well as the laser pulse duration (e.g., temporal pulse width) and/or wavelength. As discussed throughout, the heat diffusion length may be at least approximately modeled to scale as, $l_t \approx \tau(D \cdot \tau)^{1/2}$, where D (thermal diffusivity) is dependent upon physical properties of the semiconductor material, $\tau$ represents the temporal pulse width, and $\xi$ is a geometric factor that depends on the geometry of the irradiated device (e.g., semiconductor device 1704 or target substrate 1702). In a non-limiting embodiment for GaN LEDs, $D_{GaN} \approx 0.43$ $cm^2 s^{-1}$. In some embodiments, the temporal pulse width may be within the range of 1 microsecond to 10 microseconds. The thermal heat diffusion length for GaN with temporal pulse widths on the order of 10 ns pulses may be approximately 6.5 μm. In other embodiments, the temporal pulse width may be within the range of 10 nanoseconds to 1 microsecond, with a corresponding range of thermal heat diffusion lengths of 6.5 μm to 65 μm. In still other embodiments, the temporal pulse width may be within the range of 1 picosecond to 10 picoseconds, with a corresponding range of thermal heat diffusion lengths of 65 nanometers to 200 nanometers.

At step 1790, the photon source may scan the first surface 1706 of semiconductor device 1704 (and/or scanning a surface of target substrate 1702 if target substrate 1702 is being irradiated) to induce additional thermal energy to continue curing the UF material. That is, the photon source may be scanned and/or pulsed to provide the thermal energy required for curing the portion of the OF material 1762 excluded from the localization of thermal energy 1764. The step 1790 illustrates a top-down view of semiconductor device 1704 and the first surface 1706 of semiconductor device 1706. Similar to that in FIG. 16, also shown in step 1790 is an approximate beam spot 1722 of scanning photon pulse 1716. The scanning may be 1D scanning or 2D scanning, such as illustrated in arrows 1724 and 1726. In some embodiments, the scanning pattern may be at least similar to a Lissajous scanning pattern to further control thermal effects. For example, a precessing Lissajous (or Lissajous-like) scanning pattern may be employed to provide thermal energy to each of the electrical contacts, while still allowing enough thermal energy to dissipate and control for thermal effects.

The first surface 1706 may have a first spatial dimension 1732 and a second spatial dimension 1734. The spatial dimensions may be on the order of centimeters (cm) or millimeters (mm). For example, in one embodiment, the first spatial dimension 1732 may be approximately 4 mm and the second spatial dimension 1734 may be approximately 5 mm. The spatial dimensions 1732/1734 may vary in other embodiments. Similar to FIG. 16, FIG. 17 may not be to scale. For example, beam spot 1722 may be significantly smaller in it characteristic feature size and/or spatial dimensions (e.g., the spatial pulse width), with respect to spatial dimensions 1732/1734 than is shown in FIG. 17. In some embodiments, the spatial pulse width of beam spot 1722 may be less than 0.5 mm. As discussed throughout, the scanning frequency and/or the pulsing frequency of the photon source and/or pulsed photon beam may be modulated to further control the thermal effects. The scanning may continue until the entirety of the UF material has been cured. Once the UF material is cured, the target substrate 1702 and the semiconductor 1704 may be mechanically coupled via the mechanical bond formed by the adhesive forces of the cured UF material. The mechanical coupling may stabilize the electrical coupling and/or electrical bonds between the target substrate 1702 and the semiconductor device 1704. Once electrically and mechanically coupled, the target substrate 1702 and the semiconductor device 1404 may form an integrated and/or composite semiconductor device.

Figure 18:
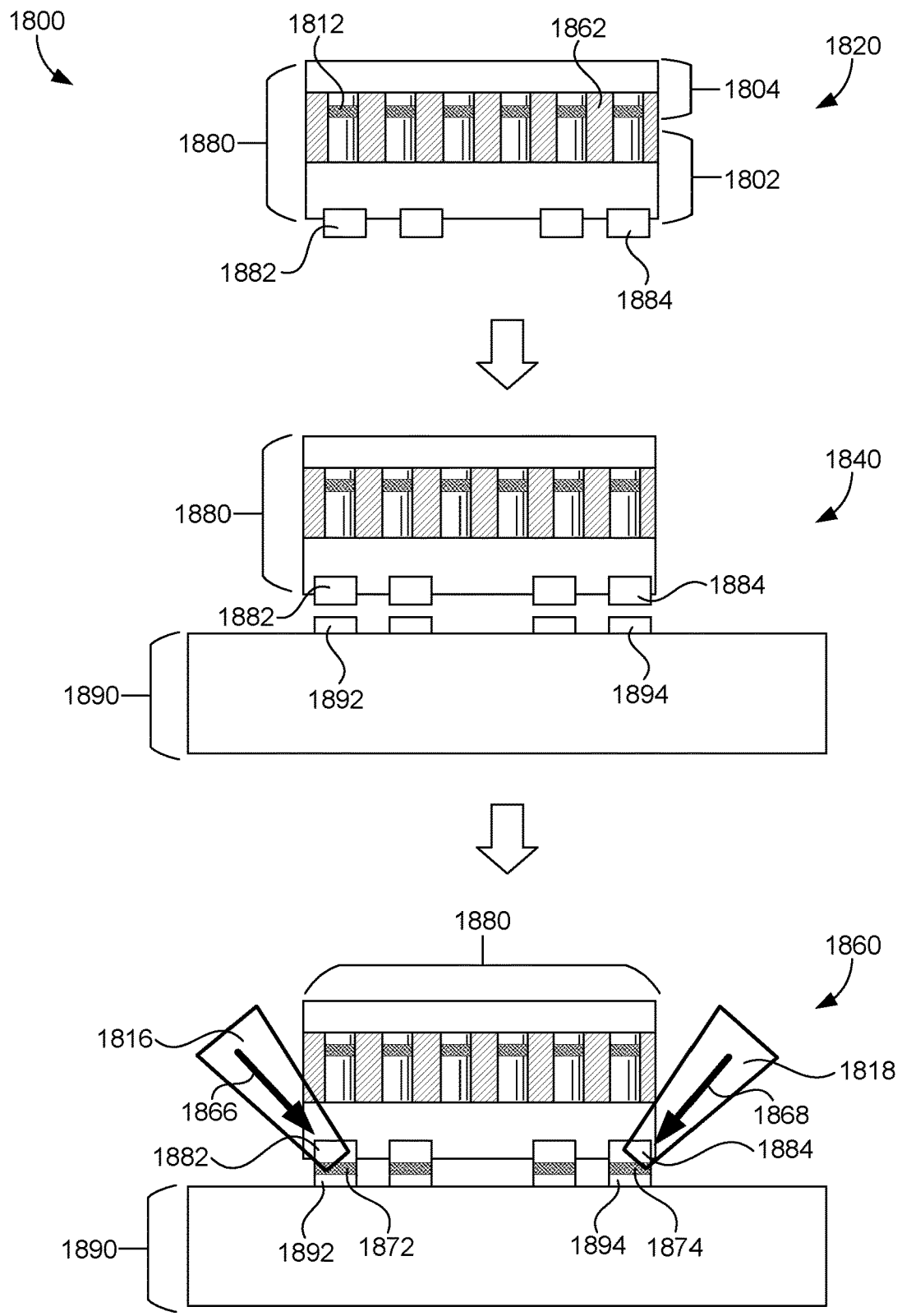
FIG. 18 illustrates an enhanced process flow for selectively bonding packaging contacts for semiconductor devices, via photon beams, that is consistent with the various embodiments.

Generalized Processes for Selectively Bonding Packaging Contacts for Semiconductor Devices Via Pulsed Lasers FIG. 18 illustrates one embodiment of an enhanced process flow for selectively bonding packaging contacts for semiconductor devices, via photon beams. Some embodiments of process 1800 are directed towards packaging the mechanically and/or electrically coupled first semiconductor device and the target substrate (e.g., a first semiconductor device and target substrate "integrated device"). For example, the integrated device may be electrically coupled to a circuit board and/or packaging boards with input/output (I/O) pins, via the various embodiments of process 1800. More particularly, continuous or pulsed photon beams may be employed to electrically couple additional electrical contacts (e.g., I/O pins) of the first semiconductor device and/or the target substrate to another device (e.g., a printed circuit board or packaging material). That is, a circuit board may be populated with semiconductor devices via pulsed photon beams. The temporal and/or spatial profile of the photon pulses may also be selected to further control for thermal effects.

More particularly, process 1800 may be employed to package a semiconductor device, such as but not limited to any of the various semiconductor devices discussed within. In some embodiments, process 1800 may be employed to electrically couple a semiconductor device to a circuit board, such as but not limited to a circuit board included in the packaging for the semiconductor device. More specifically, process 1800 may be employed to electrically bond electrical contacts (e.g., input/output pins) to electrical contacts of the circuit board (e.g., the input/output pins of the packaging circuit board). Thus, process 1800 may be employed to populate a circuit board with one or more semiconductor devices.

The semiconductor devices packaged and/or electrically coupled to a board via process 1800 may be comprised of two or more electrically and/or mechanically coupled semiconductor devices. That is, the semiconductor device packaged and/or electrically coupled to a board via process 1800 may be a composite and/or integrated semiconductor device (e.g., an integrated device). For example, once electrically and/or mechanically coupled, a target substrate (e.g., target substrate 1802) and a semiconductor device (e.g., semiconductor device 1804) may form an integrated semiconductor device 1880. Process 1800 may be employed to electrically couple integrated device 1880 to circuit board 1890.

In order to provide electrical signals to other devices (e.g., circuit board 1890), at least one of the semiconductor devices included in an integrated device (e.g., integrated device 1880) may include one or more electrical contacts. As shown in FIG. 18, integrated device 1880 includes electrical contacts via target substrate device 1802. In particular, target substrate device 1802 includes a plurality of electrical contacts, including but not limited to first electrical contact 1882 and second electrical contact 1884. In other embodiments, semiconductor device 1802 may include one or more electrical contacts. Such electrical contacts may enable the transmission of input and output (I/O) signals to and from integrated device 1880. Thus, first electrical contact 1882 and second electrical contact 1884 may be I/O pins of integrated device 1880.

Process 1800 may begin at step 1820, where integrated device 1880 is formed via the electrical and mechanical coupling of target substrate 1802 and semiconductor device 1804. The coupling of target substrate 1802 and semiconductor device 1804 may be generated via various methods, including but not limited to those discussed throughout. More specifically, semiconductor device 1804 is electrically coupled to target substrate 1802 via the formation of electrical bonds (e.g., electrical bond 1812) between the electrical contacts of semiconductor device 1804 and target substrate 1802. In some embodiments, semiconductor device 1804 is mechanically coupled to target substrate 1802 via the application and curing of underfill (UF) material 1862. For example, the UF material 1862 may have been applied and cured via any of the various embodiments discussed herein, such as but not limited to those discussed in conjunction with at least FIGS. 17, 20, 21, and 23. Other embodiments are not so limited, and the mechanical coupling may be generated by other means, such as but not limited to the chemical bonding of one or more insulating surface disposed intermediate target substrate 1802 and semiconductor device 1804, as discussed in conjunction with FIG. 22. In some embodiments, various electrical bonds, such as but not limited to electrical bond 1812 may be annealed by any of the electrical bond annealing methods discussed herein, such as those discussed in conjunction with FIG. 16.

At step 1840, integrated device 1880 may be positioned proximate another device (e.g., board 1890) such that the I/O contacts of the integrated device (e.g., first electrical contact 1882 and second electrical contact 1884) are spatially aligned with I/O contacts of board 1890 (e.g., corresponding third electrical contact 1892 and fourth electrical contact 1894 of board 1890). Note that board 1890 may be a circuit board, such as but not limited to a printed circuit board (PCB). Board 1890 may be part of the packaging for integrated device 1880. Third electrical contact 1892 and fourth electrical contact 1894 may be I/O contacts for board 1890. Thus, contacts 1892/1894 may be I/O contacts for the packaging of integrated device 1880. The various electrical contacts shown in FIG. 18 may include one or more electrical leads, pins, I/O ports, and the like.

At step 1860, one or more photon beams (e.g., first photon beam 1816 and second photon beam 1818) may be transmitted to provide thermal energy that electrically bonds first electrical contact 1882 to third electrical contact 1892 and electrically bonds second electrical contact 1884 to fourth electrical contact 1894. As shown in FIG. 18, first electrical bond 1872, generated by thermal energy induced by first photon beam 1816) electrically couples first electrical contact 1892 to third electrical contact 1892. Second electrical bond 1874 electrically couples second electrical contact 1884 to fourth electrical contact 1894. Thus, integrated device 1880 is electrically coupled to board 1890, and can transmit, as well as receive, electrical signals from board 1890 via electrical bonds, such as but not limited to electrical bonds 1872 and 1874.

First Poynting vector 1866 illustrates the directional energy flux of first photon pulse 1816. Second Poynting vector 1868 illustrates the directional energy flux of second photon pulse 1818. In order to at least partially irradiate at least one of electrical contacts 1882, 1884, 1892, and/or 1894, at least one of Poynting vectors 1868 and/or 1868 may have a component orthogonal to the plane of FIG. 18. In at least one embodiment, at least one of Poynting vectors 1868 and/or 1868 may not have a component (or have only a small component) within the plane of FIG. 18, and the at least one of Poynting vectors 1868 and/or 1868 may be substantially orthogonal to the plane of FIG. 18. In embodiments not shown in FIG. 18, at least one of photon pulses 1816 and/or 1818 may at least partially irradiate at least one of target substrate 1802, semiconductor device 1804, and/or board 1890 to induce the localized thermal energy. The thermal energy may be induced in the bulk of at least one of target substrate 1802, semiconductor device 1804, and/or board 1890 and flow to the electrical contacts being electrically coupled.

In any of the various embodiments discussed throughout, when electrically coupling one electrical contact to another, via a formation of an electrical bond induced by thermal energy, a solder reflow process may be employed. As such, solder material may be applied on one or more surfaces at an interface between two electrical contacts. The thermal energy may induce the electrical bond via a reflow of the solder material. As such, to form the electrical bonds 1872/1874, a solder reflow method may be employed, where solder material is disposed at the interface between first electrical contact 1882 and third electrical contact 1892. Additional solder material may be disposed at the interface between second electrical contact 1884 and fourth electrical contact 1894. Thermal energy induced by photon beams 1816/1818 may induce solder reflow to form corresponding electrical bonds 1872/1874.

To control thermal effects associated with the thermal energy induced by photon beams 1816/1818, photon beams 1816/1818 may be photon pulses, as discussed throughout. As such, the temporal and/or spatial profiles of first photon pulse 1816 and/or second photon pulse 1818 may be modulated and/or selected to control for adverse thermal effects. Additionally, a scanning frequency and/or pulsing frequency of photon pulses 1816/1818 may be modulated to control for thermal effects. In other embodiments, one or more photon sources (e.g., lasers) may be employed to simultaneously, or in an alternating fashion, generate two or more simultaneous (or alternating) photon pulses to form the electrical bonds. In still other embodiments, to further control thermal effects, a single photon pulse is transmitted at a time to localize the thermal energy at a single pair of electrical contacts. That is, a single pair of corresponding electrical contacts (e.g., first electrical contact first electrical contact 1882 and third electrical contact 1892) may be bonded at a time, via a modulation of the spatial profile of first photon pulse 1816. The pulsing frequency and/or temporal profile of the photon pulses may be modulated to allow heat dissipation between successive pulses. The temporal profile (e.g., pulse duration~100 microseconds) may be selected such that the induced thermal energy can flow and dissipate a sufficient length (e.g., a few hundred microns) through the various semiconductor bulks to reach the electrical contacts being bonded.

Generalized Processes for Selectively Bonding Semiconductor Devices, Via Multiple Pulsed Lasers FIG. 19 illustrates one embodiment of an enhanced process flow for selectively bonding semiconductor devices, via multiple photon beams, consistent with the various embodiments. Some embodiments of process 1900 are directed towards employing multiple photon beams or pulses to form and/or anneal the electrical bonds, as well as cure UF material. For example, one photon pulse may irradiate a first semiconductor device (semiconductor device 1904), and another photon pulse may irradiate a second semiconductor device (e.g., the target substrate 1902). The photon pulses may be opposed and/or coaxial photon pulses. In some embodiments, the opposed photon beams may be pulsed and/or scanned. The pulsing and/or scanning frequencies of the opposed photon beams may be similar or dissimilar. The pulsing of the two photon beams may be substantially in phase (so that the semiconductor device 1904 and the target substrate 1902 are simultaneously irradiated). In other embodiments, a statically or dynamically determined phase difference may be inserted in the pulsing of the two photon beams. Likewise, the scanning of the two photon beams may be in-phase is some embodiments, while in other embodiments, a phase difference exists in the scanning of the two beams.

More specifically, process 1900 may be employed to electrically couple target substrate 1902 to semiconductor device 1904. In some embodiments, process 1900 may be employed to mechanically couple target substrate 1902 to semiconductor device 1904, by curing post-applied UF material 1962, as well as simultaneously electrically coupling target substrate 1902 to semiconductor device 1904, via a first photon beam 1916 and a second photon beam 1956. The embodiments of process 1900 may control for and/or mitigate thermal effects associated with the thermal energy provided first photon beam 1916 and/or second photon beam 1956 by modulating the temporal and/or spatial profiles of the photon beams. The multiple photon beam arrangement of process 1900 may be employed to electrically couple electrical contacts, anneal the corresponding electrical bonds (via process 1600 of FIG. 16), and/or cure UF material as discussed herein.

Step 1920 of process 1900 may include positioning a target semiconductor device (e.g., a backplane and/or target substrate 1902). Target substrate 1902 includes a plurality of electrical contacts, including but not limited to first electrical contact 1996. At step 1940, the process may include positioning another semiconductor device (e.g., semiconductor device 1904) proximate the target substrate 1904. In some embodiments, semiconductor device 1904 may be any of the semiconductor devices discussed herein, such as but not limited to LED device 810 of FIGS. 8A-8B. As such, semiconductor device 1904 may include an active layer 1910 (e.g., a layer of one or more quantum wells for the LEDs) disposed between a first surface 1906 and a second surface 1908 of semiconductor device 1904. Semiconductor device 1904 includes a plurality of electrical contacts, including but not limited to second electrical contact 1994. There may be a correspondence between the electrical contacts of target substrate 1902 and the electrical contacts of semiconductor device 1902. For example, first electrical contact 1996 corresponds to second electrical contact 1996. As such, when semiconductor device 1904 is positioned proximate the target substrate 1904, a spatial alignment of the corresponding first electrical contact 1996 and the second electrical contact 1994 is formed. Also, when semiconductor device 1904 is positioned proximate the target substrate 1902 and due to the spatial alignment, an interface 1998 of the corresponding electrical contacts 1996/1994 is formed. As discussed throughout, solder material may be applied at the interface to enable a solder reflow process for electrical coupling of first electrical contact 1996 and second electrical contact 1994. Spatial alignment may include X, Y, R, tip, and/or tilt alignment.

Target substrate 1902 may include a first surface 1928 and a second surface 1926. Furthermore, target substrate 1902 may include one or more metallization layers 1920. In some embodiments, the one or more metallization layers 1920 may be disposed on, or at least be very near, second surface 1936. In other embodiments, at least one of the one or more metallization layers 1936 may be disposed intermediate the first surface 1928 and the second surface 1928 of target substrate 1902. The one or more metallization layers 1920 may include one or more electrical conducting tracks and/or interconnects (e.g., metal tracks) that electrically couple the electrical contacts of target substrate 1902 to electrical circuits embedded within target substrate 1902. Other embodiments are not so limited, and the target substrate 1902 and/or the other semiconductor device 1904 may be virtually any semiconductor device. When semiconductor device 1904 is positioned proximate the target substrate 1902, second surface 1908 of semiconductor device 1904 may be opposing second surface 1936 of target substrate 1902.

At step 1960, thermal energy may be provided to form an electrical bond 1912 at interface 1998. A first portion of the bonding thermal energy may be induced via first photon beam 1916 and a second portion of the bonding thermal energy may be induced via second photon beam 1956. First photon beam 1916 may be incident upon and/or irradiate first surface 1906 of semiconductor device 1904. Second photon beam 1956 may be incident upon and/or irradiate first surface 1928 of target substrate 1902. First Poynting vector 1966 illustrates the directional energy flux of first photon beam 1916. Second Poynting vector 1968 illustrates the directional energy flux of second photon beam 1956. Note that the direction of first Poynting vector 1966 is in an opposing direction to the direction of second Poynting vector 1968. In the non-limiting embodiment illustrated in FIG. 19, the first and second Poynting vectors 1966/1968 are substantially aligned vectors. Thus, first photon beam 1916 and second photon beam 1956 may be opposing co-axial photon beams.

As discussed throughout, in order to control thermal effects, each of first photon beam 1916 and second photon beam 1956 may be photon pulses. In order to further control thermal effects, the temporal and/or spatial profiles of each of first photon pulse 1916 and/or second photon pulse 1956 may be selected and/or modulated, as discussed throughout. In addition to selecting, modulating, and/or controlling the temporal and/or spatial profile of first photon pulse 1916, a wavelength (or frequency) of the photons of first photon pulse 1916 may be selected such that the at least a substantial amount of the laser radiation associated with first photon pulse 1916 is absorbed in a selected region of the semiconductor device 1904. For example, the wavelength of first photon pulse 1916 may be selected such that the laser radiation of first photon pulse 1916 is substantially absorbed in a region disposed intermediate the irradiation surface (e.g., first surface 1906 of semiconductor device 1904) and the active layer 1910 of semiconductor device 1904. The spatial profile 1918 of first photon pulse 1916 schematically illustrates a region of the semiconductor device 1904 where the laser radiation of first photon pulse 1916 is substantially absorbed. Note that the absorption region of the first photon pulse 1916 (e.g., spatial profile 1918), where the laser radiation associated with first photon pulse 1916 is substantially absorbed, is disposed intermediate the irradiation surface 1906 and the active layer 1910. Thus, the laser radiation of first photon pulse 1916 is not transmitted through the quantum wells (located in active layer 1910) of semiconductor device 1904.

More specifically, when semiconductor device 1904 is comprised of gallium arsenide (GaAs), gallium nitride (GaN), or other gallium-based compounds, so that the laser radiation of first photon pulse 1916 is substantially absorbed in region 1618 (i.e., the bulk material of semiconductor device 1904 is relatively opaque to photon beam 1916), the wavelength of the photons of the first photon pulse 1916 may be within the ultraviolet (UV) range. In at least one embodiment, the wavelength of first photon pulse 1916 may be less than 360 nm. In other embodiments, the wavelength of the photons of the first photon pulse 1916 may be within the visible region of the electromagnetic (EM) spectrum. In still other embodiments, the wavelength of the photons of the first photon pulse 1916 is within infrared (IR) region of the EM spectrum. For example, the photon source for first photon pulse 1916 may be a carbon dioxide ($CO_2$) laser, where the wavelength is on the order of 10 microns (e.g., a mid-IR laser).

Likewise, a wavelength of the photons of second photon pulse 1956 may be selected such that the at least a substantial amount of the laser radiation associated with second photon pulse 1956 is absorbed in a selected region of the target substrate 1902. For example, the wavelength of second photon pulse 1956 may be selected such that the laser radiation of second photon pulse 1956 is substantially absorbed in a region disposed intermediate the irradiation surface (e.g., first surface 1928 of target substrate 1902) and the second surface 1936 of target substrate 1902. In at least one embodiment, the wavelength of the second photon pulse 1956 is selected such that the laser radiation of second photon pulse 1956 is substantially absorbed in the metallization layer 1920 and/or the electrical contacts of the target substrate 1902 and/or the electrical contacts of the semiconductor device 1904. The spatial profile 1938 of second photon pulse 1956 schematically illustrates a region of the target substrate 1902 and the electrical contacts of the target substrate 1902 where the laser radiation of second photon pulse 1956 is substantially absorbed. Note the absorption region of the second photon pulse 1956 (e.g., spatial profile 1938), where the laser radiation associated with second photon pulse 1956 is substantially absorbed, within the metallization layer 1920 and the electrical contacts of target substrate 1902. Thus, the induced thermal energy may dissipate to the interfaces of the electrical contacts being bonded.

More specifically, the wavelength of second photon pulse 1956 may be selected such that the bulk material of target substrate is substantially transparent to second photon pulse 1956. Furthermore, the wavelength of second photon pulse 1956 may be selected such that the metal tracks of metallization layer 1920 is substantially opaque to second photon pulse 1956. Thus, the laser radiation of second photon pulse 1956 is substantially absorbed in the metallization layer 1920 and/or the electrical contacts of target substrate 1902, as illustrated by spatial profile 1938. In one embodiment, the metallization layer 1936 is approximately 15 microns below the second surface 1936 of the target substrate 1902. As such, the thermal energy induced by second photon pulse 1956 is substantially induced near the second surface 1936 of target substrate 1902. For instance, when the bulk material of target substrate 1902 is comprised of silicon (Si), the wavelength of second photon pulse 1956 may be in the IR range of the EM spectrum. In one non-limiting embodiment, the wavelength of the second photon pulse 1956 is greater than 1300 nanometers. Via the localization of the thermal energy induced by the co-axial photon pulses 1916/1956, various adverse thermal effects are mitigated, or at least decreased.

As discussed throughout, in order to control the thermal effects, the temporal and/or spatial profile of each of the first photon pulse 1916 and the second photon pulse 1956 may be selected based on a heat diffusion length, which depends on the bulk material that the laser radiation will be transmitted through, as well as the laser pulse duration (e.g., temporal pulse width) and/or wavelength. As discussed throughout, the heat diffusion length may be at least approximately modeled to scale as, $l_t \approx \xi(D \cdot \tau)^{1/2}$, where D (heat diffusivity) is dependent upon physical properties of the semiconductor material, $\tau$ represents the temporal pulse width, and $\xi$ is a geometric factor that depends on the geometry of the irradiated device (e.g., bulk vs. thin film aspects of semiconductor device 1904 and/or target substrate 1902). In a non-limiting embodiment for GaN LEDs, $D_{GaN} \approx 0.43$ cm$^2$s$^{-1}$. In some embodiments, the temporal pulse width of first photon pulse 1916 and/or second photon pulse 1956 may be within the range of 1 microsecond to 10 microseconds. In other embodiments, at least one of first photon pulse 1916 and/or second photon pulse 1956 may have a temporal pulse width of approximately 100 nanoseconds. The heat diffusion length for GaN with temporal pulse widths on the order of 10 ns pulses may be approximately 6.5 μm. In other embodiments, the temporal pulse width may be within the range of 10 nanoseconds to 1 microsecond, with a corresponding range of thermal heat diffusion lengths of 6.5 μm to 65 μm. In still other embodiments, the temporal pulse width may be within the range of 1 picosecond to 10 picoseconds, with a corresponding range of thermal heat diffusion lengths of 65 nanometers to 200 nanometers. In still other embodiments, the diffusion length of a photon pulse with a temporal pulse with of approximately 100 nanoseconds may be approximately 12 μm. Note that first photon pulse 1916 and second photon pulse 1956 may be focused to localize the combination of the induced thermal energies at selected electrical contacts.

As shown in FIG. 19, the first photon pulse 1916 and the second photon pulse 1956 may be pulsed and/or transmitted simultaneously. That is, the pulsing of first photon pulse 1916 and second photon pulse 1956 may be in phase, such that the thermal energy induced by each photon pulse is induced simultaneously. In other embodiments, a relative phase difference may be introduced in the pulsing first photon pulse 1916 and second photon pulse 1956. For example, a relative phase difference of π/2, π, or any other such phase value may be introduced. Introducing a phase difference in the pulsing of the multiple photon sources may further control for adverse thermal effects.

Process 1900 may also be employed to cure UF material. FIG. 19 shows UF material 1962 being cured by the combination of the thermal energy induced by the first photon pulse 1916 and the thermal energy induced by second photon pulse 1956. In various embodiment, when heated by the induced thermal energy, a volume of the uncured UF material 1962 may expand to encapsulate the first electrical contact 1996, second electrical contact 1994, and electrical bond 1912. Thus, the UF material 1962 may be cured simultaneous to the formation of electrical bond 1912. The coaxial photon pulses 1916 and 1946 may enable enhanced localization of the thermal energy and further reduce adverse thermal effects.

Arrow 1998 shows a scanning direction for the photon sources that transmitted each of first photon pulse 1916 and second photon pulse 1956. As such, electrical contacts to the left of the photon pulses 1916/1956 are electrically bonded, while electrical contacts to the right of the photon pulses 1916/1956 have yet to be bonded because the scanning photon pulses have not yet provided the thermal energy required to form electrical bonds. As noted, in addition to forming electrical bonds and curing UF material, the co-axial configuration of multiple photon pulses may be employed to anneal electrical bonds, as discussed in conjunction with at least FIG. 16.

At step 1980, the photon source that transmits first photon pulse 1916 may scan the first surface 1906 of semiconductor device 1904. The photon source that transmits the second photon pulse 1956 may scan the first surface 1928 of target substrate 1902. The step 1960 illustrates a top-down view of semiconductor device 1904 and the first surface 1906 of semiconductor device 1906. Also shown in step 1980 is an approximate beam spot 1922 of scanning first photon pulse 1916. The scanning may be 1D scanning or 2D scanning, such as illustrated in arrows 1924 and 1926.

The first surface 1906 may have a first spatial dimension 1932 and a second spatial dimension 1934. The spatial dimensions may be on the order of centimeters (cm) or millimeters (mm). For example, in one embodiment, the first spatial dimension 1932 may be approximately 4 mm and the second spatial dimension 1934 may be approximately 5 mm. The spatial dimensions 1932/1934 may vary in other embodiments. FIG. 19 may not be to scale. For example, beam spot 1922 may be significantly smaller in characteristic feature size and/or spatial dimensions (e.g., the spatial pulse width), with respect to spatial dimensions 1932/1934, than is shown in FIG. 19. In some embodiments, the spatial pulse width of beam spot 1922 may be less than 0.5 mm. As discussed throughout, the scanning frequency and/or the pulsing frequency of the photon source and/or pulsed photon beam may be modulated to further control the thermal effects.

Figure 20:
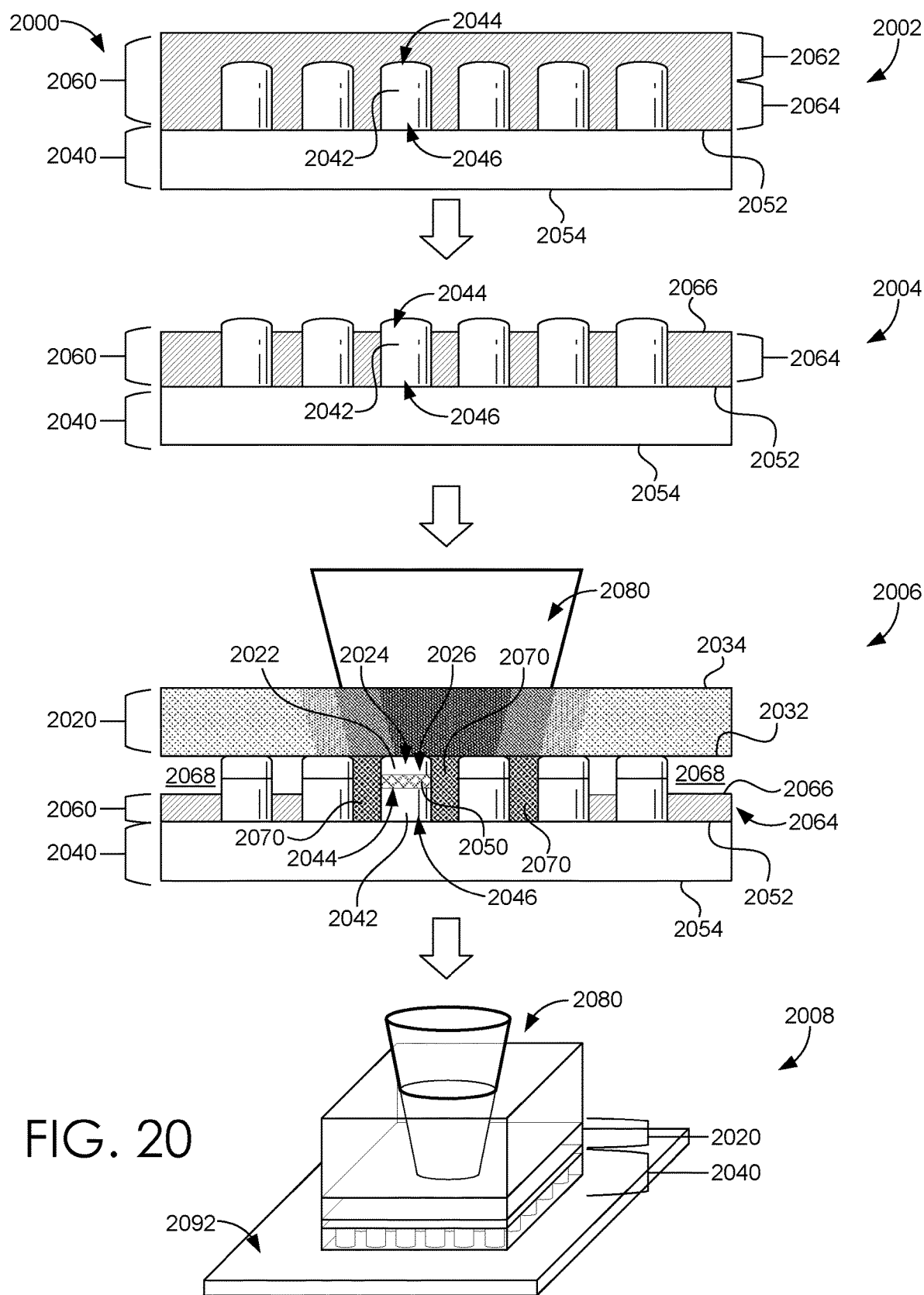
FIG. 20 illustrates an enhanced process flow for curing pre-applied underfill material, via plasma etching and photon beams, that is consistent with the various embodiments.

Generalized Processes for Curing Pre-Applied Underfill Material, Via Plasma Etching and Lasers FIG. 20 illustrates one embodiment of an enhanced process flow for curing pre-applied underfill (UF) material, via plasma etching and lasers. The plasma may be based on one or more gases, such as but not limited to O2, N2, Argon, or the like. Embodiments of process 2000 are directed towards pre-applying the UF material to stabilize the electrical coupling of a first semiconductor device (e.g., semiconductor device 2020) and a second semiconductor device (e.g., target substrate 2040). In process 2000, the UF material may be applied prior to forming the "sandwich" that forms the alignment between the pairs of corresponding electrical contacts of the first semiconductor device and the second semiconductor device. That is, the uncured UF material may be deposited on the first semiconductor device, the second semiconductor device, or a combination thereof. The uncured UF material may be cured via one or more photon beams that are also employed to electrically bond the electrical contacts of the first semiconductor device and the second semiconductor device. In other embodiments of process 2000, other curing processes may be employed. In some embodiments of process 2000, an excess portion of the pre-applied and uncured UF material may be removed via plasma etching. A continuous photon beam or a pulsed photon beam may be employed to form and anneal the electrical bonds, as well as cure the UF material.

More specifically, process 2000 may be employed to cure UF material that has been applied to at least one of the first semiconductor device and/or the second semiconductor device. The UF material may be applied to the at least one of the first semiconductor device or the second semiconductor device prior to electrically coupling the first and second semiconductor devices. Once cured, the UF material may mechanically couple the first and second semiconductor devices. The mechanical coupling of the semiconductor devices may increase a reliability of an electrical coupling between the semiconductor devices.

In some embodiments of process 2000, thermal energy is provided to cure the UF material. The thermal energy may be provided by a continuous or a pulsed photon beam. For a continuous photon beam, the spatial profile of the photon beam may be selected and/or modulated to control for adverse thermal effects (e.g., misalignment of electrical contacts of the first and second semiconductor devices due to a CTE mismatch of the semiconductor devices.) For a pulsed photon beam (e.g., a photon pulse), one or more of the spatial profile and/or temporal profile may be selected or modulated to control adverse thermal effects. Any of the various methods of selecting or modulating the temporal and/or spatial profile of a photon beam/pulse discussed herein may be employed. In some embodiments, the photon beam or pulse may be a laser beam or a laser pulse.

In at least one embodiment, at least a portion of the provided thermal energy may electrically couple the first and second semiconductor devices, via the formation of one or more an electrical bonds between at least one corresponding pair of electrical contacts of the first and the second semiconductor devices. That is, a portion of the thermal energy provided by a photon pulse cures the UF material, while another portion of the thermal energy forms an electrical bond between a first electrical contact of the first semiconductor device and a second electrical contact of the second semiconductor device. In some embodiments, the cured UF material may mechanically stabilize the electrical coupling and/or the electrical bond. As discussed throughout, the photon source that transmits the photon beam/pulse may be scanned to provide thermal energy uniformly across a substantial portion of the first and/or second semiconductor devices. Scanning a pulsed photon beam may decrease the total amount of thermal energy being provided per unit time (because only a small portion of the semiconductor device is being irradiated at any particular moment). The alignment between the electrical contacts between the two semiconductor devices may be preserved, even in the presence of a CTE mismatch scenario. Scanning the photon source may ensure that each pair of corresponding electrical contacts is bonded and that at least a substantial portion of the applied UF material is cured.

In some embodiments, the first semiconductor device may be semiconductor device 2020 shown in FIG. 20. Semiconductor device 2020 may be virtually any semiconductor device, including any of the various embodiments of LED devices discussed herein. For example, semiconductor device 2020 may be a micro light emitting diode (μLED) with feature sizes that are less than 100 micrometers (μm). The semiconductor device 2020 may be included in a display device. The display device may be included in a head-mounted device that is at least one of a virtual-reality device, an augmented-reality device, or a mixed-reality device. The second semiconductor device may be virtually any other semiconductor device, such as but not limited to target substrate 2040. Target substrate 2040 may be equivalent to, or at least similar to, any of the target substrate devices discussed herein. Thus, target substrate 2040 may be a backplane of the display device.

As shown in FIG. 20, semiconductor device 2020 may include a first surface 2032, a third surface 2034, and a plurality of electrical contacts, including but not limited to first electrical contact 2022. At least some of the plurality of electrical contacts of semiconductor device 2020 may be and/or include "solder bump"-type electrical contacts. At least some of the plurality of electrical contacts of semiconductor device 2020 may be comprised of nanoporous gold (NPG). At least some of the plurality of electrical contacts of semiconductor device 2020 may be comprised of gold, silver, or the like.

As shown in FIG. 20, each of the plurality of electrical contacts of semiconductor device 2020 may extend from and beyond the first surface 2032 of semiconductor device 2020. As such, first electrical contact 2022 includes a distal portion 2024 and a proximal portion 2026. The proximal portion 2026 of first electrical contact 2022 of semiconductor device 2020 is relatively proximate the first surface 2032 of semiconductor device 2020, compared to the distal portion 2024 of first electrical contact 2022. The distal portion 2024 of first electrical contact 2022 of semiconductor device 2020 is relatively distant from the first surface 2032 of semiconductor device 2020, as compared to the proximal portion 2026 of semiconductor device 2020. That is, the proximal portion 2026 of first electrical contact 2022 is closer to the first surface 2032 than the more distant distal portion 2024 of the first electrical contact 2022.

Furthermore, target substrate 2040 may include a second surface 2052, a fourth surface 2054, and a plurality of electrical contacts, including but not limited to second electrical contact 2042. Similar to semiconductor device 2020, at least some of the plurality of electrical contacts of target substrate 2040 may be "solder bump"-type electrical contacts. At least some of the plurality of electrical contacts of target substrate 2040 may be comprised of nanoporous gold (NPG). At least some of the plurality of electrical contacts of target substrate 2040 may be comprised of gold, silver, or the like. As shown in FIG. 20, each of the plurality of electrical contacts of target substrate 2040 extend from and beyond the second surface 2052 of target substrate 2040. As such, second electrical contact 2042 includes a distal portion 2044 and a proximal portion 2046. The proximal portion 2046 of second electrical contact 2042 of target substrate 2040 is relatively proximate the second surface 2052 of target substrate 2040, as compared to the distal portion 2044 of second electrical contact 2042. The distal portion 2044 of second electrical contact 2042 of target substrate 2040 is relatively distant from the second surface 2052 of target substrate 2040, as compared to the proximal portion 2046 of second electrical contact 2042. That is, the proximal portion 2046 of second electrical contact 2042 is closer to the second surface 2052 than the more distant distal portion 2044 of the second electrical contact 2042.

At step 2002 of process 2000, uncured UF material 2060 is deposited on and/or applied to at least one surface of at least one of target substrate 2040 or semiconductor device 2020. In various embodiments, an UF applicator device and/or an UF application process may be employed to apply and/or deposit the uncured UF material 2060. The UF application process may include a spin coating process, a dip coating process, a doctor blading process, a spray coating process, or the like. As shown in FIG. 20, the uncured UF material 2060 may be deposited on the second surface 2052 of target substrate 2040. When deposited on the second surface 2052 of target substrate 2040, the uncured UF material 2060 may substantially cover second surface 2052 and substantially encapsulate the second electrical contact 2042 of target substrate 2040.

In other embodiments not shown in FIG. 20, at step 2002, the uncured UF material 2060 may be deposited on first surface 2032 of semiconductor device 2020, to substantially cover the first surface 2032 and substantially encapsulate the first electrical contact 2022 of semiconductor device 2020. The uncured UF material 2060 may include a distal portion 2062 and a proximal portion 2064, where the proximal portion 2064 of uncured UF material 2060 is more proximate to the second surface 2052 of target substrate 2040 than the more distant distal portion 2062. The distal portion 2062 of the uncured UF material 2060 may be an excess portion of the uncured UF material 2060.

At step 2004, the distal or excess portion 2062 of the uncured UF material 2060 is removed to form an exposed layer 2066 of uncured UF material 2060. The removal of the excess portion 2062 of the uncured UF material 2060 at least partially exposes the distal portion 2044 of second electrical 2042 (or the distal portion 2024 of first electrical contact 2022 of the uncured UF material 2060 is applied to the first surface 2032 of semiconductor device 2020). The excess portion 2062 of the uncured UF material 2060 may be removed via an etching process. That is, the excess portion 2062 may be removed by exposure to an etching source, such as but not limited to an etching plasma. Thus, the excess portion 2062 of the uncured UF material 2060 may be removed via a plasma etching process. For example, the uncured UF material 2060 (or at least the excess portion 2062 thereof) may be exposed to a plasma source that etches away the excess portion 2062 of the uncured UF material 2060 and forms (or exposes) the exposed layer 2066 of the uncured UF material 2060. The plasma of the plasma source maybe a radiofrequency (RF) oxygen plasma.

In addition to etching the excess portion 2062 of the uncured UF material 2060, the plasma may functionalize one or more surfaces of the exposed distal portion 2044 of the second electrical contact 2042. That is, the plasma may increase the wetting properties of the one or more surfaces of the distal portion 2044 of second electrical contact 2042 so that the second electrical contact 2042 more readily adhesively bonds to first electrical contact 2022, prior to a formation of electrical bond 250. The enhanced adhesive bonding of the first electrical contact 2022 to the second electrical contact 2042, via the functionalization of the one or more surfaces of the exposed distal portion 2044 of the second electrical contact 2042, provides a mechanical stabilization, prior to electrically coupling, for an alignment between first electrical contact 422 and second electrical contact 442. That is, functionalizing a portion of second electrical contact 242, via exposure to plasma material, decreases the likelihood of a misalignment (due to thermal effects associated with a CTE mismatch) between first electrical contact 422 and second electrical contact 442, prior to electrically coupling first electrical contact 422 and second electrical contact 442. Thus, the functionalization contributes to controlling, or at least decreasing a severity, in adverse thermal effects.

At step 2006, semiconductor device 2020 may be positioned proximate to the target substrate 2040 to form a spatial alignment of the first electrical contact 2022 of semiconductor device 2020 with the second electrical contact 2042 of the target substrate 2040. When aligned, the first surface 2032 and the second surfaces 2052 may be opposed surfaces, a void 2068 is disposed between the first surface 2032 and the exposed layer 2066 of the uncured UF material 2060. The at least partially exposed distal portion 2044 of the second electrical contact 2042 is adjacent the distal portion 2024 of the first electrical contact 2022. A pick and place head (PPH) may be employed to position semiconductor device 2020 proximate to target substrate 2040 and from the spatial alignment of the first electrical contact 2022 of semiconductor device 2020 with the second electrical contact 2042 of the target substrate 2040.

Also at step 2006, thermal energy is provided to the uncured UF material 2060 to cure the uncured UF material 2060. Region marked with hatched pattern 270 indicate a portion of the UF material 260 that has been cured via the thermal energy. The thermal energy increases a volume (as shown via hatched regions 2070) of the uncured UF material 2060 and decreases a volume of the void 2068 disposed between the first surface 2032 and the exposed layer 2066 of the uncured UF material 260. The cured UF material 2070 stabilizes the spatial alignment of the first electrical contact 2022 with the second electrical contact 2042. At least a portion of the provided thermal energy may electrically bond the distal portion 2024 of the first electrical contact 2022 to the at least partially exposed distal portion 2044 of the second electrical contact 2042. That is, at least a portion of the thermal energy may form electrical bond 2050 and form an electrical coupling between semiconductor device 2040 and target substrate 2040.

In some embodiments, and to generate the thermal energy, a photon beam 2080 may be transmitted to irradiate the semiconductor device 2020. In other embodiments not shown in FIG. 20, the photon beam 2080 may be transmitted to irradiate the target substrate 2040. In still other embodiments, opposed and/or coaxial photon beams, such as those discussed in conjunction with at least FIG. 19, may be employed to irradiated both semiconductor device 2020 and target substrate 2040, and generate at least a portion of the thermal energy.

The wavelength (or frequency) of the photons of photon beam 2080 may be selected, such that the laser radiation of photon beam 2080 is absorbed in a selected region of the irradiated semiconductor device 2020 or the irradiated target substrate 2040. A substantial portion of the thermal energy is induced in the absorption region of semiconductor device 2020 or the irradiated target substrate 2040. The induced thermal energy may dissipate or flow to other regions for curing the UF material 2060 and/or forming electrical bonds (e.g., electrical bonds 2050). The gradient in shading of semiconductor device 2020 indicates a gradient in the flow of the induced thermal energy away from the absorption region and a flow to the regions where the thermal energy will cure the UF material and bond the electrical contacts.

In some embodiments, the semiconductor device 2020 and/or the target substrate 2040 may include an epitaxial layer (e.g., an epi layer) of semiconductor material layered on semiconductor substrate (or bulk) region of semiconductor material. In some embodiments, the wavelength of photon beam 2080 may be selected such that the laser radiation of photon beam 2080 is absorbed in an epi layer of the semiconductor device 2020 or the target substrate 2040. For example, the photons of photon beam 2080 may be ultraviolet (UV) photons with a wavelength of less than 360 nanometers. In other embodiments, the wavelength of photon beam 2080 may be selected such that the laser radiation of photon beam 2080 is absorbed in the electrical contacts of the semiconductor device 2020 or the target substrate 2040 (e.g., the absorption region may be in first electrical contact 2022 and/or second electrical contact 2042). In such embodiments, the photons may be infrared (IR) photons with a wavelength greater than 800 nanometers. Thus, at least a portion of the thermal energy may be generated and/or induced in at least one of an epitaxial layer of the semiconductor device 2020, an epitaxial layer of the target substrate 2040, the first electrical contact 2024, or the second electrical contact 2042.

As noted above, photon beam 2080 may be a photon pulse. Photon pulse 2080 may include a temporal and/or spatial profile that is modulated to control thermal effects associated with the thermal energy and/or the spatial alignment of the first electrical contact with the second electrical contact, the thermal. As discussed throughout, the temporal and/or spatial profile of the photon pulse 2080 may be based on a thermal diffusivity and a geometry associated with the semiconductor device 2020 or the target substrate 2040. The temporal and/or spatial profile may be selected and/or modulated based on a geometry of at least the semiconductor device 2020 and/or the target substrate 2040 (e.g., a spatial distance between the first electrical contact 2022 and an adjacent electrical contact of the semiconductor device 2020).

The temporal profile localizes the thermal effects to at least one of the first electrical contact 2022, the second electrical contact 2042, and/or portion of the uncured UF material adjacent the second electrical contact (e.g., hatched regions 2070). The localized thermal effects may include decreasing a viscosity of a localized portion of the uncured UF material. As shown in hatched regions 2070, the localized thermal energy may increase a volume of the localized portion of the uncured UF material, such that at least some of the localized portion of the uncured UF 2060 material flows over a surface of the at least partially exposed distal portion 2044 of the second electrical contact 2042 or the distal portion 2024 of first electrical contact 2022. The localized portion of the uncured UF material 2060 may be localized around the second electrical contact 2042 and/or the first electrical contact 2022. That is, the lowered viscosity and increased volume of the UF material 2060 may "wet" exposed surfaces of the electrical contacts (e.g., first electrical contact 2022 and/or second electrical contact 2042).

More particularly, as the UF material 2060 is heated, the volume of the UF material 2060 increases to fill any voids and/or gaps surrounding the electrical contacts. For example, during the laser scanning, as the UF material 2060 expands, the gap is closing while the air is steadily removed. Furthermore, as the UF material 2060 is heated above the glass transition temperature of the UF material 2060, the CTE of the UF material 2060 may be increased. When the semiconductor device 2020 and/or the target substrate 2040 is of sufficiently low thermal conductivity and/or the pitching between the electrical contacts is large enough such that thermal effects may be acceptable, the photon beam 2080 may be a continuously operated photon beam. However, when adverse thermal effects are a concern (e.g., when the thermal conductivity of the devices is sufficiently high and/or the pitch of the electrical contacts is sufficiently small), photon beam 2080 may be a pulsed photon beam. For example, the thermal walk-off induced by CTE mismatch may occur at various pitches if the diameter of interconnect (pillars/bumps) is sufficiently small. Decreasing the interconnect pitch may lead to automatically thinner bumps.

As shown in step 2008, the (pulsed or continuous) photon beam 2080 may be a scanning photon beam. As such, scanning photon beam 2080 may irradiate and be scanned across at least one of the third surface 2034 of semiconductor device 2020 and/or the fourth surface 2054 of the target substrate 2040. The scanning photon beam 2080 may be provided via a scanning pulsed laser source. The pulsing frequency and/or the scanning frequency of the pulsed scanning laser beam 2080 may be selected to further control the thermal effects. In some embodiments, target substrate 2040 may be populating a circuit board, such as circuit board 2092.

Figure 21:
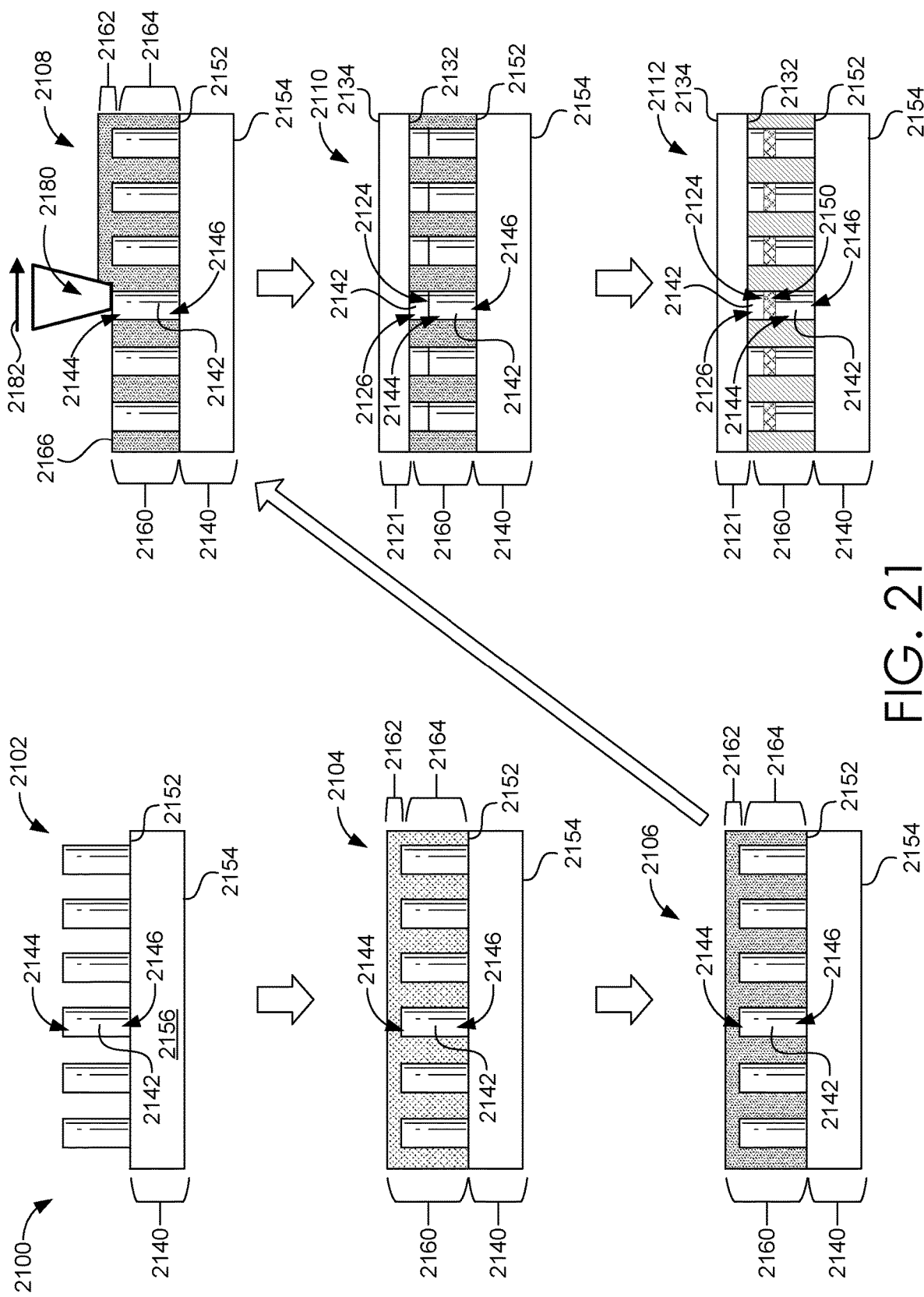
FIG. 21 illustrates an enhanced process flow for selectively bonding semiconductor devices and curing pre-applied underfill material, via photon beams, that is consistent with the various embodiments.

Generalized Processes for Selectively Bonding Semiconductor Devices and Curing Pre-Applied Underfill Material, Via Lasers FIG. 21 illustrates one embodiment of an enhanced process flow for selectively bonding semiconductor devices and curing pre-applied underfill material, via photon beams, that is consistent with the various embodiments. In embodiments of process 2100, a two-stage curing process is employed for the pre-applied UF material. The two UF curing stages may include a pre-curing stage and a curing stage. In such embodiments, the pre-applied UF material may be pre-cured via a thermal curing process (e.g., with an ultraviolet (UV) or an infrared (IR) photon beam). After pre-curing, the excess portion of the pre-cured UF material may be removed via a laser ablation and/or laser abrasion process. Electrical bonding of the electrical contacts may be formed via continuous or pulsed photon beams. In some embodiments, in addition to or as an alternative to pulsed photon beams electrically bonding the contacts, low temperature thermocompression may be employed to electrically bond the electrical contacts after the laser abrasion process. After (or before) the electrical coupling of a first semiconductor device (e.g., semiconductor device 2120) and a second semiconductor device (e.g., target substrate 2140), the pre-cured UF material may be cured via a room temperature (or low temperature) curing process. For example, an anaerobic or moisture curing process may be employed for the second curing stage.

More specifically, process 2100 may be employed to cure UF material that has been applied to at least one of a first semiconductor device and/or a second semiconductor device. The UF material may be pre-applied to the at least one of the first semiconductor device, the second semiconductor device, or a combination thereof, prior to electrically coupling the first and second semiconductor devices. Once cured, the UF material may mechanically couple the first and second semiconductor devices. The mechanical coupling of the semiconductor devices may increase a reliability of an electrical coupling between the semiconductor devices.

Various embodiments of process 2100 may include a two-stage curing process. During the first stage, the UF material may be pre-cured. That is, the UF material may include a 2-stage UF material. The pre-curing stage may include an ultraviolet (UV) curing process, an infrared (IR) curing process, or a thermal curing process. The second stage curing process may include a room or low-temperature curing process. For example, the second stage curing process may include an anaerobic or moisture curing process, performed at approximately room temperature. The curing stage may include employing an anaerobic adhesive to cure the pre-cured UF material. In other embodiments, the curing stage may include employing a moisture-absorbing process to cure the pre-cured UF material.

Between the pre-curing and curing stages, the electrical contacts of the two semiconductor devices may be bonded via a continuously operated, or pulsed, photon beam, such as those embodiments discussed herein. After the pre-curing process and before electrically bonding the electrical contacts, an excess volume of the pre-cured UF material may be removed via a laser-abrasion process (e.g., a laser ablation process). The laser abrasion/ablation process may expose the electrical contacts of at least one of the first semiconductor device or the second semiconductor device for bonding with the electrical contacts of the other device. The laser abrasion process may form a planar surface on a distal portion of the pre-cured UF material. That is, the laser abrasion may planarize a surface of the pre-cured UF material.

In some embodiments, the first semiconductor device may be semiconductor device 2120 shown in FIG. 21. Semiconductor device 2120 may be virtually any semiconductor device, including any of the various embodiments of LED devices discussed herein. For example, semiconductor device 2120 may be a micro light emitting diode (µLED) with feature sizes that are less than 100 micrometers (µm). The semiconductor device 2120 may be included in a display device. The display device may be included in a head-mounted device that is at least one of a virtual-reality device, an augmented-reality device, or a mixed-reality device. The second semiconductor device may be virtually any other semiconductor device, such as but not limited to target substrate 2140. Target substrate 2140 may be equivalent to, or at least similar to, any of the target substrate devices discussed herein. Thus, target substrate 2140 may be a backplane of the display device.

As shown in FIG. 21, semiconductor device 2120 may include a first surface 2132, a third surface 2134, and a plurality of electrical contacts, including but not limited to first electrical contact 2122. At least some of the plurality of electrical contacts of semiconductor device 2120 may be and/or include "solder bump"-type electrical contacts. In some embodiments, the plurality of electrical contacts of semiconductor device 2120 may be comprised of a deformable and/or pliable electrically conductive materials. For example, at least some of the plurality of electrical contacts of semiconductor device 2120 may be comprised of deformable nanoporous gold (NPG). In other embodiments, at least some of the plurality of electrical contacts of semiconductor device 2120 may be comprised of deformable gold and/or deformable silver. Other deformable and electrically conductive material may be employed to fabricate the plurality of electrical contacts of semiconductor device 2120.

As shown in FIG. 21, each of the plurality of electrical contacts of semiconductor device 2120 may extend from and beyond the first surface 2132 of semiconductor device 2120. As such, first electrical contact 2122 includes a distal portion 2124 and a proximal portion 2126. The proximal portion 2126 of first electrical contact 2122 of semiconductor device 2120 is relatively proximate the first surface 2132 of semiconductor device 2120, compared to the distal portion 2124 of first electrical contact 2122. The distal portion 2124 of first electrical contact 2122 of semiconductor device 2120 is relatively distant from the first surface 2132 of semiconductor device 2120, as compared to the proximal portion 2126 of semiconductor device 2120. That is, the proximal portion 2126 of first electrical contact 2122 is closer to the first surface 2132 than the more distant distal portion 2124 of the first electrical contact 2122.

Furthermore, target substrate 2140 may include a second surface 2152, a fourth surface 2154, and a plurality of electrical contacts, including but not limited to second electrical contact 2142. Similar to semiconductor device 2120, at least some of the plurality of electrical contacts of target substrate 2140 may be "solder bump"-type electrical contacts. In some embodiments, the plurality of electrical contacts of target substrate 2140 may be comprised of a deformable and/or pliable electrically conductive materials. For example, at least some of the plurality of electrical contacts of target substrate 2140 may be comprised of deformable nanoporous gold (NPG). At least some of the plurality of electrical contacts of target substrate 2140 may be comprised of deformable gold, silver, or the like.

As shown in FIG. 21, each of the plurality of electrical contacts of target substrate 2140 extend from and beyond the second surface 2152 of target substrate 2140. As such, second electrical contact 2142 includes a distal portion 2144 and a proximal portion 2146. The proximal portion 2146 of second electrical contact 2142 of target substrate 2140 is relatively proximate the second surface 2152 of target substrate 2140, as compared to the distal portion 2144 of second electrical contact 2142. The distal portion 2144 of second electrical contact 2142 of target substrate 2140 is relatively distant from the second surface 2152 of target substrate 2140, as compared to the proximal portion 2146 of second electrical contact 2142. That is, the proximal portion 2146 of second electrical contact 2142 is closer to the second surface 2152 than the more distant distal portion 2144 of the second electrical contact 2142.

At step 2102 of process 2100, the target substrate 2140 may be positioned. At step 2104, uncured UF material 2160 is deposited on and/or applied to at least one surface of at least one of target substrate 2140 or semiconductor device 2120. In various embodiments, an UF applicator device and/or an UF application process may be employed to apply and/or deposit the uncured UF material 2160. The UF application process may include a spin coating process, a dip coating process, a doctor blading process, a spray coating process, or the like. As shown in FIG. 21, the uncured UF material 2160 may be deposited on the second surface 2152 of target substrate 2140. When deposited on the second surface 2152 of target substrate 2140, the uncured UF material 2160 may substantially cover second surface 2152 and substantially encapsulate the second electrical contact 2142 of target substrate 2140.

In other embodiments not shown in FIG. 21, at step 2104, the uncured UF material 2160 may be deposited on first surface 2132 of semiconductor device 2120, to substantially cover the first surface 2132 and substantially encapsulate the first electrical contact 2122 of semiconductor device 2120. The uncured UF material 2160 may include a distal portion 2162 and a proximal portion 2164, where the proximal portion 2164 of uncured UF material 2160 is more proximate to the second surface 2152 of target substrate 2140 than the more distant distal portion 2162. The distal portion 2162 of the uncured UF material 2160 may be an excess portion of the uncured UF material 2160.

At step 2106, thermal energy may be applied to the uncured UF material 2160 to pre-cure the UF material 2060. That is, a UF pre-curing apparatus may employ a thermal curing process to pre-cure the uncured UF material 2160. The different density of shading of the UF material 2160 in step 2104 and step 2106 shows the transition from the uncured UF material in step 2104 and the pre-cured UF material 2160 of step 2106. The thermal energy may be provided by a photon source (not shown in FIG. 21). The photon source may provide a photon beam (not shown in FIG. 21). The photon beam of step 2106 may be scanning photon beam. The photon beam may be a continuously operated photon beam or a pulsed photon beam such as those embodiments discussed throughout. The temporal and/or spatial profile of the photon pulse may be selected to control for adverse thermal effects. The photon beam may be provided by a laser device. The wavelength of the photons in the photon beam may be within the ultraviolet (UV) range. In at least one embodiment, the wavelength may be less than 360 nm. In other embodiments, the wavelength of the photons may be within the visible region of the electromagnetic (EM) spectrum. In still other embodiments, the wavelength of the photons is within infrared (IR) region of the EM spectrum. For example, the photon source may be a carbon dioxide ($CO_2$) laser, where the wavelength is on the order of 10.6 microns (e.g., a mid-IR laser). The thermal energy may be provided by sources other than a photon beam.

At step 2108, a laser abrasion and/or laser ablation process may be performed to remove the excess portion 2162 portion of the UF material 2160. The laser ablation process may include irradiating the excess portion 2162 of the pre-cured UF material 2060 with a photon beam 2180. The photon beam 2180 may be provided by an ablation apparatus (e.g., a laser device). Photon beam 2180 may be a scanning photon beam, as indicated by the scanning arrow 2182. Ablating photon beam 2180 may be scanned across the excess portion 2162 to remove the excess portion 2162 of the pre-cured UF material 2160. Ablating the excess portion 2162 may form a planar surface 2166 of the pre-cured UF material 2160 that at least partially exposes the distal portion 2144 of the second electrical contact 2142. The scanning photon beam 2180 may be continuously operated or pulsed, as discussed throughout to control adverse thermal effects.

At step 2110, the semiconductor device 2120 may be positioned proximate to the target substrate 2040 to form a spatial alignment of the first electrical contact 2122 with the second electrical contact 2142. The first surface 2132 of the semiconductor device 2120 and the second surface 2152 of the target substrate 2040 may be opposing surfaces. The exposed distal portion 2144 of the second electrical contact 2142 is adjacent the distal portion 2124 of the first electrical contact 2122. A pick and place head (PPH) may be employed to position the semiconductor device 2120.

Also at step 2110, an electrical coupling between the semiconductor device 2120 and the target substrate 2140 may be formed by bonding the at least partially exposed distal portion 2144 of the second electrical contact 2142 to the adjacent distal portion 2124 of the first electrical contact 2122. That is, electrical bond 2150 may be formed between the first electrical contact 2122 and the second electrical contact 2142, as shown in step 2112. Bonding the exposed distal portion 2144 of the second electrical contact 2142 to the adjacent distal portion 2124 of the first electrical contact 2122 may be induced by additional thermal energy. The additional thermal energy may be generated by an additional photon beam (not shown in FIG. 21). The additional photon beam may irradiate at least one of third surface 2134 of the semiconductor device 2120 or the fourth surface 2054 of the target substrate 2140. The additional photon beam may be a continuously operated or pulsed photon beam. A discussed throughout, a pulsed photon beam may include a temporal and/or a spatial profile that is selected and/or modulated to control for adverse thermal effects associated with the additional thermal energy provided by the additional photon beam. In some embodiments, in addition to, or as an alternative to pulsed photon beams electrically bonding the contacts, low temperature thermocompression may be employed to electrically bond the electrical contacts after the laser abrasion process. That is, the electrical bonding may be at least partially induced by a low temperature thermocompression bonding process. An anaerobic adhesive of the pre-curing stage may enable or enhance the thermocompression process.

At step 2112, the pre-cured UF material 2160 may be cured. The cured UF material 2160 may mechanically stabilize the electrical coupling between the semiconductor device 2120 and the target substrate 2140. A curing apparatus may be employed to cure the pre-cured UF material 2060. The difference in the shading of the UF material 2160 in steps 2110 and 2112 indicate the transition from pre-cured UF material to cured UF material. The curing apparatus may employ a room temperature UF curing process to cure the pre-cured UF material 2160. For example, an anaerobic and/or moisture curing process may be employed at room (or near) room temperature.

Figure 22:
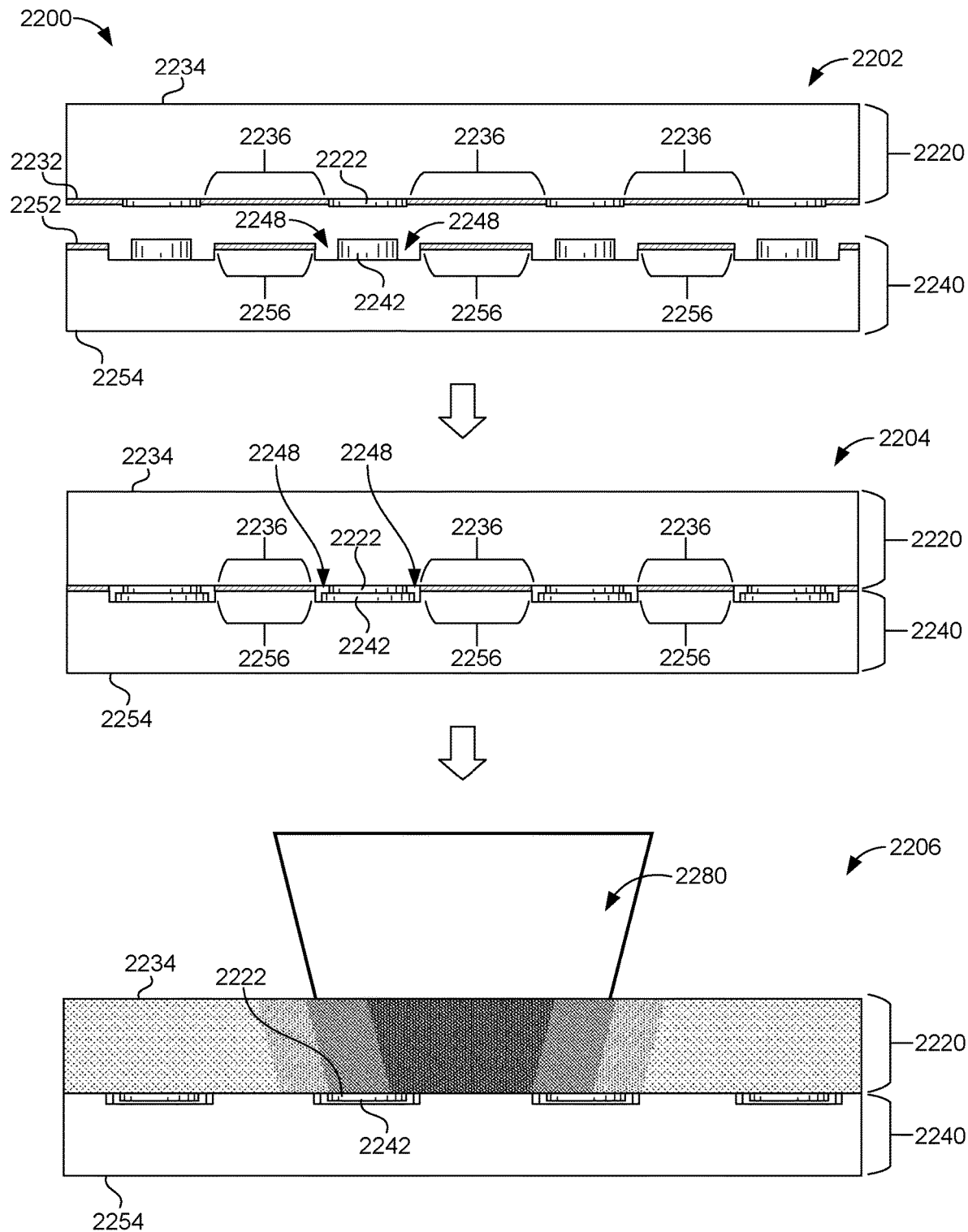
FIG. 22 illustrates an enhanced process flow for selectively bonding semiconductor devices and mechanically stabilizing the electrical bonds, via photon beams and chemical bonding of dielectric layers, that is consistent with the various embodiments.

Generalized Processes for Selectively Bonding Semiconductor Devices and Mechanically Stabilizing the Electrical Bonds, Via Lasers and Chemical Bonding of Dielectric Layers FIG. 22 illustrates one embodiment of an enhanced process flow for selectively bonding semiconductor devices and mechanically stabilizing the electrical bonds, via lasers and chemical bonding of dielectric layers. In embodiments of process 2200, electrical bonds between a first semiconductor device (e.g., semiconductor device 2220) and a second semiconductor device (e.g., target substrate 2240) may be mechanically stabilized without the employment of UF material. An insulating (or dielectric) layer may be formed on surfaces of the first semiconductor device and the second semiconductor. The insulating layers may be activated via plasma activation. When compressed together, the activated insulating layers may at least partially chemically bond (e.g., covalent bonds) to form, prior to electrically bonding, at least a somewhat stable mechanical coupling between the first semiconductor device and the second semiconductor device. The chemical bonding of the insulating layers stabilizes the alignment between corresponding electrical contacts of the first semiconductor device and the second semiconductor device. Because of the stabilization of the alignment, adverse thermal effects resulting in a misalignment of the electrical contacts, during electrical bonding, may be mitigated. A continuous or pulsed photon beam may be employed to form the electrical bonds, depending on the thermal properties of the first semiconductor device and/or the second semiconductor device.

As noted above, process 2200 may be employed to stabilize electrical bonds without the employment of underfill (UF) material. Rather than UF material, the first semiconductor device (e.g., semiconductor device 2220) and the second semiconductor device (e.g., target substrate 2040) may be at least weakly mechanically bonded, prior to being electrically coupled, via an adhesive force associated with a chemical bonding on dielectric surfaces (e.g., insulating layer 2236 and insulating layer 2256) of the semiconductor device 2220 and target substrate 2240. To increase the affinity for chemically bonding the dielectric surfaces, each of insulating layer 2236 and insulating layer 2256 may be activated and/or functionalized via a plasma activation process. After an initial mechanical bonding via application of a compressive force on the semiconductor device 2020 and target substrate 2040 "sandwich," a localized thermal source (e.g., a continuous or pulsed photon beam) may be employed to form the electrical bonds as discussed throughout.

Semiconductor device 2220 may be virtually any semiconductor device, including any of the various embodiments of LED devices discussed herein. For example, semiconductor device 2220 may be a micro light emitting diode ($\mu$LED) with feature sizes that are less than 100 micrometers ($\mu$m). The semiconductor device 2220 may be included in a display device. The display device may be included in a head-mounted device that is at least one of a virtual-reality device, an augmented-reality device, or a mixed-reality device. Target substrate 2240 may be equivalent to, or at least similar to, any of the target substrate devices discussed herein. Thus, target substrate 2240 may be a backplane of the display device.

As shown in FIG. 22, semiconductor device 2220 may include a first surface 2232, a third surface 2234, and a plurality of electrical contacts, including but not limited to first electrical contact 2222. At least some of the plurality of electrical contacts of semiconductor device 2220 may be and/or include "solder bump"-type electrical contacts. In some embodiments, the plurality of electrical contacts of semiconductor device 2220 may be comprised of a deformable and/or pliable electrically conductive materials. For example, at least some of the plurality of electrical contacts of semiconductor device 2220 may be comprised of deformable nanoporous gold (NPG). In other embodiments, at least some of the plurality of electrical contacts of semiconductor device 2220 may be comprised of deformable gold, silver, or the like. Other deformable and electrically conductive material may be employed to fabricate the plurality of electrical contacts of semiconductor device 2220.

As shown in FIG. 22, each of the plurality of electrical contacts of semiconductor device 2220 may extend from and beyond the first surface 2232 of semiconductor device 2220. As such, first electrical contact 2222 may include a distal portion and a proximal portion. The proximal portion of first electrical contact 2222 of semiconductor device 2220 is relatively proximate the first surface 2232 of semiconductor device 2220, compared to the distal portion of first electrical contact 2222. The distal portion of first electrical contact 2222 of semiconductor device 2220 is relatively distant from the first surface 2232 of semiconductor device 2220, as compared to the proximal portion of semiconductor device 2220. That is, the proximal portion of first electrical contact 2222 is closer to the first surface 2232 than the more distant distal portion of the first electrical contact 2222.

Furthermore, target substrate 2240 may include a second surface 2252, a fourth surface 2254, and a plurality of electrical contacts, including but not limited to second electrical contact 2242. Similar to semiconductor device 2220, at least some of the plurality of electrical contacts of target substrate 2240 may be "solder bump"-type electrical contacts. In some embodiments, the plurality of electrical contacts of target substrate 2240 may be comprised of a deformable and/or pliable electrically conductive materials. For example, at least some of the plurality of electrical contacts of target substrate 2240 may be comprised of deformable nanoporous gold (NPG). At least some of the plurality of electrical contacts of target substrate 2240 may be comprised of deformable gold, silver, or the like.

As shown in FIG. 22, each of the plurality of electrical contacts of target substrate 2240 extend from and beyond a recession, depression, divot, and/or well in the second surface 2252 of target substrate 2240. Due to the recession, depression, divot, and/or well in the second surface 2252 of target substrate 2240, a void 2248 is formed around the second electrical contact 2242 of target substrate 2040. More particularly, void 2284 is disposed between a portion of the second insulating layer 2252 and the second contact 2242. Second electrical contact 2242 includes a distal portion and a proximal portion. The proximal portion of second electrical contact 2242 of target substrate 2240 is relatively proximate the second surface 2252 of target substrate 2240, as compared to the distal portion of second electrical contact 2242. The distal portion of second electrical contact 2242 of target substrate 2240 is relatively distant from the second surface 2252 of target substrate 2240, as compared to the proximal portion of second electrical contact 2242. That is, the proximal portion of second electrical contact 2242 is closer to the second surface 2252 than the more distant distal portion of the second electrical contact 2242.

A first insulating layer 2236 may be formed on at least a portion of the first surface 2032 of semiconductor device 2220. The first insulating layer 2236 may cover the at least portion of the first surface 2032 of the semiconductor device 2220 and exposes the distal portion of the first contact 2222 of the semiconductor device 2220. The second insulating layer 2256 may be formed on at least a portion of the second surface 2052 of target substrate 2240. The second insulating layer 2256 may cover the at least portion of the second surface 2052 and expose the distal portion of the second contact 2242 of the target substrate 2240.

One or more fabrication devices may form the first and second insulating layers 2236 and 2256. The first and second insulating layers 2236 and 2256 may be formed from virtually any insulating and/or dielectric material. In some embodiments, one or both of first and second insulating layers 2236 and 2256 may be comprised, at least partly, of silicon dioxide ($SiO_2$), polymer-based insulating passivation layer, and/or another dielectric oxide. Forming the second insulating layer 2256 on the second surface 2252 may at least partially form the void 2250 disposed between the portion of the second insulating layer 2256 and the second electrical contact 2242. In alternative embodiments, not shown in FIG. 22, the first electrical contact 2222 of semiconductor device 2220 may be recessed within a depression, divot, and/or well in the first surface 2232 of semiconductor device 2220. As such, first electrical contact 2222 may at least be partially surrounded by a void, rather than second electrical contact 2242. In some embodiments, the electrical contacts of each of the semiconductor device 2220 and the target substrate 240 may be recessed within a depression, divot, and/or well in the first surface 2232 of the semiconductor device 2220 and/or the second surface 2252 of the target substrate 2040.

At step 2202, a plasma activation process may be applied to the first and/or second insulating layers 2236 and 2256. That is, a plasma may be applied to the first insulating layer 2036 of the semiconductor device 2220 and the second insulating layer 2256 of the target substrate 2240. Exposing the first and second insulating layers 2236 and 2256 to a plasma may activate each of the first insulating layer 2236 and the second insulating layer 2256. Activating the insulating layers 2236 and 2256 may enhance an affinity for chemically bonding (e.g., with covalent bonds) the insulating layers 2236 and 2256. More particularly, the plasma may planarize the activated first insulating layer 2236 and the activated second insulating layer 2256 to enhance a chemical bonding of the activated first insulating layer 2236 and the activated second insulating layer 2256 in step 2204. The plasma may be applied by a plasma apparatus, such as but not limited to a plasma source.

At step 2204, the semiconductor device 2220 may be positioned proximate to the target substrate 2240 to form a spatial alignment of the first contact 2222 of the semiconductor device 2220 with the second contact 2242 of the target substrate 2240. The activated first insulating layer 2236 of semiconductor device 2220 and the second insulating layer 2256 of the target substrate 2240 may be adjacent and/or opposed layers. The exposed distal portion of the second contact 2242 of the target substrate 2240 may be adjacent the exposed distal portion of the first contact 2222 of the semiconductor device 2220. A pick and place head (PPH) may be employed to position the semiconductor device 2220 proximate the target substrate 2240.

Furthermore, at step 2204, a mechanical coupling between the semiconductor device 2220 and the target substrate 2240 may be formed by chemically bonding the activated first insulating layer 2256 of the semiconductor device 2220 to the activated second insulating layer 2256 of the target substrate 2240. More particularly, at step 2204, a compressive force may be applied to at least one of the semiconductor device 2220 or the target substrate 2240. The compressive force may catalyze and/or activate a chemical bonding (e.g., covalent bonds) of the activated first insulating layer 2236 of the semiconductor device 2220 to the activated second insulating layer 2256 of the target substrate 2240. The chemical bonding may provide at least a partial mechanical coupling of the semiconductor device 2220 to the target substrate 2240. The PPH may be employed to provide the compressive force.

As noted above, the second electrical contact 2242 (and/or the first electrical contact 2222) may be comprised of a deformable electrically conductive materials (e.g., NPG, gold, silver, or the like). As such, the compressive force may deform a shape of at least one of the first electrical contact 2222 and/or the second electrical contact 2242. The compressive force may be applied at room temperature or low temperature. When the shape of the first electrical contact 2222 and/or the second electrical contact 2242 is deformed, the displaced electrical conductive material (e.g., the material forming the deformed shape) of the first electrical contact 2222 and/or the second electrical contact 2242 may at least partially fill the void 2250, as shown in step 2204. For example, the shape of at least one of the first electrical contact 2222 and/or the second electrical contact 2242 may be "flattened-out" and widened to at least partially fill the void 2250. In some embodiments, positioning the first semiconductor device 2220 proximate to the target substrate 2240 and forming the mechanical coupling between the semiconductor device 2220 and the target substrate 2240 may be performed at room temperature and at atmospheric pressure.

At step 2206, an electrical coupling between the semiconductor device 2220 and the target substrate 2240 can be made by electrically bonding the exposed distal portion of the second contact 2242 to the adjacent distal portion of the first contact 2222 via inducing thermal energy that is localized to the first and second electrical contacts 2222 and 2242, respectively. The mechanical coupling between the semiconductor device 2220 and the target substrate 2240

(e.g., provided by the covalent bonding of the first insulating layer 2236 and the second insulating layer 2256) mechanically stabilizes the electrical coupling. The induced thermal energy may be induced by a photon beam 2280. Photon beam 2280 may be a continuously operated photon beam or a photon pulse. Photon beam and/or photon pulse 2280 may include a temporal and/or spatial profile that is selected to control thermal effects associated with thermal energy. Controlling the thermal effects may include localizing the thermal energy to the first and second contacts 2222 and 2242. An electrical coupling device (e.g., a photon source and/or a laser) may provide the thermal energy. The photon source may be a scanning photon source and/or a scanning laser. The thermal energy may be localized. The gradient in shading of semiconductor device 2220 indicates a localized gradient in the flow of the induced thermal energy away from the absorption region and a flow to the regions where the thermal energy will bond the electrical contacts.

Although photon beam 2280, as shown in FIG. 22, is irradiating third surface 2234 of semiconductor device, photon beam 2280 may be transmitted to irradiate the fourth surface 2254 of target substrate 2240. In some embodiments, multiple photon beams may be employed to electrically couple semiconductor device 2220 and target substrate 2240, as discussed in conjunction with at least the embodiments of FIG. 19. Photon pulse 2280 may be transmitted by a pulsed photon beam that is scanned across at least one of the third surface 2234 of the semiconductor device 2220 and/or the fourth surface 2254 of the target substrate 2240.

In some embodiments, semiconductor device 2220 and target substrate 2240 may be mechanically and/or electrically coupled via process 2200 at the wafer-level. That is, the semiconductor device 2220 may be a first pre-diced semiconductor die included in a first semiconductor wafer. The target substrate 2240 may be a second pre-diced semiconductor die included in a second semiconductor wafer. Positioning the first semiconductor device 2220 proximate to the target substrate 2240 may include positioning the first semiconductor wafer proximate the second semiconductor wafer.

Process 2200 provides various benefits and/or advantages when electrically coupling semiconductor device 2220 to target substrate 2240. For example, semiconductor device 2220 may be positioned proximate target substrate 2240 at room temperature and/or at atmospheric pressure. A combination of the chemically bonded first insulating layer 2236 and second insulating layer 2256 encapsulates the electrically bonded first electrical contact 2222 and second electrical contact 2242. Thus, an electromigration process associated with the first electrical contact 2222 and the second electrical contact 2242 may be at least partially reduced and/or mitigated. No UF material is required to re-distribute the thermo-mechanical stress associated with a CTE mismatch. Also, the electrical contacts may be smaller, which allows for easier fabrication.

Figure 23:
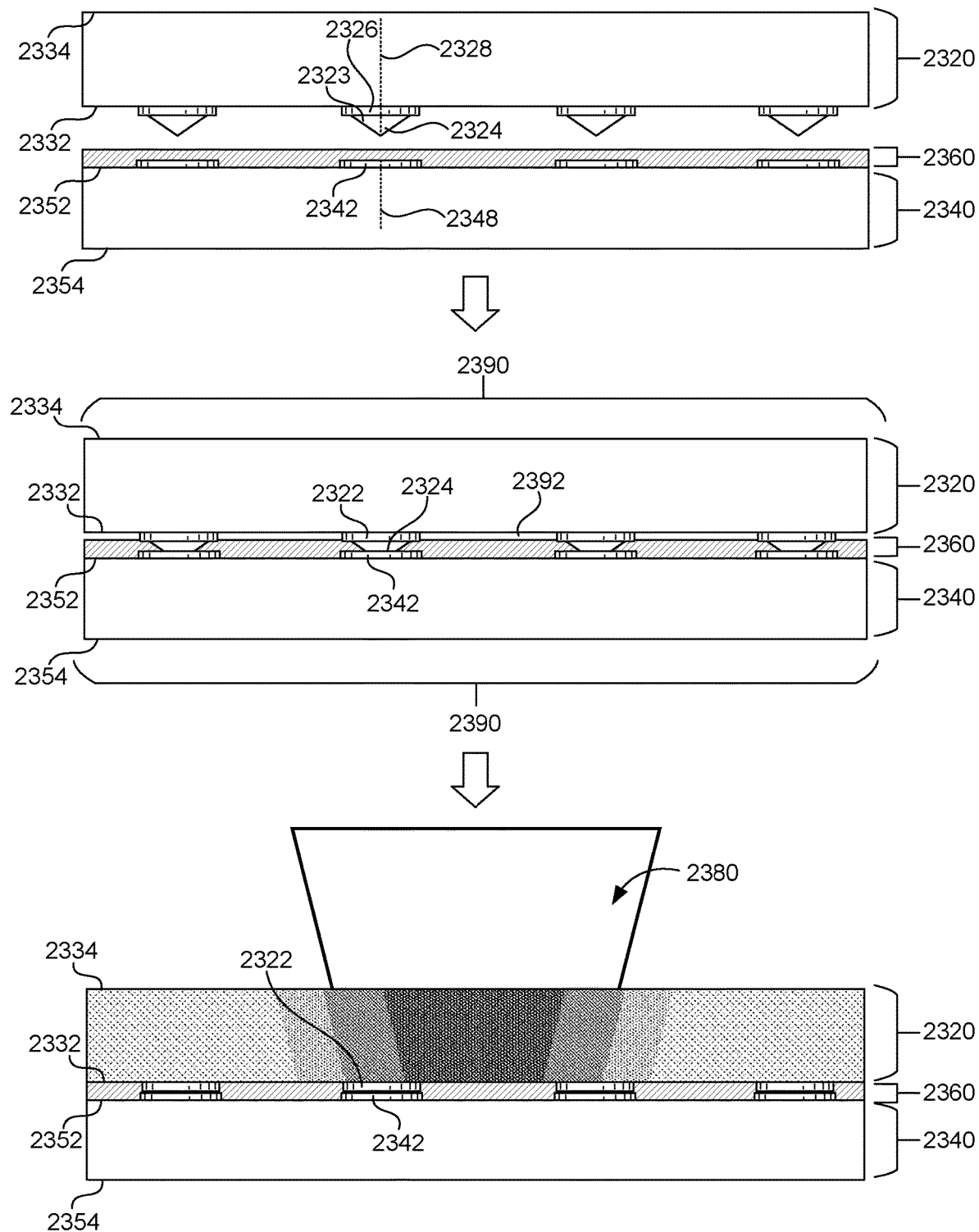
FIG. 23 illustrates one embodiment of an enhanced process flow for selectively bonding semiconductor devices and mechanically stabilizing the electrical bonds, via photon beams and pre-applied underfill material, which is consistent with the various embodiments.

Generalized Processes for Selectively Bonding Semiconductor Devices and Mechanically Stabilizing the Electrical Bonds, Via Lasers and Pre-Applied Underfill Material FIG. 23 illustrates one embodiment of an enhanced process flow for selectively bonding semiconductor devices and mechanically stabilizing the electrical bonds, via photon beams and pre-applied underfill material, which is consistent with the various embodiments. In embodiments of process 2300, pre-applied UF material may be employed to stabilize the pre-bonded alignment of the electrical contacts of the first semiconductor device and a second semiconductor device (e.g., target substrate 2340). The electrical contacts of one of the first semiconductor device or the second semiconductor device may be formed from deformable electrically conductive material (e.g., nanophorous gold, gold, silver, or the like). The deformable electrical contacts of at least one of the semiconductor device 2320 or the target substrate 2340 may be formed into a "spikey" or tapered shape. In some embodiments, one of the semiconductor device 2320 or the target substrate 2340 has "spikey" deformable contacts, while the other of the semiconductor device 2320 or the target substrate 2340 has "flat" contacts. Uncured UF material may be pre-applied to the device (e.g., the semiconductor device 2320 or the target substrate 2340) with the "flat" contacts. The pre-applied and uncured UF material may substantially encapsulate the "flat" electrical contacts. In the non-limiting embodiment shown in FIG. 23, the semiconductor device 2320 has the "spikey" deformable contacts, and uncured UF material is pre-applied to substantially cover or encapsulate the "flat" electrical contacts of the target substrate 2340. In another embodiment not shown in FIG. 23, the target substrate 2340 has the "spikey" deformable contacts, and uncured UF material is pre-applied to substantially cover or encapsulate the "flat" electrical contacts of the first semiconductor device 2320.

A semiconductor device 2320 and target substrate 2340 "sandwich" 2390 may be formed by aligning the "spikey" electrical contacts of the semiconductor device 2320 with the corresponding "flat" contacts of the target substrate 2340 (substantially encapsulated by the pre-applied uncured UF material). The "sandwich" 2390 may be compressed via a compressive force. The compressive force may be applied at room temperature or low temperature. When compressed, the "spikey" contacts act as a wedge to "plow" away (or displace) at least a portion of the uncured UF material encapsulating the corresponding flat electrical contacts. Localized thermal energy (e.g., from continuous or pulsed photon beams) may be applied during the compression. The localized thermal energy deforms and "flattens"-out the "spikey" electrical contacts. As the "spikey" electrical contacts are deformed, additional UF material is displaced. The localized thermal energy bonds the electrical contacts and cures the UF material. Because the "spikey" contacts are "flattened-out" during the compression, bonding, and curing, such embodiments are tolerant to variations in the height and shape of the fabricated electrical contacts.

Semiconductor device 2320 may be virtually any semiconductor device, including any of the various embodiments of LED devices discussed herein. For example, semiconductor device 2320 may a micro light emitting diode (µLED) with feature sizes that are less than 100 micrometers (µm). The semiconductor device 2320 may be included in a display device. The display device may be included in a head-mounted device that is at least one of a virtual-reality device, an augmented-reality device, or a mixed-reality device. Target substrate 2340 may be equivalent to, or at least similar to, any of the target substrate devices discussed herein. Thus, target substrate 2340 may be a backplane of the display device.

As shown in FIG. 23, semiconductor device 2320 may include a first surface 2332, a third surface 2334, and a plurality of electrical contacts, including but not limited to first electrical contact 2322. At least some of the plurality of electrical contacts of semiconductor device 2320 may be and/or include "solder bump"-type electrical contacts. In some embodiments, the plurality of electrical contacts of semiconductor device 2320 may be comprised of a deformable and/or pliable electrically conductive materials. For example, at least some of the plurality of electrical contacts of semiconductor device 2320 may be comprised of deformable nanoporous gold (NPG). In other embodiments, at least some of the plurality of electrical contacts of semiconductor device 2320 may be comprised of deformable gold, silver, or the like. Other deformable and electrically conductive material may be employed to fabricate the plurality of electrical contacts of semiconductor device 2320.

As shown in FIG. 23, each of the plurality of electrical contacts of semiconductor device 2320 may extend from and beyond the first surface 332 of semiconductor device 2320. As such, first electrical contact 2322 includes a distal portion 2324 and a proximal portion 2326. The proximal portion 2326 of first electrical contact 2322 of semiconductor device 2320 is relatively proximate the first surface 2332 of semiconductor device 2320, compared to the distal portion 2324 of first electrical contact 2322. The distal portion 2324 of first electrical contact 2322 of semiconductor device 2320 is relatively distant from the first surface 2332 of semiconductor device 2320, as compared to the proximal portion 2326 of semiconductor device 2320. That is, the proximal portion 2326 of first electrical contact 2322 is closer to the first surface 2332 than the more distant distal portion 2324 of the first electrical contact 2322.

More particularly, the electrical contacts of semiconductor device 2320 may be formed such that a shape of the electrical contacts of semiconductor device 2320, including but not limited to first electrical contact 2322, is a "spikey" and/or tapered shape. That is, the shape of the first electrical contact 2322 may be tapered along an axis 2328 that is substantially orthogonal to the first surface 2332 (and the third surface 2334) of semiconductor device 2320. The proximal portion 2326 of the first electrical contact 2322 is disposed intermediate the first surface 2332 and the distal portion 2324 of the first electrical contact 2322. The cross section of first electrical contact 2322 may be tapered. For instance, an area of a cross section (e.g., a cross section that is substantially orthogonal to the plane of FIG. 23) of the distal portion 2324 of the first electrical contact 2322 is less than an area of a cross section (e.g. a cross section that is substantially orthogonal to the plane of FIG. 23) of the proximal portion 2326 of the first electrical contact 2322. Each of the cross section of the proximal portion 2326 of the first electrical contact 2322 and the cross section of the distal portion 2324 of the first electrical contact 2322 are substantially orthogonal to the axis 2328.

Furthermore, target substrate 2340 may include a second surface 2352, a fourth surface 2354, and a plurality of electrical contacts, including but not limited to second electrical contact 2342. Similar to semiconductor device 2320, at least some of the plurality of electrical contacts of target substrate 2340 may be "solder bump"-type electrical contacts. In some embodiments, the plurality of electrical contacts of target substrate 2340 may be comprised of a deformable and/or pliable electrically conductive materials. For example, at least some of the plurality of electrical contacts of target substrate 2340 may be comprised of deformable nanoporous gold (NPG). At least some of the plurality of electrical contacts of target substrate 2340 may be comprised of deformable gold, silver, or the like. In some embodiments, the electrical contacts of target substrate 2340 are less deformable and/or less pliable than the electrical contacts of semiconductor device 2320.

As shown in FIG. 23, each of the plurality of electrical contacts of target substrate 2340 extend from and beyond the second surface 2352 of target substrate 2340. As such, second electrical contact 2342 includes a distal portion and a proximal portion. The proximal portion of second electrical contact 2342 of target substrate 2340 is relatively proximate the second surface 2352 of target substrate 2340, as compared to the distal portion of second electrical contact 2342. The distal portion of second electrical contact 2342 of target substrate 2340 is relatively distant from the second surface 2352 of target substrate 2340, as compared to the proximal portion of second electrical contact 2342. That is, the proximal portion of second electrical contact 2342 is closer to the second surface 2352 than the more distant distal portion of the second electrical contact 2342.

More particularly, the electrical contacts of target substrate 2340 may be formed such that a shape of the electrical contacts of target substrate 2340, including but not limited to second electrical contact 2342, is a "flat" and/or uniform shape. For example, the shape of second electrical contact may be a "puck" or a flat "disk" shape. That is, the shape of the second electrical contact 2342 may be uniform along an axis 2348 that is substantially orthogonal to the second surface 2352 (and the fourth surface 2354) of target substrate 2340. The proximal portion of the second electrical contact 2342 is disposed intermediate the second surface 2352 and the distal portion of the second electrical contact 2342. A cross section of the second electrical contact 2342 may be substantially uniform. For instance, an area of a cross section (e.g. a cross section that is substantially orthogonal to the plane of FIG. 23) of the distal portion of the second electrical contact 2342 may be substantially equivalent to an area of a cross section (e.g. a cross section that is substantially orthogonal to the plane of FIG. 23) of the proximal portion of the second electrical contact 2342. Each of the cross section of the proximal portion of the second electrical contact 2342 and the cross section of the distal portion of the second electrical contact 2342 are substantially orthogonal to the axis 2348. One or more fabrication devices may form the first electrical contact 2322 of semiconductor device 2320 and the second electrical contact 2342 of the target substrate 2340.

At step 2302 of process 2300, uncured UF material 2360 may be deposited on and/or applied to the second surface 2352 of target substrate 2340. A UF applicator may apply and/or deposit the uncured UF material 2360. Once applied, the uncured UF material 2360 may substantially cover second surface 2352 and substantially encapsulate the second electrical contact 2342 of the target substrate 2340. In other embodiments, the electrical contacts of the semiconductor device 2320 are "flat" and/or uniform electrical contacts. In such embodiments, the electrical contacts of target substrate 2340 may be "spikey" and/or tapered. In such embodiments, at step 2302, uncured UF material 2360 may be deposited on and/or applied to the first surface 2332 of semiconductor device 2320. The uncured UF material 2360 may substantially cover first surface 2332 and substantially encapsulate the first electrical contact 2322 of the semiconductor device 2320. In such embodiments, the electrical contacts of semiconductor device 2320 may be less deformable and/or less pliable than the electrical contacts of target substrate 2340.

At step 2304, the semiconductor device 2320 may be positioned proximate to the target substrate 2340 to form a spatial alignment of the first contact 2322 of the semiconductor device 2320 with the second contact 2342 of the target substrate 2340. The semiconductor device 2320 proximate to the target substrate 2340 may be performed at room temperature and/or at atmospheric pressure. A pick and place head (PPH) may be employed to position the semiconductor device 2320. The first surface 2332 of the semiconductor device 2320 and the second surface 2352 of the target substrate 2340 may be opposed surfaces. When the tapered distal portion 2324 of the first electrical contact 2322 comes into physical contact with the distal portion of the second electrical contact 2342, such that the distal portion of the second electrical contact 2342 is adjacent the distal portion 2324 of the first electrical contact 2322, the tapered shape of the first electrical contact 2322 of the semiconductor device displaces at least a portion of uncured UF material 2360 that encapsulates the second electrical contact 2342 of target substrate 2340.

As shown in the illustration of step 2304, when the semiconductor device 2320 is positioned proximate to the target substrate 2340, a void 2392 disposed between the uncured UF material 2360 and the first surface 2332 of the semiconductor device 2320 is formed. Also at step 2304, the PPH, or another fabrication apparatus, may apply a compressive force to at least one of the semiconductor device 2320 or the target substrate 2040. The compressive force may be applied at room temperature or low temperature. As shown in step 2304, the compressive force may deform the tapered shape of the first electrical contact 2322 (or alternatively the second electrical contact 2342). The compressive force may somewhat "flatten"-out the "spikey" shape of the first electrical contact 2322.

At step 2306, thermal energy is provided. A thermal energy source may provide the thermal energy. A portion of the thermal energy may cure the uncured UF material 2360. As shown in the illustration of step 2306, the thermal energy may further deform the tapered shape of the first electrical contact 2322. Note that the deformed shape of the first electrical contact 2322 (as shown in the illustration of step 2306) is less tapered than the tapered shaped of the first electrical contact 2322 (as illustrated in step 2302). The deformed shaped of the first electrical contact 2322 displaces an additional portion of the uncured UF material 2360 that substantially encapsulates the second electrical contact 2342. The thermal energy may further "flatten"-out the "spikey" shape of the first electrical contact 2322, as well as cure the UF material 2360 and electrically bond the "flattened-out" first electrical contact 2322 to the second electrical contact 2342. As the "spikey" shape of the first electrical contact 2322 is flattened-out, more UF material 2360 is displaced. Furthermore, the thermal energy may further soften the deformable material of the first electrical contact 2322 and/or further soften the UF material 2360. Displacing the UF material 2360 may further increase the mechanical stability of the electrical coupling of the first electrical contact 4222 and the second electrical contact 2342. During the electrical bonding and UF material 2360 curing, and as the tapered shape of the first electrical contact 2322 is flattened-out, the conductive surfaces of the first electrical contact 2322 and the second electrical contact 2342 may be kept in physical contact, further preserving the spatial alignment of the first electrical contact 2322 and the second electrical contact 2342. Also note that providing the thermal energy to cure the UF material 2360 may increase the volume of the uncured UF material 2360 and displace, remove, and/or at least partially fill in the void 2392. The thermal energy may be localized. The gradient in shading of semiconductor device 2320 indicates a localized gradient in the flow of the induced thermal energy away from the absorption region and a flow to the regions where the thermal energy will cure the UF material 2360 and bond the electrical contacts.

As discussed throughout, curing the UF material 2360 may form a mechanical coupling between the semiconductor device 2320 and the target substrate 2340. Another portion of the thermal energy may electrically bond the distal portion of the second electrical contact 2342 to the distal portion 2324 of the first electrical contact 2342. Electrically bonding the first electrical contact 2322 to the second electrical contact 2342 may form an electrical coupling between the semiconductor device 2320 and the target substrate 2340. The mechanical coupling between the semiconductor device 2320 and the target substrate 2340 mechanically stabilizes the electrical coupling between the first electrical contact 2322 and the second electrical contact 2342.

The thermal energy may be provided by a continuous or pulsed photon beam 2380. Thus, at step 2306, the thermal energy source (e.g. a photon source such as but not limited to a laser) may transmit photon beam 2380 that induces the thermal energy. Photon beam 2380 may be a photon pulse. Photon pulse 2380 may have a temporal and/or spatial profile that is selected to control thermal effects associated with the thermal energy. Controlling the thermal effects may include localizing the thermal effects to the first electrical contact 2322, the second contact 2342, and another portion of the uncured UF material 2360 that substantially encapsulates the first electrical contact 2322 and the second electrical contact 2342. The temporal and/or spatial profile of photon pulse 2380 may be selected and/or modulated based on geometrical and/or thermal properties of the semiconductor device 2320 and/or the target substrate 2340. For example, the temporal and/or spatial profile of photon pulse may be based on the CTE of the semiconductor substrate 2320 and/or the target substrate, a spatial distance between the first electrical contact 2322 and another electrical contact of the semiconductor device 2320 (e.g., the pitch of the electrical contacts of the semiconductor device 2220), the pitch of the electrical contacts of the target substrate 2340, or the like. The wavelength (or frequency) of the photons of photon pulse 2380 may be selected and/or modulated to decrease radiation damage, associated with the laser radiation of photon pulse 2380, as well as further control the adverse thermal effects.

As shown in FIG. 23, photon pulse 2380 may irradiate the third surface 2334 of the semiconductor device 2320. In other embodiments, photon pulse 2380 may irradiate the fourth surface 2354 of target substrate. In still other embodiments, multiple photon pulses may irradiate both the semiconductor device 2320 and the target substrate 2240. For example, the opposed and coaxial photon beam arrangement, discussed in conjunction with at least FIG. 19, may be employed for process 2300. In some embodiments, the photon beam and/or pulse 2380 may be a scanning photon beam. One or more scanning photon beams may be scanned across the third surface 2334 of the semiconductor device 2320 and/or the fourth surface 2354 of the target substrate 2340. A temporal and/or spatial profile of the scanning photon beam may be selected to preserve the spatial alignment between the first electrical contact 2322 and the second electrical contact 2342. The scanning frequency and/or the pulsing frequency of the scanning photon beam may be selected and/or modulated to control for the thermal effects.

As shown in the illustration of step 2306, when cured, the volume of the UF material 2360 expands to substantially encapsulate the bonded first electrical contact 2322 and the second electrical contact 2342. When encapsulated via cured UF material 2360, an electromigration process catalyzed by electrical current passing through first electrical contact 2322 and second electrical contact 2342 may be decreased and/or mitigated.

In some embodiments, semiconductor device 2320 and target substrate 2340 may be mechanically and/or electrically coupled via process 2300 at the wafer-level. That is, the semiconductor device 2320 may be a first pre-diced semiconductor die included in a first semiconductor wafer. The target substrate 2340 may be a second pre-diced semiconductor die included in a second semiconductor wafer. Positioning the first semiconductor device 2320 proximate to the target substrate 2340 may include positioning the first semiconductor wafer proximate the second semiconductor wafer.

Process 2300 provides various benefits and/or advantages when electrically coupling semiconductor device 2320 to target substrate 2340. For example, semiconductor device 2320 may be positioned proximate target substrate 2340 at room temperature and/or at atmospheric pressure. The cured UF material encapsulates the electrically bonded first electrical contact 2322 and second electrical contact 2342. That is, the layer of UF material 2360 provides a seal around the electrical contacts. Thus, an electromigration process associated with the first electrical contact 2322 and the second electrical contact 2342 may be at least partially reduced and/or mitigated. Furthermore, because the "spikey" electrical contacts are flattened out, process 2300 is relatively tolerant to fabrications variations in the size and height of the "spikey" electrical contacts.

Additional Embodiments

Additional and/or alternative embodiments for selectively bonding LEDs via a pulsed laser will now be described. These embodiments are consistent with the various embodiments described herein. A non-limiting embodiment includes a system for assembling a display device. The system may include a pick and place head (PPH), a pulsed photon source, and a controller. The PPH places a first light-emitting component (LEC) and a second LEC on a target substrate of the display device. The photon source irradiates the first LEC with a first photon pulse. The first photon pulse provides a first electrical contact of the first LEC with first thermal energy. The first thermal energy electrically couples the first electrical contact of the first LEC with a first electrical contact of the target substrate. In some embodiments, the bonding may be performed in small areas, such that the bonding occurs by bonding bump by bump. The photon source irradiates the second LEC with a second photon source. The second photon pulse provides a second electrical contact of the second LEC with second thermal energy. The second thermal energy electrically couples the second electrical contact of the second LEC with a second electrical contact of the target substrate. The photon source emits the first photon pulse and the second photon pulse with a temporal pulse width. The temporal pulse width is modulated to control thermal effects associated with the first thermal energy and the second thermal energy. The controller operates the photon source and controls the temporal pulse width of the first and the second photon pulses.

The temporal pulse width of the first and the second photon pulses may be modulated based on a thermal diffusivity of the first and the second LEC's. In some embodiments, the temporal pulse width of the first and the second photon pulses is modulated based on a spatial distance between the first and the second electrical contacts of the first and the second LECs when the first and second LECs are placed on the target substrate. In various embodiments, controlling the thermal effects includes limiting an amount of the first thermal energy such that a position of the second electrical contact of the second LEC is maintained and the first photon pulse provides the first electrical contact of the first LEC with the first thermal energy. In at least one embodiment, controlling the thermal effects includes limiting an amount of the second thermal energy such that the electrical coupling between the first electrical contact of the first LEC to the first electrical contact of the target substrate that is formed by the first photon pulse is maintained when the second photon pulse provides the second electrical contact of the second LEC with the second thermal energy.

In various embodiments, the photon source transmits each of the first and the second photon pulses through the PPH to irradiate the first and the second LECs. The temporal pulse width of the first and the second photon pulses may be modulated to control a heat diffusion length associated with the first and the second photon pulses. The modulation of the temporal pulse width may be based on a spatial distance between the first and the second electrical contacts of the first and the second LECs when the first and the second LECs are placed on the target substrate. The photon source may irradiate the first LEC with a third photon pulse. The third photon pulse provides the first electrical contact of the first LEC with a third thermal energy that further electrically couples the first electrical contact of the first LEC to the first electrical contact of the target substrate. A temporal period between the first and the third photon pulses may be based on a spatial distance between the first and the second electrical contacts of the first and the second LECs when the first and the second LECs are placed on the target substrate.

Another embodiment includes a display device, such as but not limited to an LED display device. The LED display device may be a µLED display device. The display device includes a display substrate (e.g., a Si backplane), a plurality of LEDs (e.g., one or more rows of LEDs), and a plurality of electrical couplings. The display device has a plurality of electrical contacts arranged thereon. Each of the plurality of electrical couplings affixes a lead of an LED of the plurality of LEDs to a corresponding electrical contact of the display substrate. The electrical couplings enable the display substrate to operate the affixed LED. Each of the plurality of electrical couplings may be formed by a method that includes aligning the lead of the LED with the corresponding electrical contact of the display substrate such that a thermal contact is formed between the LED and the electrical contact of the display substrate. The method may also include irradiating the LED with one or more electromagnetic (EM) pulses, such as but not limited to laser pulses. The one or more EM pulses may have a temporal profile and/or a spatial profile that is modulated, tuned, chosen, selected, and/or adjusted. The temporal and/or spatial profiles are modulated, tuned, chosen, selected, and/or adjusted to provide a sufficient amount of thermal energy to the lead of the LED and the corresponding electrical contact of the display substrate to form an electrical coupling and also control thermal effects.

In some embodiments, the method forming each of the plurality of electrical couplings also includes scanning a laser device across the plurality of LEDs. The scanned laser device irradiates each of the LEDs with the one or more EM pulses, such as but not limited to laser pulses. In some embodiments, an elastomeric interface layer (e-layer) may be formed on the plurality of LEDs. A conformable surface of the PPH may be coupled, affixed, and/or adhered to the elastomer layer of the plurality late LEDs. The PPH may be employed to pick up the plurality of LEDs via the e-layer. The PPH may be employed to align the lead of each of the plurality of LEDs with the corresponding electrical contact of the display substrate. The laser device may be employed to transmit the one or more laser pulses through the PPH and irradiate each of the plurality of LEDs. In various embodiments, the display device is included in a virtual reality (VR) headset and/or an augmented reality (AR) headset. In various embodiments, controlling the thermal effects includes maintaining the thermal contact between the lead of each of the plurality of LEDs and the corresponding electrical contacts of the display substrate.

From the foregoing, it will be seen that this invention is one well adapted to attain all the ends and objects set forth above, together with other advantages which are obvious and inherent to the system and method. It will be understood that certain features and subcombinations are of utility and may be employed without reference to other features and subcombinations. This is contemplated by and is within the scope of the claims.

The subject matter of the present invention is described with specificity herein to meet statutory requirements. However, the description itself is not intended to limit the scope of this patent. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

What is claimed is:

1. A method for electrically coupling a first semiconductor device to a target substrate, the method comprising:
    positioning the first semiconductor device proximate to the target substrate by employing a pick-up head to spatially align an electrical contact of the first semiconductor device with an electrical contact of the target substrate; and
    transmitting, through the pick-up head and into the first semiconductor device, a photon pulse with a temporal profile characterized by a temporal pulse width and a spatial profile characterized by at least one of a one-dimensional or two-dimensional pulse width and beam spot size that is selected to control thermal effects associated with thermal energy induced by the photon pulse and a wavelength that is selected such that a substantial portion of the thermal energy is absorbed and initially localized within a body of the first semiconductor device and proximate to the electrical contact of the first semiconductor device to bond the electrical contact of the first semiconductor device to the electrical contact of the target substrate.

2. The method of claim 1, further comprising:
    employing the pick-up head to pick up the first semiconductor device from a carrier substrate and position the first semiconductor device proximate to the target substrate; and
    transmitting, through the pick-up head, the photon pulse to irradiate the first semiconductor device.

3. The method of claim 1, further comprising:
    transmitting an additional photon pulse with an additional temporal profile that is selected to control thermal effects associated with additional thermal energy induced by the additional photon pulse, the additional thermal energy bonding an electrical contact of a second semiconductor device to a second electrical contact of the target substrate, the electrical contact of the first semiconductor device and the electrical contact of the second semiconductor device being linearly positioned, and
    wherein the photon pulse and the additional photon pulse are transmitted by scanning a photon-pulse source across the linearly positioned first semiconductor device and the second semiconductor device to electrically couple the first semiconductor device and the second semiconductor device to the target substrate.

4. The method of claim 1, further comprising:
    positioning a linear array of semiconductor devices proximate to the target substrate, the linear array of semiconductor devices including the first semiconductor device, wherein the temporal profile of the photon pulse is selected to localize the thermal effects to the first semiconductor device thereby maintaining the spatial alignment of the semiconductor devices in the linear array of semiconductor devices with electrical contacts of the target substrate.

5. The method of claim 1, wherein the first semiconductor device is a light-emitting diode (LED) with feature sizes that are less than 100 micrometers (μm) and the target substrate is a backplane of a display device.

6. The method of claim 1, further comprising:
    irradiating the first semiconductor device with a plurality of photon pulses that includes the first photon pulse, wherein a temporal period between consecutive photon pulses of the plurality of photon pulses is selected to control thermal effects associated with thermal energy provided by each of the plurality of photon pulses.

7. The method of claim 1, wherein the temporal profile is based on a thermal diffusivity and a geometry associated with the first semiconductor device such that the temporal profile localizes the thermal effects at the first semiconductor device.

8. The method of claim 1, wherein the temporal profile is selected to localize the thermal effects associated with the thermal energy at the electrical contact of the first semiconductor device.

9. The method of claim 1, wherein the temporal profile is selected to localize the thermal effects associated with the thermal energy at the electrical contact of the first semiconductor device and another electrical contact of the first semiconductor device or another semiconductor device.

10. The method of claim 1, wherein the temporal profile is selected such that the thermal energy initially localized within the body of the first semiconductor device diffuses to the electrical contact of the first semiconductor device and does not substantially heat a previously bonded electrical contact of the first semiconductor device or another semiconductor device.

11. The method of claim 1, further comprising:
    forming an elastomer layer on a top surface of the first semiconductor device;
    affixing a surface of the pick-up head to the elastomer layer of the first semiconductor device;
    employing the pick-up head to pick up the first semiconductor device, via the elastomer layer;
    employing the pick-up head to spatially align the electrical contact of the first semiconductor device with the electrical contact of the target substrate; and
    employing a photon source to transmit the photon pulse through the pick-up head and irradiate the top surface of the first photon pulse.

12. The method of claim 1, wherein transmitting the photon pulse forms an electrical bond between the electrical contact of the first semiconductor device and the electrical contact of the target substrate, the method further comprising:
: transmitting an additional photon pulse with an additional temporal profile that is selected to control thermal effects associated with additional thermal energy induced by the additional photon pulse, the additional thermal energy annealing the electrical bond between the electrical contact of the first semiconductor device and the electrical contact of the target substrate.

13. The method of claim 12, wherein an additional electrical bond between an additional electrical contact of the first semiconductor device and an additional electrical contact of the target substrate is formed, the method further comprising:
scanning a photon source that transmitted the additional photon pulse across at least one of the first semiconductor device or the target substrate to anneal the additional electrical bond.

14. The method of claim 12, wherein the first semiconductor device includes a first surface, a second surface that opposes the first surface, and an active layer disposed between the first surface and the second surface, the additional photon pulse irradiates the first surface, and a wavelength of the additional photon pulse is selected such that laser radiation associated with the additional photon pulsed is substantially absorbed by a portion of the semiconductor device disposed between the first surface and the active layer.

15. The method of claim 1, further comprising:
depositing uncured underfill (UF) material intermediate the first semiconductor device and the target substrate; and
transmitting the photon pulse, wherein at least a portion of the thermal energy induced by the photon pulse cures the UF material.

16. The method of claim 15, wherein depositing the uncured UF material intermediate the first semiconductor device and the target substrate is enabled by a capillary flow process.

17. The method of claim 15, wherein the uncured UF material is deposited intermediate the first semiconductor device and the target substrate after the first semiconductor device is positioned proximate to the target substrate.

18. The method of claim 1, wherein transmitting the photon pulse forms an electrical bond between the electrical contact of the first semiconductor device and the electrical contact of the target substrate such that an electrically integrated device including the first semiconductor device and the target substrate is formed, the method further comprising:
positioning the integrated device proximate to a circuit board by spatially aligning a second electrical contact of the target substrate with an electrical contact of the circuit board; and
transmitting an additional photon pulse with an additional temporal profile that is selected to control thermal effects associated with additional thermal energy induced by the additional photon pulse, the additional thermal energy bonding the second contact of the target substrate to the electrical contact of the circuit board such that the circuit board is enabled to provide an electrical signal to the first semiconductor device via the electrical bond between the electrical contact of the first semiconductor device and the electrical contact of the target substrate.

19. The method of claim 18, wherein solder material is disposed at an interface between the second electrical contact of the target substrate and the electrical contact of the circuit board, and wherein the additional temporal profile is selected to localize the additional thermal effects associated with the additional thermal energy at the interface between the second electrical contact of the target substrate and the electrical contact of the circuit board, such that the solder material is reflown to form an electrical bond between the second electrical contact of the target substrate and the electrical contact of the circuit.

20. The method of claim 1, wherein the photon pulse irradiates the first semiconductor device, the method further comprising:
transmitting an additional photon pulse with an additional temporal profile that is selected to control thermal effects associated with additional thermal energy induced by the additional photon pulse, which irradiates the target substrate, and a combination of the additional thermal energy and the thermal energy associated with the photon pulse bonds the electrical contact of the first semiconductor device to the electrical contact of the target substrate.

21. The method of claim 20, wherein a first Poynting vector is associated with the photon pulse, a second Poynting vector is associated with the additional photon pulse, and the first and the second Poynting vectors are substantially aligned vectors in substantially opposing directions.

22. The method of claim 20, wherein the first semiconductor device includes a first surface, a second surface that opposes the first surface, and an active layer disposed between the first surface and the second surface, the photon pulse irradiates the first surface, and the wavelength of the photon pulse is selected such that a substantial portion of laser radiation associated with the photon pulsed is absorbed by a portion of the first semiconductor device disposed between the first surface and the active layer.

23. The method of claim 20, wherein the target substrate includes a first surface, a second surface that opposes the first surface, a metallization layer disposed on the second surface, and a bulk of semiconductor material that is transparent to a wavelength of the additional photon pulse and disposed between the first surface and the second surface, the additional photon pulse irradiating the first surface such that laser radiation associated with the additional photon pulse is substantially transmitted through the bulk of the semiconductor material and is substantially absorbed by the metallization layer.

24. A method for electrically coupling a first semiconductor device to a target substrate, the method comprising:
positioning the first semiconductor device proximate to the target substrate by spatially aligning an electrical contact of the first semiconductor device with an electrical contact of the target substrate; and
transmitting a plurality of photon pulses with a temporal profile characterized by a temporal pulse width that includes a temporal offset between consecutive pulses of the plurality of photon pulses is selected to control thermal effects associated with thermal energy induced by the plurality of photon pulses, and a spatial profile characterized by at least one of a one-dimensional or two-dimensional pulse width and beam spot size, the thermal energy bonding the electrical contact of the first semiconductor device to the electrical contact of the target substrate.

* * * * *